US011774853B2

(12) United States Patent
Hatakeyama et al.

(10) Patent No.: US 11,774,853 B2
(45) Date of Patent: Oct. 3, 2023

(54) RESIST COMPOSITION AND PATTERNING PROCESS

(71) Applicant: Shin-Etsu Chemical Co., Ltd., Tokyo (JP)

(72) Inventors: Jun Hatakeyama, Joetsu (JP); Masaki Ohashi, Joetsu (JP); Masahiro Fukushima, Joetsu (JP); Takayuki Fujiwara, Joetsu (JP); Kazuhiro Katayama, Joetsu (JP)

(73) Assignee: Shin-Etsu Chemical Co., Ltd., Tokyo (JP)

( * ) Notice: Subject to any disclaimer, the term of this patent is extended or adjusted under 35 U.S.C. 154(b) by 481 days.

(21) Appl. No.: 16/717,292

(22) Filed: Dec. 17, 2019

(65) Prior Publication Data

US 2020/0192222 A1 Jun. 18, 2020

(30) Foreign Application Priority Data

Dec. 18, 2018 (JP) ................................ 2018-236571

(51) Int. Cl.

| | |
|---|---|
| ***G03F 7/038*** | (2006.01) |
| ***G03F 7/004*** | (2006.01) |
| ***C08L 33/14*** | (2006.01) |
| ***C08L 25/06*** | (2006.01) |
| ***C08G 61/02*** | (2006.01) |
| ***C08L 33/08*** | (2006.01) |
| ***G03F 7/20*** | (2006.01) |

(52) U.S. Cl.

CPC .......... *G03F 7/0382* (2013.01); *C08G 61/02* (2013.01); *C08L 25/06* (2013.01); *C08L 33/08* (2013.01); *C08L 33/14* (2013.01); *G03F 7/0045* (2013.01); *G03F 7/2004* (2013.01); *C08G 2261/3222* (2013.01)

(58) Field of Classification Search

CPC ...... G03F 7/0045; G03F 7/0046; G03F 7/038; G03F 7/0382; G03F 7/039; G03F 7/0392; G03F 7/0395; G03F 7/0397

See application file for complete search history.

(56) References Cited

U.S. PATENT DOCUMENTS

| | | | | |
|---|---|---|---|---|
| 9,122,153 | B2 | 9/2015 | Echigo et al. | |
| 9,176,379 | B2 | 11/2015 | Ichikawa et al. | |
| 9,448,475 | B2 | 9/2016 | Masuyama et al. | |
| 9,563,123 | B2 | 2/2017 | Masuyama et al. | |
| 10,295,904 | B2 | 5/2019 | Hatakeyama et al. | |
| 2017/0205709 | A1 * | 7/2017 | Hatakeyama | C07C 69/635 |
| 2017/0285469 | A1 | 10/2017 | Nagamine et al. | |
| 2017/0351177 | A1 * | 12/2017 | Hatakeyama | G03F 7/0048 |

FOREIGN PATENT DOCUMENTS

| | | | | |
|---|---|---|---|---|
| JP | 58-52490 | A | | 3/1983 |
| JP | 5-204157 | A | | 8/1993 |
| JP | 2015-161823 | A | | 9/2015 |
| JP | 2015-172746 | A | | 10/2015 |
| JP | 2015-180928 | A | | 10/2015 |
| JP | 2017-219836 | A | | 12/2017 |
| JP | 20184812 | A | | 1/2018 |
| JP | 2018095851 | A | * | 6/2018 |
| JP | 2018097356 | A | * | 6/2018 |
| TW | 201805721 | A | | 2/2018 |
| WO | 2013/024777 | A1 | | 2/2013 |

OTHER PUBLICATIONS

English Machine Translation of JP2018095851A (Year: 2018).*
English Machine Translation of JP2018097356A (Year: 2018).*
Yamamoto, H. et al.; "Polymer-Structure Dependence of Acid Generation in Chemically Amplified Extreme Ultraviolet Resists", Jpn. J. Appl. Physics, 2007, vol. 46, No. 7, pp. L142-L144 (3 pages), cited in specification.
Office Action dated Aug. 13, 2020, issued in counterpart TW Application No. 108145912. (9 pages).

* cited by examiner

*Primary Examiner* — Duane Smith
*Assistant Examiner* — Nicholas E Brown
(74) *Attorney, Agent, or Firm* — WHDA, LLP

(57) ABSTRACT

A resist composition comprising an iodized base polymer and an iodized benzene ring-containing quencher has a high sensitivity and improved LWR and CDU.

17 Claims, No Drawings

RESIST COMPOSITION AND PATTERNING PROCESS

CROSS-REFERENCE TO RELATED APPLICATION

This non-provisional application claims priority under 35 U.S.C. § 119(a) on Patent Application No. 2018-236571 filed in Japan on Dec. 18, 2018, the entire contents of which are hereby incorporated by reference.

TECHNICAL FIELD

This invention relates to a resist composition and a patterning process using the composition.

BACKGROUND ART

To meet the demand for higher integration density and operating speed of LSIs, the effort to reduce the pattern rule is in rapid progress. The logic devices used in smart phones or the like drive forward the miniaturization technology. Logic devices of 10-nm node are manufactured in a large scale using a multi-patterning lithography process based on ArF lithography.

In the application of lithography to next 7-nm or 5-nm node devices, the increased expense and overlay accuracy of multi-patterning lithography become tangible. The advent of EUV lithography capable of reducing the number of exposures is desired.

Since the wavelength (13.5 nm) of extreme ultraviolet (EUV) is shorter than 1/10 of the wavelength (193 nm) of ArF excimer laser, the EUV lithography achieves a high light contrast, from which a high resolution is expectable. Because of the short wavelength and high energy density of EUV, an acid generator is sensitive to a small dose of photons. It is believed that the number of photons available with EUV exposure is 1/14 of that of ArF exposure. In the EUV lithography, the phenomenon that the edge roughness (LWR) of line patterns or the critical dimension uniformity (CDU) of hole patterns is degraded by a variation of photon number is considered a problem.

Aiming to reduce a photon number variation, an attempt was made to render the resist more absorptive so that the number of photons absorbed in the resist is increased.

Patent Document 1 discloses a halogen-substituted styrene base resin. Among the halogen atoms, iodine is highly absorptive to EUV radiation of wavelength 13.5 nm. Recently Patent Documents 2 to 4 propose to use iodine-substituted resins as EUV resist material. Regrettably, it is not true that a higher sensitivity is obtainable merely by incorporating iodine to increase the number of photons absorbed. With respect to the acid generation in EUV exposure, Non-Patent Document 1 reports that the acid generation efficiency of iodized styrene is only 14% of that of hydroxystyrene.

The EUV lithography resist must meet high sensitivity, high resolution and low LWR at the same time. As the acid diffusion distance is reduced, LWR is reduced, but sensitivity becomes lower. For example, as the PEB temperature is lowered, the outcome is a reduced LWR, but a lower sensitivity. As the amount of quencher added is increased, the outcome is a reduced LWR, but a lower sensitivity. It is necessary to overcome the tradeoff relation between sensitivity and LWR. It would be desirable to have a resist material having a high sensitivity and resolution as well as improved LWR and CDU.

Patent Document 5 proposes a quencher of iodonium carboxylate type having a carboxylate ion bonded to an iodonium cation. Patent Documents 6 and 7 propose the use of hypervalent iodine compounds as the quencher. Patent Document 8 discloses a sulfonium salt of iodized benzoic acid. Since iodine has a large atomic weight, quenchers in the form of iodized compounds are fully effective for suppressing acid diffusion.

CITATION LIST

Patent Document 1: JP-A H05-204157
Patent Document 2: JP-A 2015-161823
Patent Document 3: WO 2013/024777
Patent Document 4: JP-A 2018-004812
Patent Document 5: JP 5852490 (U.S. Pat. No. 9,176,379)
Patent Document 6: JP-A 2015-180928 (U.S. Pat. No. 9,563,123)
Patent Document 7: JP-A 2015-172746 (U.S. Pat. No. 9,448,475)
Patent Document 8: JP-A 2017-219836
Non-Patent Document 1: Jpn. J. Appl. Physics, Vol. 46, No. 7, pp. L142-L144, 2007

SUMMARY OF INVENTION

For the acid-catalyzed chemically amplified resist, it is desired to develop a resist composition providing a high sensitivity and reducing LWR or improving CDU of hole patterns.

An object of the invention is to provide a resist composition which exhibits a high sensitivity, low LWR and improved CDU independent of whether it is of positive tone or negative tone, and a pattern forming process using the same.

The inventors have found that a resist composition comprising an iodized polymer and a quencher selected from a sulfonium or ammonium salt of iodized benzene ring-containing carboxylic acid, a sulfonium or ammonium salt of iodized benzene ring-containing N-carbonylsulfonamide, an iodized benzene ring-containing amine, and an iodized benzene ring-containing ammonium salt exhibits a high sensitivity, low LWR, improved CDU, and wide process margin.

In one aspect, the invention provides a resist composition comprising an iodized base polymer, and at least one quencher selected from the group consisting of a sulfonium or ammonium salt of iodized benzene ring-containing carboxylic acid, a sulfonium or ammonium salt of iodized benzene ring-containing N-carbonylsulfonamide, an iodized benzene ring-containing amine, and an iodized benzene ring-containing ammonium salt.

Preferably, the sulfonium or ammonium salt of iodized benzene ring-containing carboxylic acid, the sulfonium or ammonium salt of iodized benzene ring-containing N-carbonylsulfonamide, the iodized benzene ring-containing amine, and the iodized benzene ring-containing ammonium salt have the following formulae (A)-1 to (A)-4, respectively.

(A)-1

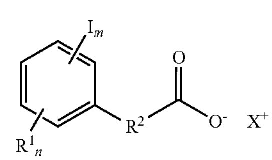

-continued (A)-2

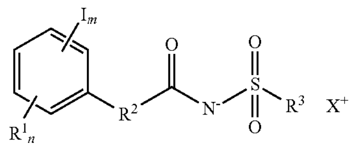

(A)-3

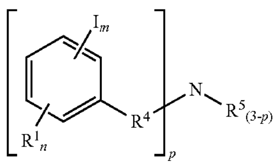

(A)-4

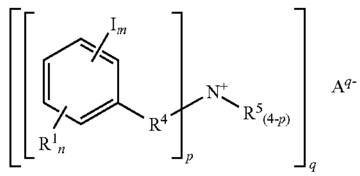

Herein $R^1$ is hydroxyl, fluorine, chlorine, bromine, amino, nitro, cyano, or a $C_1$-$C_6$ alkyl group, $C_1$-$C_6$ alkoxy group, $C_2$-$C_6$ acyloxy group or $C_1$-$C_4$ alkylsulfonyloxy group, which may be substituted with halogen, or —$NR^{1A}$—C(═O)—$R^{1B}$ or —$NR^{1A}$—C(═O)—O—$R^{1B}$, $R^{1A}$ is hydrogen or a $C_1$-$C_6$ alkyl group, $R^{1B}$ is a $C_1$-$C_6$ alkyl group or $C_2$-$C_8$ alkenyl group. $R^2$ is a single bond or a $C_1$-$C_{20}$ divalent linking group which may contain ether bond, carbonyl moiety, ester bond, amide bond, sultone moiety, lactam moiety, carbonate moiety, halogen, hydroxyl moiety or carboxyl moiety. $R^3$ is a $C_1$-$C_{10}$ alkyl group or $C_6$-$C_{10}$ aryl group, which may be substituted with amino, nitro, cyano, $C_1$-$C_{12}$ alkyl, $C_1$-$C_{12}$ alkoxy, $C_2$-$C_{12}$ alkoxycarbonyl, $C_2$-$C_{12}$ acyl, $C_2$-$C_{12}$ acyloxy, hydroxyl or halogen. $R^4$ is a $C_1$-$C_{20}$ divalent hydrocarbon group which may contain an ester bond or ether bond. $R^5$ is hydrogen, nitro, or a $C_1$-$C_{20}$ monovalent hydrocarbon group which may contain hydroxyl, carboxyl, ether bond, ester bond, thiol, nitro, cyano, halogen or amino, with the proviso that in case of p=1, groups $R^5$ may bond together to form a ring with the nitrogen atom to which they are attached, the ring optionally containing a double bond, oxygen, sulfur or nitrogen; m is an integer of 1 to 5, n is an integer of 0 to 4, meeting $1 \le m+n \le 5$, p is 1, 2 or 3, q is 1 or 2. $A^{q-}$ is a carboxylate anion, fluorine-free sulfonimide anion, sulfonamide anion, or halide ion. $X^+$ is a sulfonium cation having the formula (Aa) or ammonium cation having the formula (Ab):

(Aa)

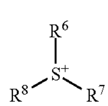

(Ab)

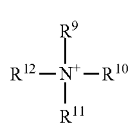

Herein $R^6$, $R^7$ and $R^8$ are each independently fluorine, chlorine, bromine, iodine, or a $C_1$-$C_{20}$ monovalent hydrocarbon group which may contain a heteroatom, $R^6$ and $R^7$ may bond together to form a ring with the sulfur atom to which they are attached. $R^9$ to $R^{12}$ are each independently hydrogen or a $C_1$-$C_{24}$ monovalent hydrocarbon group which may contain halogen, hydroxyl, carboxyl, thiol, ether bond, ester bond, thioester bond, thionoester bond, dithioester bond, amino, nitro, sulfone or ferrocenyl, $R^9$ and $R^{10}$ may bond together to form a ring, $R^9$ and $R^{10}$ taken together may form ═C($R^{9A}$)($R^{10A}$), $R^{9A}$ and $R^{10A}$ are each independently hydrogen or a $C_1$-$C_{16}$ monovalent hydrocarbon group, $R^{9A}$ and $R^{10A}$ may bond together to form a ring with the carbon and nitrogen atoms to which they are attached, the ring optionally containing a double bond, oxygen, sulfur or nitrogen.

The resist composition may further comprise an acid generator capable of generating sulfonic acid, imidic acid or methide acid.

In a preferred embodiment, the iodized base polymer comprises recurring units having the formula (a1) or recurring units having the formula (a2).

(a1)

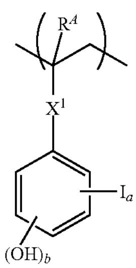

(a2)

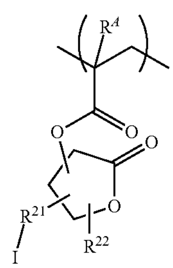

Herein $R^A$ is each independently hydrogen or methyl, $R^{21}$ is a single bond or methylene, $R^{22}$ is hydrogen or a $C_1$-$C_4$ alkyl group, $X^1$ is a single bond, ether bond, ester bond, amide bond, —C(═O)—O—$R^{23}$—, phenylene, -Ph-C(═O)—O—$R^{24}$—, or -Ph-$R^{25}$—O—C(═O)—$R^{26}$—, wherein Ph stands for phenyl, $R^{23}$ is a $C_1$-$C_{10}$ alkanediyl group which may contain an ether bond or ester bond, $R^{24}$, $R^{25}$ and $R^{26}$ are each independently a single bond or a $C_1$-$C_6$ straight or branched alkanediyl group, a is an integer of 1 to 5, preferably an integer of 1 to 3, b is an integer of 1 to 4, meeting $1 \le a+b \le 5$.

Typically the resist composition contains an organic solvent.

In a preferred embodiment, the iodized base polymer further comprises recurring units having the formula (b1) or recurring units having the formula (b2).

(b1)

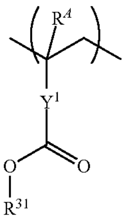

(b2)

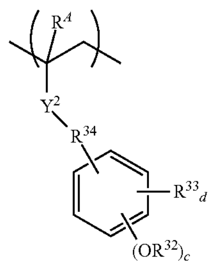

Herein $R^A$ is each independently hydrogen or methyl, $Y^1$ is a single bond, phenylene, naphthylene, or a $C_1$-$C_{12}$ linking group containing an ester bond or lactone ring, $Y^2$ is a single bond or ester bond, $R^{31}$ and $R^{32}$ are each independently an acid labile group, $R^{33}$ is fluorine, trifluoromethyl, cyano, a $C_1$-$C_6$ alkyl, $C_1$-$C_6$ alkoxy, $C_2$-$C_7$ acyl, $C_2$-$C_7$ acyloxy, or $C_2$-$C_7$ alkoxycarbonyl group, $R^{34}$ is a single bond or $C_1$-$C_6$ alkanediyl group in which some carbon may be replaced by an ether or ester bond, c is 1 or 2, d is an integer of 0 to 4, meeting $1 \leq c+d \leq 5$.

The resist composition may further comprise a dissolution inhibitor.

Typically, the resist composition is a chemically amplified positive resist composition.

In another preferred embodiment, the iodized base polymer is free of an acid labile group. The resist composition may further comprise a crosslinker. Typically, the resist composition is a chemically amplified negative resist composition.

The resist composition may further comprise an iodine-free quencher.

The resist composition may further comprise a surfactant.

In a further preferred embodiment, the iodized base polymer further comprises recurring units of at least one type selected from recurring units having the formulae (g1) to (g3).

(g1)

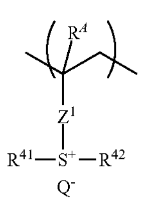

-continued (g2)

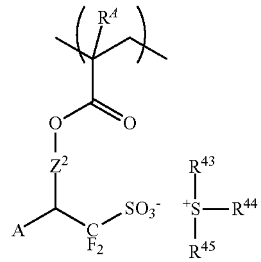

(g3)

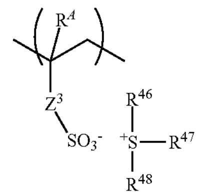

Herein $R^A$ is each independently hydrogen or methyl. $Z^1$ is a single bond, phenylene, —O—$Z^{12}$—, —C(═O)—$Z^{11}$—$Z^{12}$—, $Z^{11}$ is —O— or —NH—, $Z^{12}$ is a $C_1$-$C_6$ alkanediyl group, $C_2$-$C_6$ alkenediyl group or phenylene group, which may contain a carbonyl moiety, ester bond, ether bond or hydroxyl moiety. $Z^2$ is a single bond, —$Z^{21}$—C(═O)—O—, —$Z^{21}$—O—, or —$Z^{21}$—O—C(═O)—, $Z^{21}$ is a $C_1$-$C_{12}$ alkanediyl group which may contain a carbonyl moiety, ester bond or ether bond. $Z^3$ is a single bond, methylene, ethylene, phenylene, fluorinated phenylene, —O—$Z^{32}$—, or —C(═O)—$Z^{31}$—$Z^{32}$—, $Z^{31}$ is —O— or —NH—, $Z^{32}$ is a $C_1$-$C_6$ alkanediyl group, phenylene, fluorinated phenylene, trifluoromethyl-substituted phenylene group, or $C_2$-$C_6$ alkenediyl group, which may contain a carbonyl moiety, ester bond, ether bond or hydroxyl moiety. $R^{41}$ to $R^{48}$ are each independently a $C_1$-$C_{20}$ monovalent hydrocarbon group which may contain a heteroatom, any two of $R^{43}$, $R^{44}$ and $R^{45}$ or any two of $R^{46}$, $R^{47}$ and $R^{48}$ may bond together to form a ring with the sulfur atom to which they are attached. "A" is hydrogen or trifluoromethyl. $Q^-$ is a non-nucleophilic counter ion.

In another aspect, the invention provides a pattern forming process comprising the steps of applying the resist composition defined above to form a resist film on a substrate, exposing the resist film to high-energy radiation, and developing the exposed resist film in a developer.

Preferably, the high-energy radiation is ArF excimer laser of wavelength 193 nm, KrF excimer laser of wavelength 248 nm, EB, or EUV of wavelength 3 to 15 nm.

Advantageous Effects of Invention

A resist composition comprising an iodized polymer and a quencher selected from a sulfonium or ammonium salt of iodized benzene ring-containing carboxylic acid, a sulfonium or ammonium salt of iodized benzene ring-containing N-carbonylsulfonamide, an iodized benzene ring-containing amine, and an iodized benzene ring-containing ammonium salt has the advantage of controlled acid diffusion due to the high atomic weight of iodine. Since iodine is highly absorptive to EUV of wavelength 13.5 nm, it effectively generates secondary electrons during exposure. This contributes to a higher sensitivity than a combination of an iodized polymer with an iodine-free quencher. Thus, a resist material having a high sensitivity, low LWR and improved CDU may be designed.

DESCRIPTION OF EMBODIMENTS

As used herein, the singular forms "a," "an" and "the" include plural referents unless the context clearly dictates otherwise. The notation ($C_n$-$C_m$) means a group containing from n to m carbon atoms per group. As used herein, the term "iodized" or "fluorinated" indicates that a compound contains iodine or fluorine. Me stands for methyl, Ac for acetyl, and Ph for phenyl.

The abbreviations and acronyms have the following meaning.

EB: electron beam
EUV: extreme ultraviolet
Mw: weight average molecular weight
Mn: number average molecular weight
Mw/Mn: molecular weight distribution or dispersity
GPC: gel permeation chromatography
PEB: post-exposure bake
PAG: photoacid generator
LWR: line width roughness
CDU: critical dimension uniformity Resist Composition One embodiment of the invention is a resist composition comprising an iodized base polymer and at least one quencher selected from the group consisting of a sulfonium or ammonium salt of iodized benzene ring-containing carboxylic acid, a sulfonium or ammonium salt of iodized benzene ring-containing N-carbonylsulfonamide, an iodized benzene ring-containing amine, and an iodized benzene ring-containing ammonium salt, which are collectively referred to as "iodized benzene ring-containing quencher," hereinafter. The quencher traps the acid generated upon radiation exposure. An acid generator capable of generating a sulfonic acid, imide acid or methide acid may be added to the resist composition while a polymer-bound acid generator may also be used.

In the resist composition, the base polymer contains iodine. Since iodine is highly absorptive to radiation, the base polymer generates secondary electrons upon exposure. The energy of secondary electrons is transferred to the acid generator to promote the efficiency of acid generation. As the efficiency of acid generation increases, the acid diffusion becomes more active. This invites a higher sensitivity and degraded CDU or LWR at the same time, failing to escape from the tradeoff relationship of sensitivity to CDU or LWR.

It is the iodized benzene ring-containing quencher that can effectively suppress the acid diffusion. The quencher suppresses the diffusion of acid which is efficiently generated by more secondary electrons generated from the iodized polymer, thereby achieving a high sensitivity and improved CDU or low LWR at the same time. It becomes possible to escape from the outstanding tradeoff relationship. Since the iodized benzene ring-containing quencher itself is highly absorptive, it also generates secondary electrons to promote decomposition of the acid generator.

The iodized benzene ring-containing quencher exerts the desired LWR or CDU improving effect, which may stand good either in positive and negative tone pattern formation by aqueous alkaline development or in negative tone pattern formation by organic solvent development.

Iodized Benzene Ring-Containing Quencher

The iodized benzene ring-containing quencher is preferably selected from compounds having the following formulae (A)-1 to (A)-4.

(A)-1

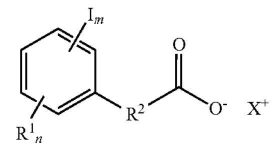

(A)-2

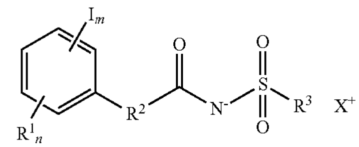

(A)-3

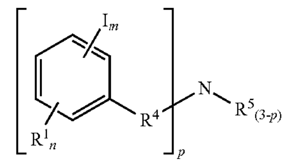

(A)-4

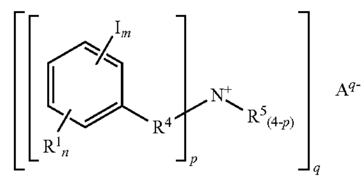

In formulae (A)-1 and (A)-2, $R^1$ is hydroxyl, fluorine, chlorine, bromine, amino, nitro, cyano, or a $C_1$-$C_6$ alkyl group, $C_1$-$C_6$ alkoxy group, $C_2$-$C_6$ acyloxy group or $C_1$-$C_4$ alkylsulfonyloxy group, which may be substituted with halogen, or —$NR^{1A}$—C(═O)—$R^{1B}$ or —$NR^{1A}$—C(═O)—O—$R^{1B}$, wherein $R^{1A}$ is hydrogen or a $C_1$-$C_6$ alkyl group, and $R^{1B}$ is a $C_1$-$C_6$ alkyl group or $C_2$-$C_8$ alkenyl group.

The $C_1$-$C_6$ alkyl group may be straight, branched or cyclic and examples thereof include methyl, ethyl, n-propyl, isopropyl, cyclopropyl, n-butyl, isobutyl, sec-butyl, tert-butyl, cyclobutyl, n-pentyl, cyclopentyl, n-hexyl and cyclohexyl. The alkyl moiety of the $C_1$-$C_6$ alkoxy group is as exemplified for the alkyl group; the alkyl moiety of the $C_2$-$C_6$ acyloxy group is as exemplified for the alkyl group, but of 1 to 5 carbon atoms; the alkyl moiety of the $C_1$-$C_4$ alkylsulfonyloxy group is as exemplified for the alkyl group, but of 1 to 4 carbon atoms. The $C_2$-$C_8$ alkenyl group may be straight, branched or cyclic and examples thereof include vinyl, 1-propenyl, 2-propenyl, butenyl, hexenyl, and cyclohexenyl.

$R^1$ is preferably fluorine, chlorine, bromine, hydroxyl, amino, $C_1$-$C_3$ alkyl, $C_1$-$C_3$ alkoxy, $C_2$-$C_4$ acyloxy, —$NR^{1A}$—C(═O)—$R^{1B}$, or —$NR^{1A}$—C(═O)—O—$R^{1B}$.

In formulae (A)-1 and (A)-2, $R^2$ is a single bond or a $C_1$-$C_{20}$ divalent linking group which may contain an ether bond, carbonyl moiety, ester bond, amide bond, sultone moiety, lactam moiety, carbonate moiety, halogen, hydroxyl moiety or carboxyl moiety.

In formula (A)-2, $R^3$ is a $C_1$-$C_{10}$ alkyl group or $C_6$-$C_{10}$ aryl group, which may be substituted with amino, nitro, cyano, $C_1$-$C_{12}$ alkyl, $C_1$-$C_{12}$ alkoxy, $C_2$-$C_{12}$ alkoxycarbonyl, $C_2$-$C_{12}$ acyl, $C_2$-$C_{12}$ acyloxy, hydroxyl or halogen.

The $C_1$-$C_{10}$ alkyl group may be straight, branched or cyclic and examples thereof include n-heptyl, n-octyl, n-nonyl, n-decyl, norbornyl and adamantyl as well as those exemplified above for the $C_1$-$C_6$ alkyl group. Examples of the $C_6$-$C_{10}$ aryl group include phenyl, tolyl, xylyl, 1-naphthyl and 2-naphthyl. The $C_1$-$C_{12}$ alkyl group may be straight, branched or cyclic and examples thereof include n-undecyl and n-dodecyl as well as those exemplified above for the $C_1$-$C_{10}$ alkyl group. The alkyl moiety of the $C_1$-$C_{12}$ alkoxy group is as exemplified above for the $C_1$-$C_{12}$ alkyl group; the alkyl moiety of the $C_2$-$C_{12}$ alkoxycarbonyl group, $C_2$-$C_{12}$ acyl group, and $C_2$-$C_{12}$ acyloxy group is as exemplified above for the $C_1$-$C_{12}$ alkyl group, but of 1 to 11 carbon atoms.

In formulae (A)-3 and (A)-4, $R^4$ is a $C_1$-$C_{20}$ divalent hydrocarbon group. The divalent hydrocarbon group may be straight, branched or cyclic. Examples thereof include straight or branched alkanediyl groups such as methylene, ethylene, propane-1,2-diyl, propane-1,3-diyl, butane-1,2-diyl, butane-1,3-diyl, butane-1,4-diyl, pentane-1,5-diyl, hexane-1,6-diyl, heptane-1,7-diyl, octane-1,8-diyl, nonane-1,9-diyl, decane-1,10-diyl, undecane-1,11-diyl, dodecane-1,12-diyl; $C_3$-$C_{20}$ cyclic alkanediyl groups such as cyclopentanediyl, cyclohexanediyl, norbornanediyl, and adamantanediyl; $C_2$-$C_{20}$ alkenediyl groups such as vinylene and propene-1,3-diyl; and $C_6$-$C_{20}$ arylene groups such as phenylene and naphthylene, and mixtures thereof. The divalent hydrocarbon group may contain an ester bond and/or ether bond.

In formulae (A)-3 and (A)-4, $R^5$ is hydrogen, nitro, or a $C_1$-$C_{20}$ monovalent hydrocarbon group. The $C_1$-$C_{20}$ monovalent hydrocarbon group may be straight, branched or cyclic. Examples thereof include straight or branched $C_1$-$C_{20}$ alkyl groups such as methyl, ethyl, n-propyl, isopropyl, n-butyl, isobutyl, sec-butyl, tert-butyl, n-pentyl, n-hexyl, n-octyl, n-nonyl, n-decyl, undecyl, dodecyl, tridecyl, tetradecyl, pentadecyl, heptadecyl, octadecyl, nonadecyl and icosyl; $C_3$-$C_{20}$ cyclic alkyl groups such as cyclopropyl, cyclopentyl, cyclohexyl, cyclopropylmethyl, 4-methylcyclohexyl, cyclohexylmethyl, norbornyl, adamantyl; $C_2$-$C_{20}$ alkenyl groups such as vinyl, propenyl, butenyl, hexenyl; $C_3$-$C_{20}$ cyclic alkenyl groups such as cyclohexenyl and norbornenyl; $C_2$-$C_{20}$ alkynyl groups such as ethynyl, propynyl, butynyl, 2-cyclohexylethynyl, 2-phenylethynyl; $C_6$-$C_{20}$ aryl groups such as phenyl, methylphenyl, ethylphenyl, n-propylphenyl, isopropylphenyl, n-butylphenyl, isobutylphenyl, sec-butylphenyl, tert-butylphenyl, naphthyl, methylnaphthyl, ethylnaphthyl, n-propylnaphthyl, isopropylnaphthyl, n-butylnaphthyl, isobutylnaphthyl, sec-butylnaphthyl, tert-butylnaphthyl; $C_7$-$C_{20}$ aralkyl groups such as benzyl and phenethyl. The monovalent hydrocarbon group may contain hydroxyl, carboxyl, ether bond, ester bond, thiol, nitro, cyano, halogen or amino, or a mixture thereof. In case of p=1, groups $R^5$ may bond together to form a ring with the nitrogen atom to which they are attached, and the relevant ring may contain a double bond, oxygen, sulfur or nitrogen.

In formulae (A)-1 to (A)-4, m is an integer of 1 to 5, and n is an integer of 0 to 4, meeting $1 \le m+n \le 5$. In formulae (A)-3 and (A)-4, p is 1, 2 or 3, and q is 1 or 2.

Examples of the anion of the salt having formula (A)-1 are shown below, but not limited thereto.

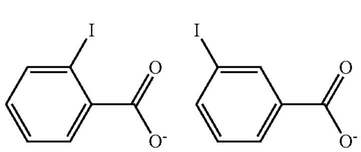

-continued

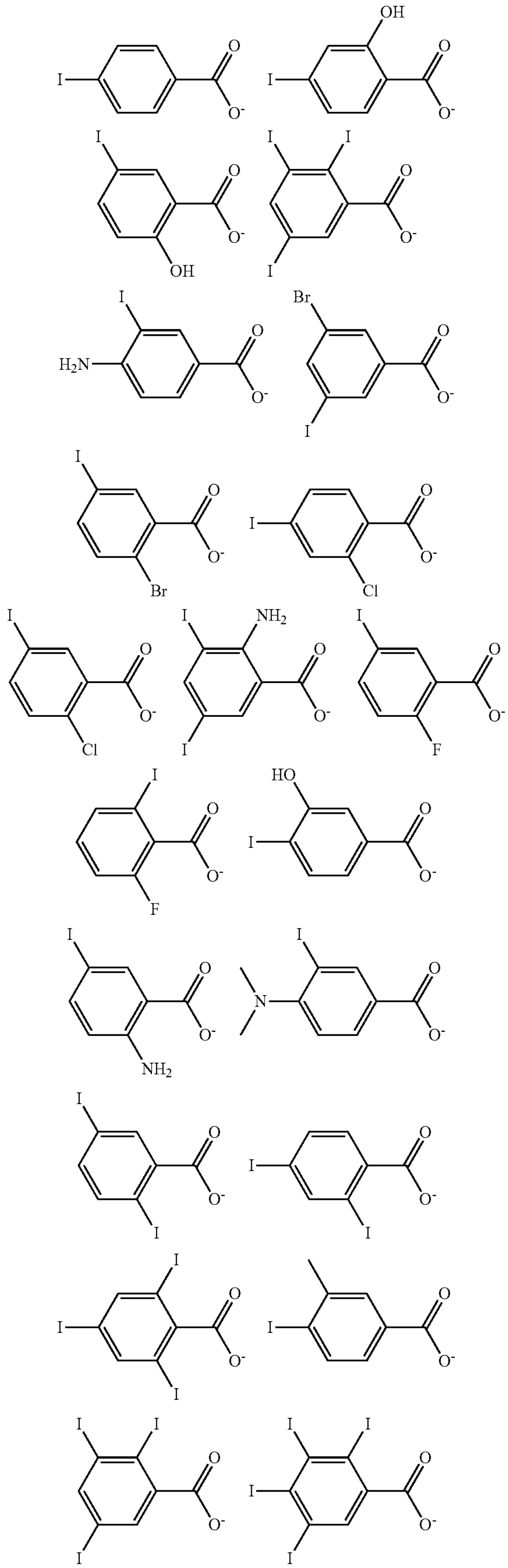

-continued
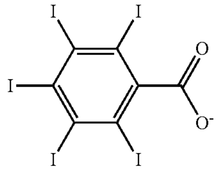
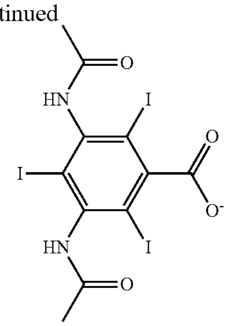
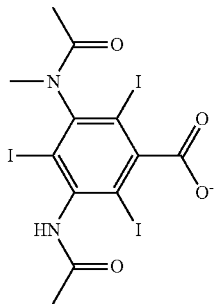
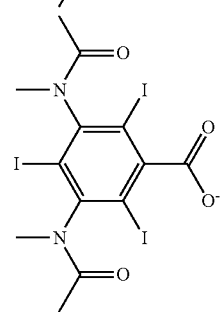
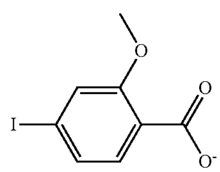
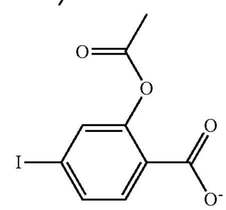
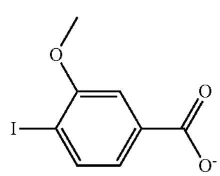
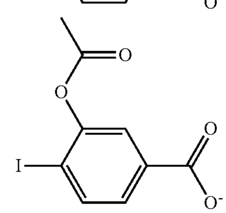
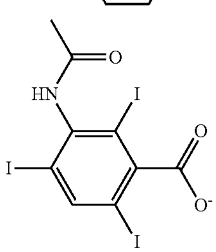
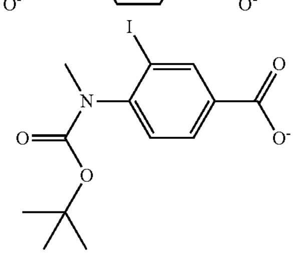
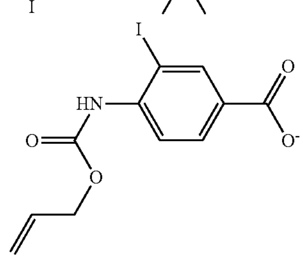
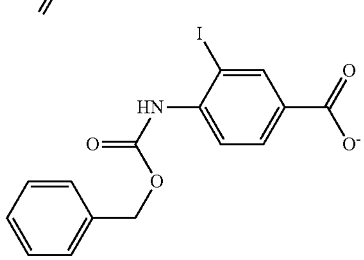
-continued
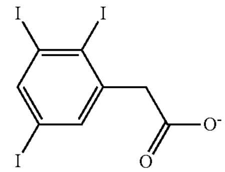
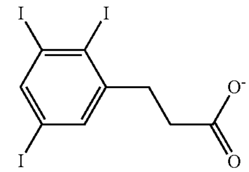
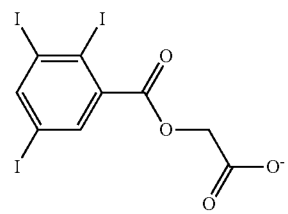
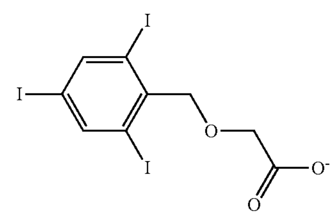
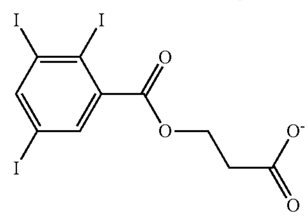
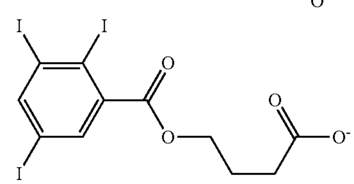
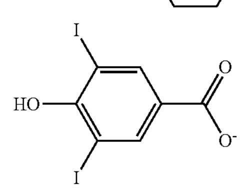
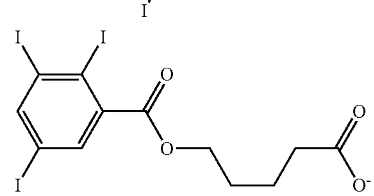
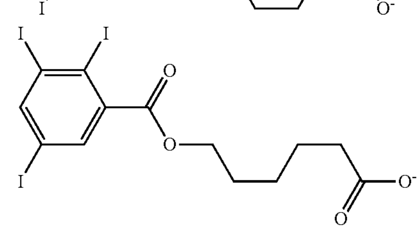

-continued
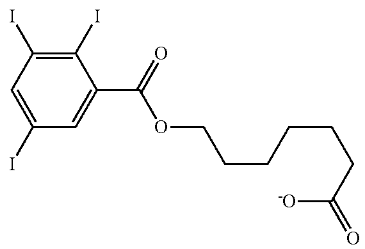
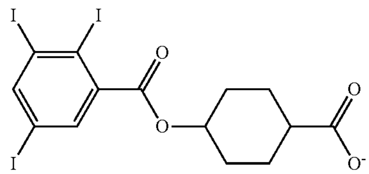
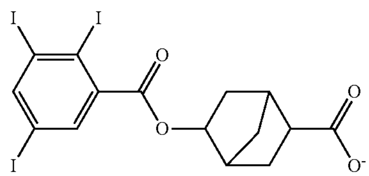
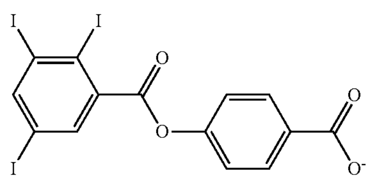
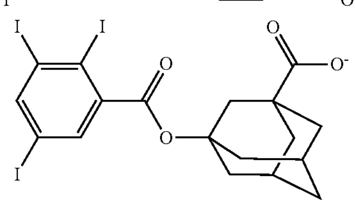
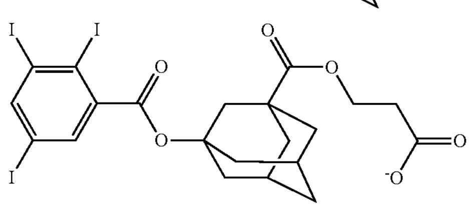
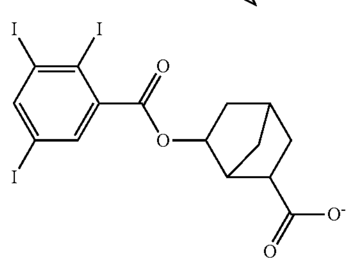
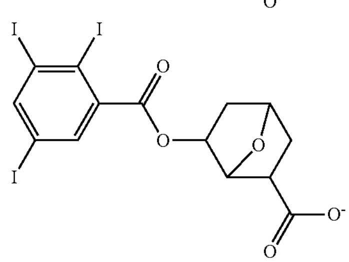
-continued
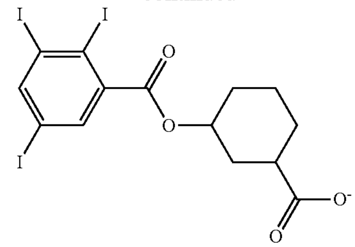
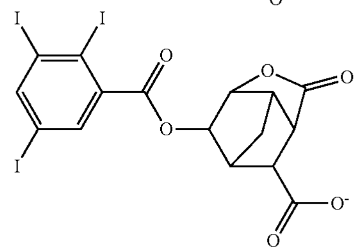
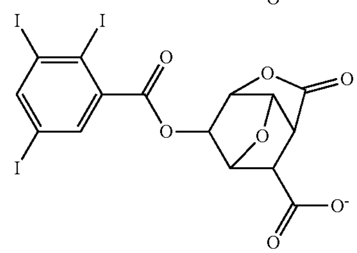
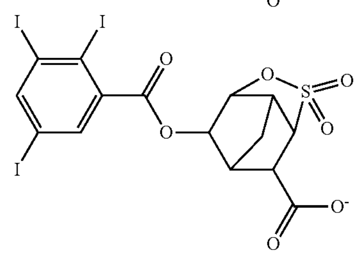
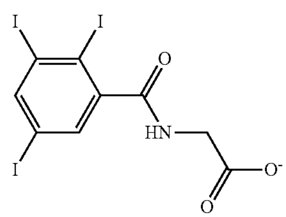
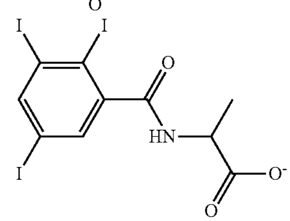
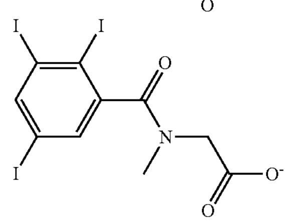
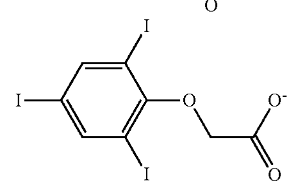
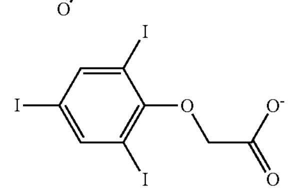
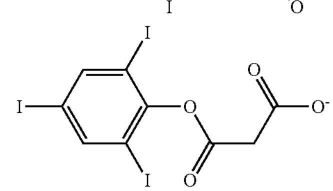

-continued
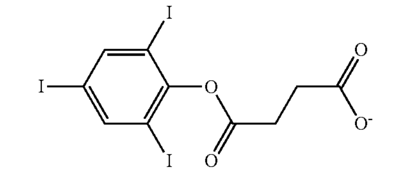
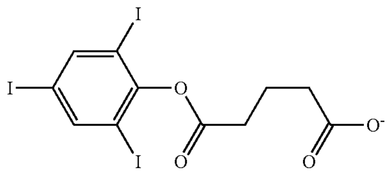
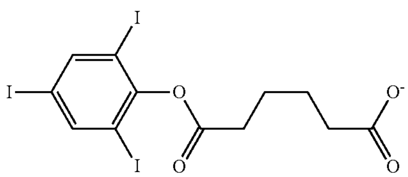
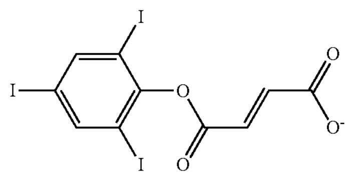
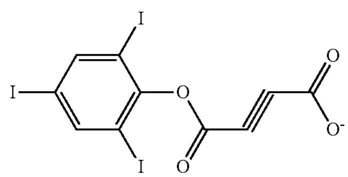
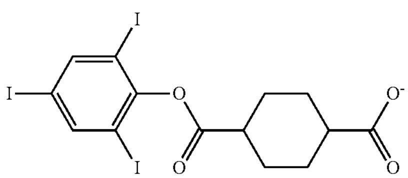
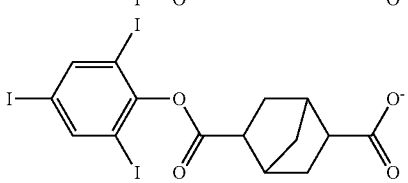
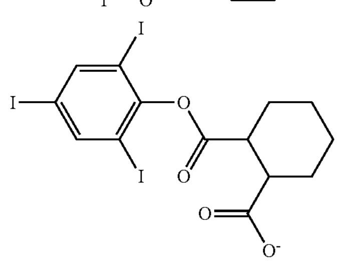
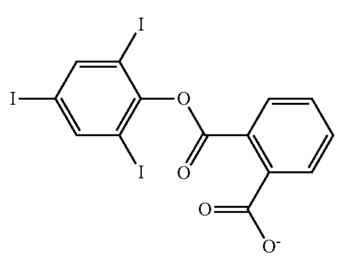
-continued
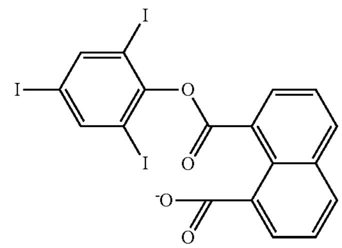
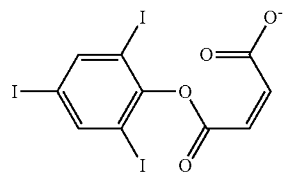
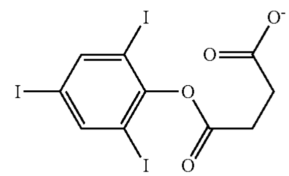
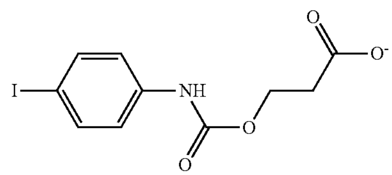
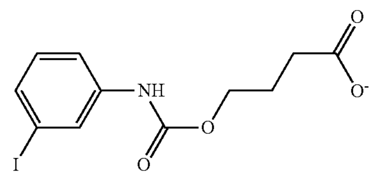
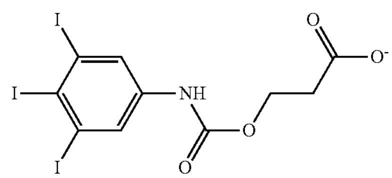
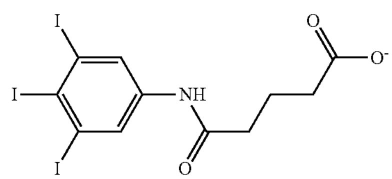
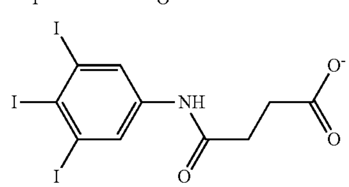
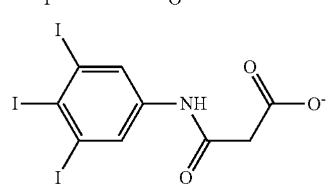
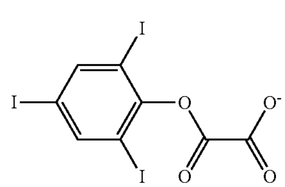
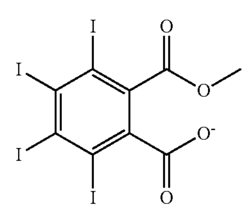

-continued
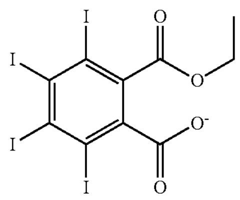
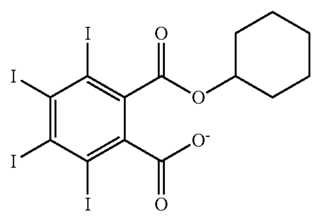
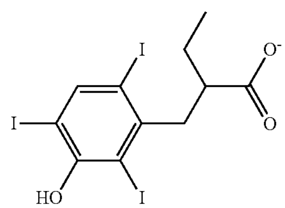
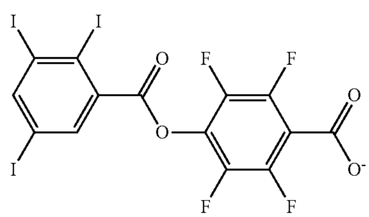
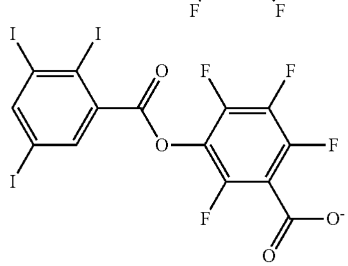
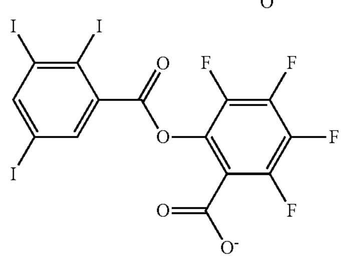
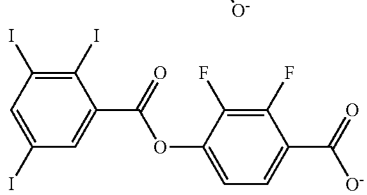
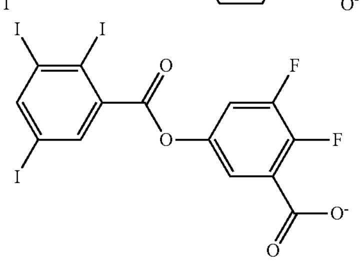
-continued
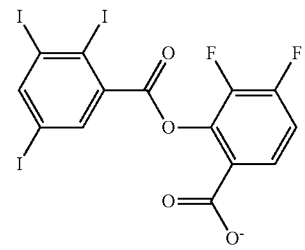
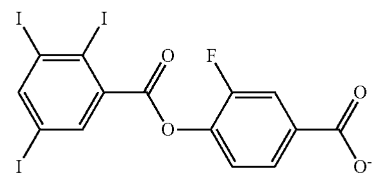
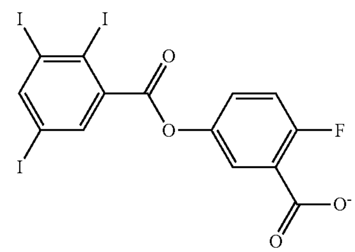
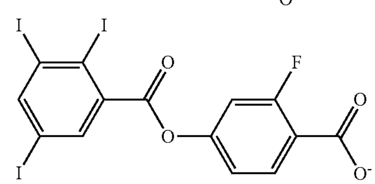
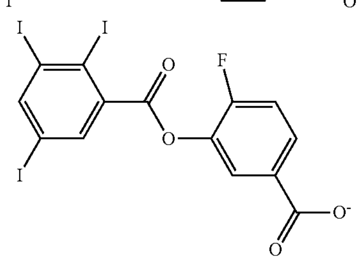
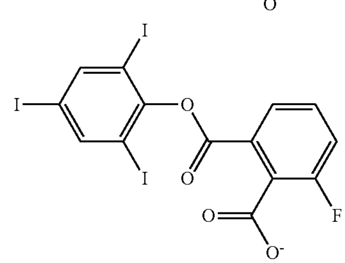
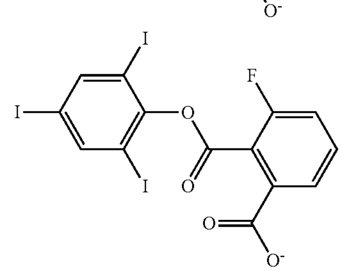

-continued
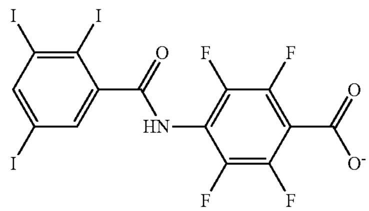
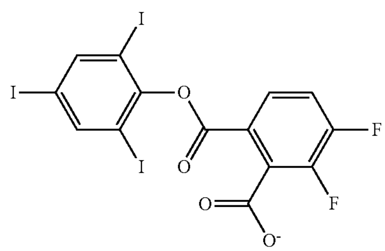
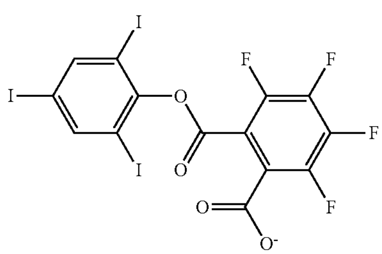
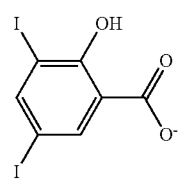
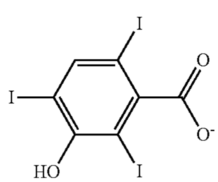
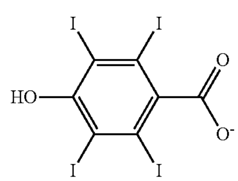
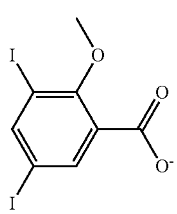
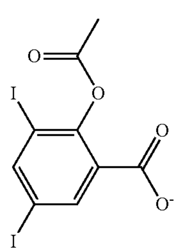
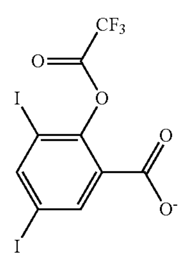
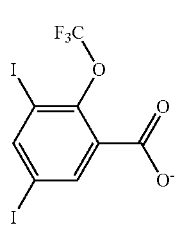
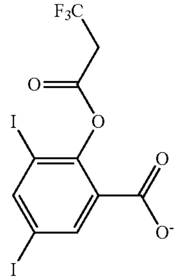
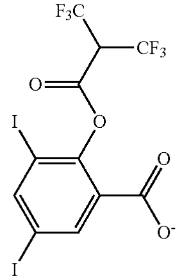
-continued
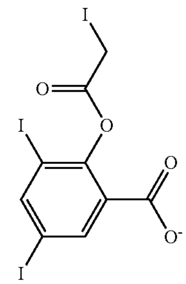
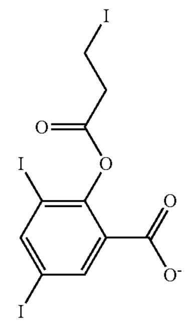
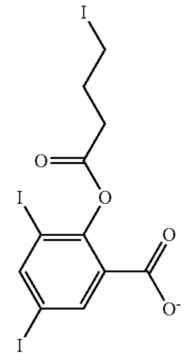
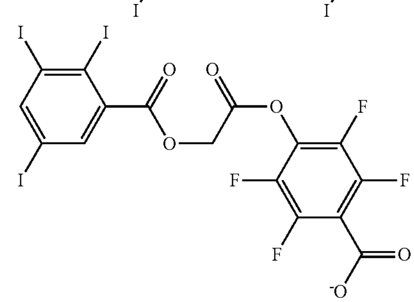
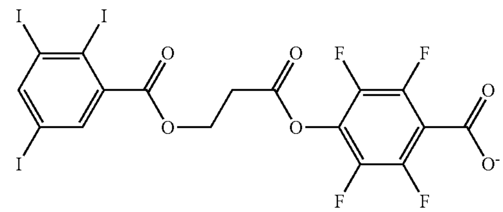
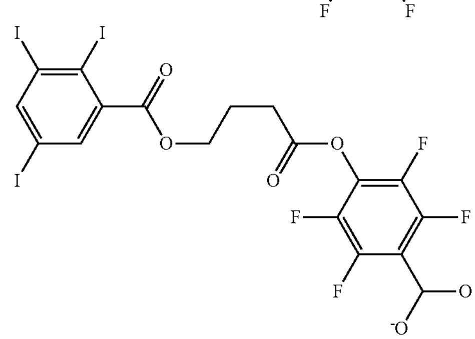
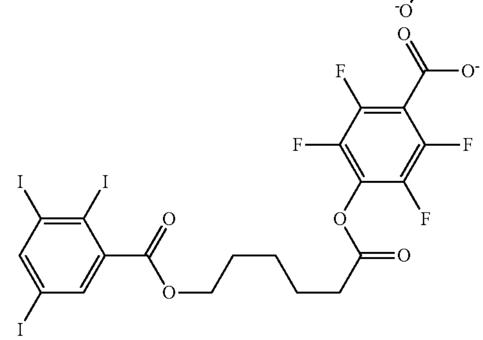
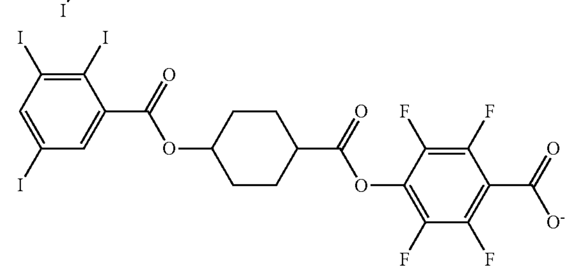

-continued
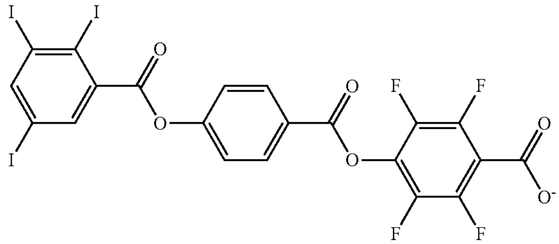
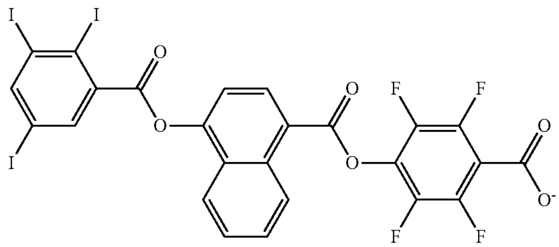
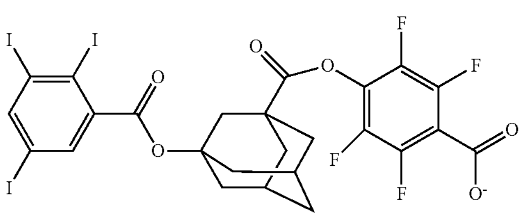
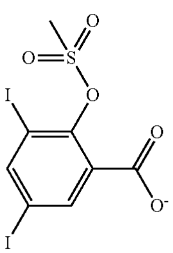
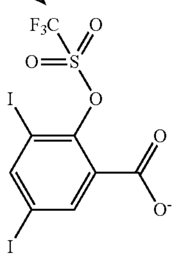
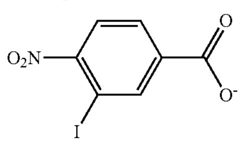
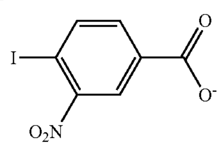
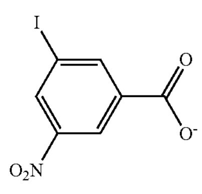
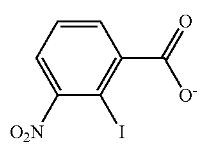
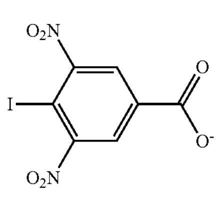
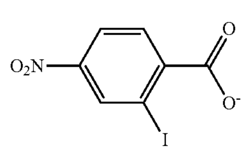
Examples of the anion of the salt having formula (A)-2 are shown below, but not limited thereto.
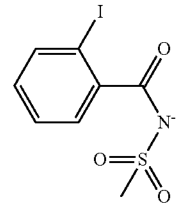
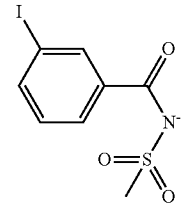
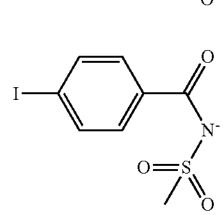
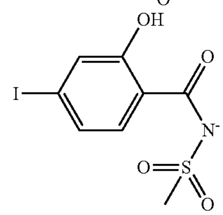
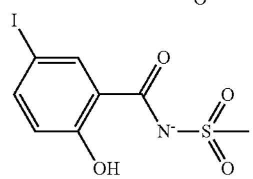
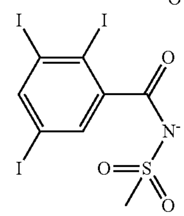
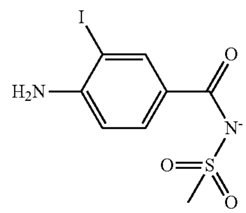
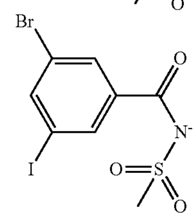
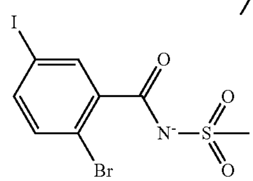
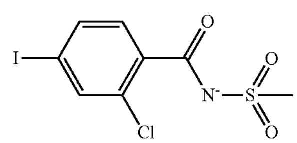
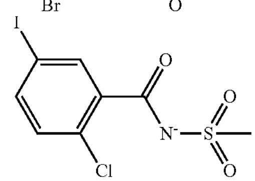
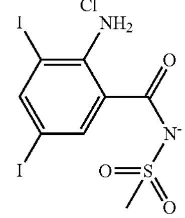
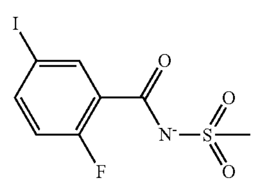
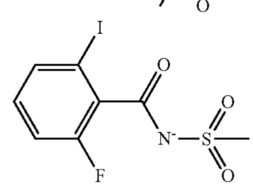
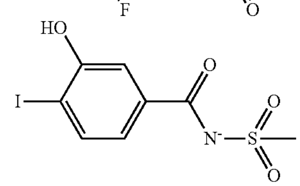
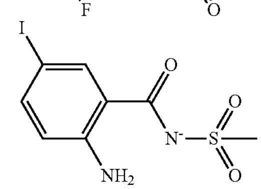
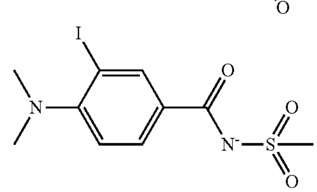
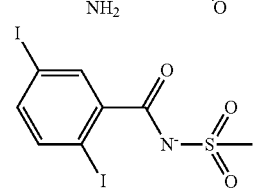

-continued
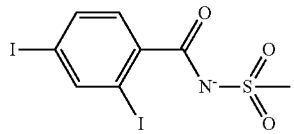
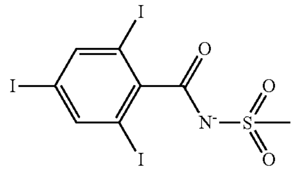
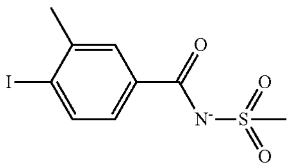
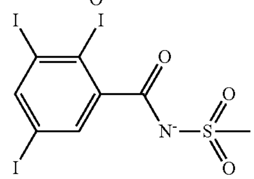
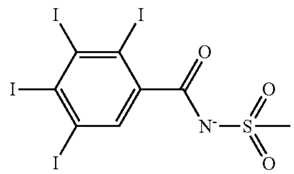
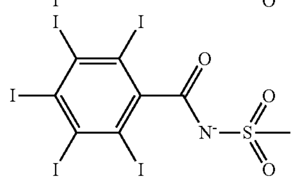
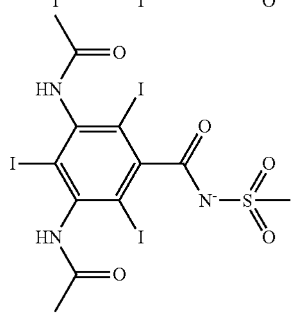
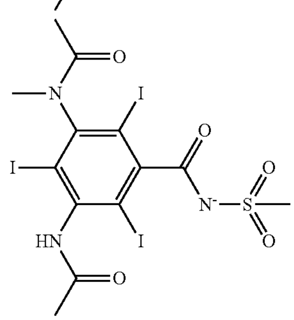
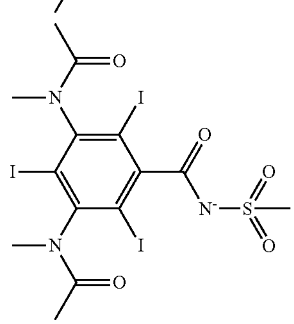
-continued
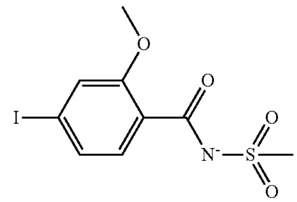
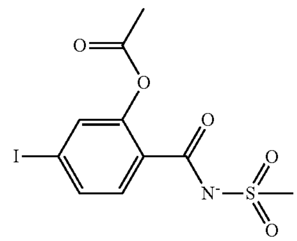
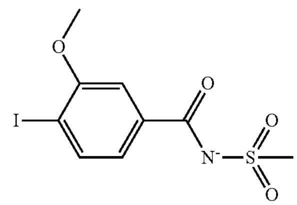
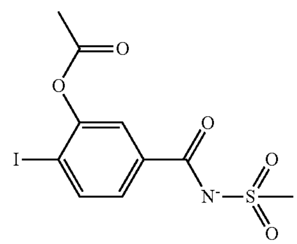
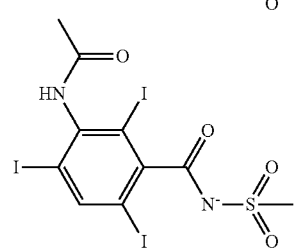
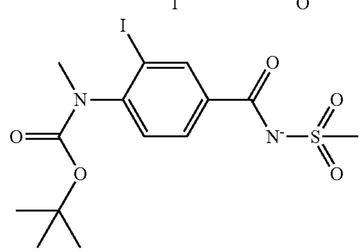
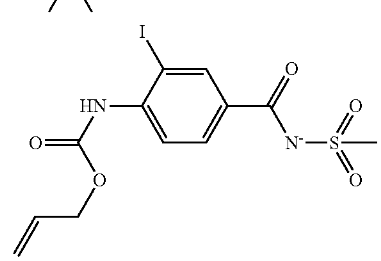

-continued
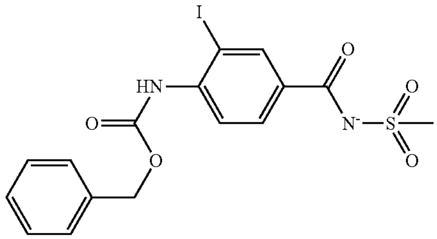
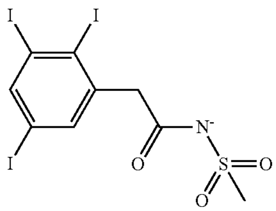
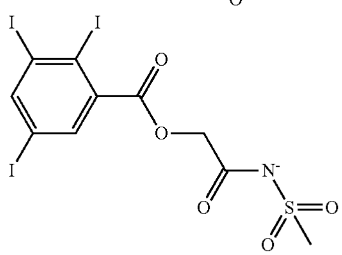
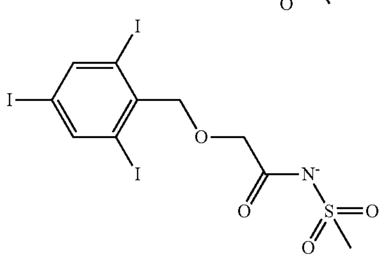
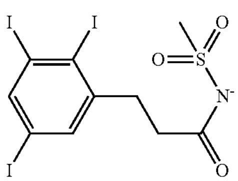
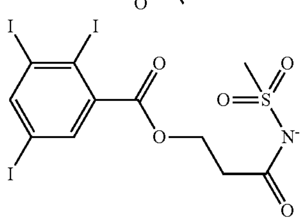
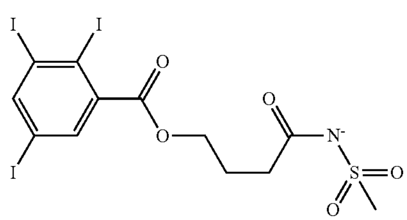
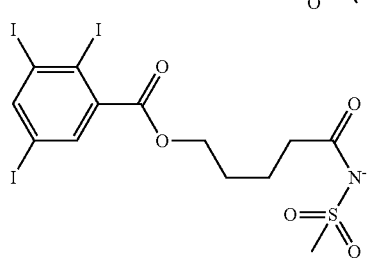
-continued
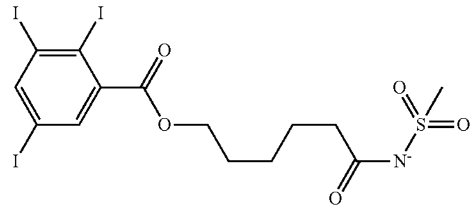
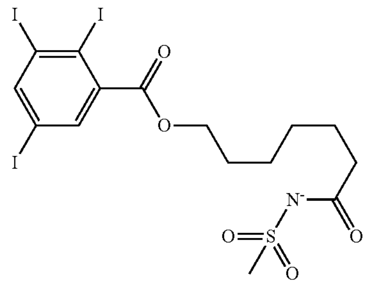
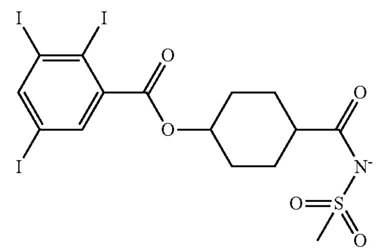
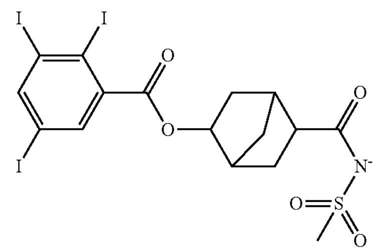
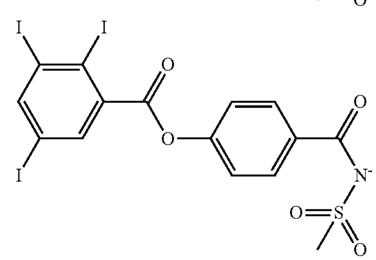
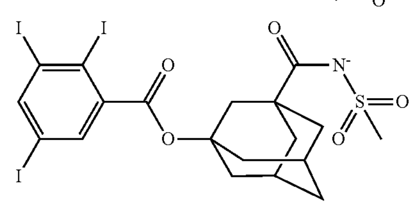
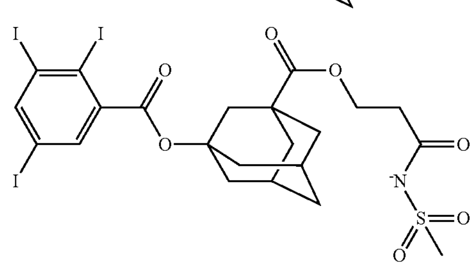

-continued
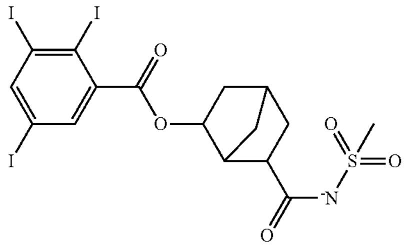
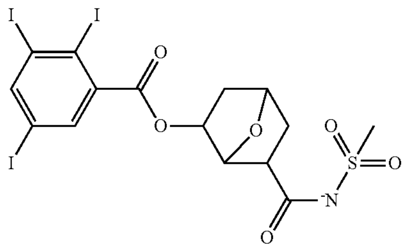
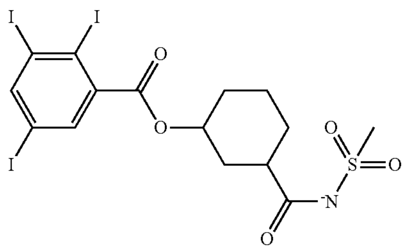
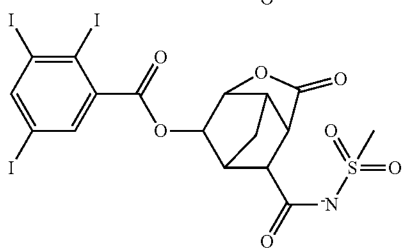
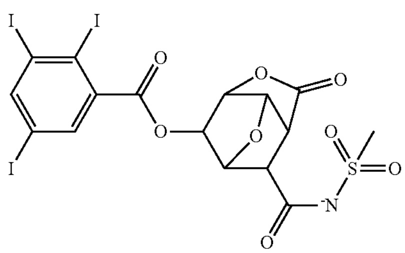
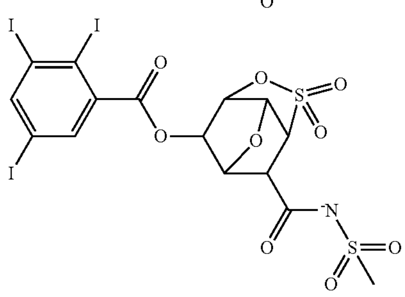
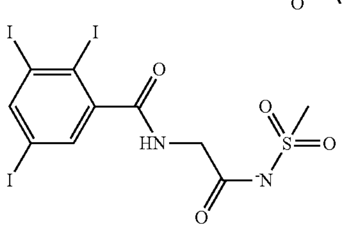
-continued
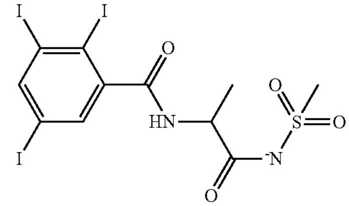
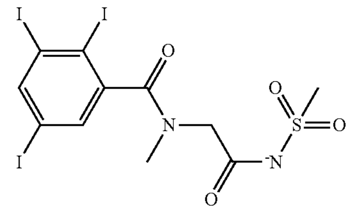
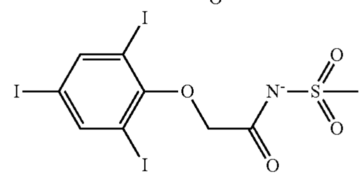
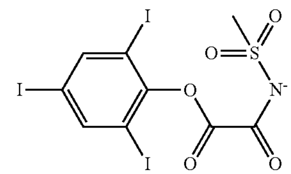
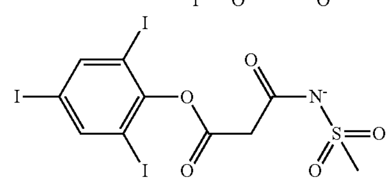
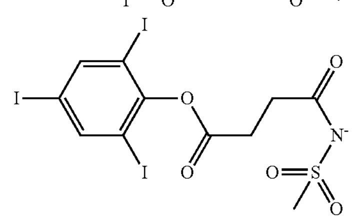
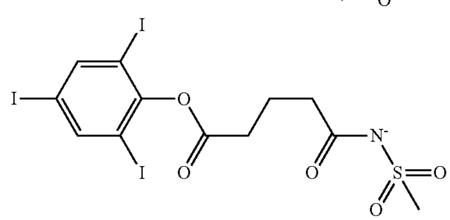
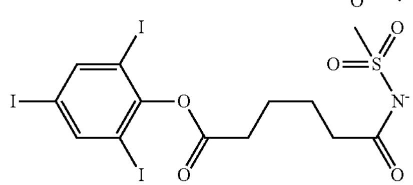
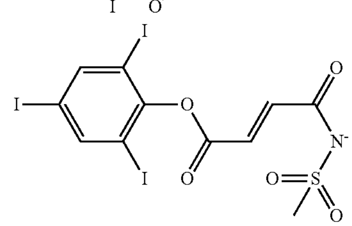

-continued
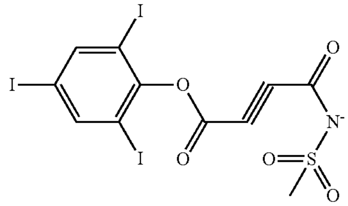
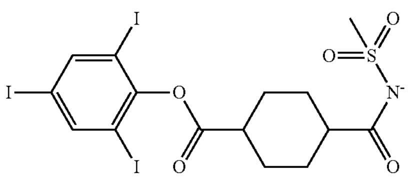
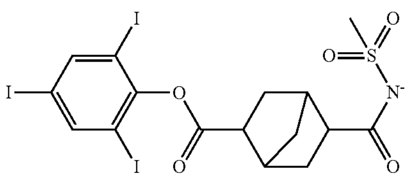
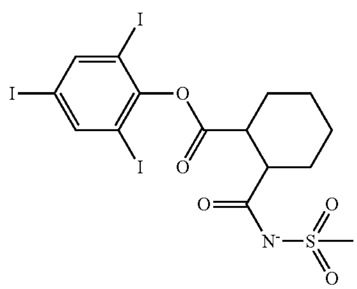
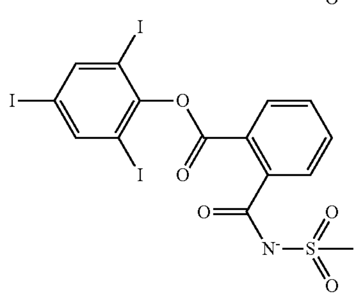
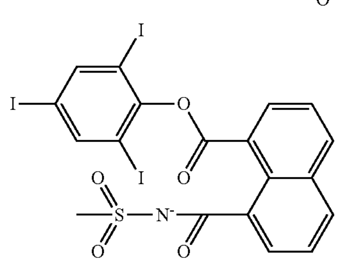
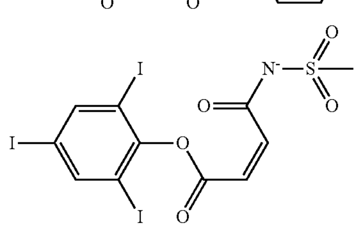
-continued
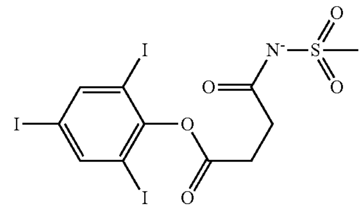
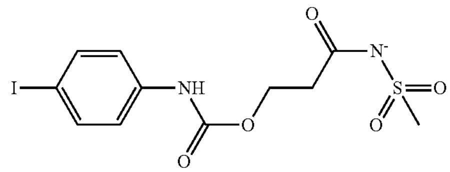
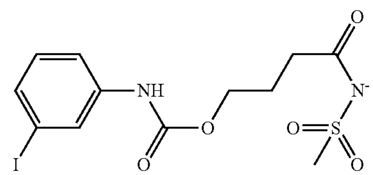
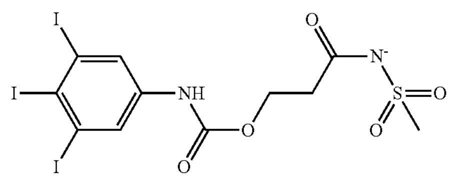
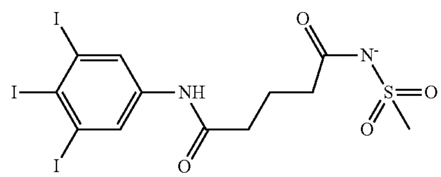
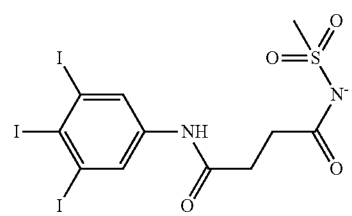
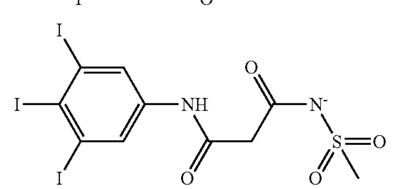
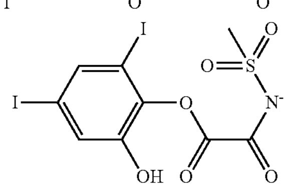
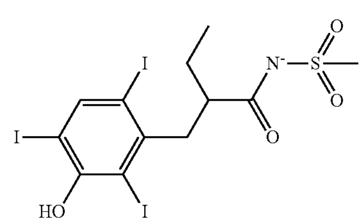

-continued
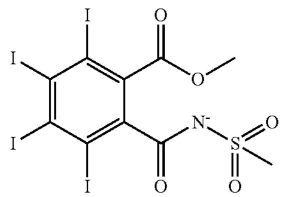
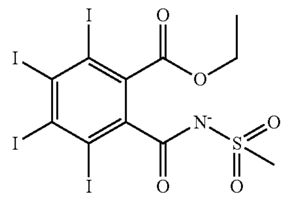
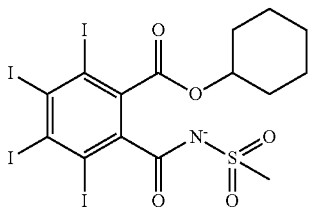
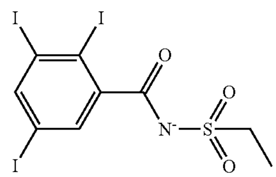
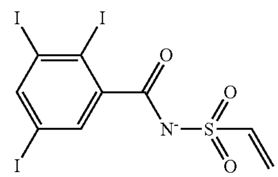
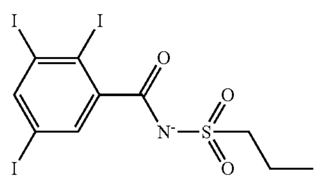
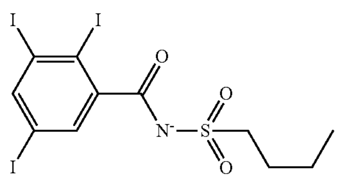
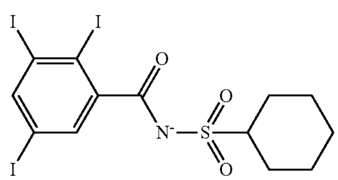
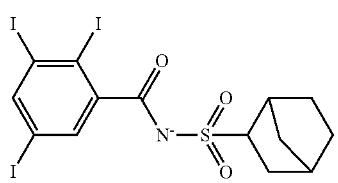
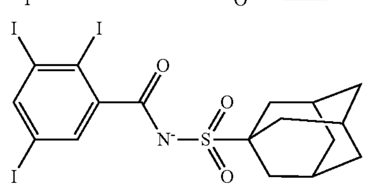
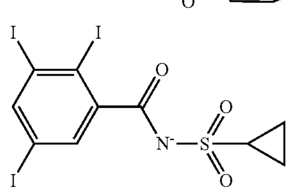
-continued
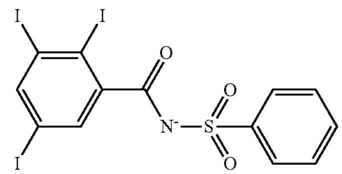
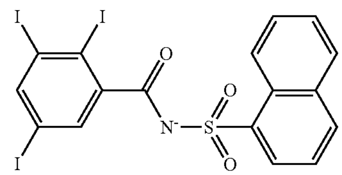
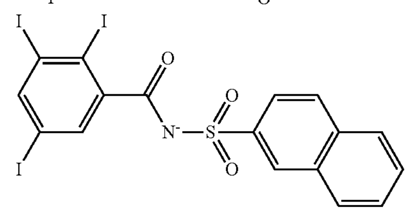
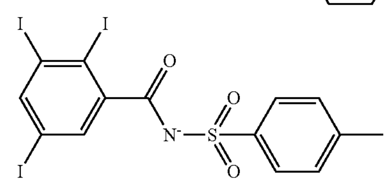
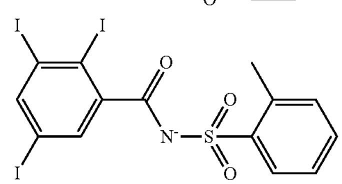
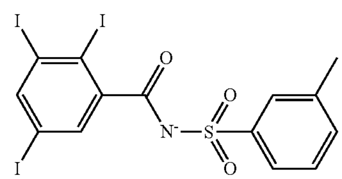
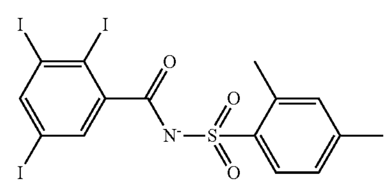
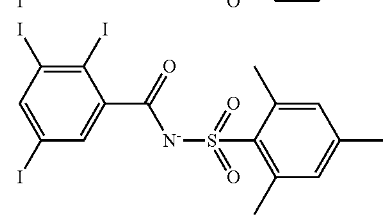
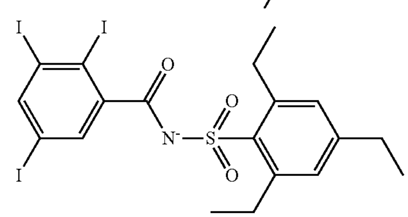

-continued
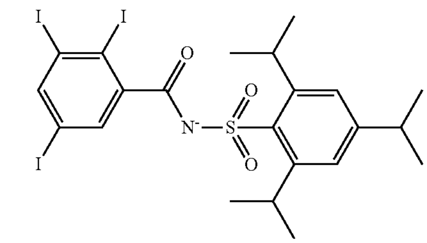
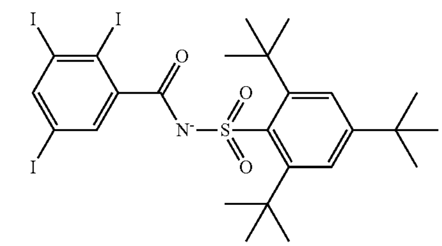
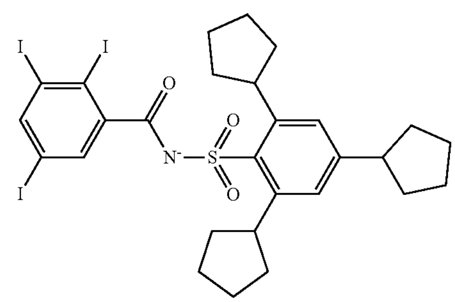
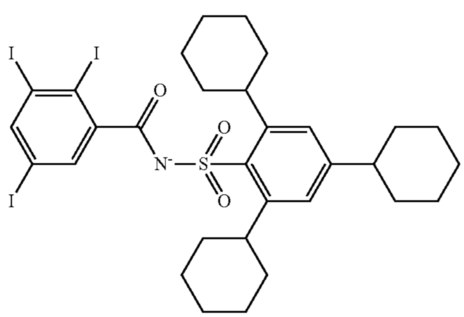
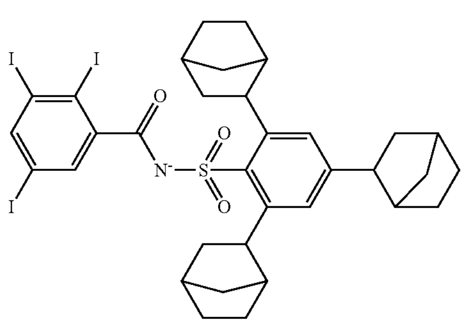
-continued
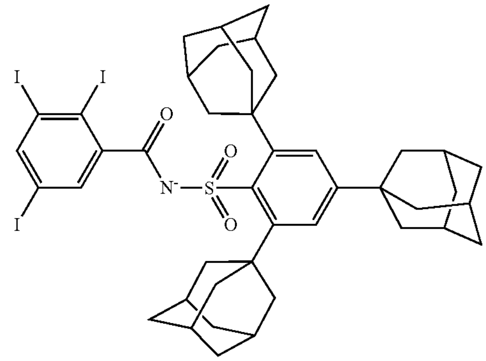
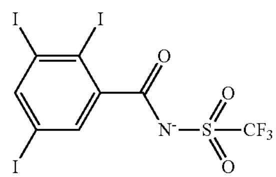
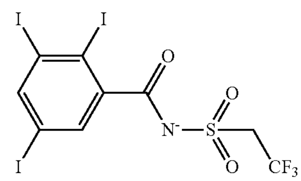
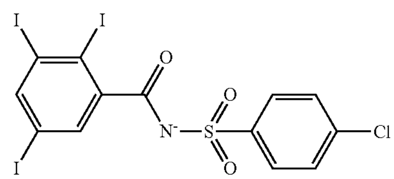
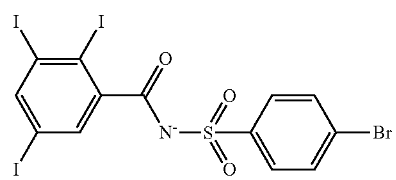
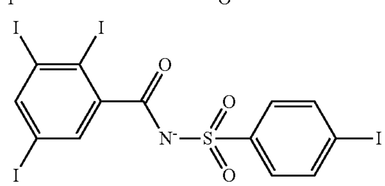
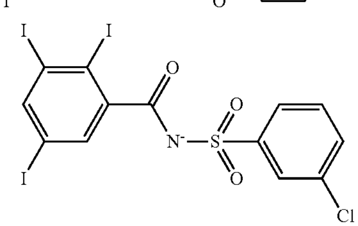
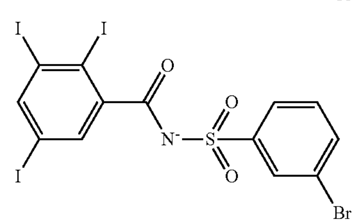
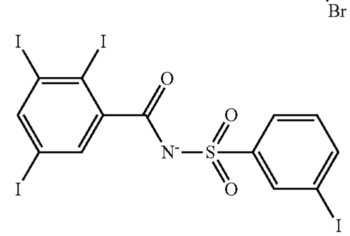

-continued
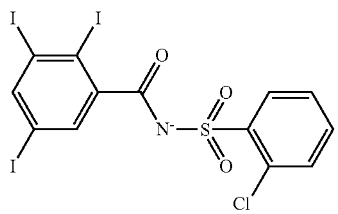
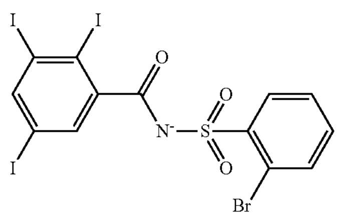
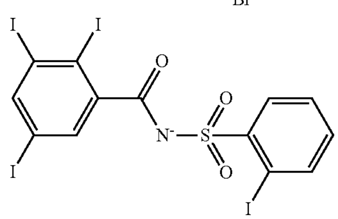
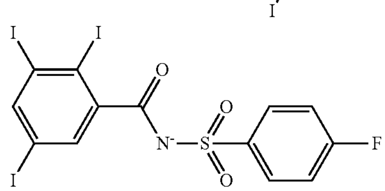
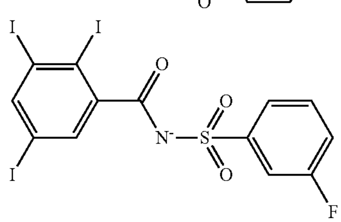
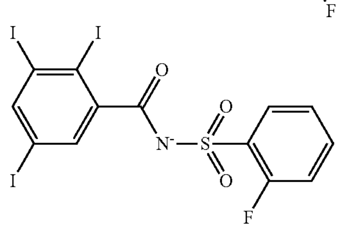
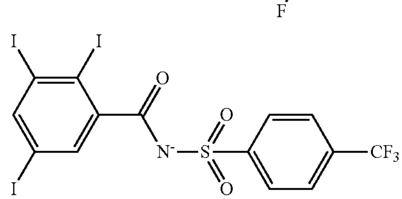
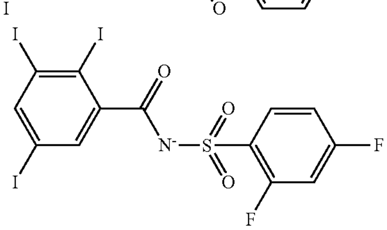
-continued
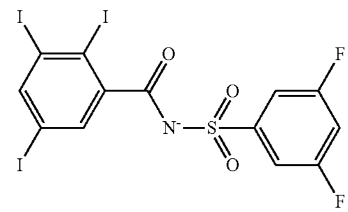
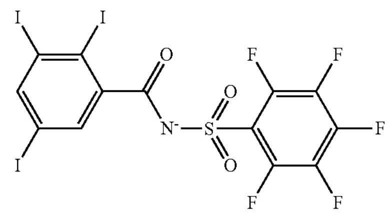
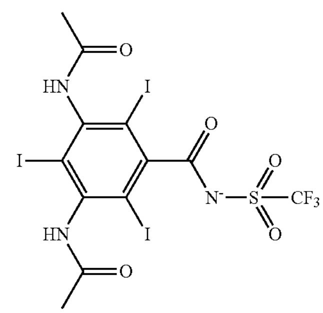
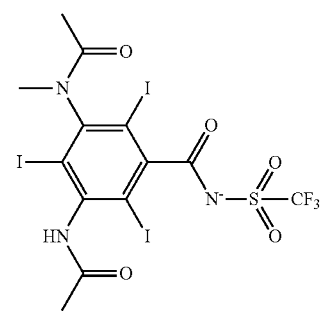
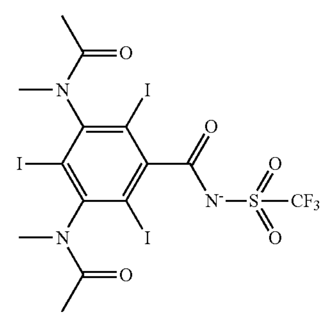
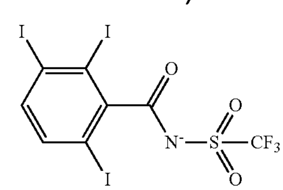
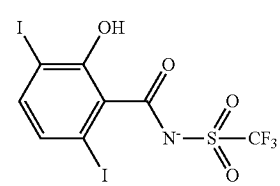
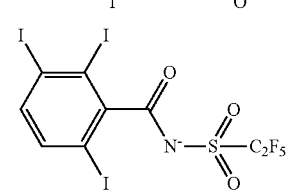
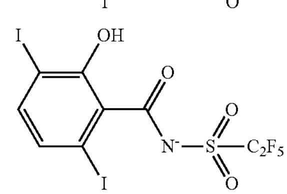

-continued
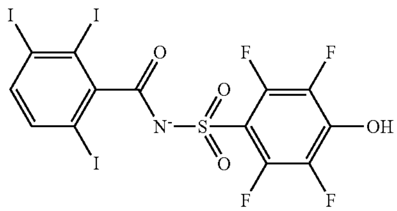
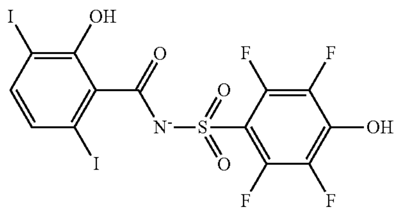
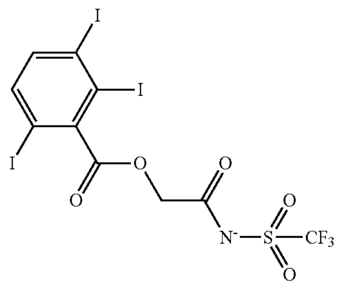
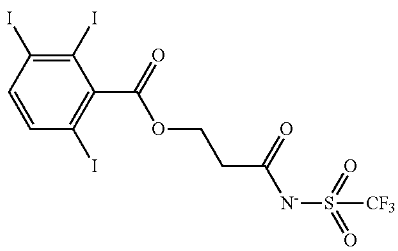
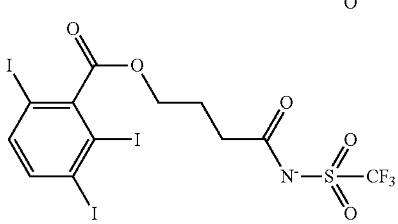
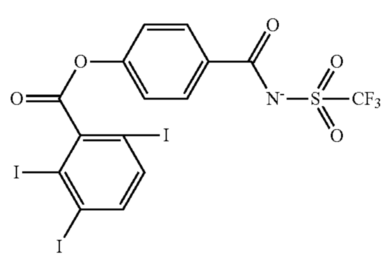
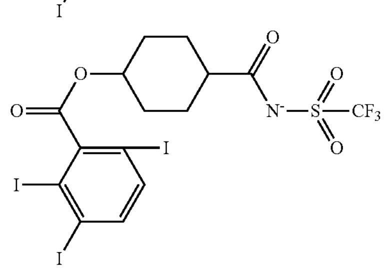
-continued
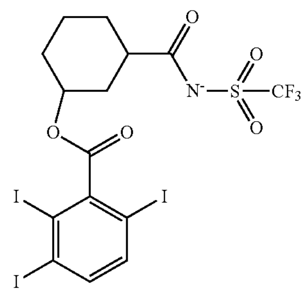
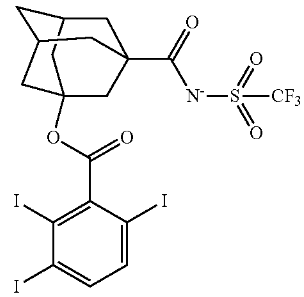
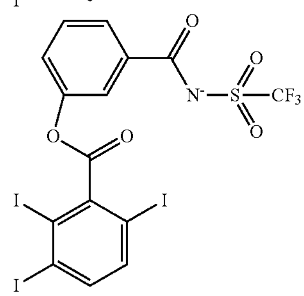
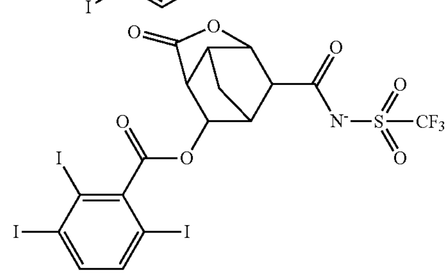
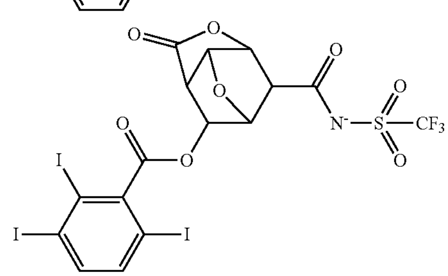
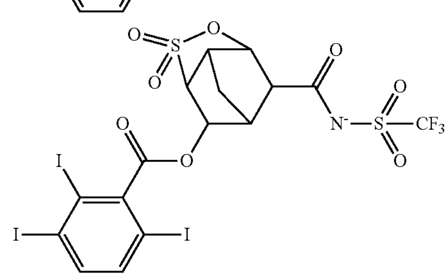

In formulae (A)-1 and (A)-2, $X^+$ is a sulfonium cation having the formula (Aa) or ammonium cation having the formula (Ab).

(Aa)

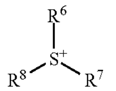

(Ab)

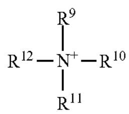

In formula (Aa), $R^6$, $R^7$ and $R^8$ are each independently fluorine, chlorine, bromine, iodine, or a $C_1$-$C_{20}$ monovalent hydrocarbon group which may contain a heteroatom. $R^6$ and $R^7$ may bond together to form a ring with the sulfur atom to which they are attached. The $C_1$-$C_{20}$ monovalent hydrocarbon group may be straight, branched or cyclic, and examples thereof include $C_1$-$C_{20}$ alkyl, $C_6$-$C_{20}$ aryl, and $C_7$-$C_{20}$ aralkyl groups. In these groups, some or all hydrogen may be substituted by hydroxyl, carboxyl, halogen, cyano, nitro, sultone, sulfone, or sulfonium salt-containing moiety, or an ether bond, ester bond, amide bond, carbonyl moiety, carbonate moiety or sulfonate bond may intervene between carbon atoms.

Preferred examples of the sulfonium cation having formula (Aa) are those having the formulae (Aa)-1 and (Aa)-2.

(Aa)-1

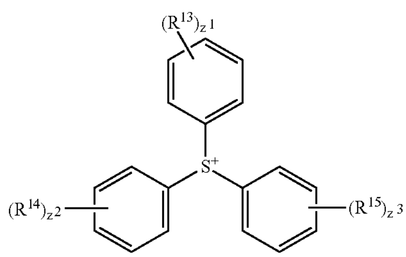

(Aa)-2

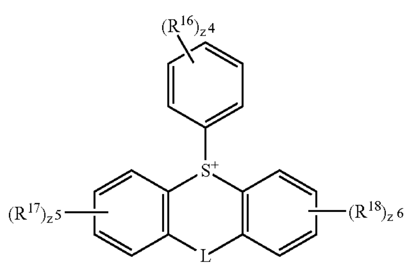

In formulae (Aa)-1 and (Aa)-2, $R^{13}$ to $R^{18}$ are each independently a $C_1$-$C_{14}$ monovalent hydrocarbon group. Examples of the monovalent hydrocarbon group include $C_1$-$C_{14}$ alkyl, $C_2$-$C_{14}$ alkenyl, $C_6$-$C_{14}$ aryl, and $C_7$-$C_{14}$ aralkyl groups. In these groups, some or all hydrogen may be substituted by hydroxyl, carboxyl, halogen, cyano, nitro, sultone, sulfone, or sulfonium salt-containing moiety, or some carbon may be replaced by ether bond, ester bond, carbonyl, amide bond, carbonate or sulfonic ester bond. L is a single bond, methylene, ether bond, thioether bond, or carbonyl group. The subscripts $z^1$ to $z^6$ are each independently an integer of 0 to 5. Examples of the alkyl, alkenyl, aryl and aralkyl groups are as exemplified above for $R^5$.

Examples of the sulfonium cation having formula (Aa) are shown below, but not limited thereto.

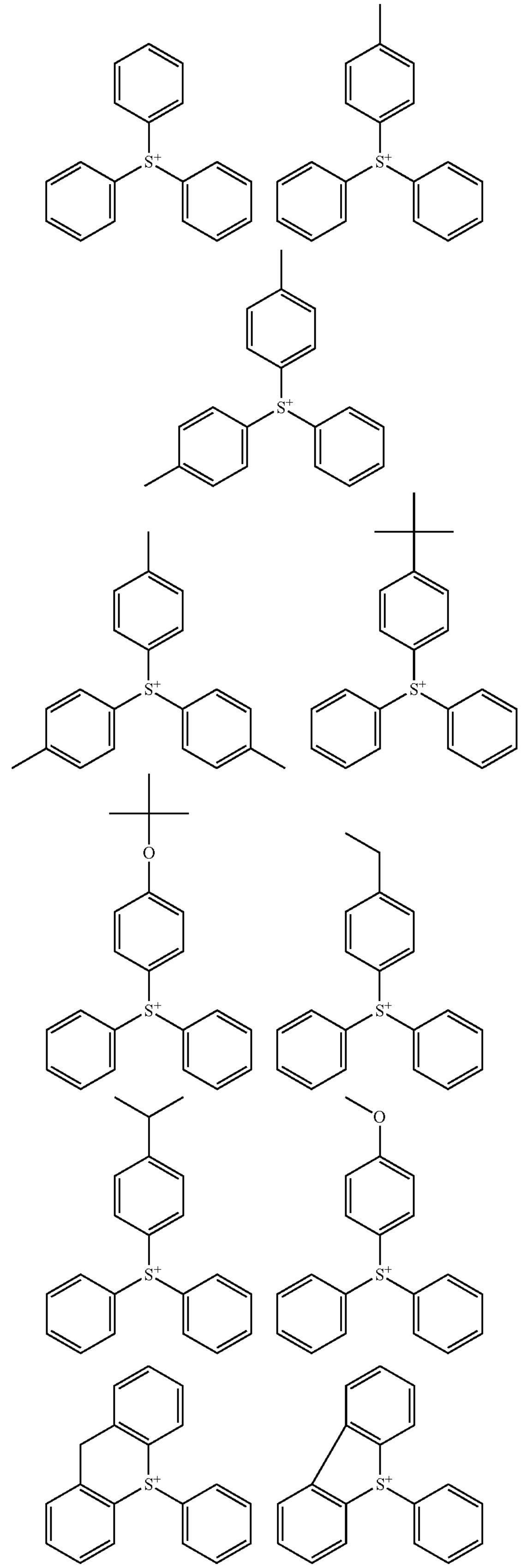

-continued
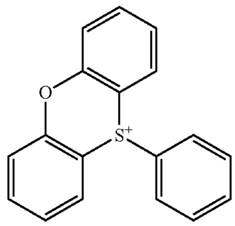
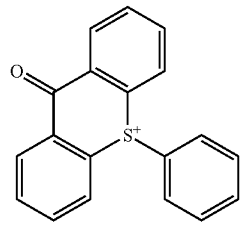
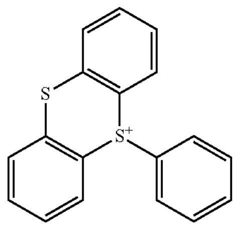
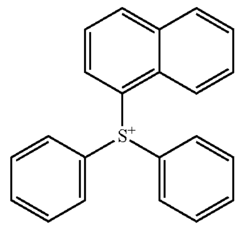
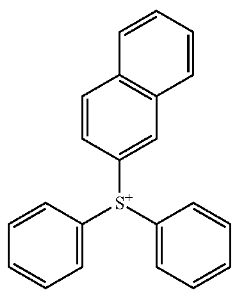
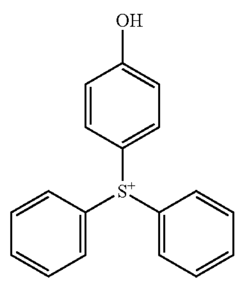
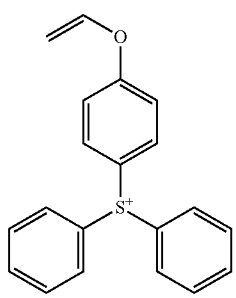
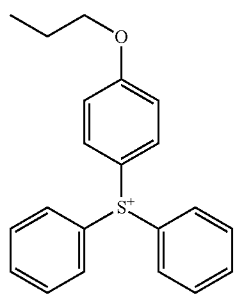
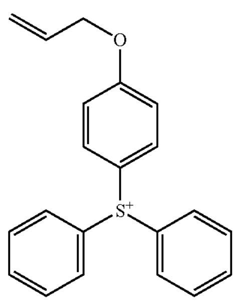
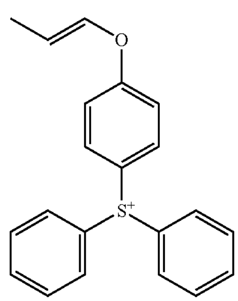
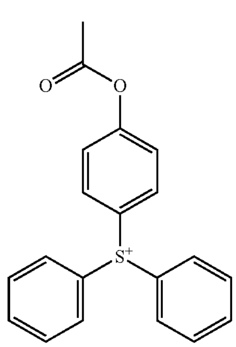
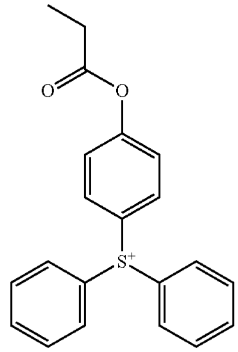
-continued
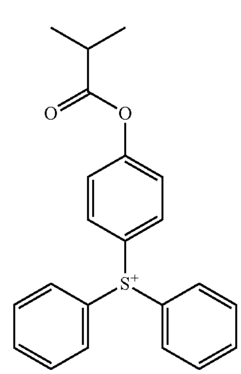
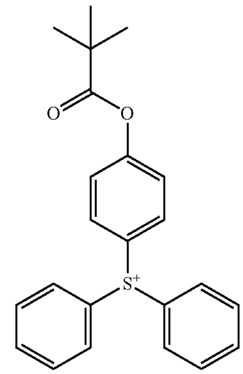
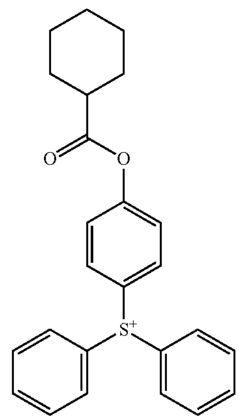
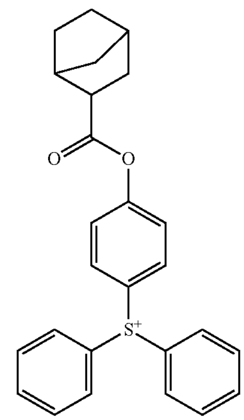
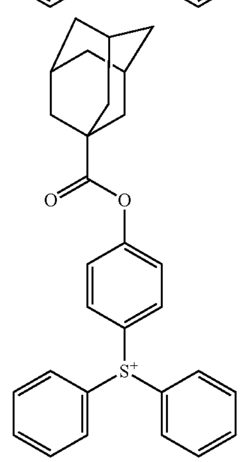
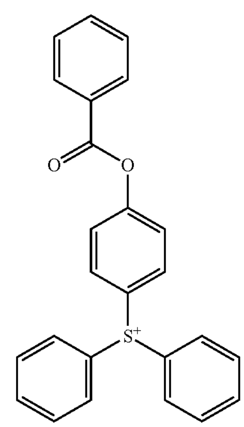
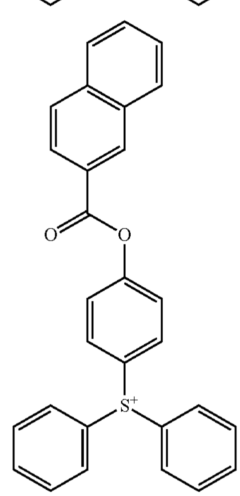
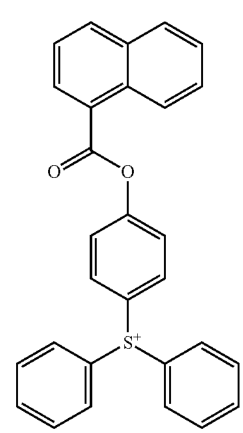

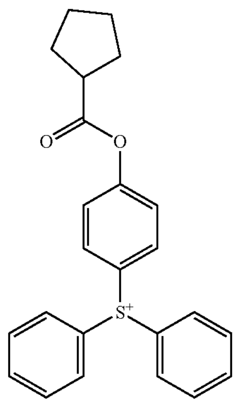
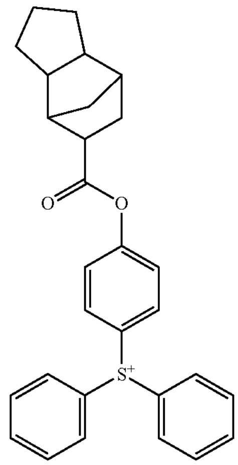
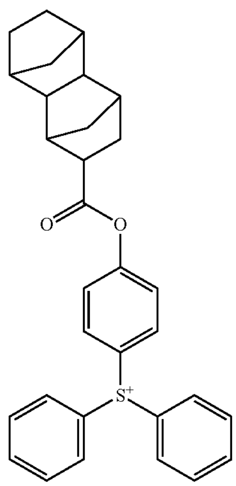
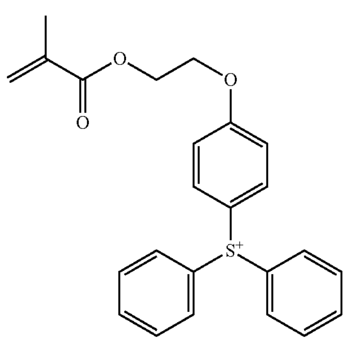
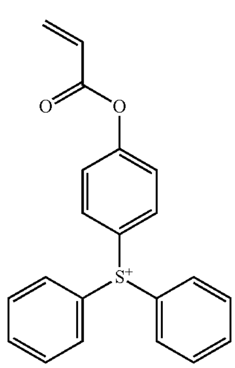
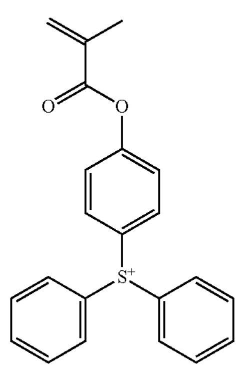
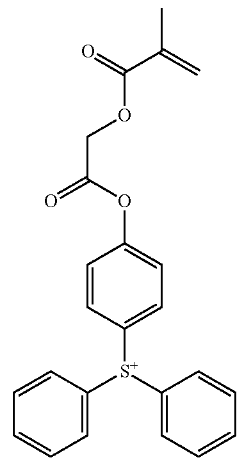
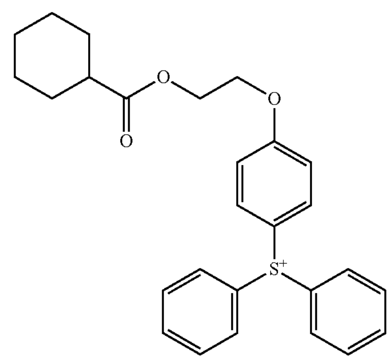
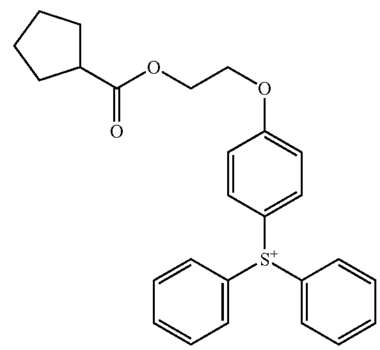
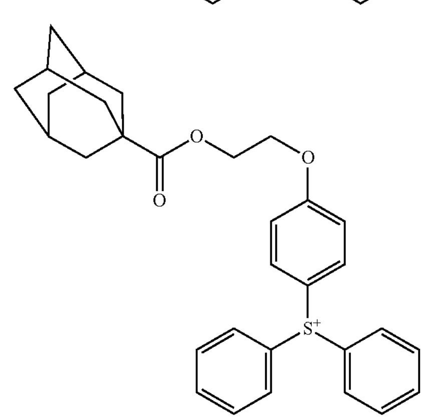

-continued
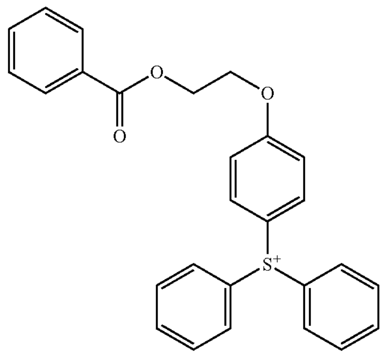
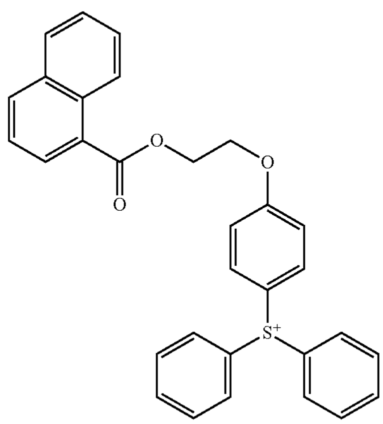
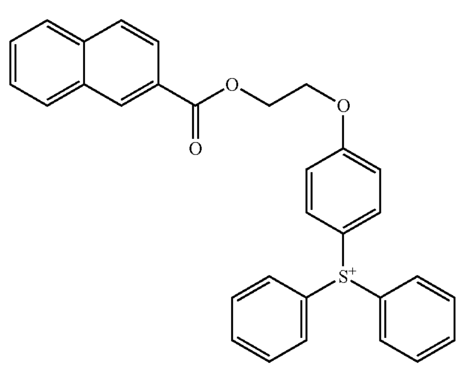
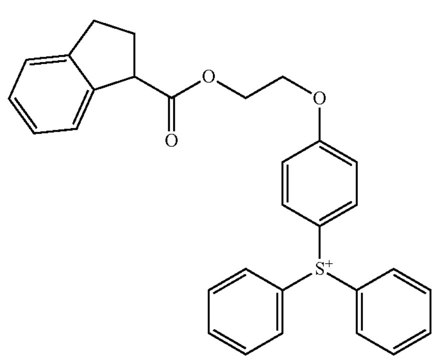
-continued
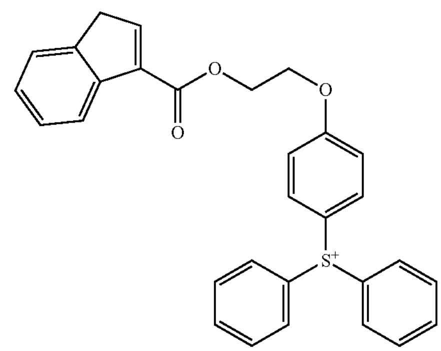
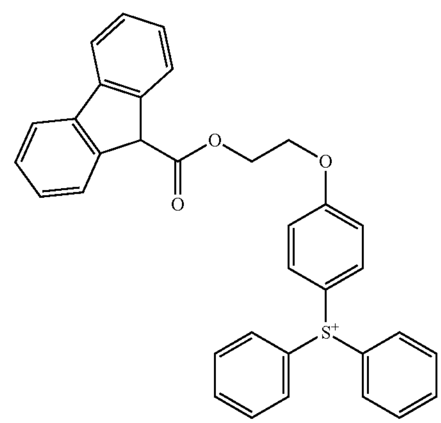
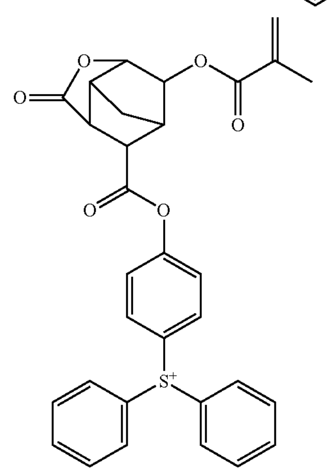
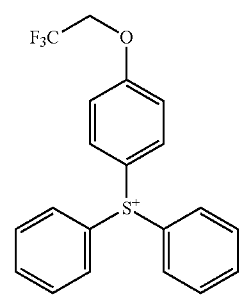
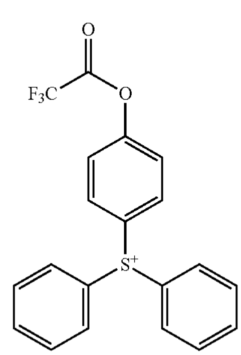
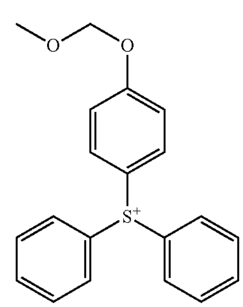

-continued
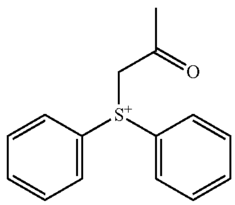
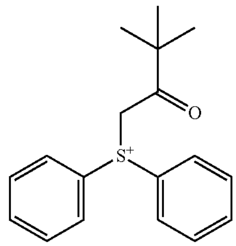
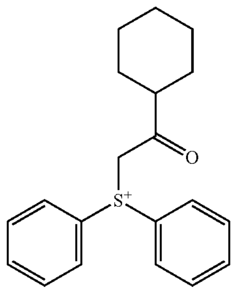
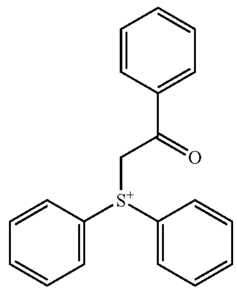
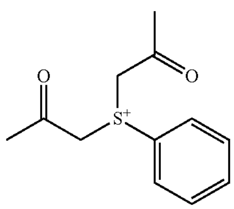
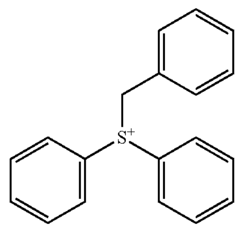
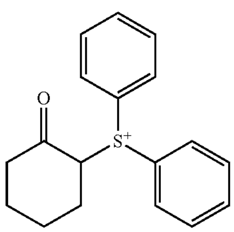
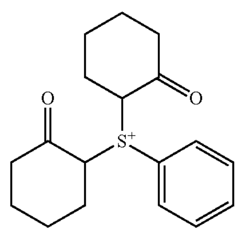
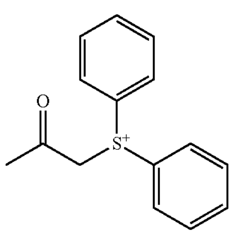
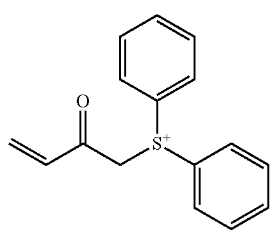
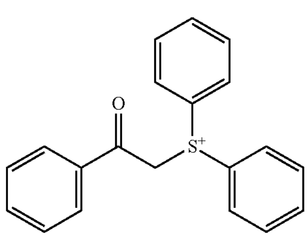
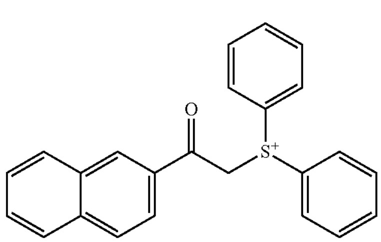
-continued
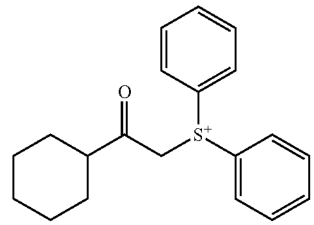
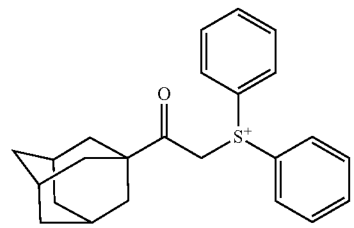
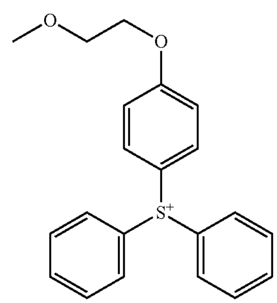
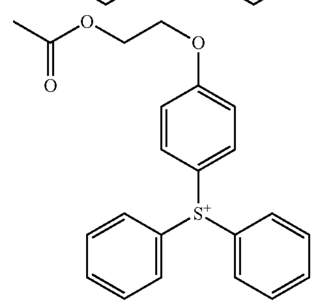
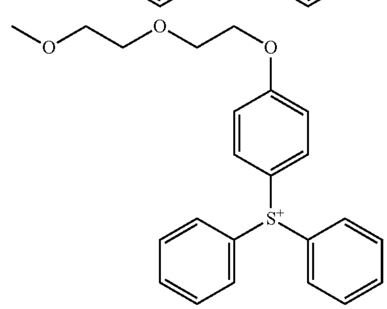
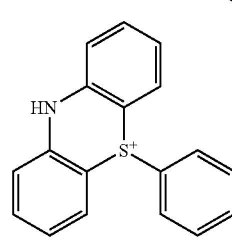
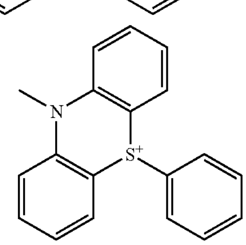

-continued
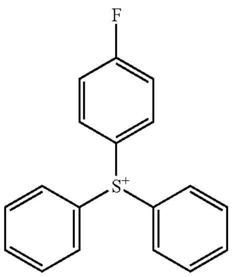
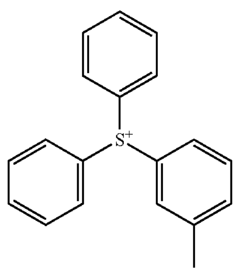
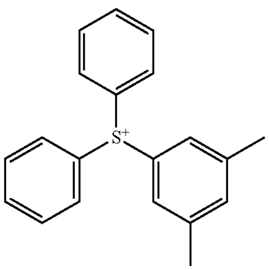
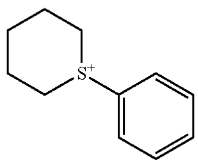
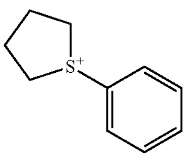
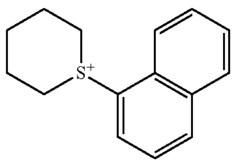
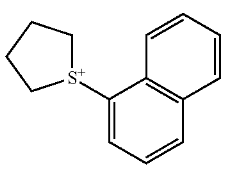
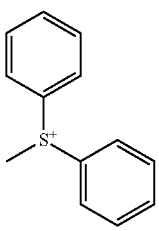
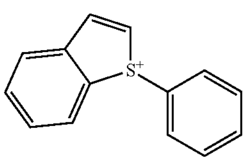
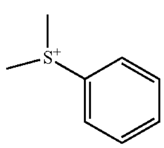
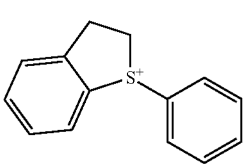
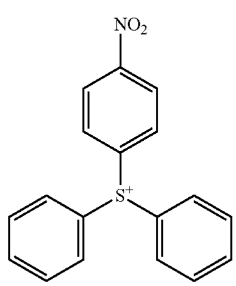
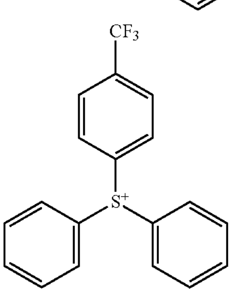
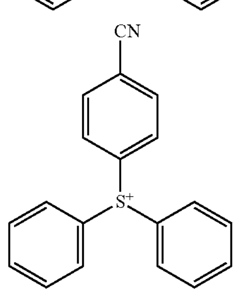
-continued
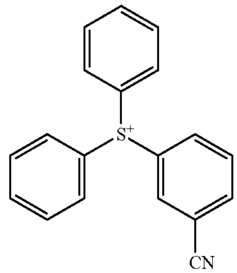
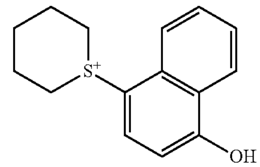
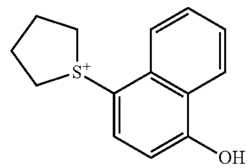
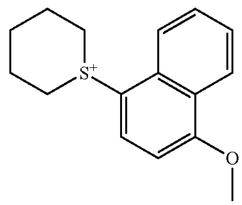
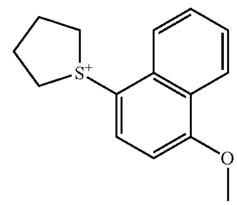
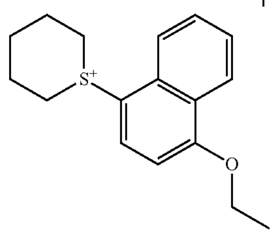
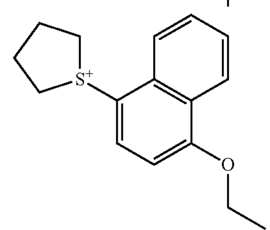
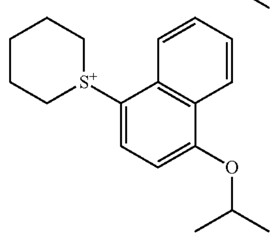
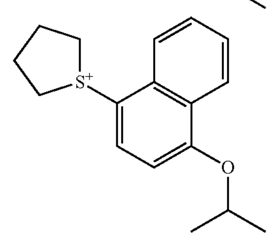
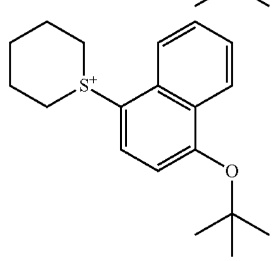
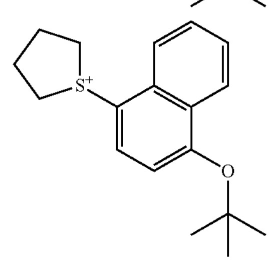
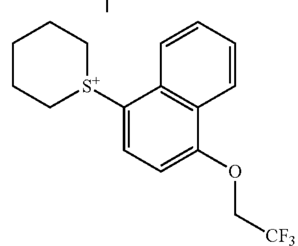

-continued
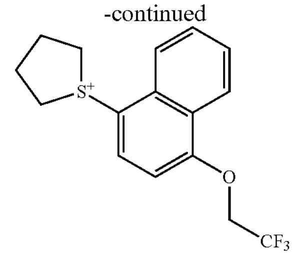
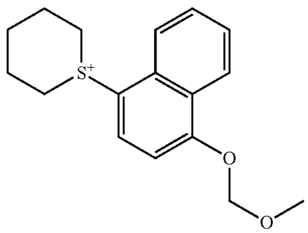
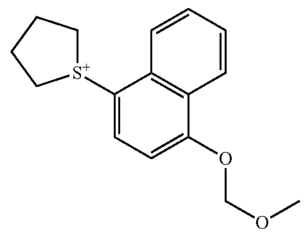
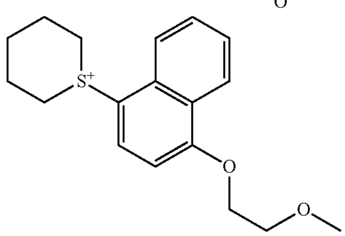
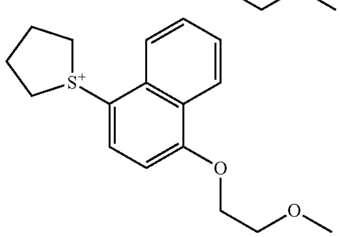
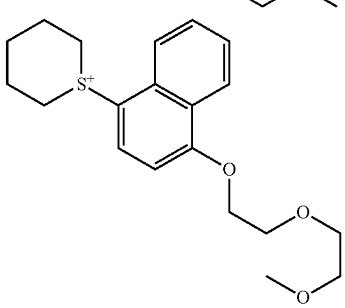
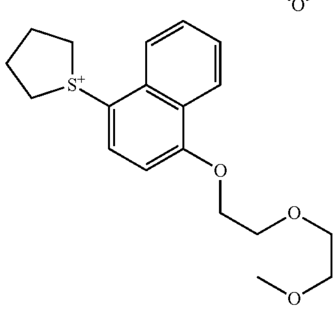
-continued
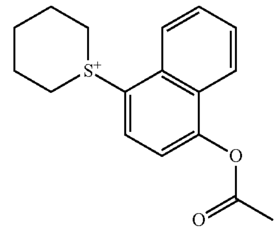
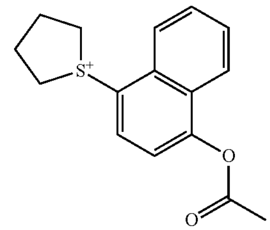
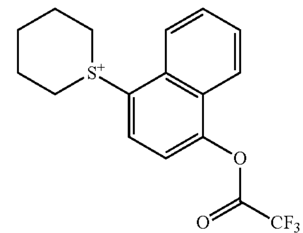
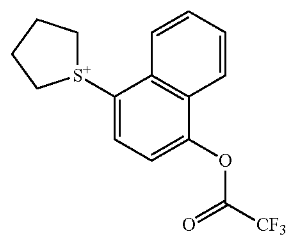
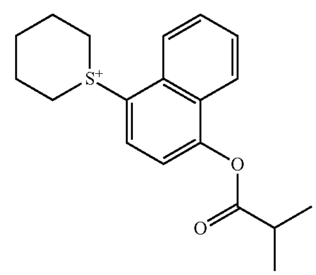
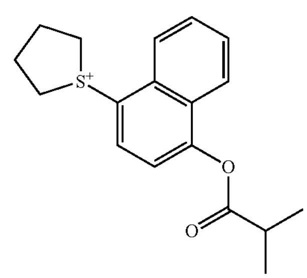
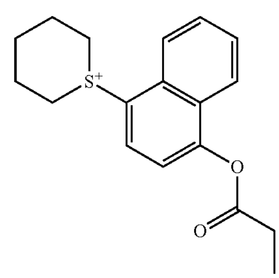
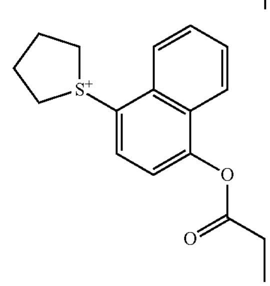
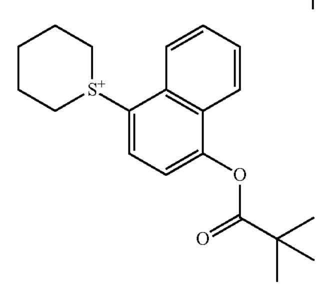

-continued
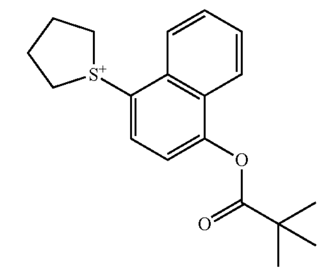
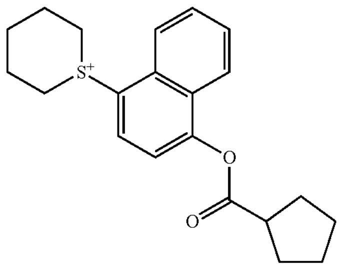
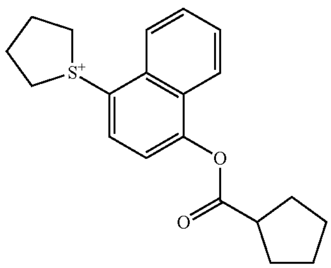
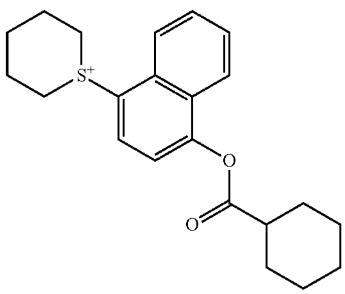
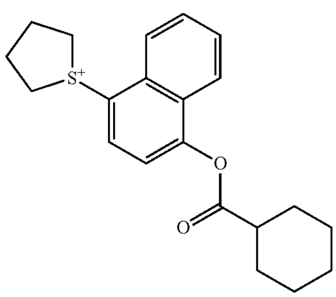
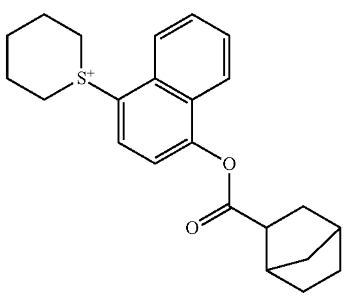
-continued
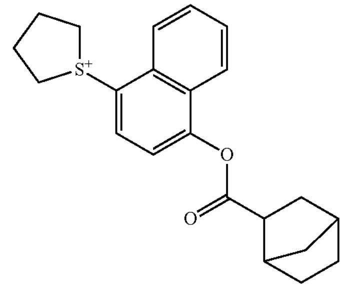
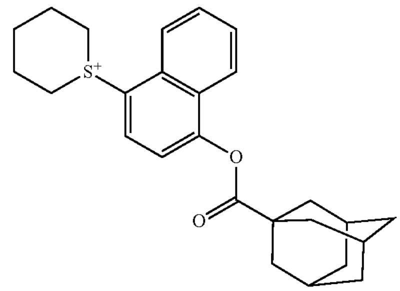
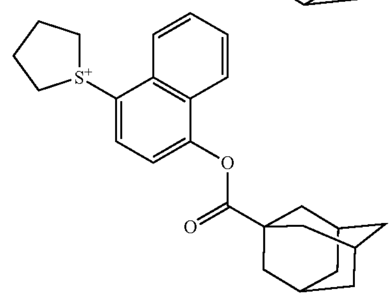
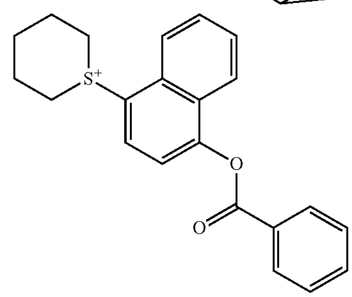
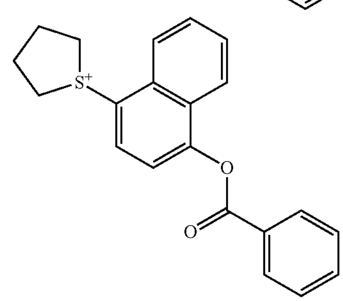
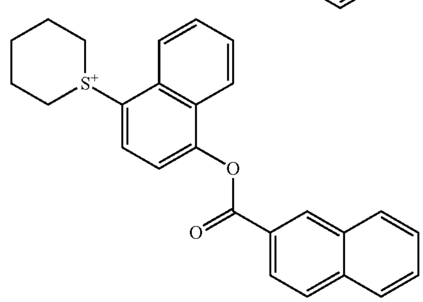

-continued
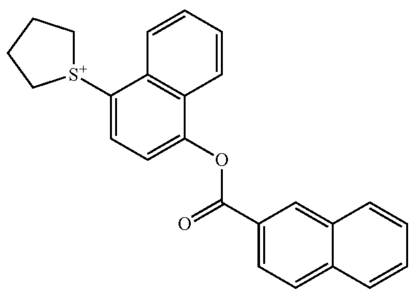
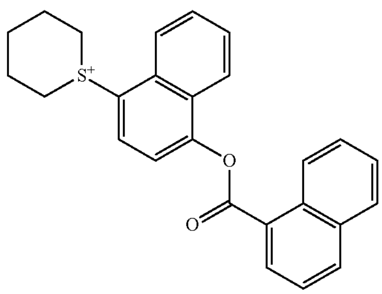
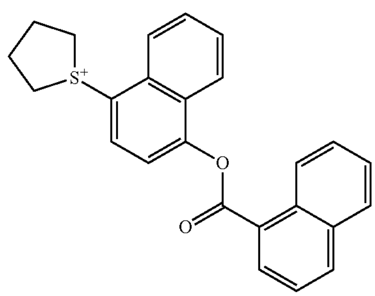
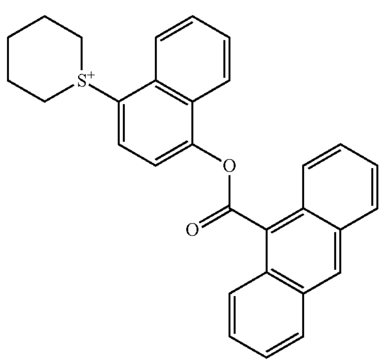
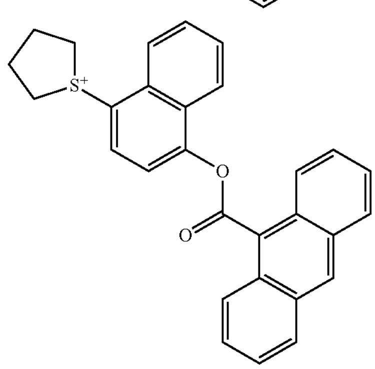
-continued
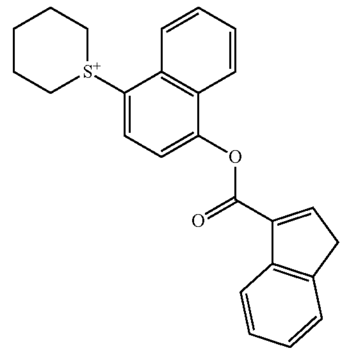
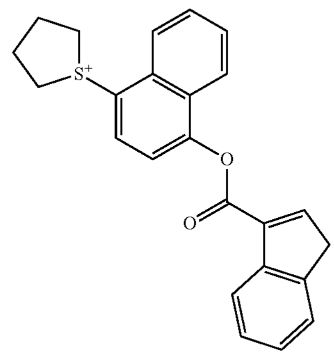
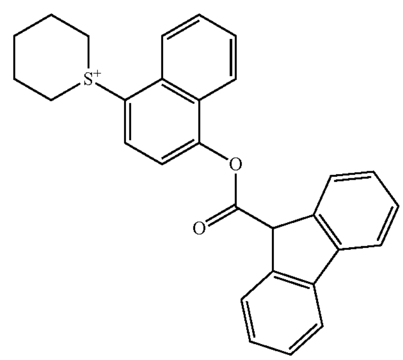
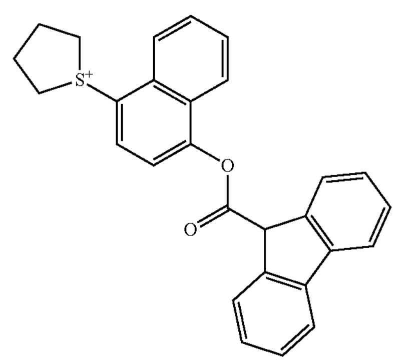
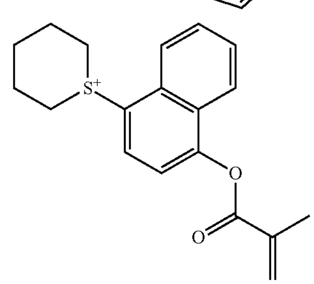

-continued
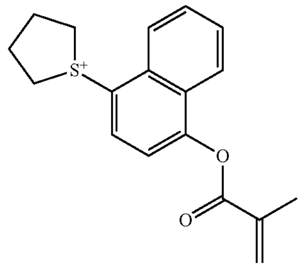
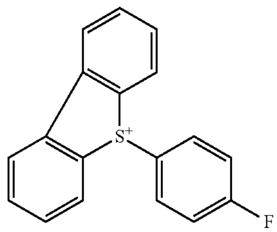
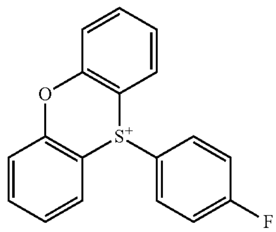
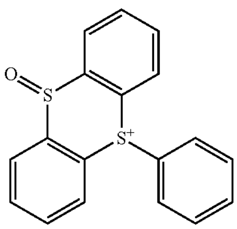
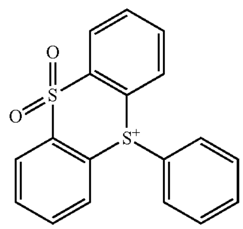
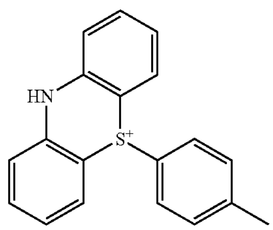
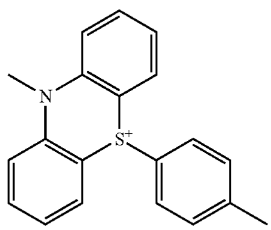
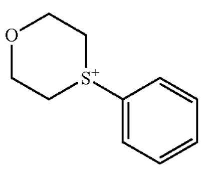
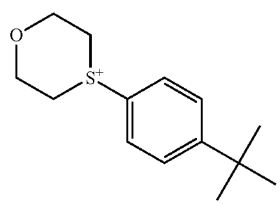
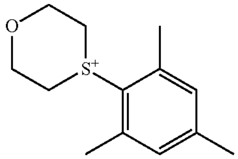
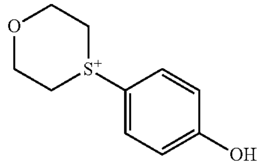
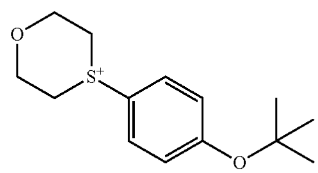
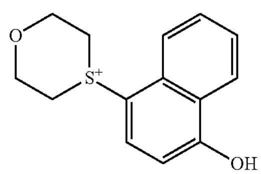
-continued
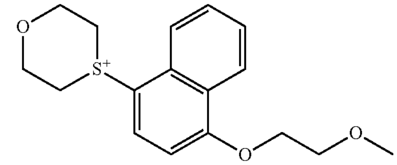
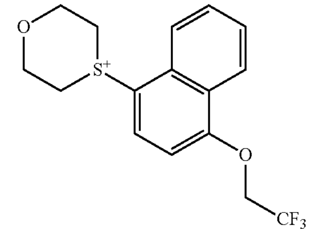
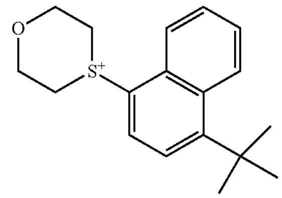
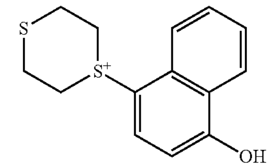
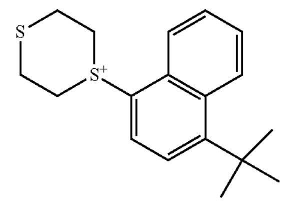
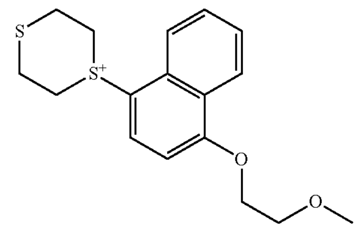
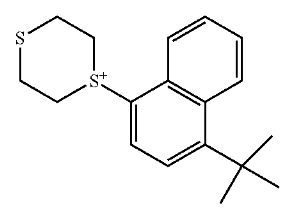
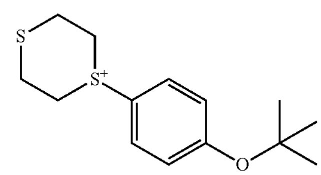
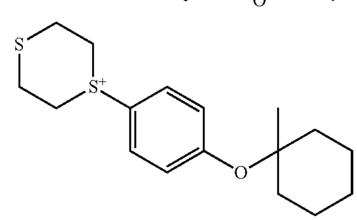

-continued
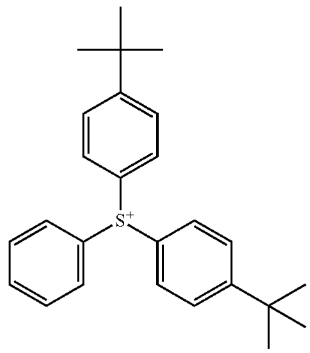
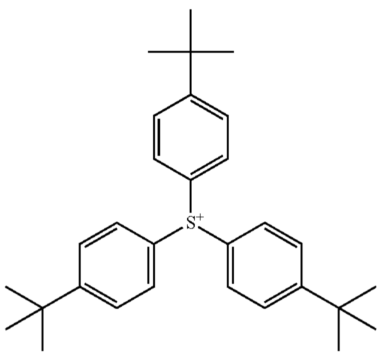
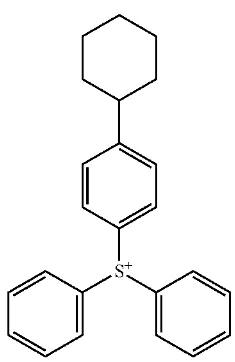
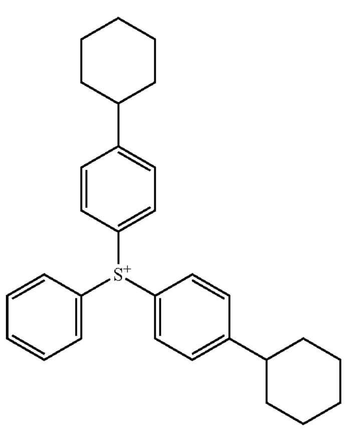
-continued
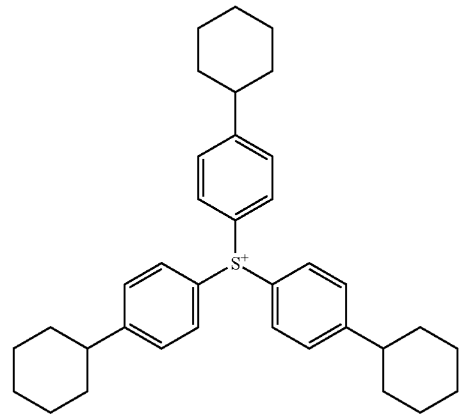
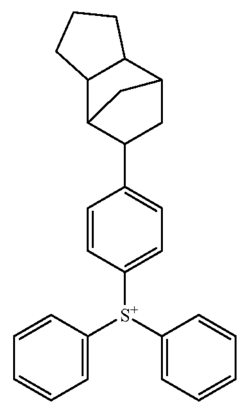
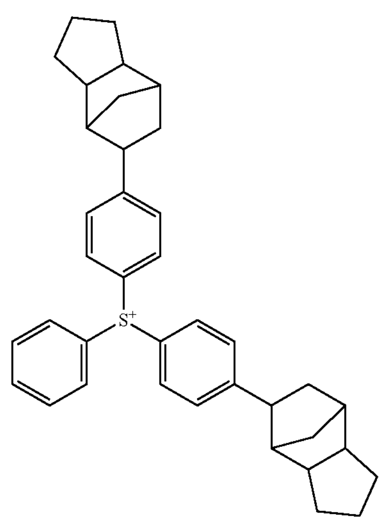

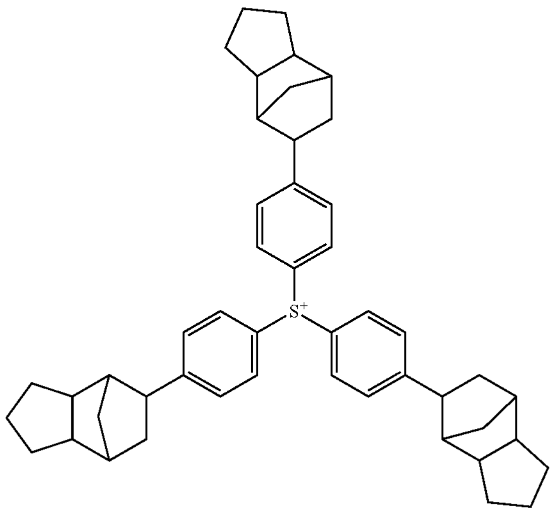
S+
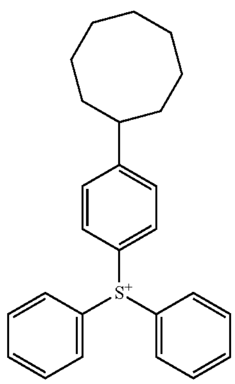
S+
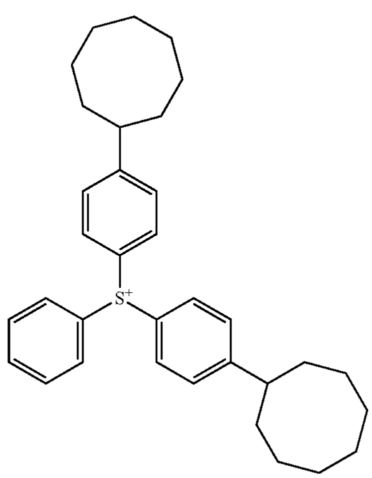
S+
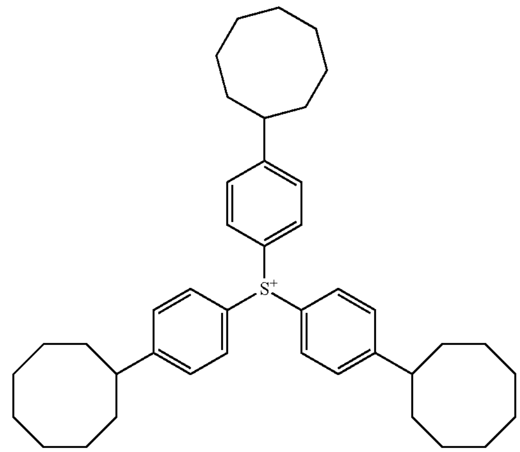
S+
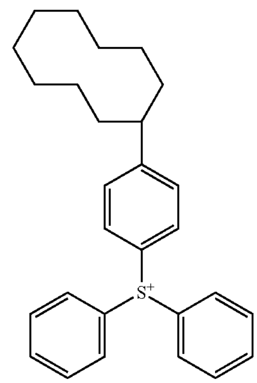
S+
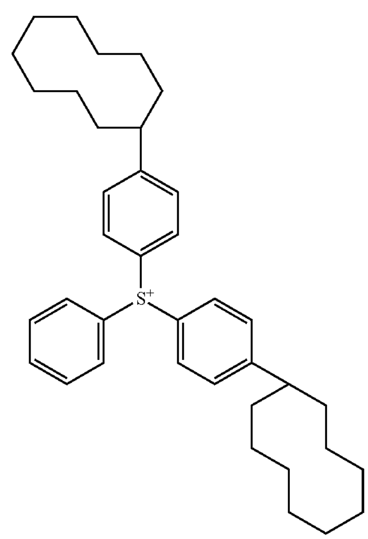
S+

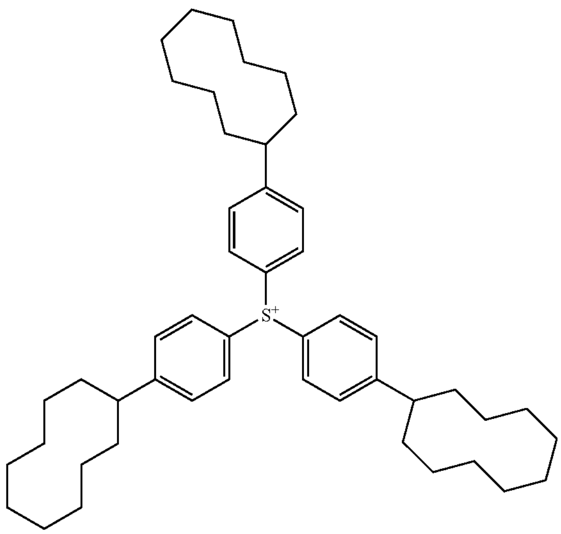
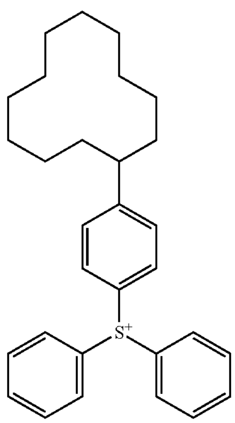
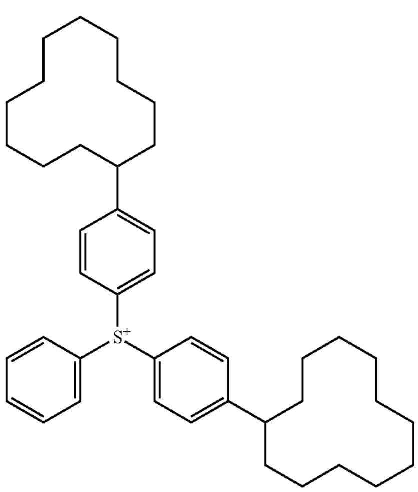
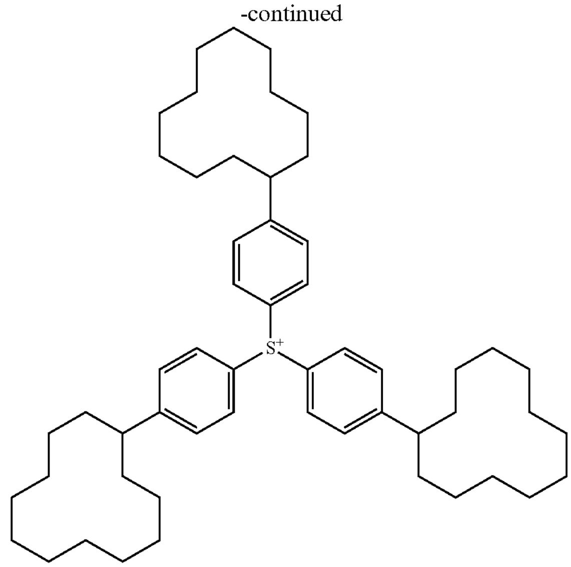
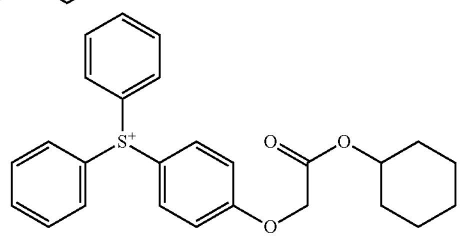
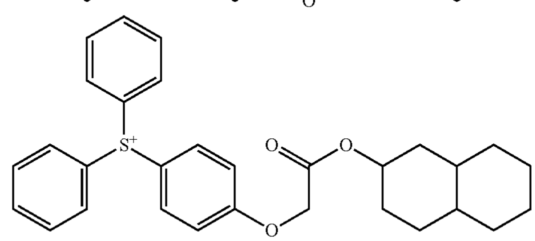
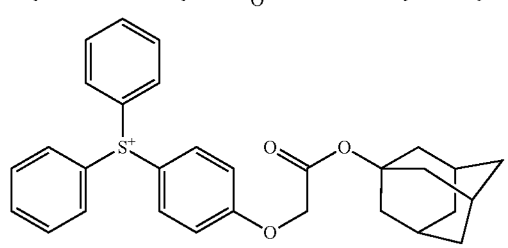
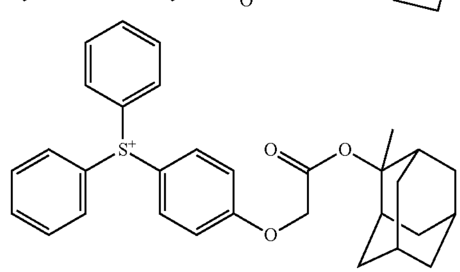
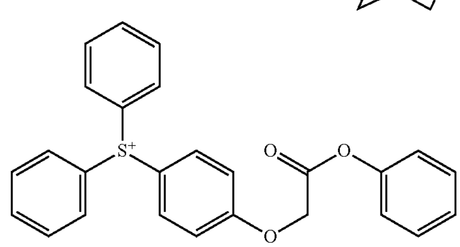
S+
O
O
O

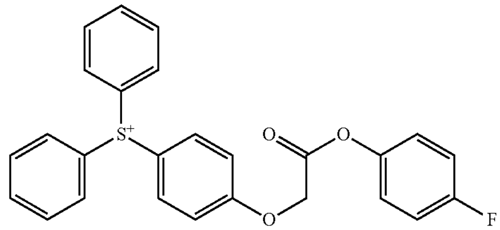
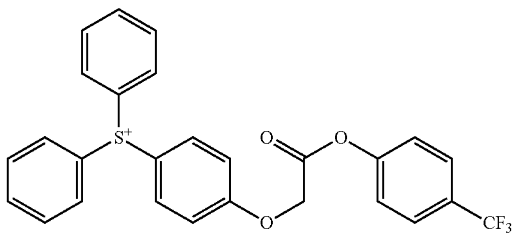
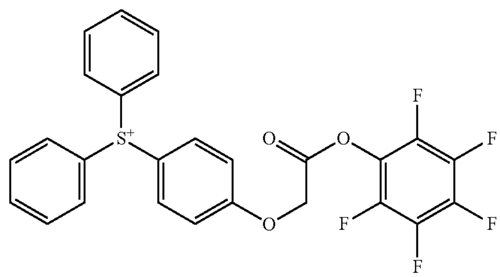
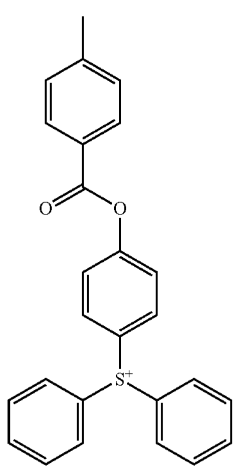
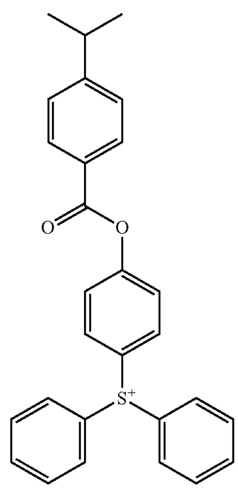
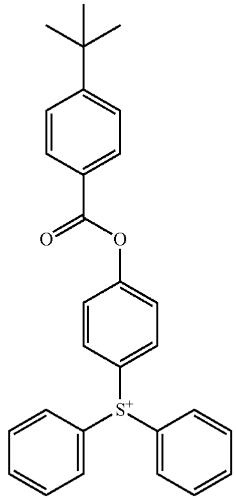
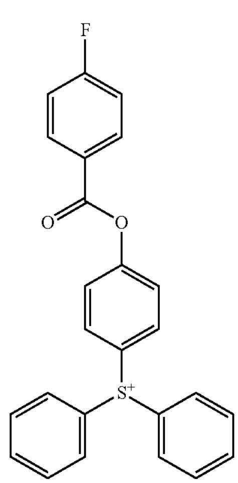
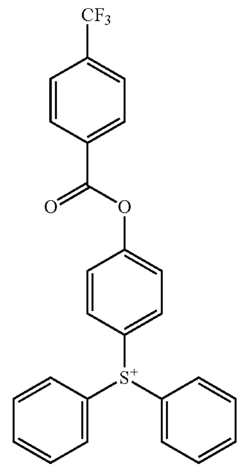
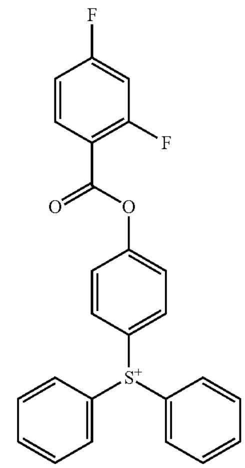
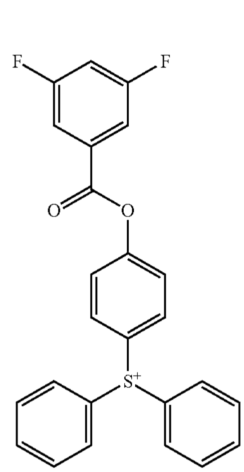
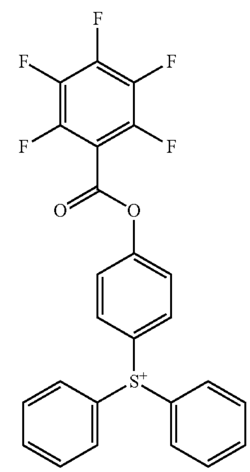
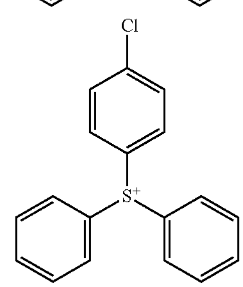
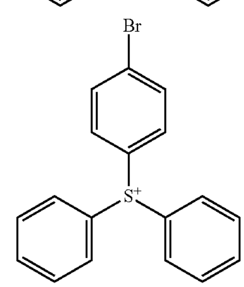
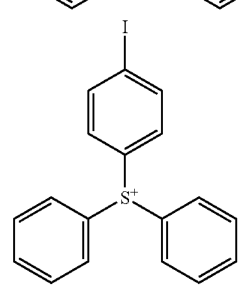
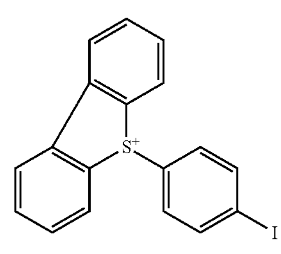
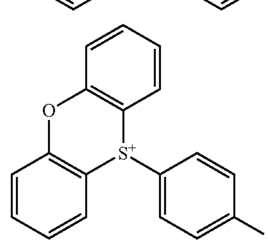
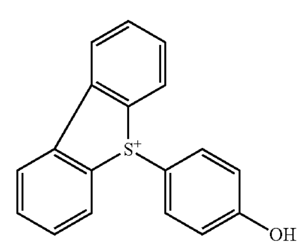

-continued
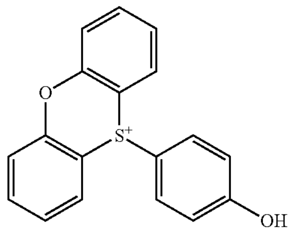
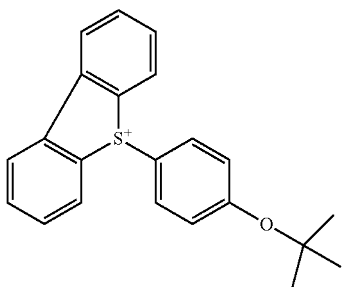
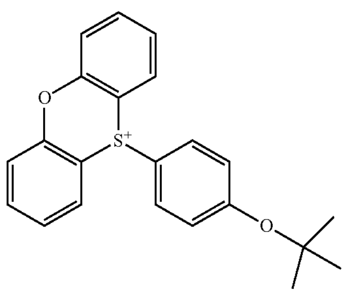
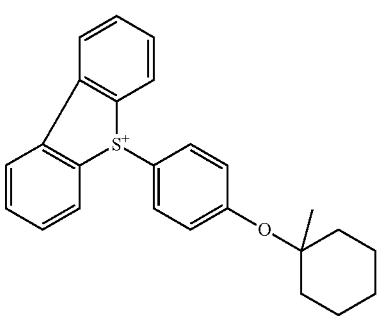
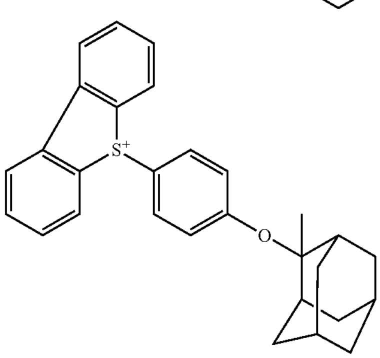
-continued
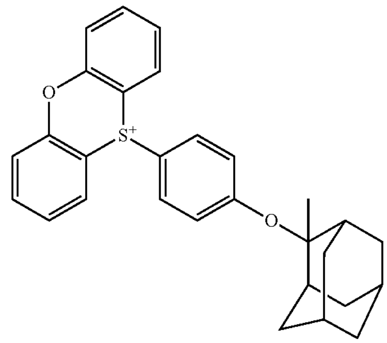
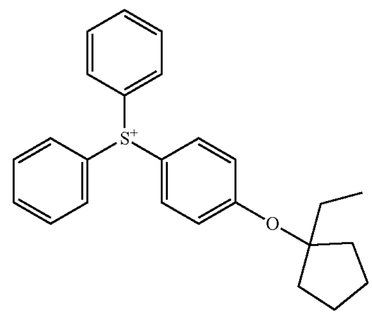
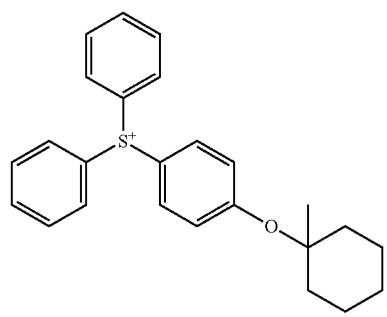
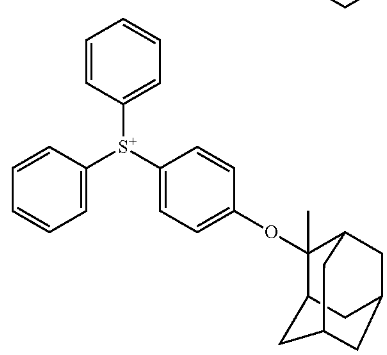
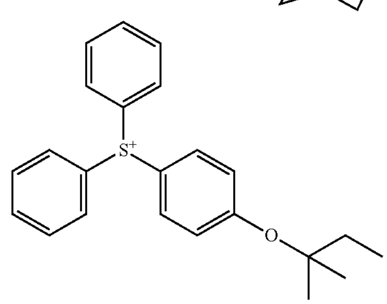

-continued

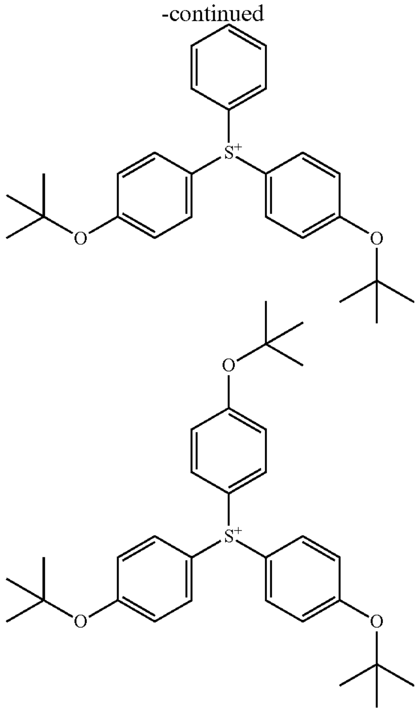

In formula (Ab), $R^9$ to $R^{12}$ are each independently hydrogen or a $C_1$-$C_{24}$ monovalent hydrocarbon group which may contain halogen, hydroxyl, carboxyl, thiol, ether bond, ester bond, thioester bond, thionoester bond, dithioester bond, amino, nitro, sulfone or ferrocenyl. $R^9$ and $R^{10}$ may bond together to form a ring, or $R^9$ and $R^{10}$ taken together may form $=C(R^{9A})(R^{10A})$, wherein $R^{9A}$ and $R^{10A}$ are each independently hydrogen or a $C_1$-$C_{16}$ monovalent hydrocarbon group, $R^{9A}$ and $R^{10A}$ may bond together to form a ring with the carbon and nitrogen atoms to which they are attached, and the relevant ring may contain a double bond, oxygen, sulfur or nitrogen.

The $C_1$-$C_{24}$ monovalent hydrocarbon group may be straight, branched or cyclic and examples thereof include $C_1$-$C_{24}$ alkyl, $C_2$-$C_{24}$ alkenyl, $C_2$-$C_{24}$ alkynyl, $C_6$-$C_{20}$ aryl, and $C_7$-$C_{20}$ aralkyl groups, and mixtures thereof. Examples of the alkyl, alkenyl, alkynyl, aryl and aralkyl groups are as exemplified above for $R^5$.

Examples of the ammonium cation having formula (Ab) are shown below, but not limited thereto.

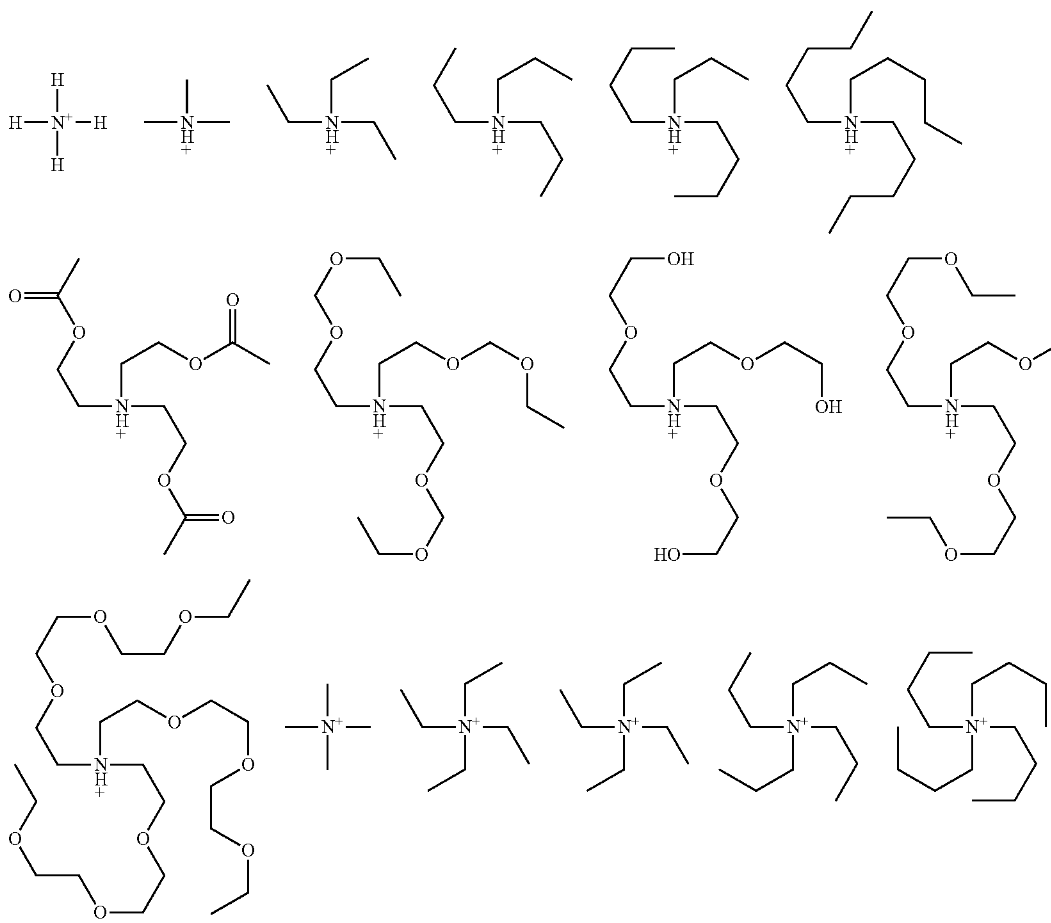

-continued
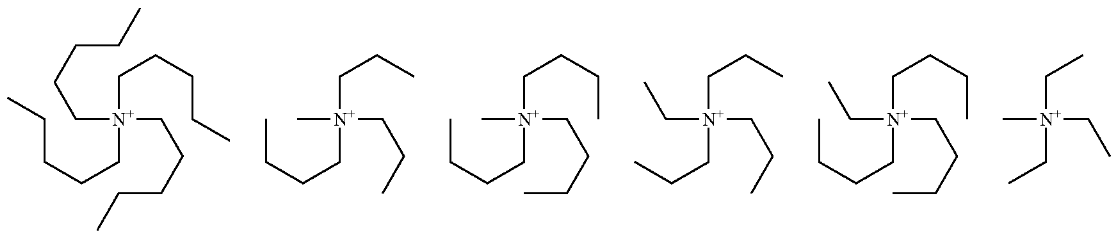
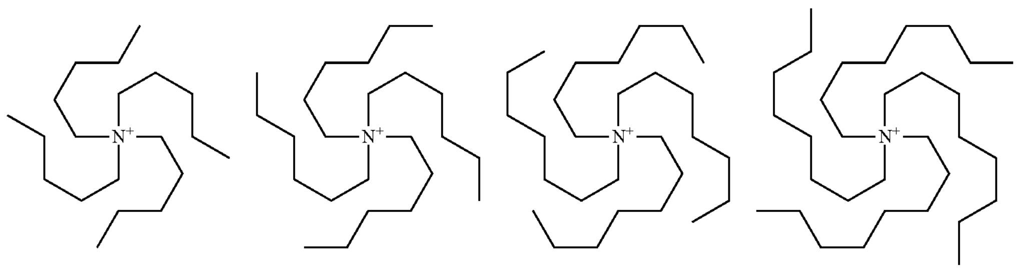
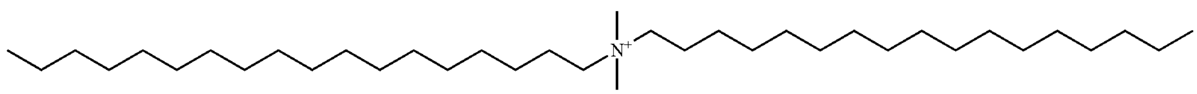
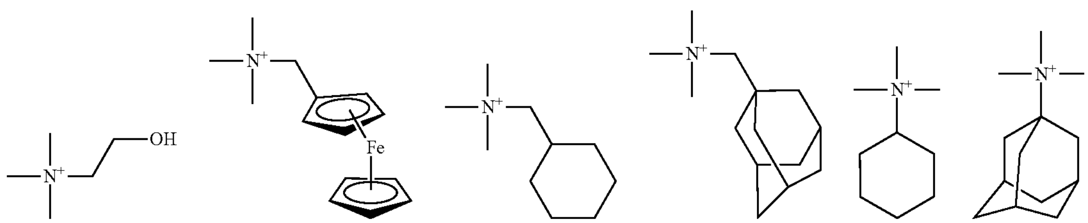
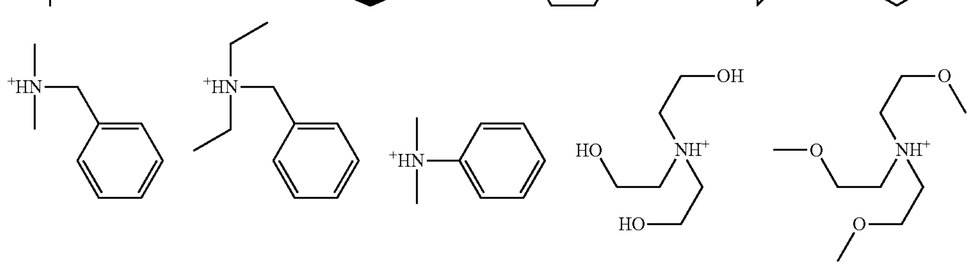
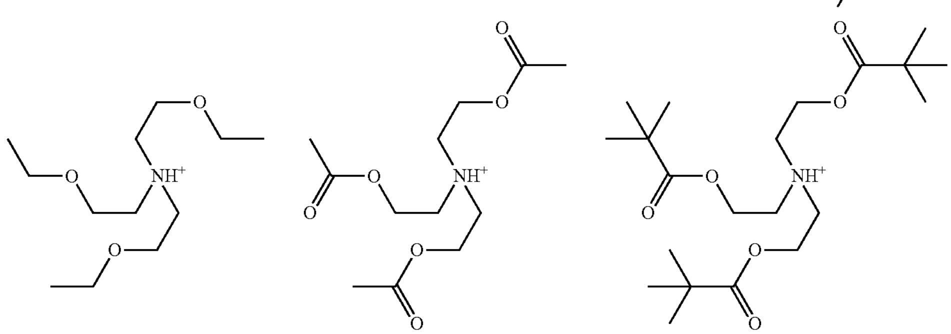
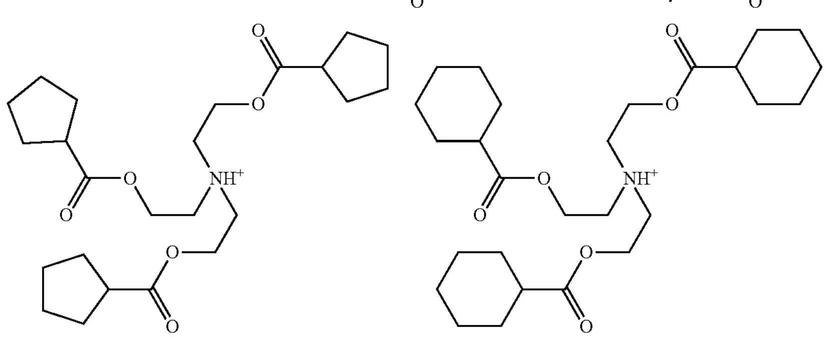

-continued
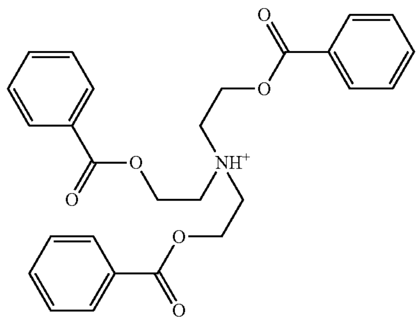
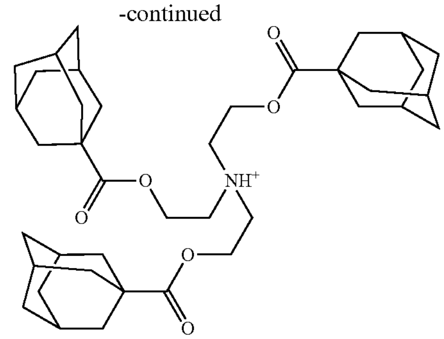
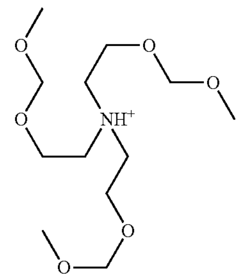
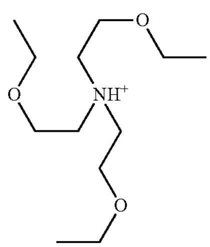
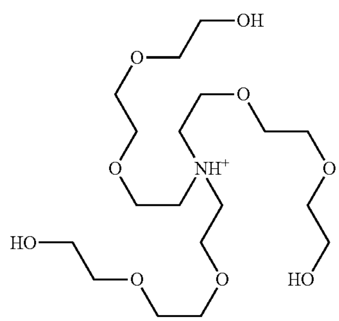
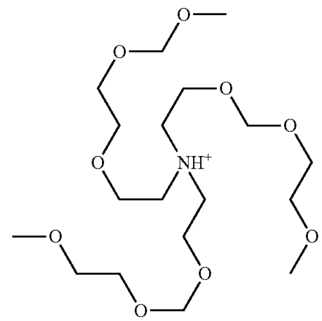
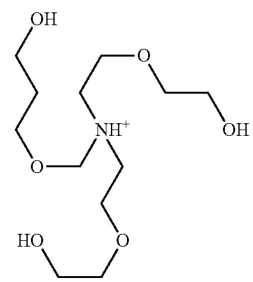
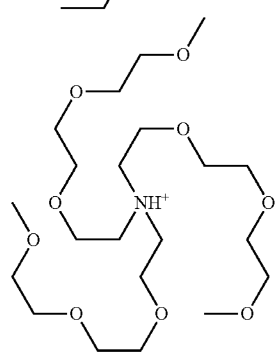
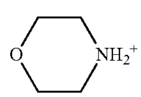
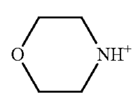
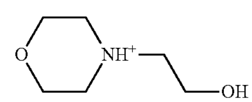
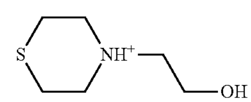
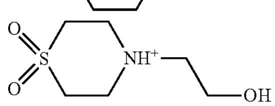
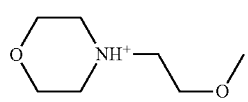
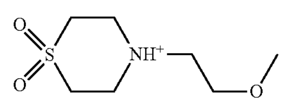
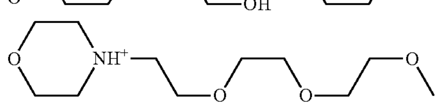
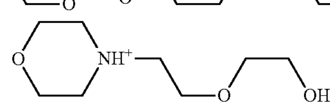
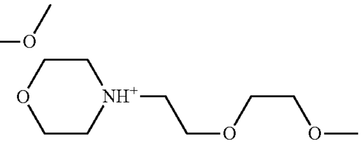
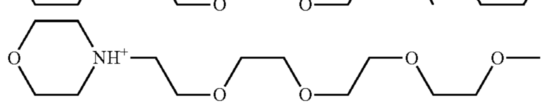
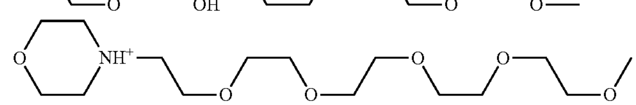
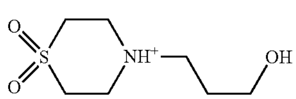
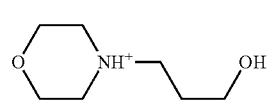
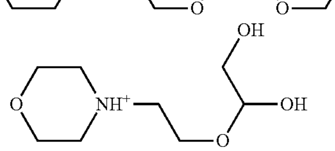
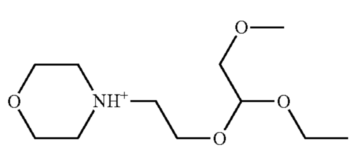
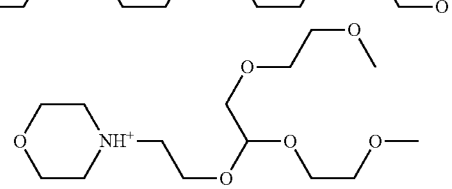
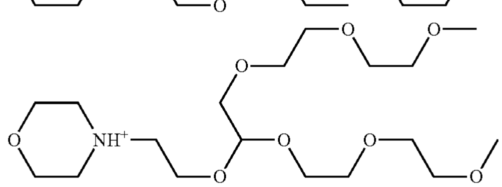
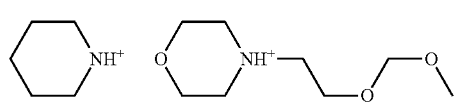

-continued
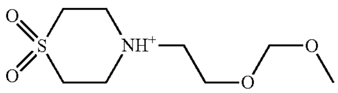
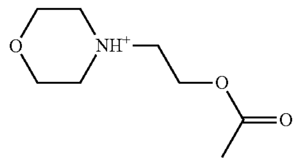
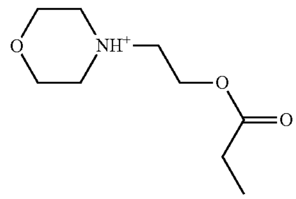
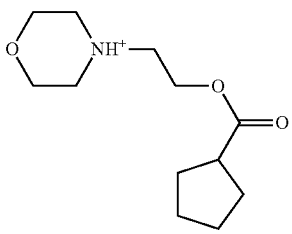
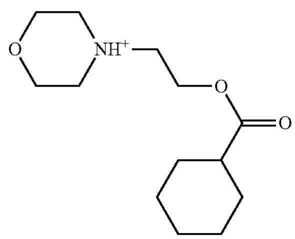
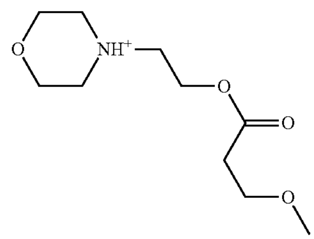
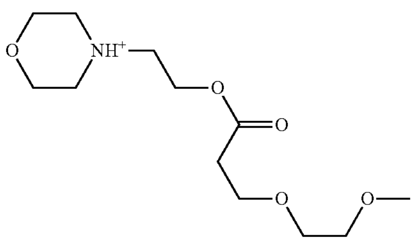
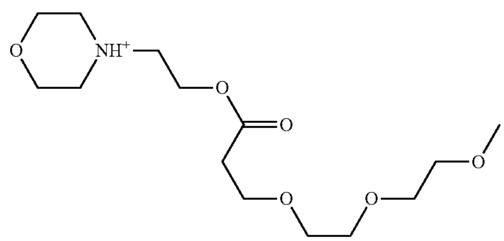
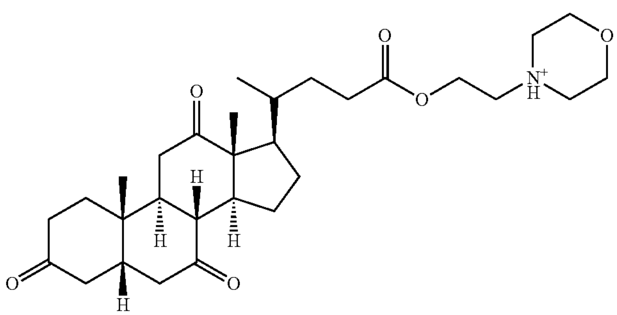
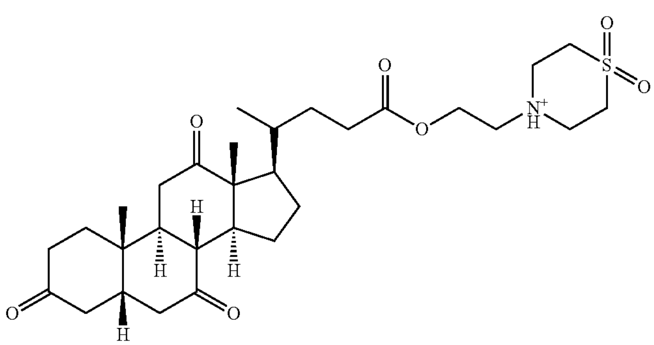
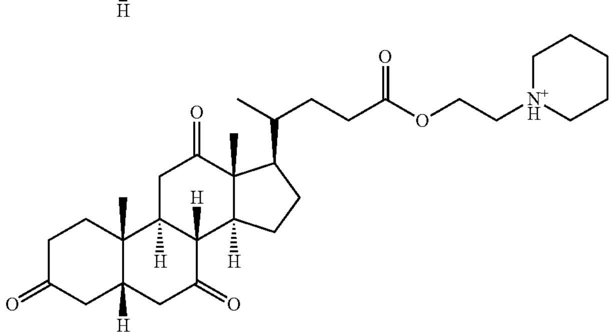

-continued
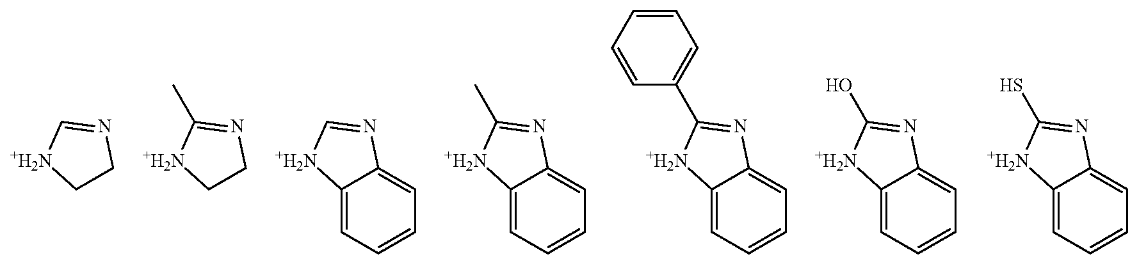
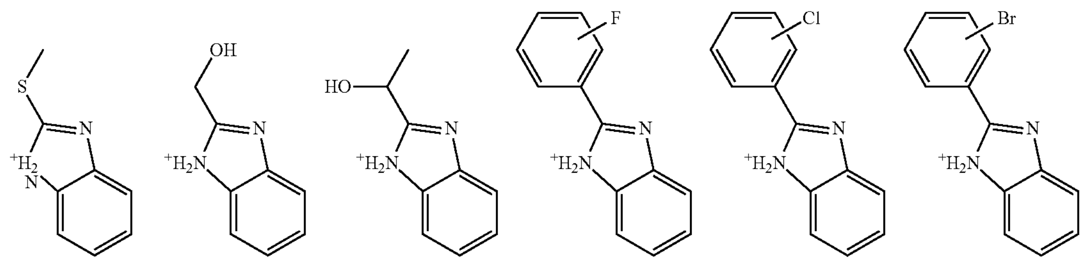
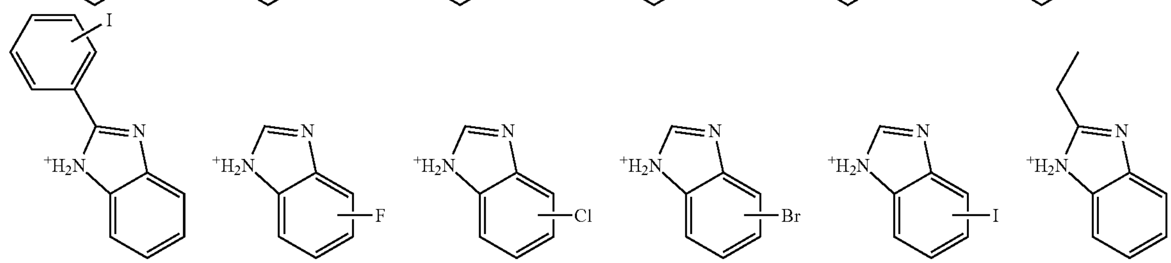
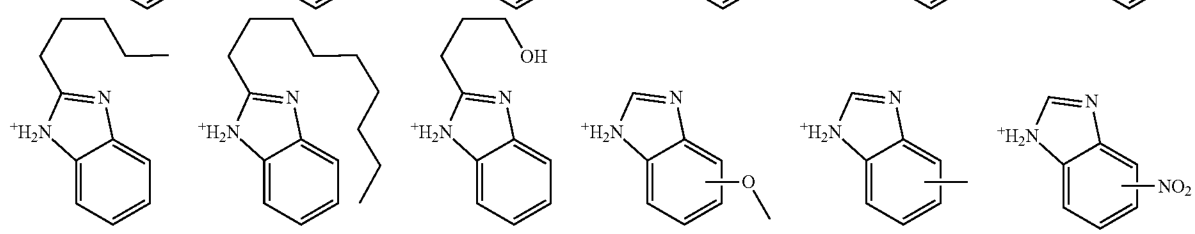
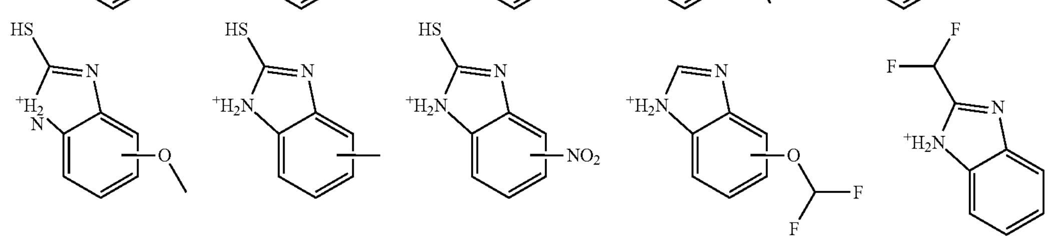
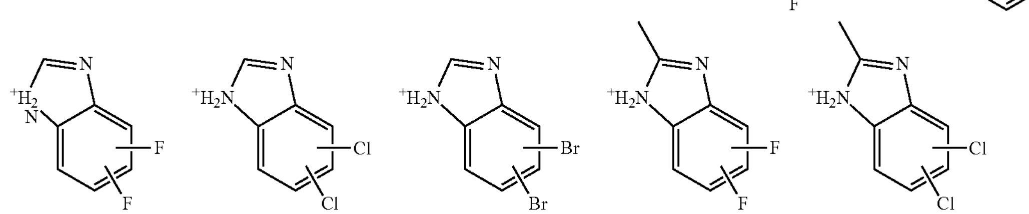
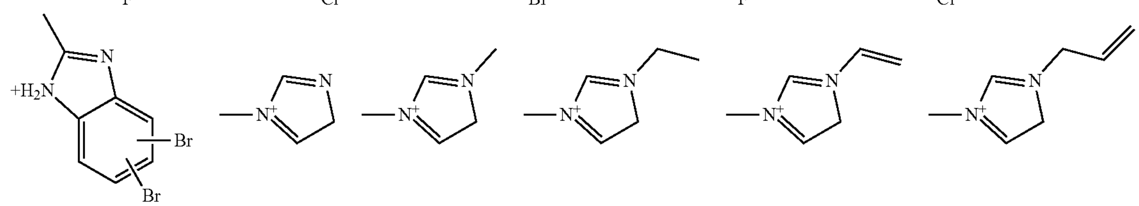

-continued
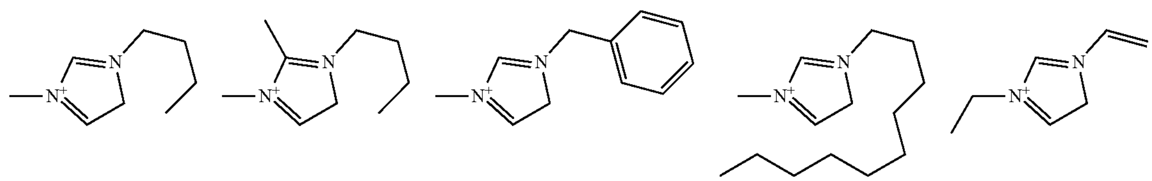
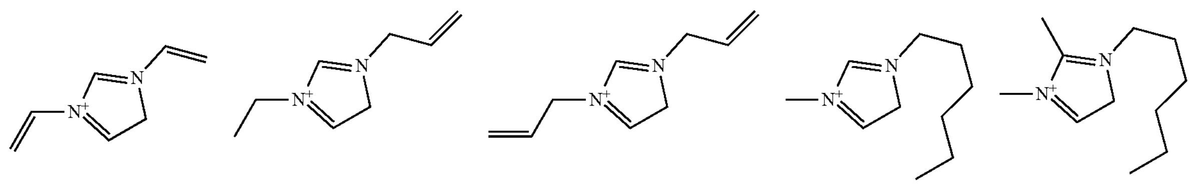
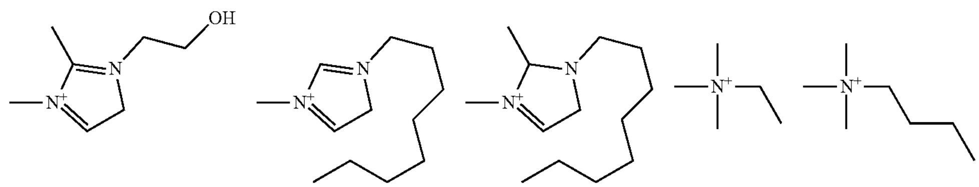
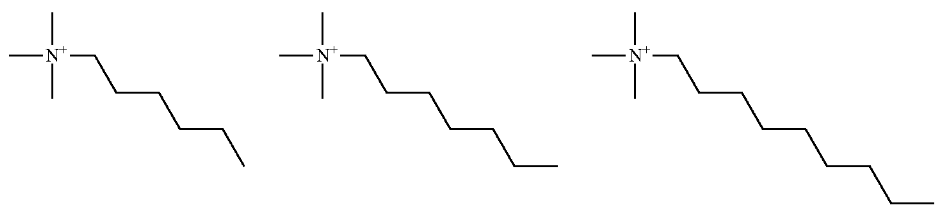
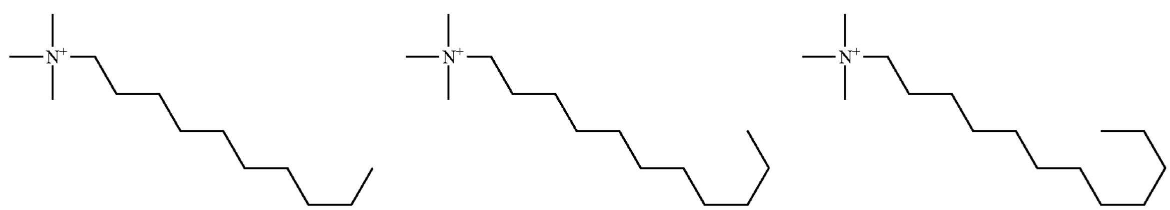
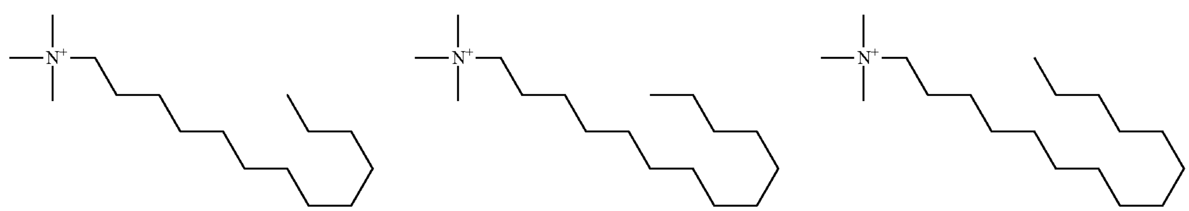
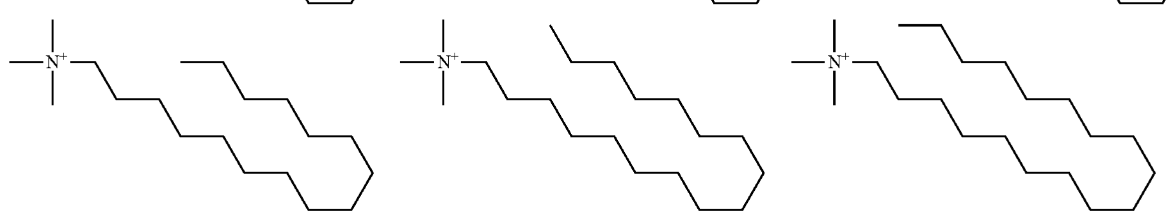
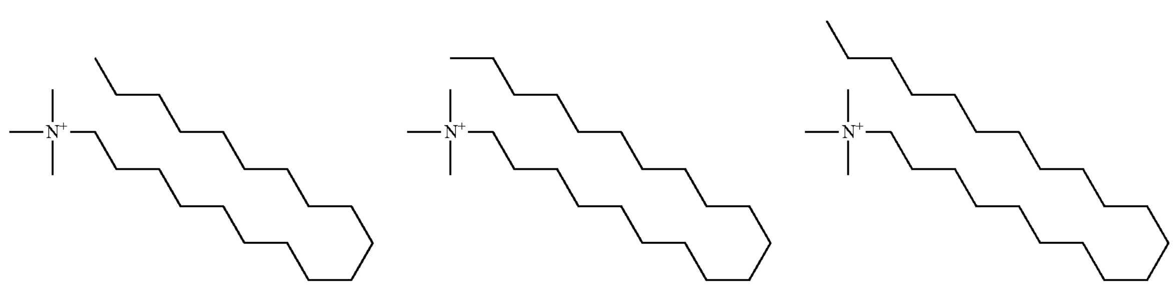

-continued
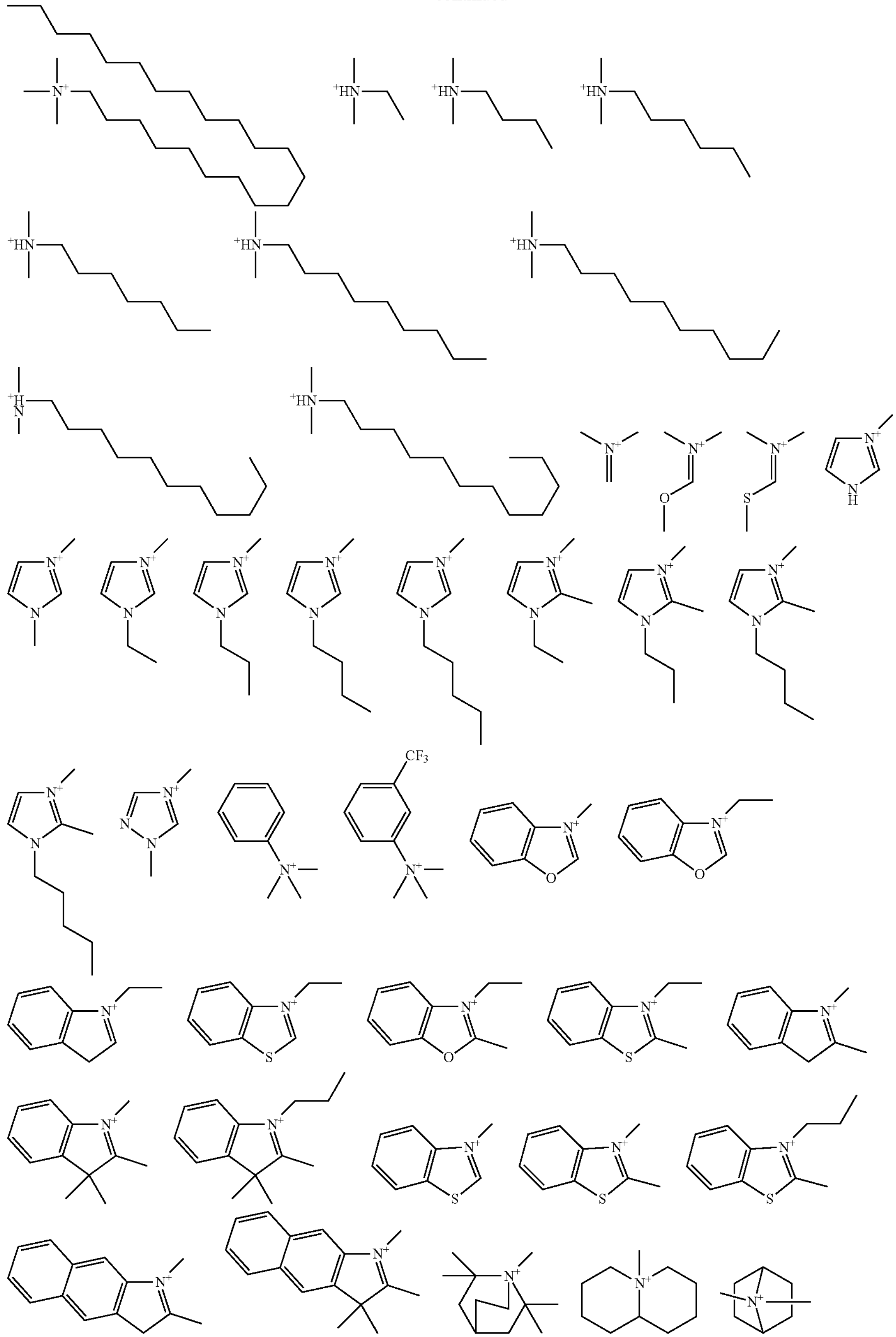

-continued
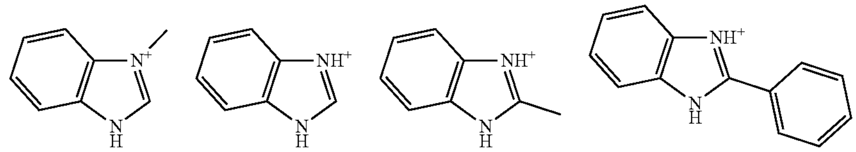
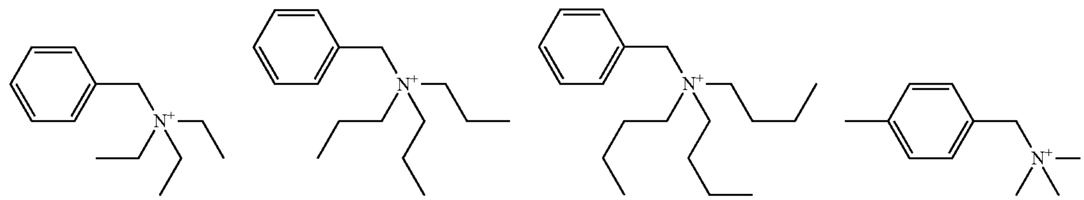
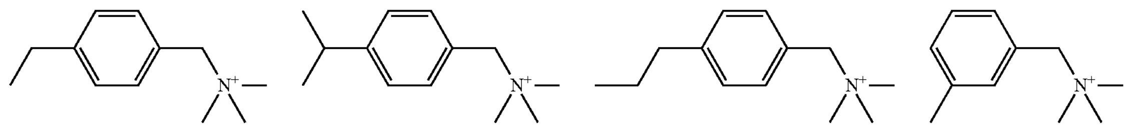
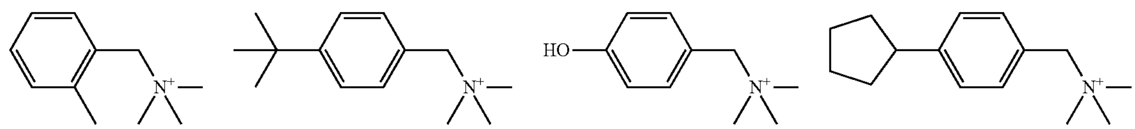
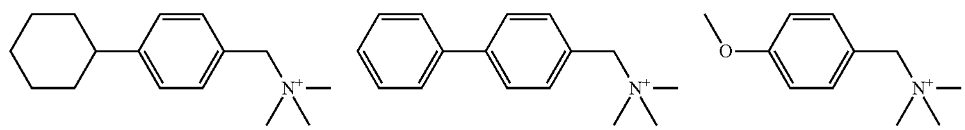
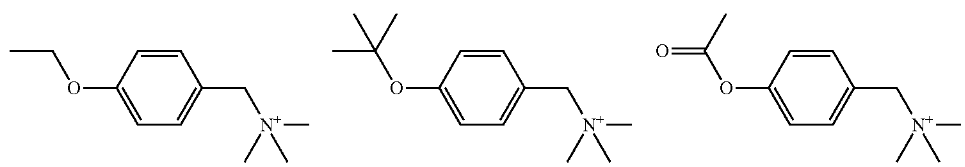
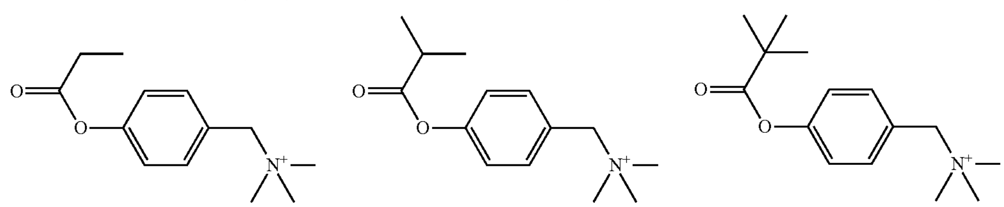
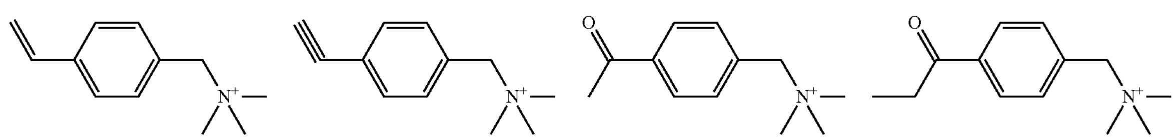
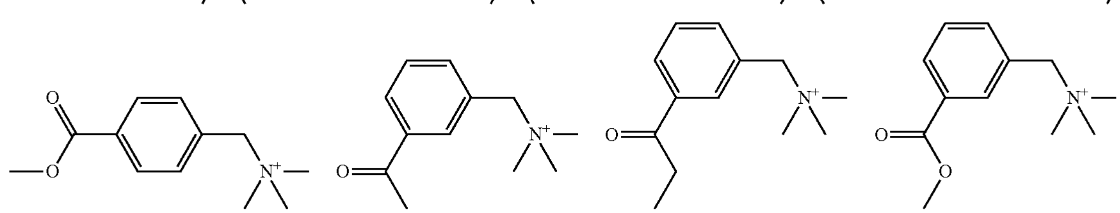
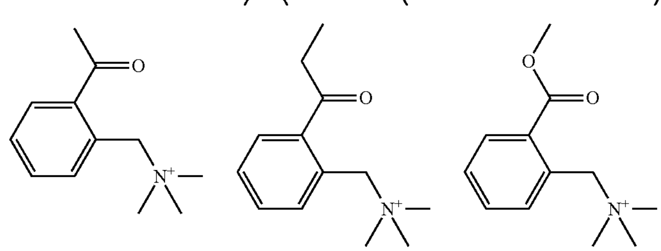

-continued
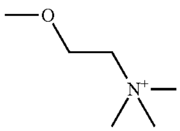
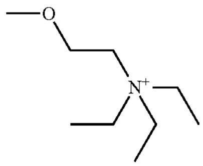
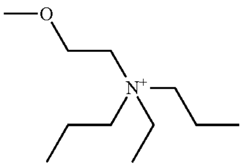
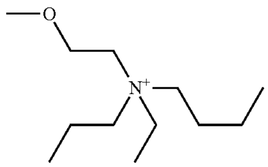
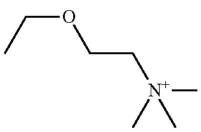
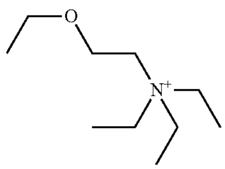
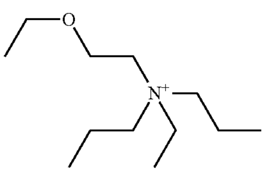
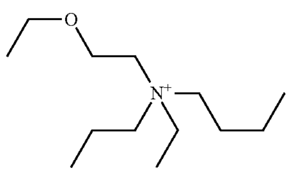
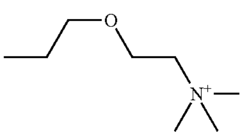
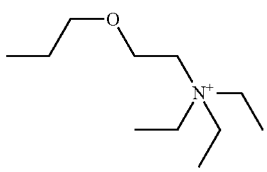
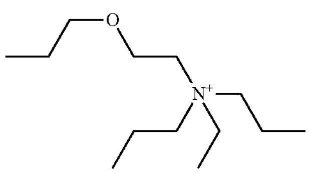
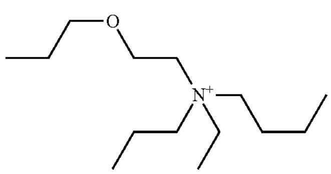
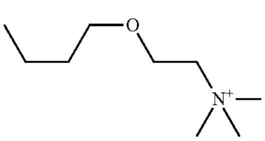
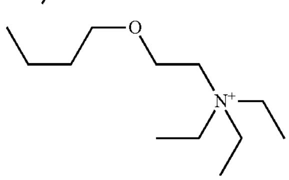
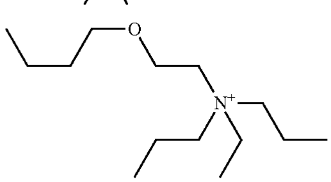
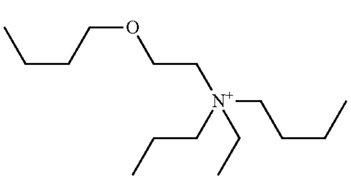
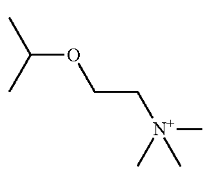
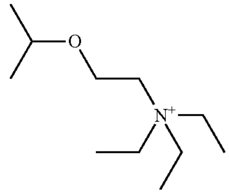
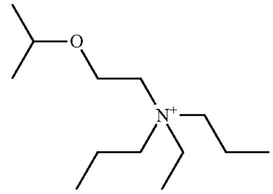
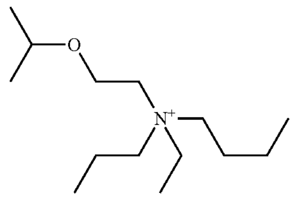
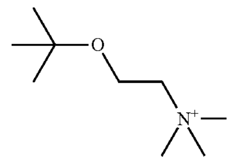
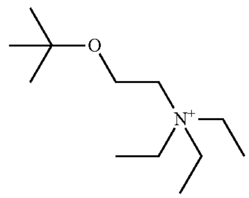
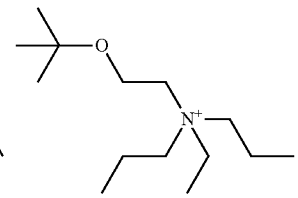
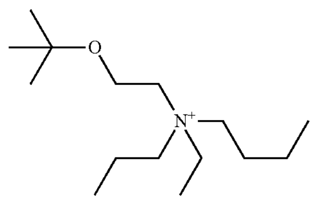
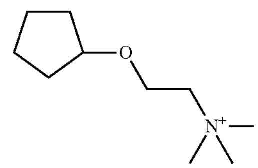
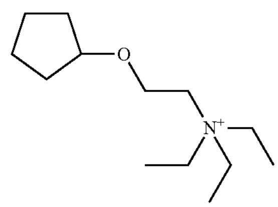
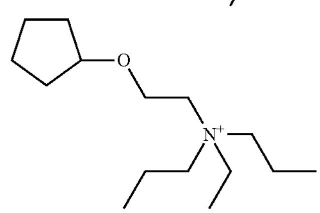
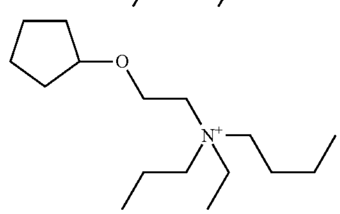
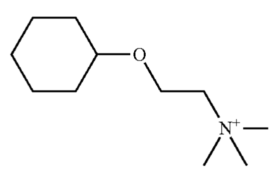
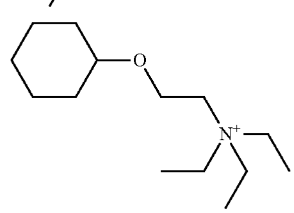

-continued
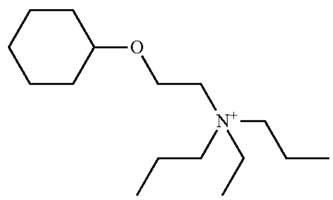
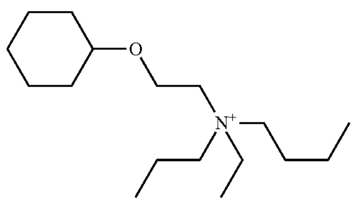
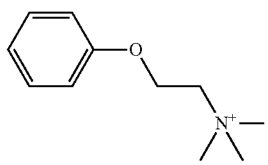
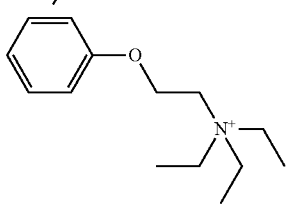
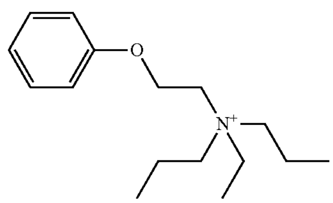
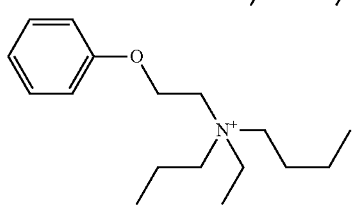
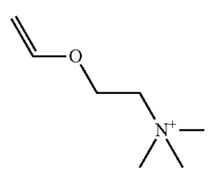
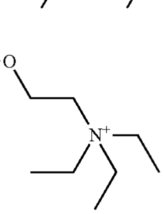
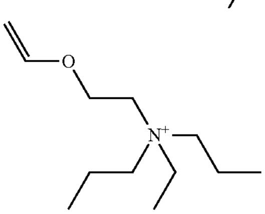
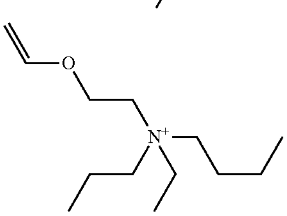
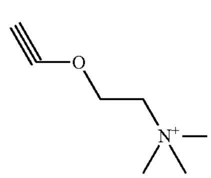
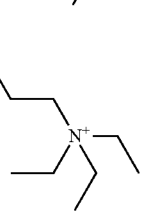
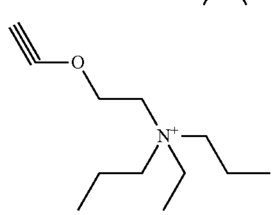
-continued
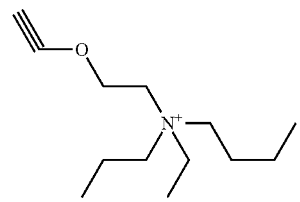
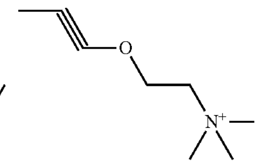
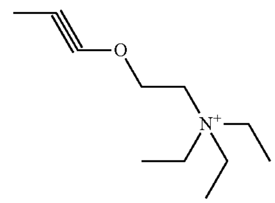
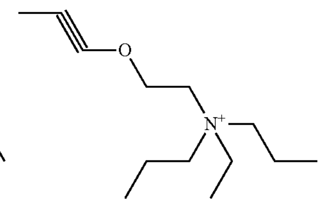
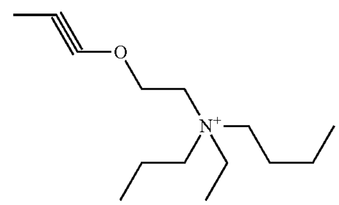
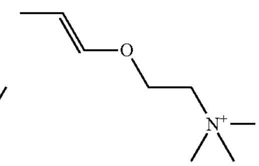
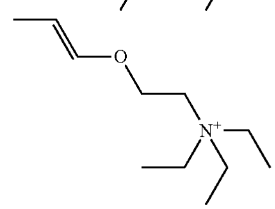
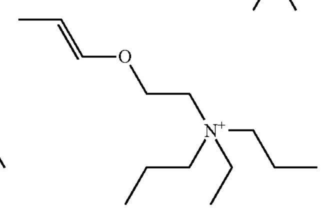
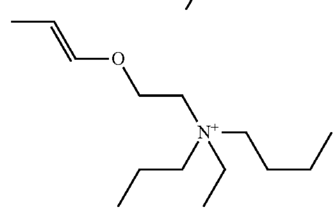
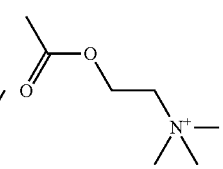
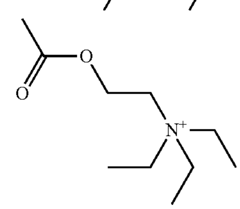
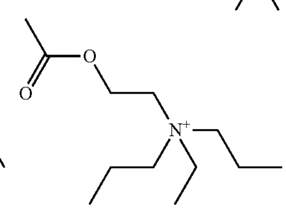
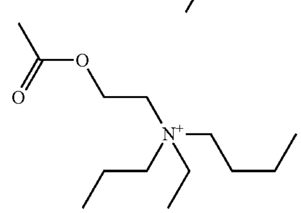
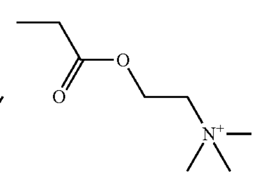
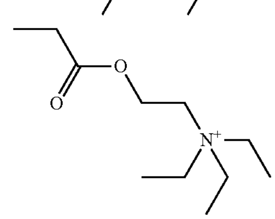
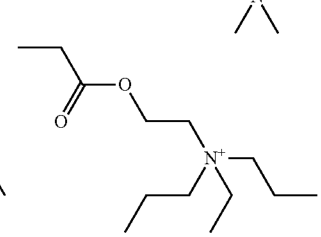

-continued
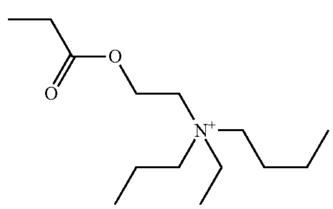
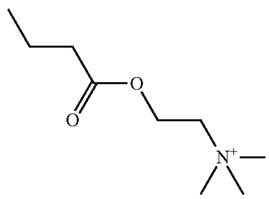
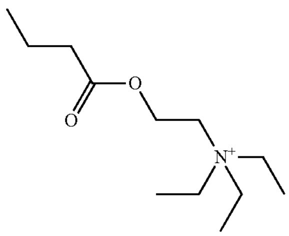
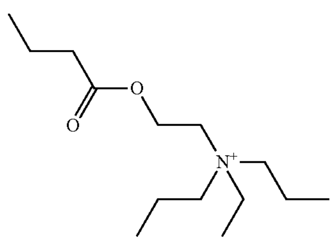
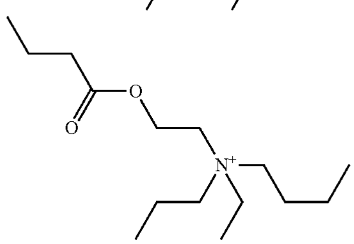
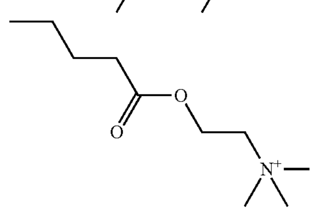
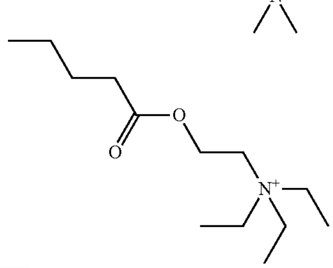
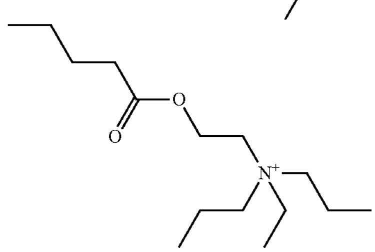
-continued
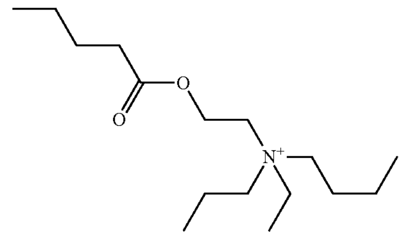
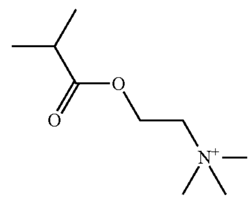
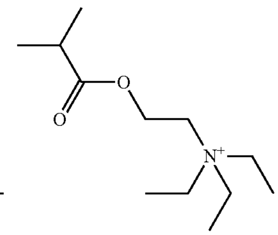
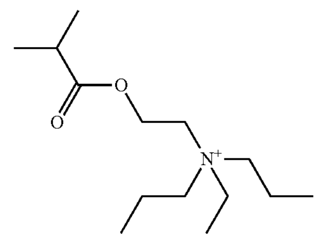
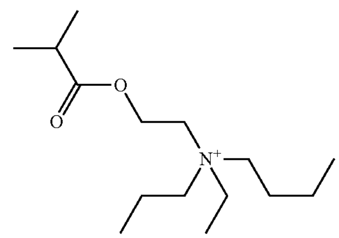
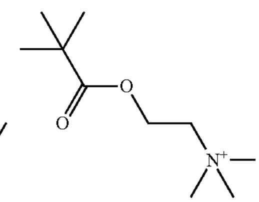
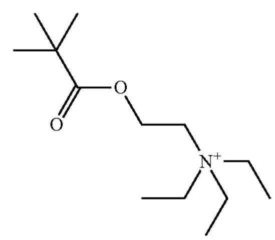
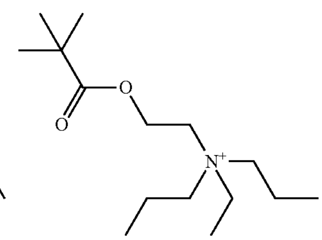
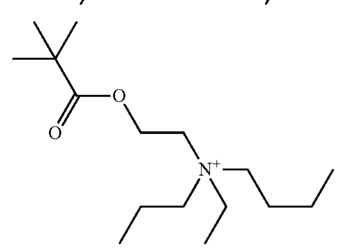
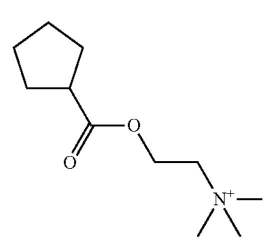
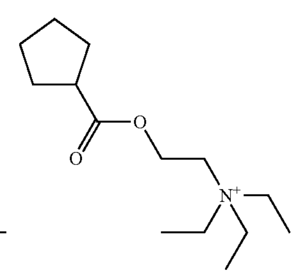

-continued
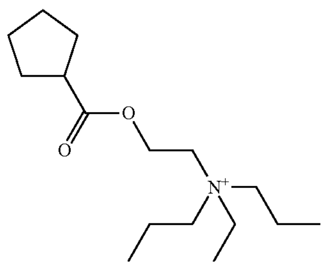
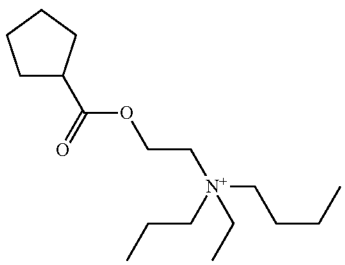
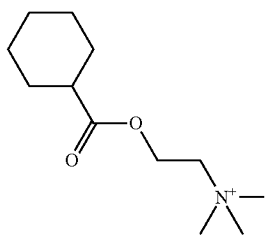
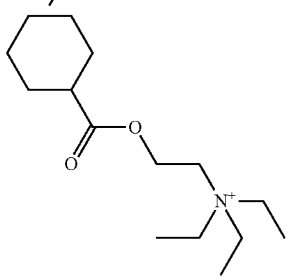
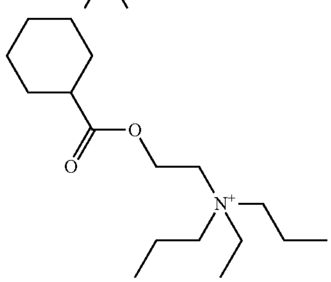
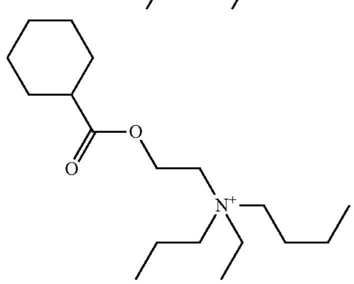
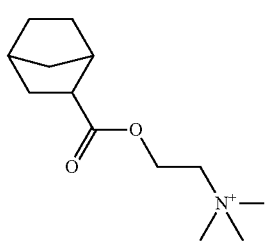
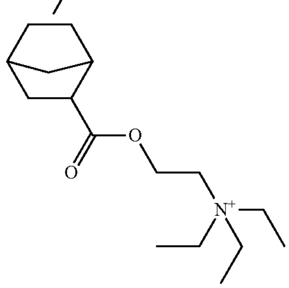
-continued
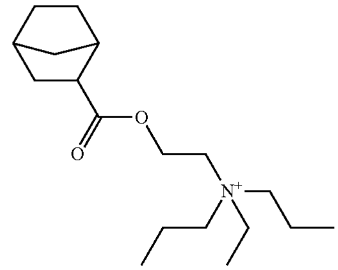
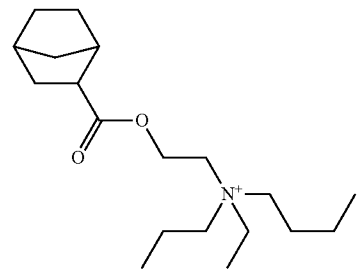
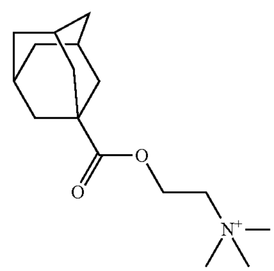
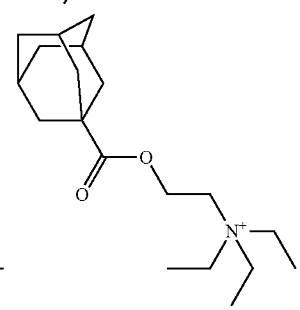
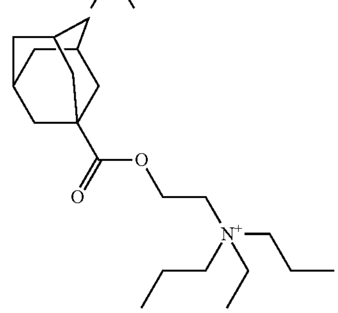
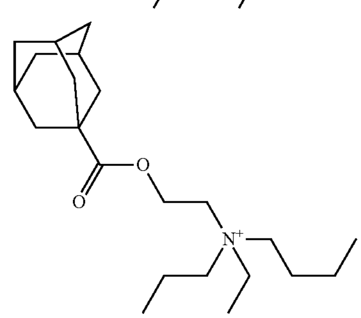
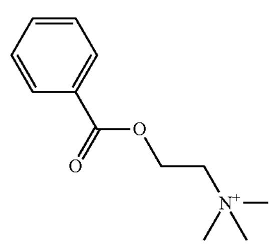
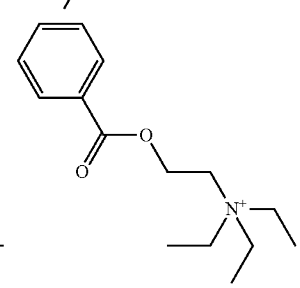

-continued
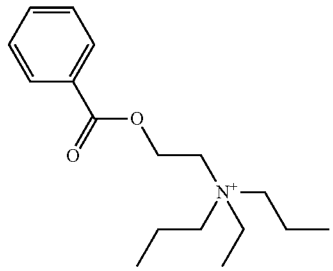
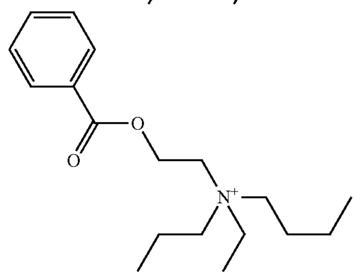
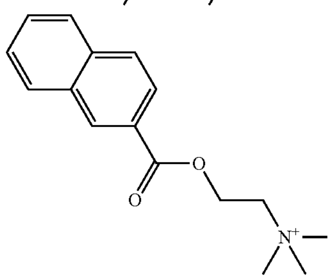
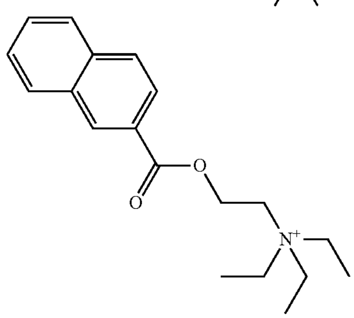
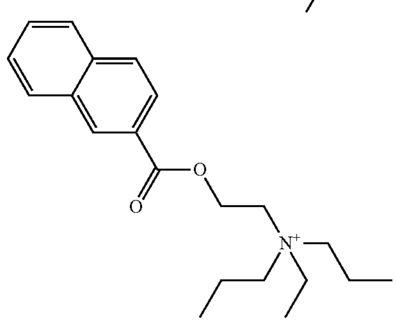
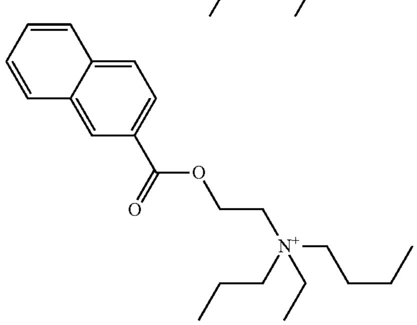
-continued
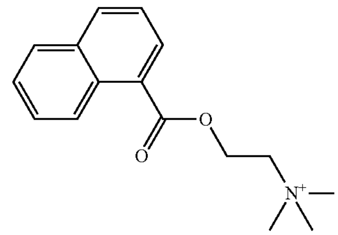
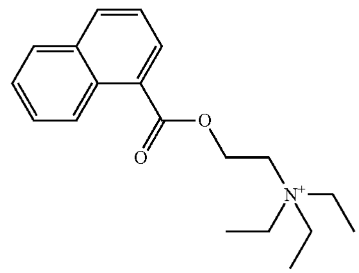
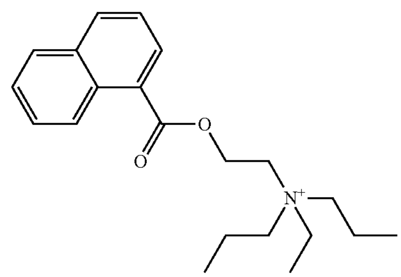
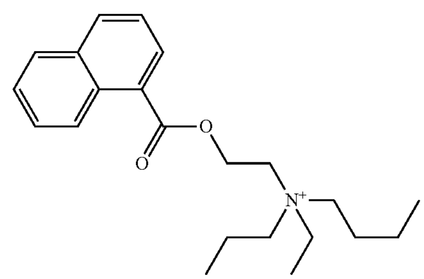
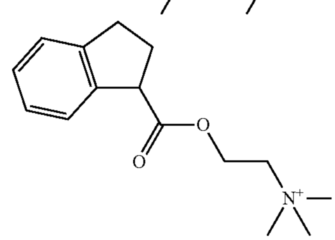
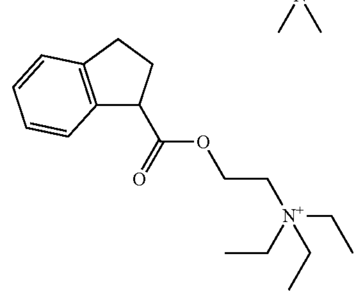

-continued
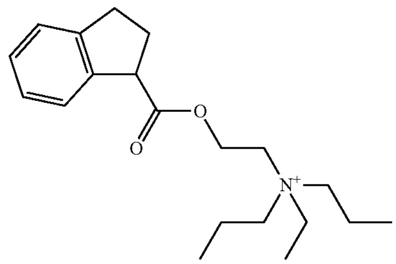
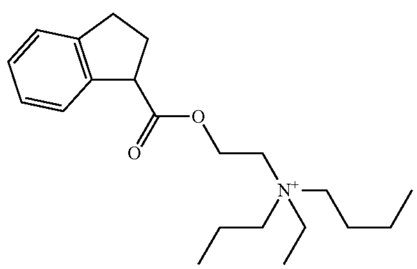
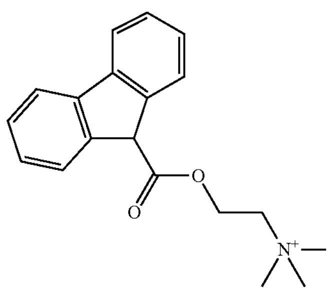
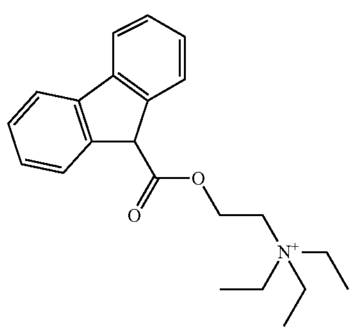
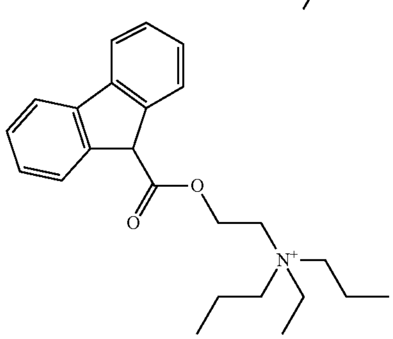
-continued
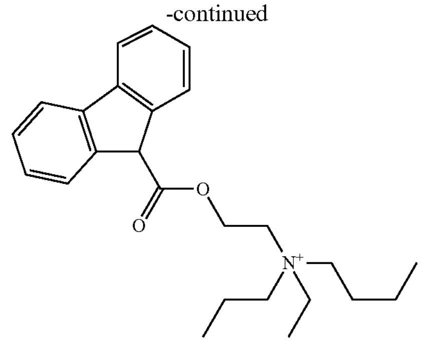
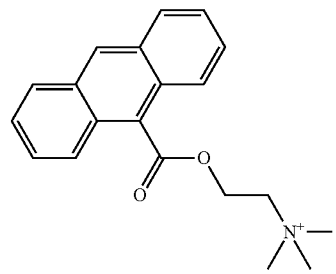
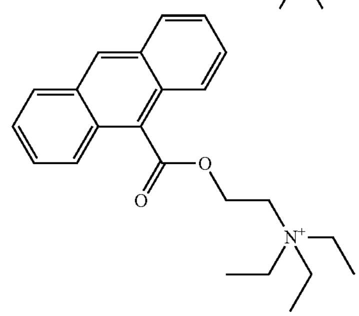
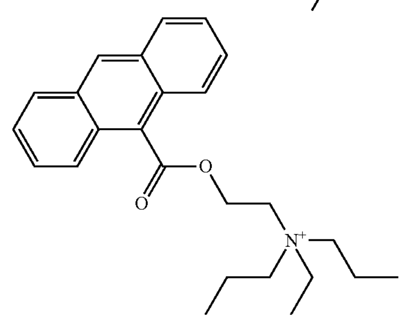
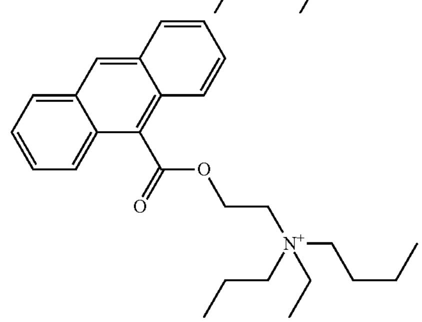
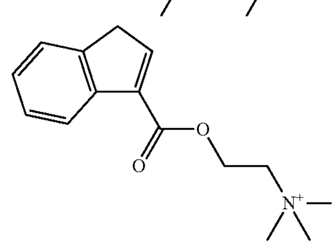

-continued
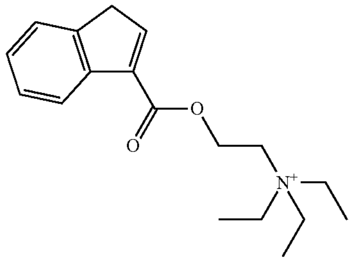
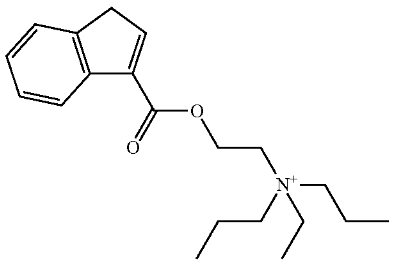
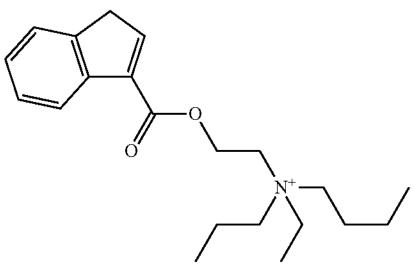
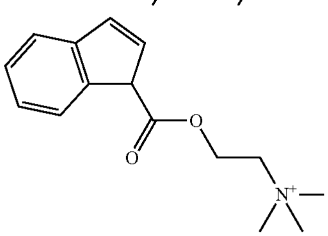
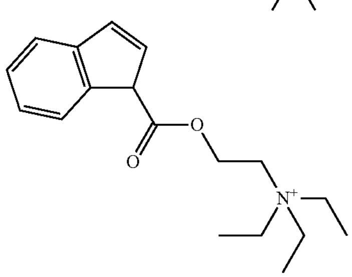
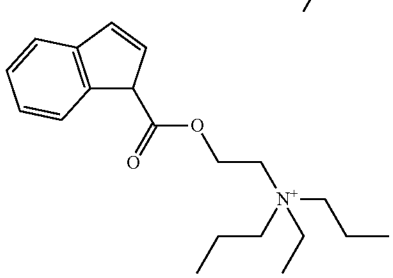
-continued
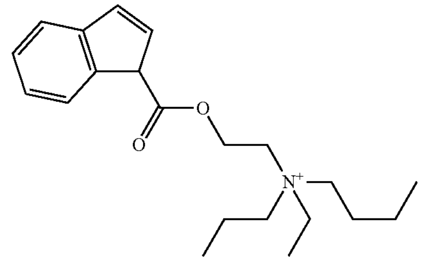
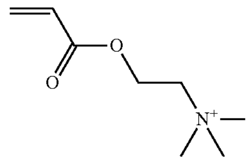
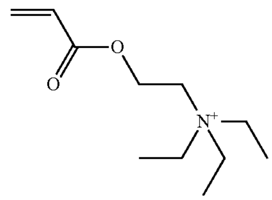
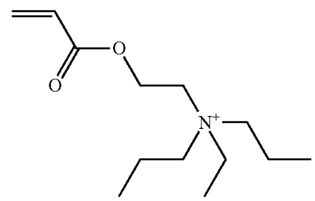
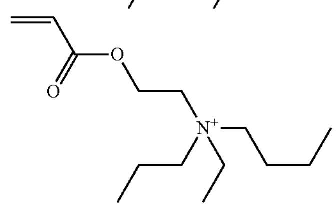
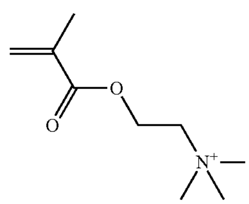
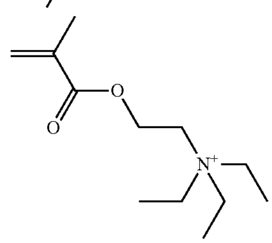
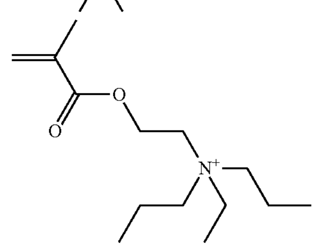
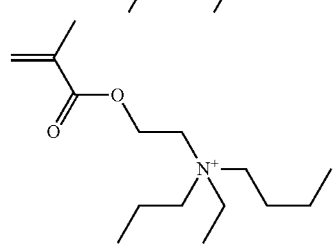

-continued
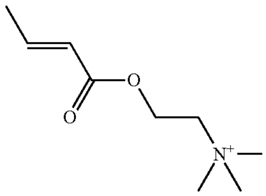
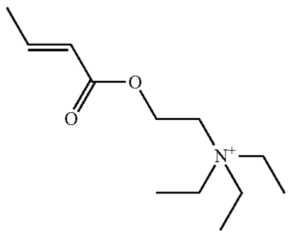
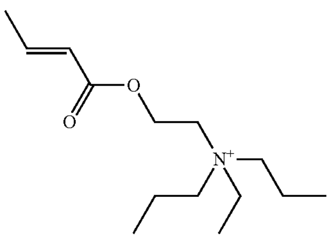
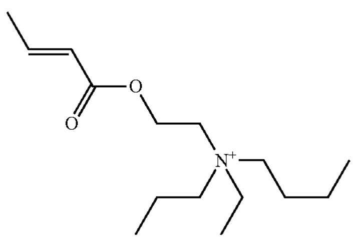
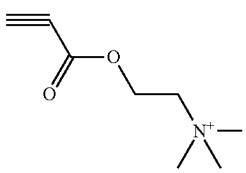
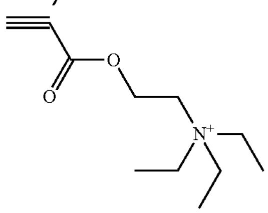
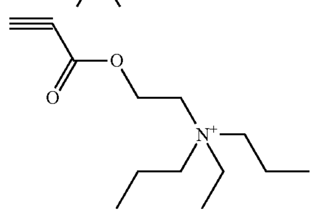
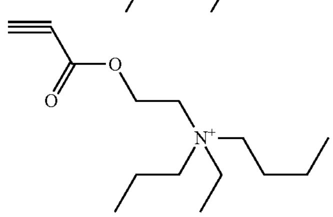
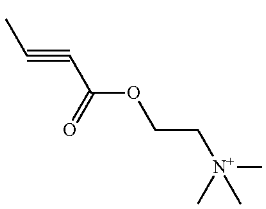
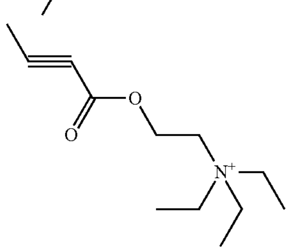
-continued
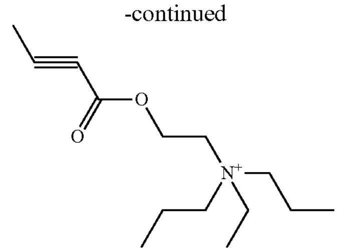
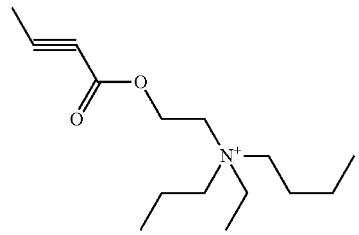
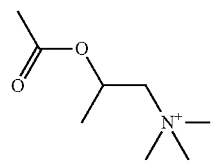
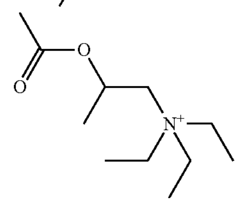
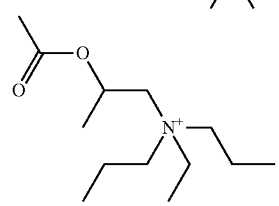
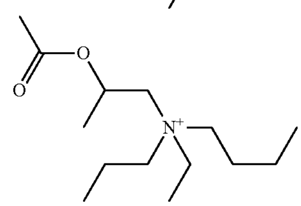
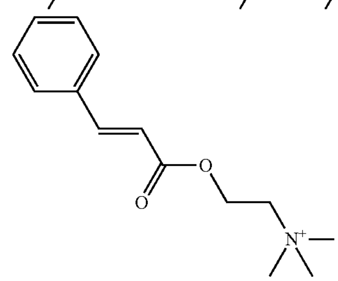
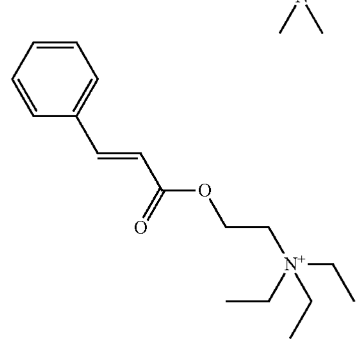
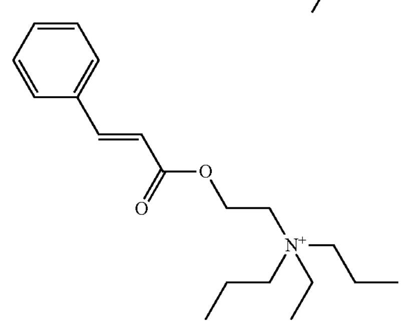

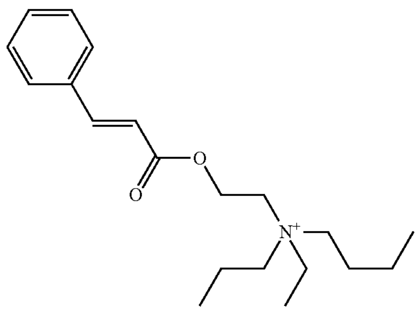
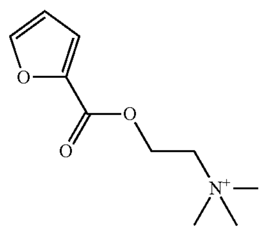
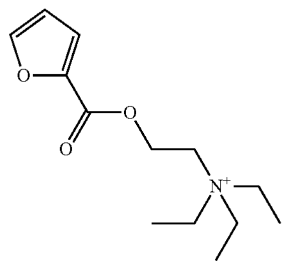
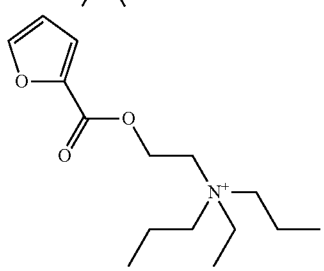
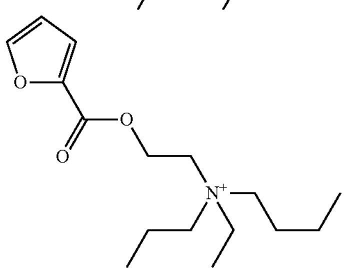
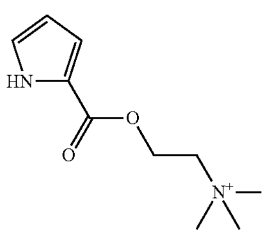
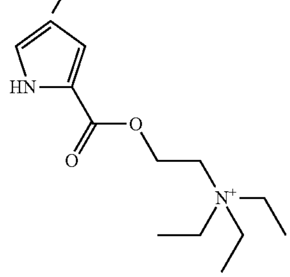
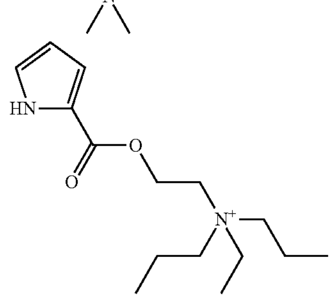
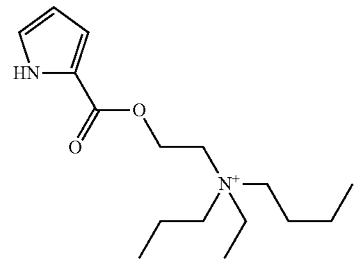
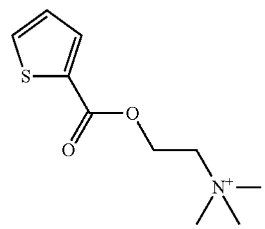
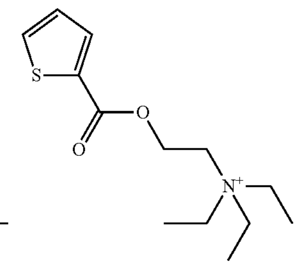
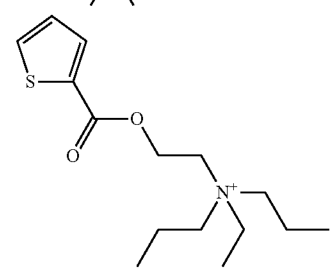
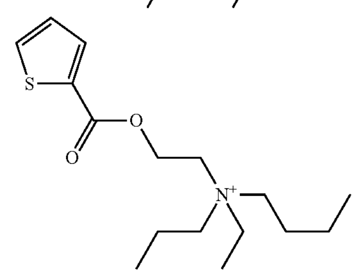
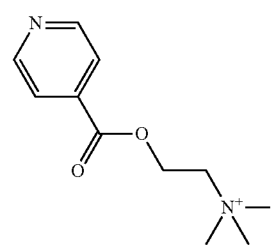
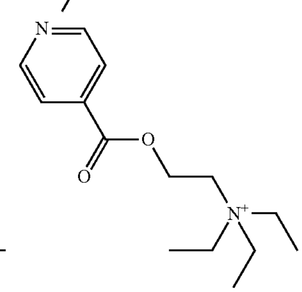
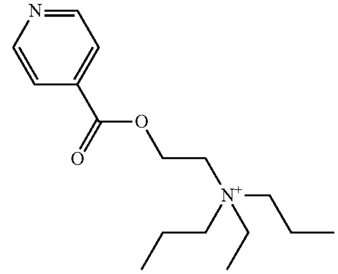

-continued
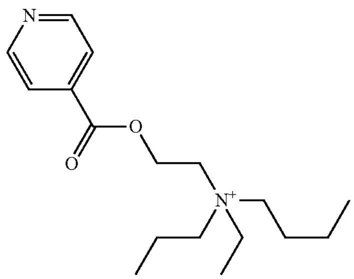
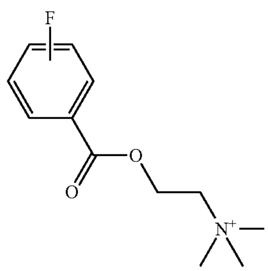
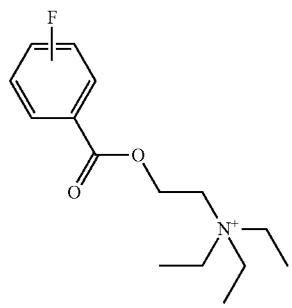
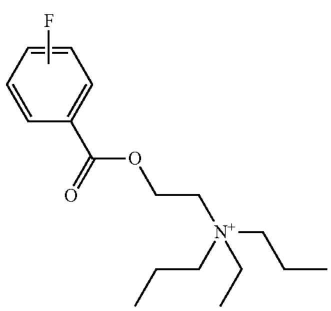
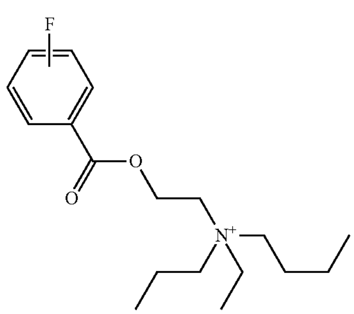
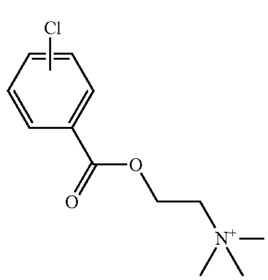
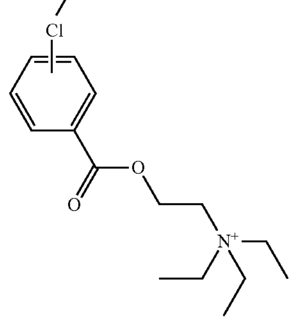
-continued
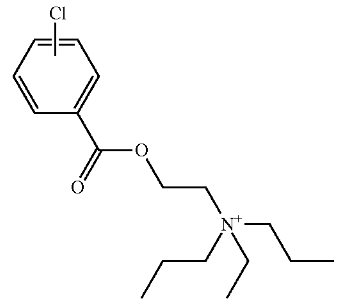
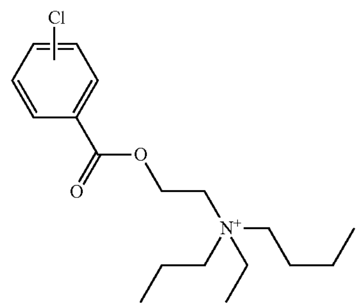
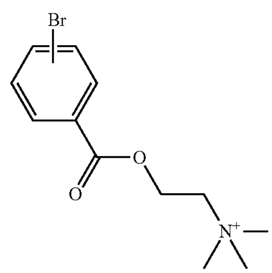
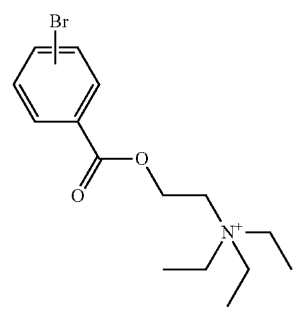
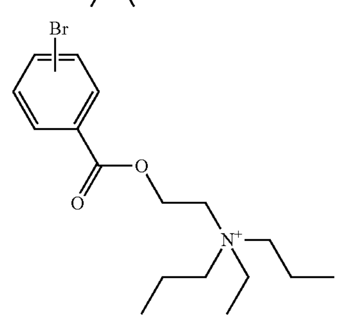
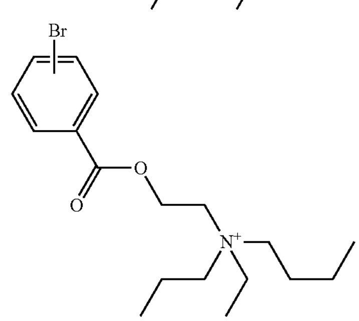

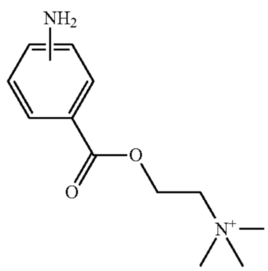
NH2
O
O
N+
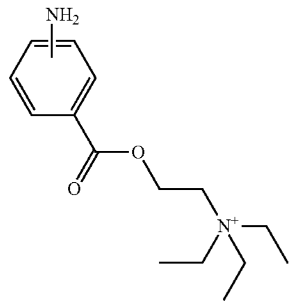
NH2
O
O
N+
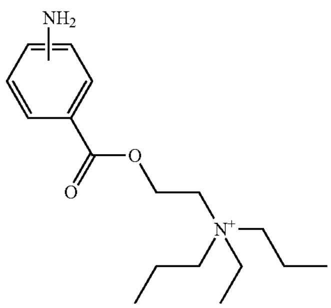
NH2
O
O
N+
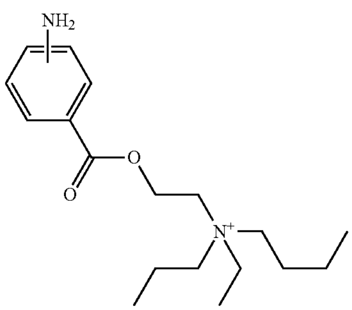
NH2
O
O
N+
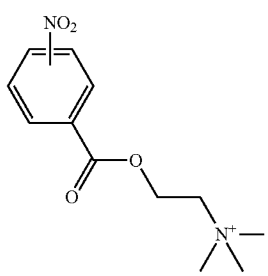
NO2
O
O
N+
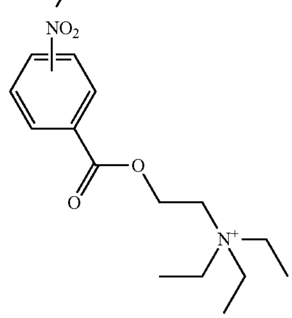
NO2
O
O
N+
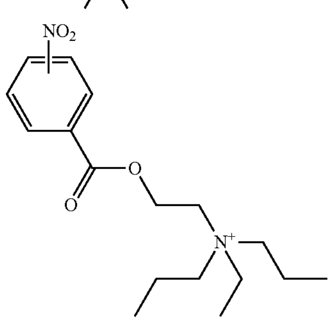
NO2
O
O
N+
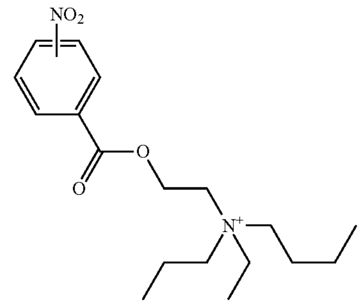
NO2
O
O
N+
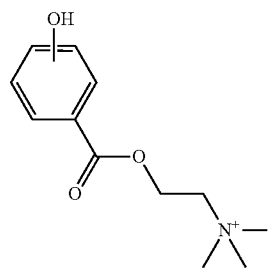
OH
O
O
N+
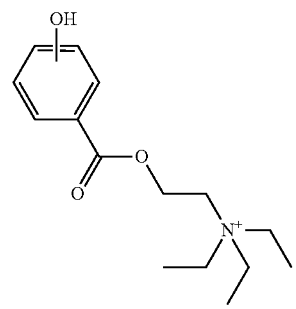
OH
O
O
N+
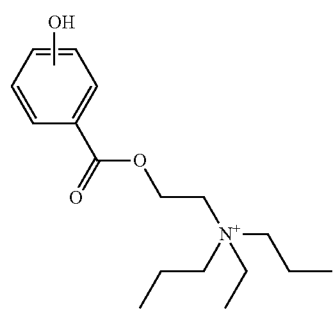
OH
O
O
N+
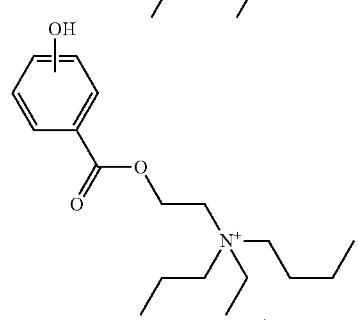
OH
O
O
N+
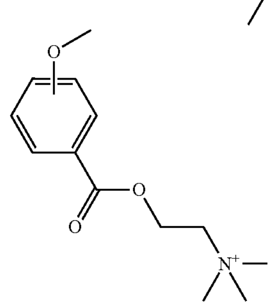
O
O
O
N+
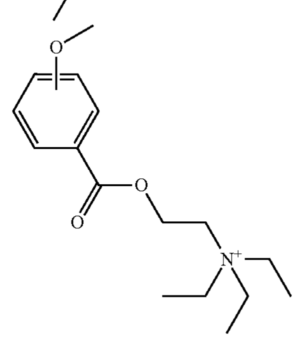
O
O
O
N+

-continued
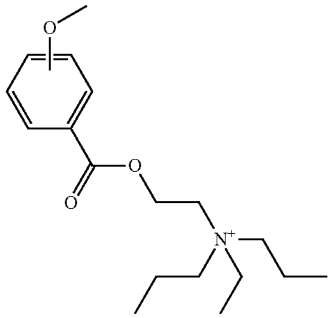
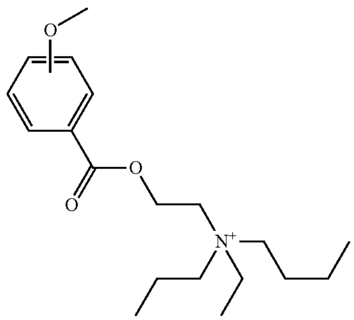
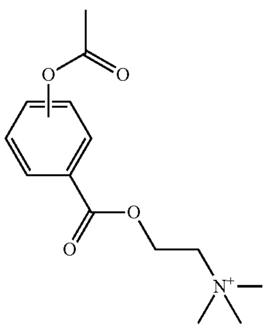
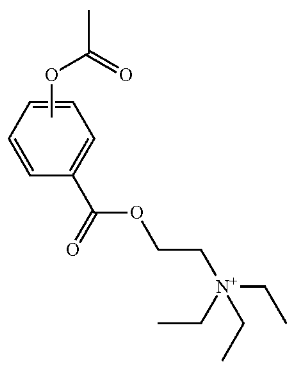
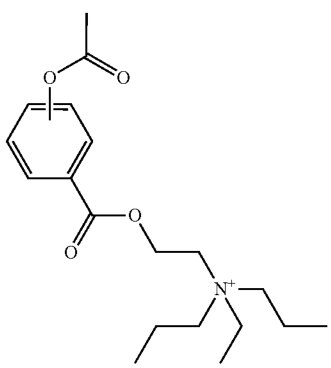
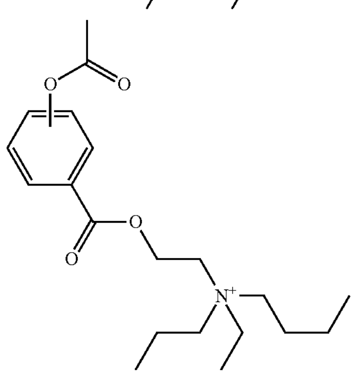
-continued
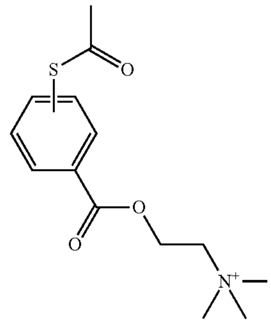
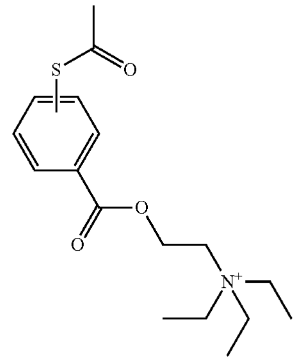
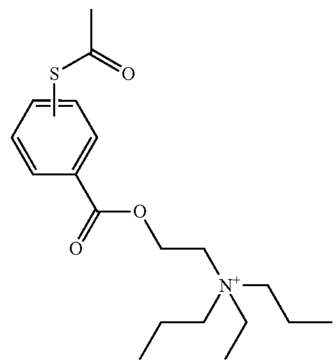
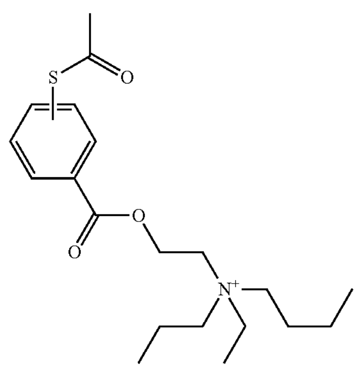
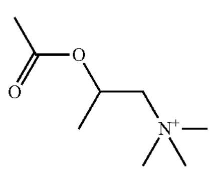
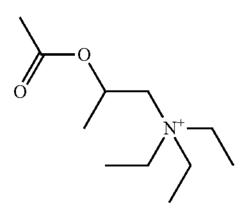
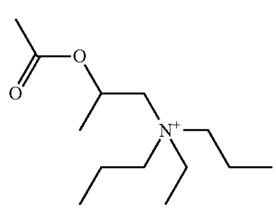
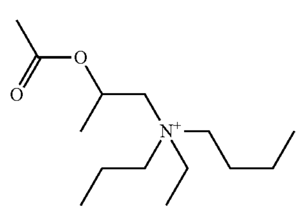

-continued
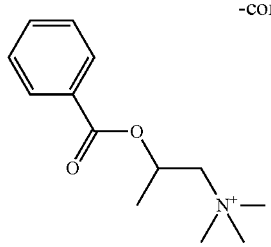
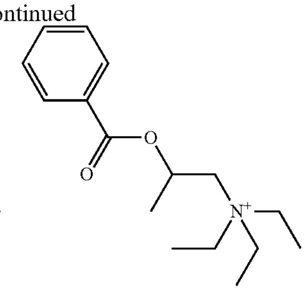
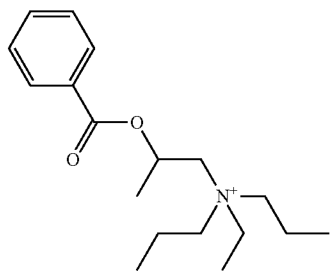
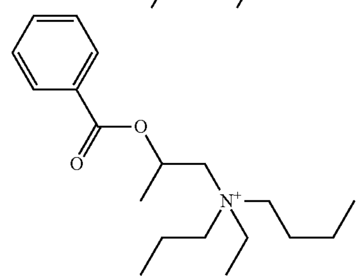
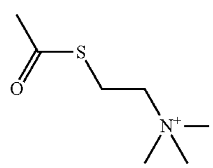
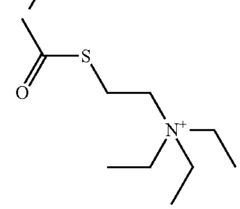
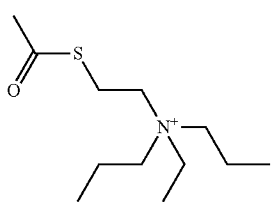
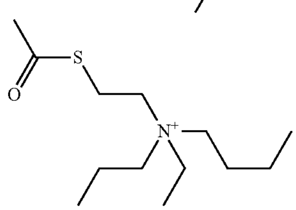
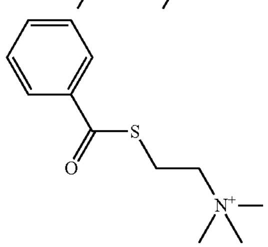
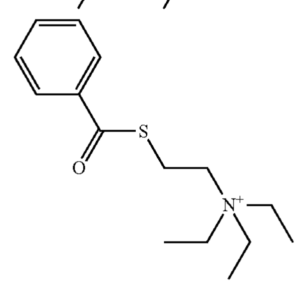
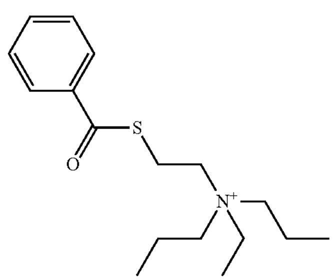
-continued
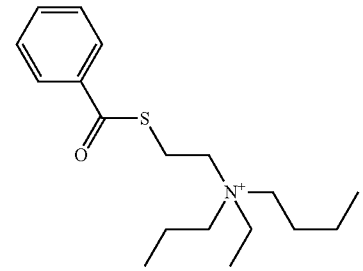
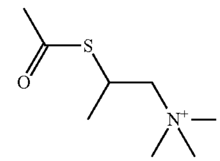
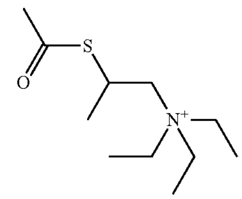
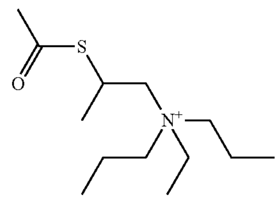
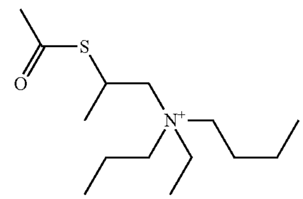
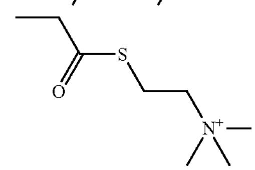
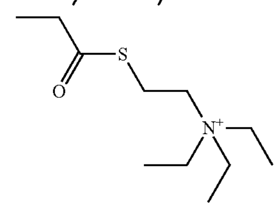
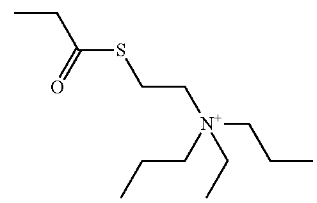
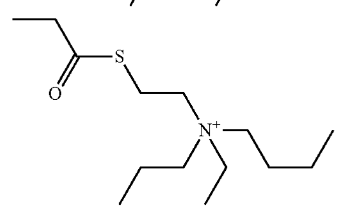
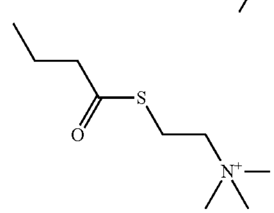
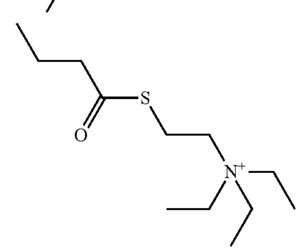
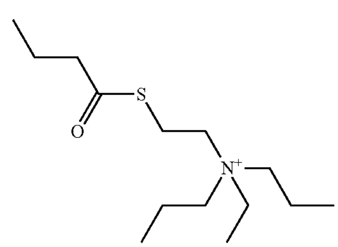

-continued
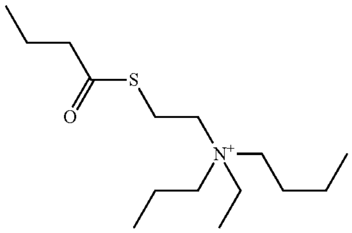
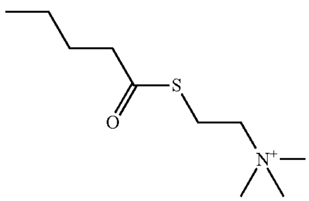
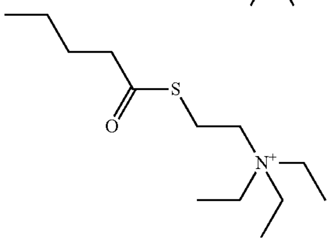
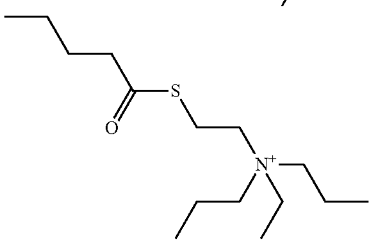
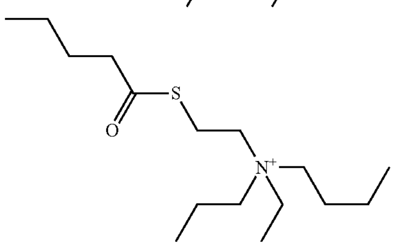
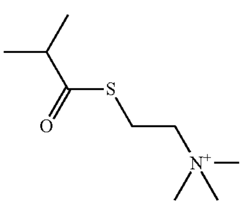
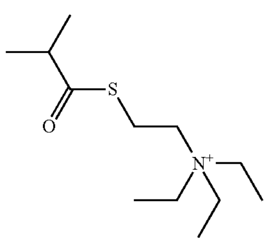
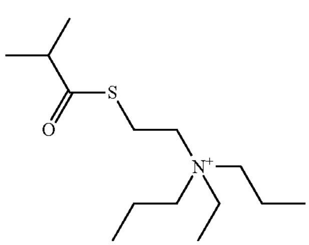
-continued
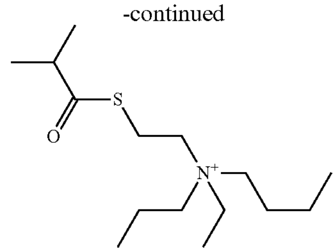
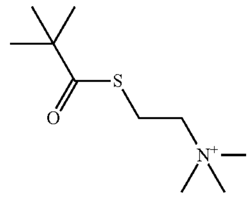
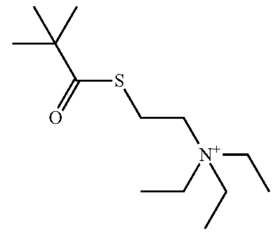
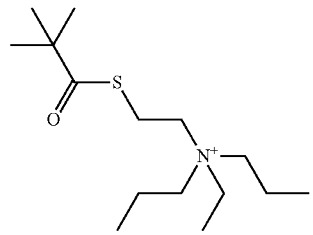
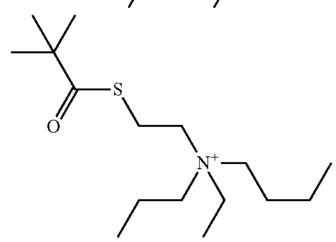
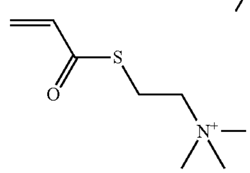
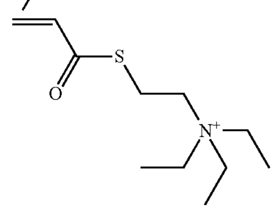
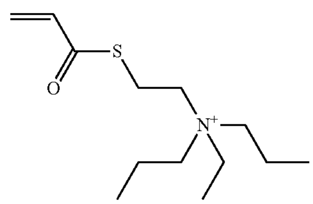
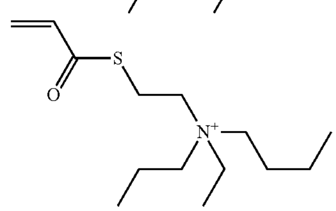
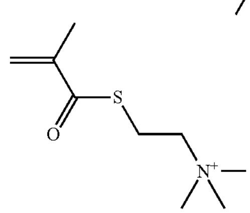
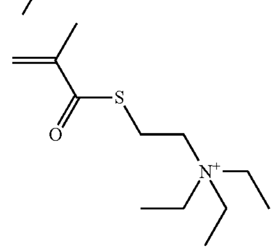

-continued
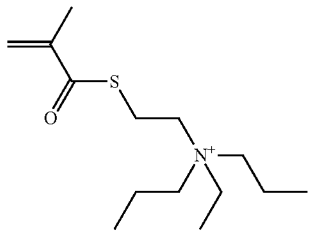
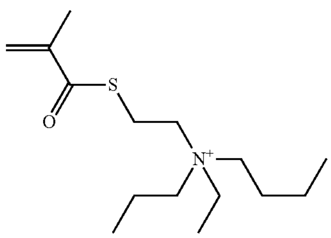
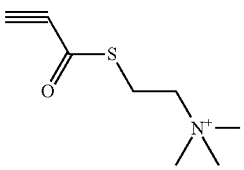
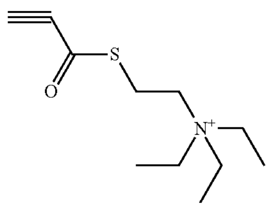
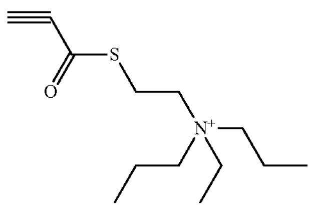
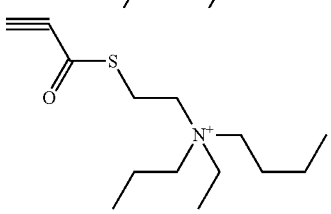
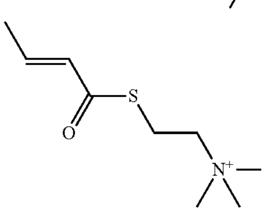
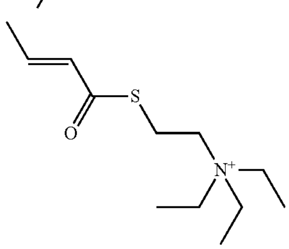
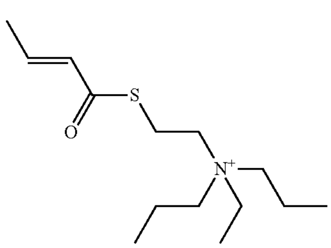
-continued
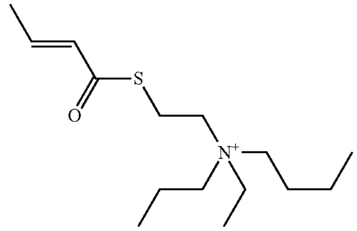
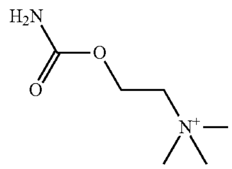
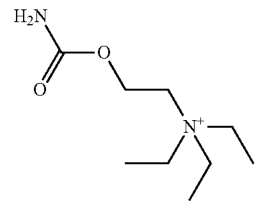
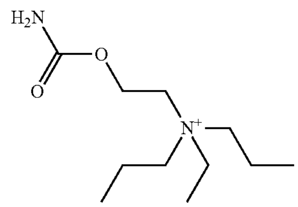
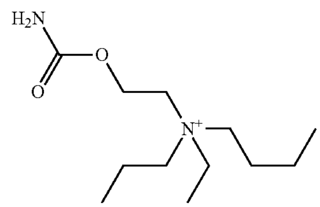
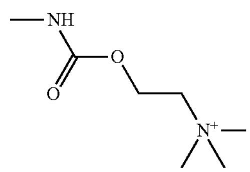
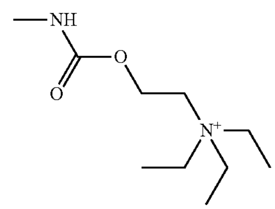
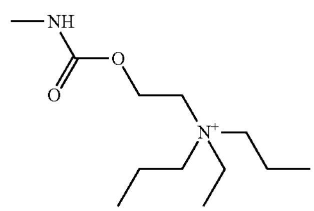
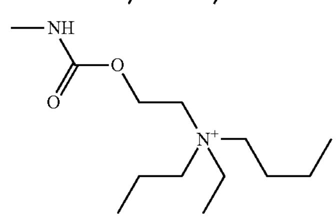
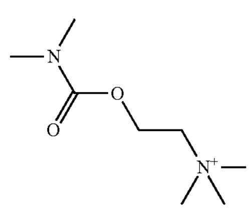
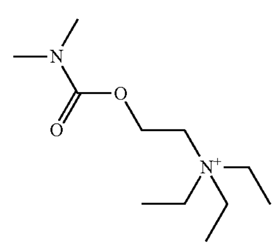

-continued
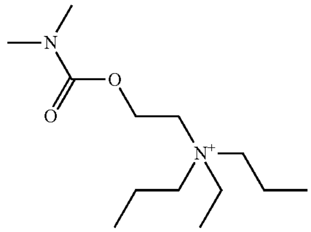
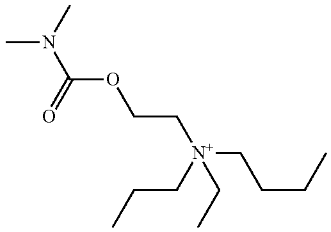
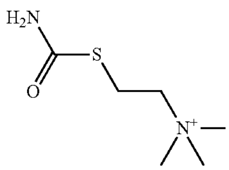
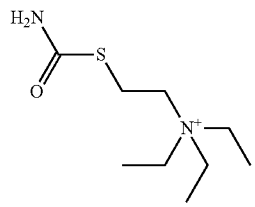
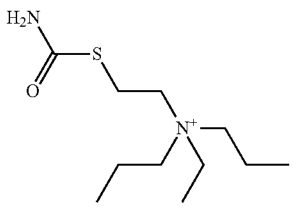
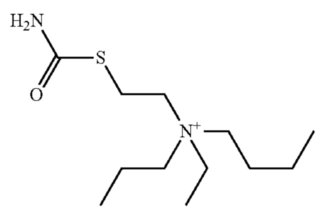
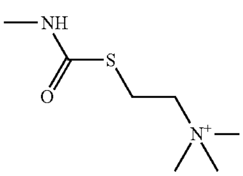
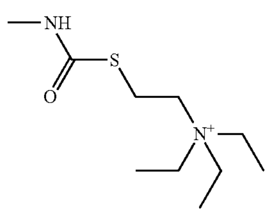
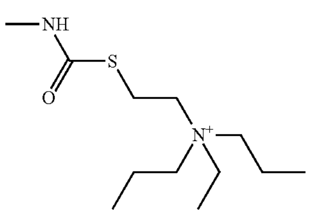
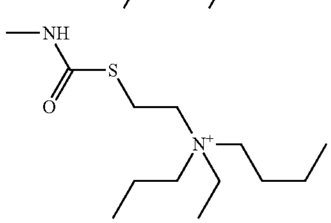
-continued
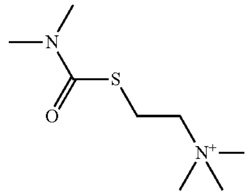
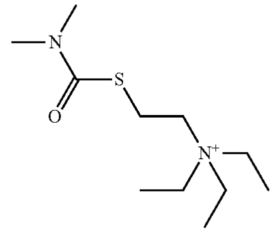
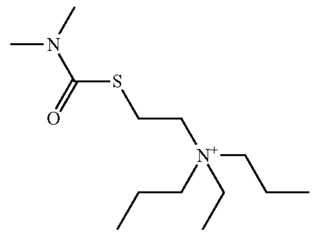
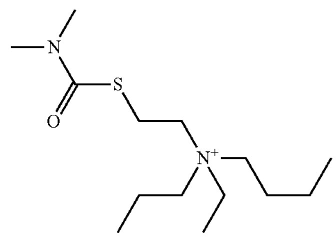
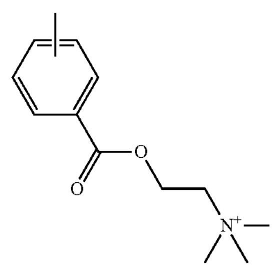
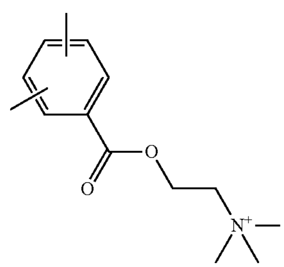
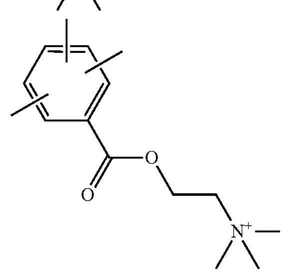
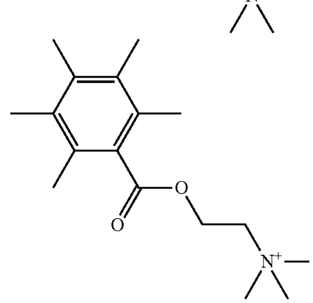

-continued
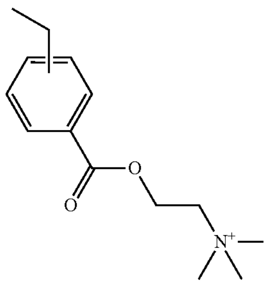
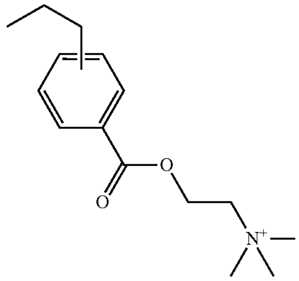
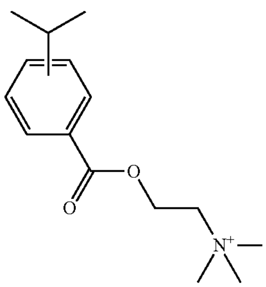
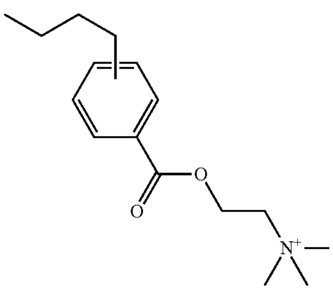
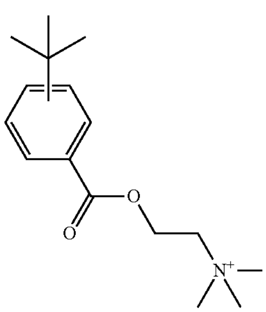
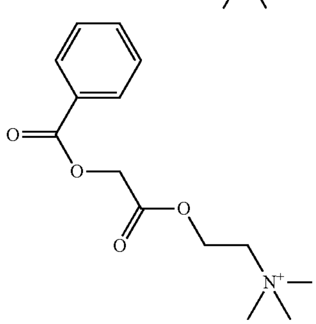
-continued
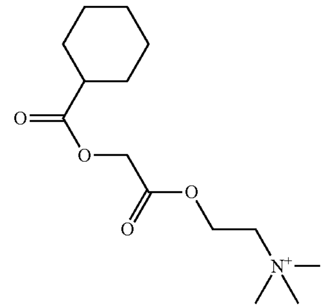
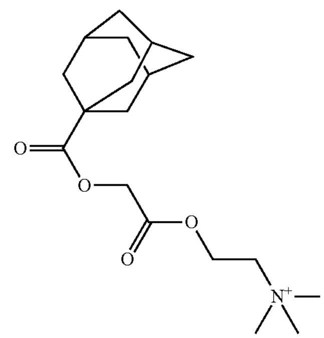
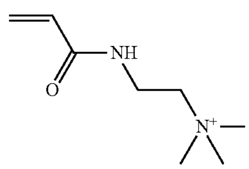
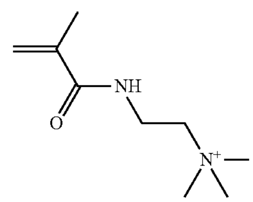
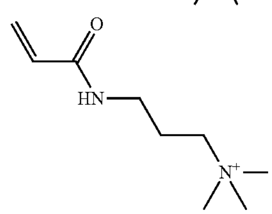
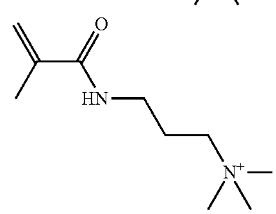
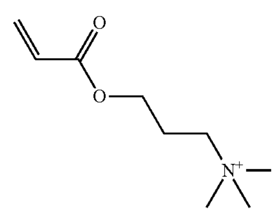
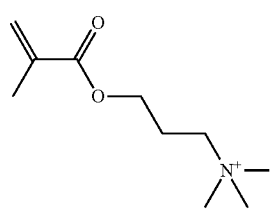
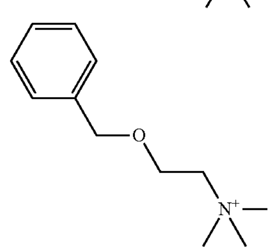
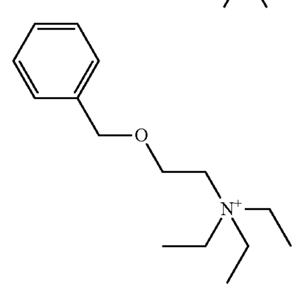

-continued
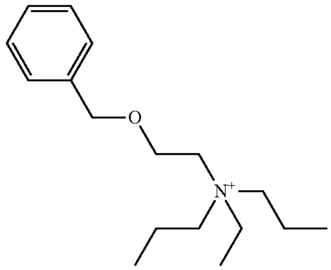
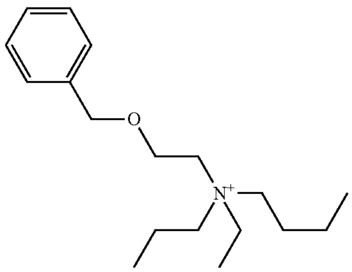
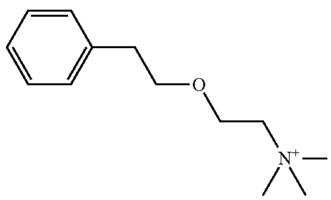
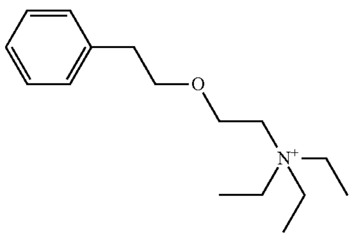
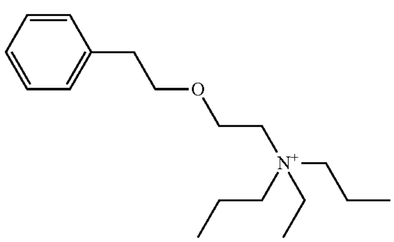
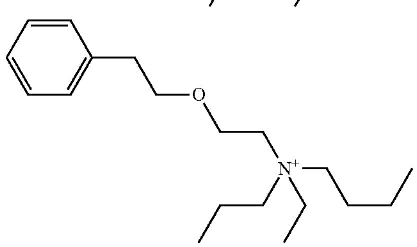
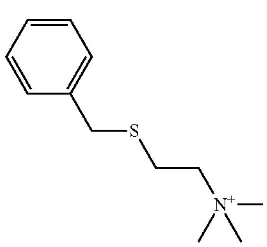
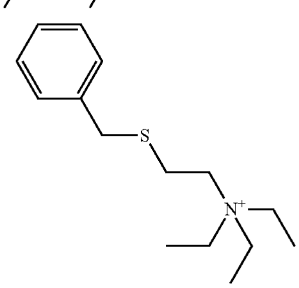
-continued
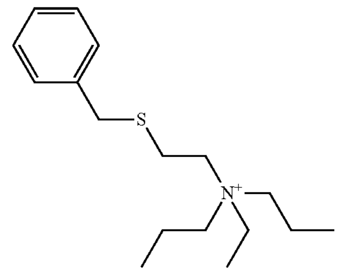
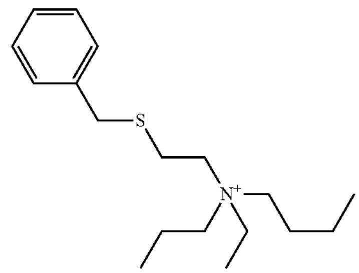
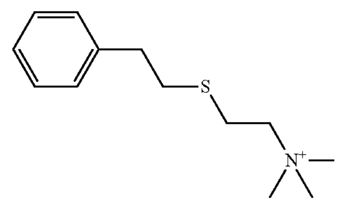
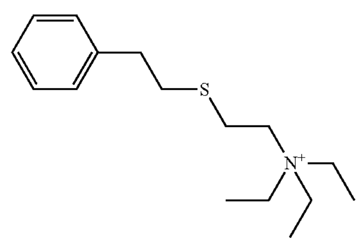
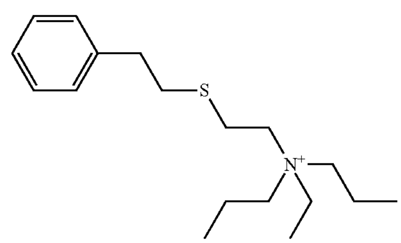
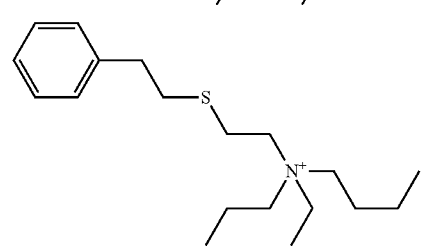
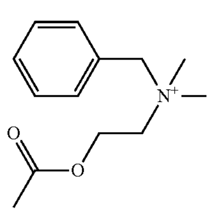
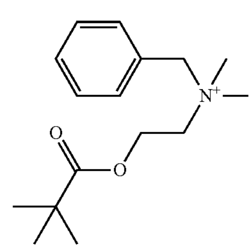

-continued
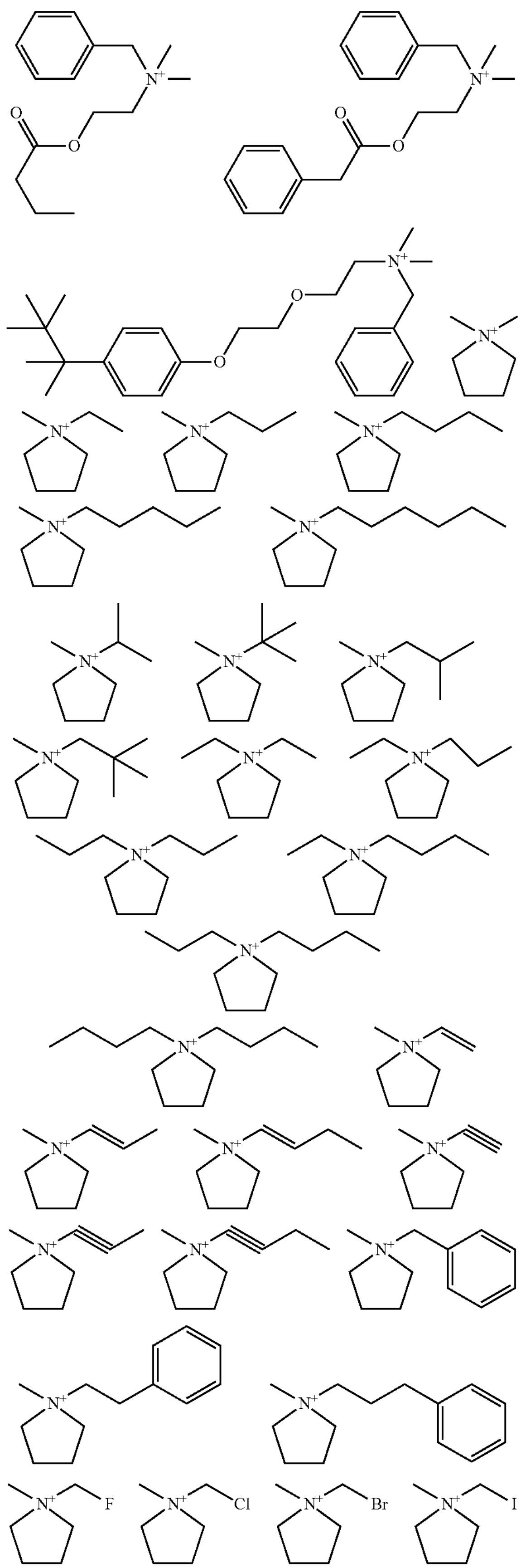
-continued
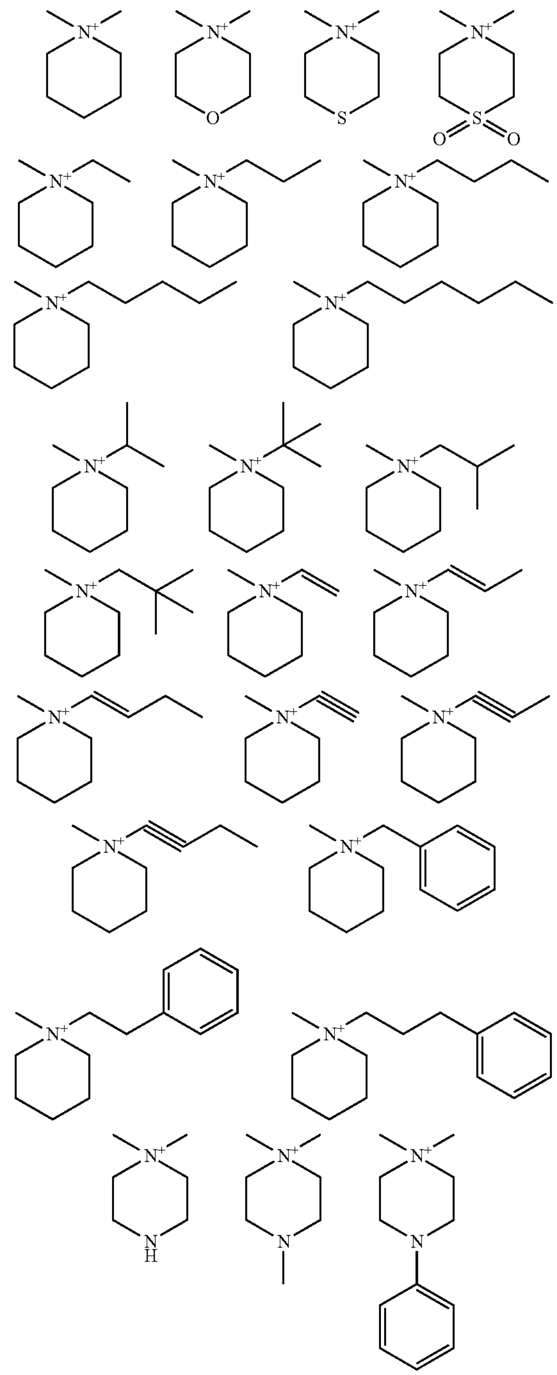
Examples of the amine compound having formula (A)-3 are shown below, but not limited thereto.
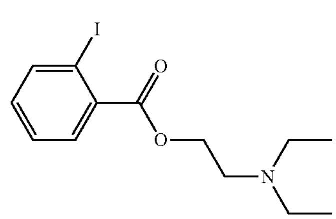

-continued
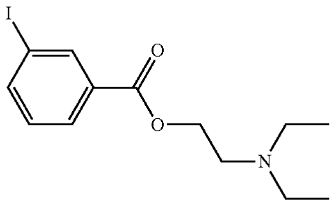
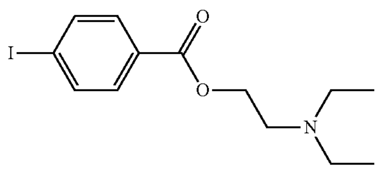
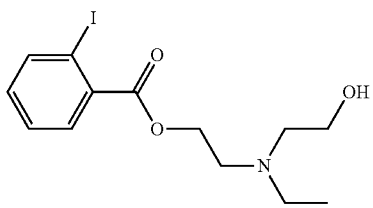
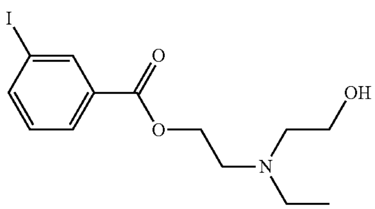
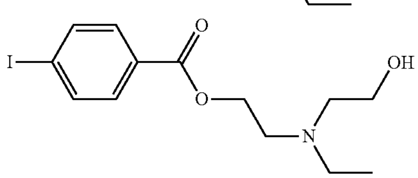
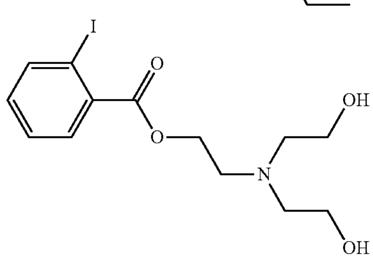
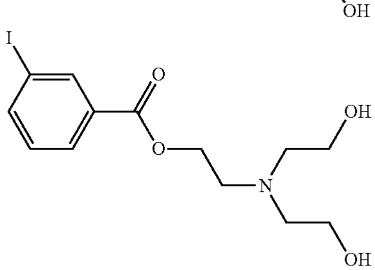
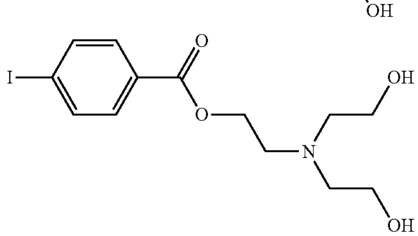
-continued
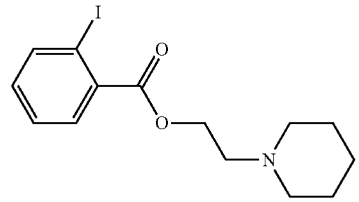
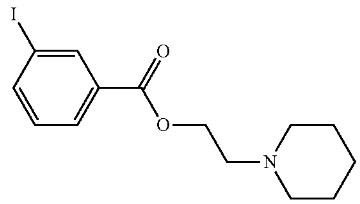
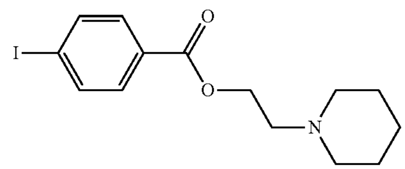
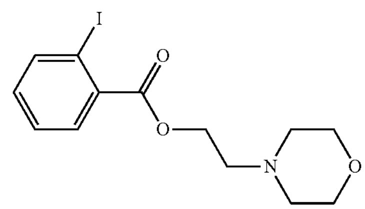
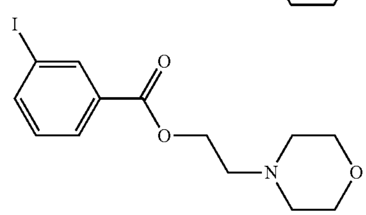
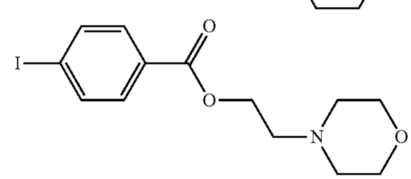
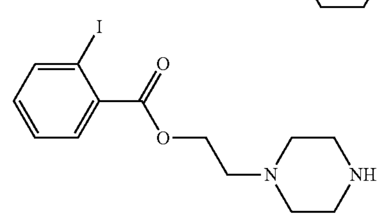
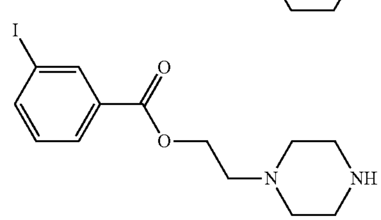
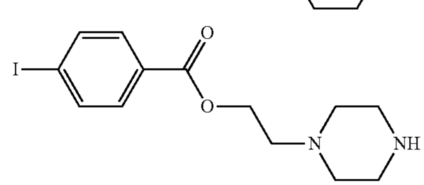

-continued
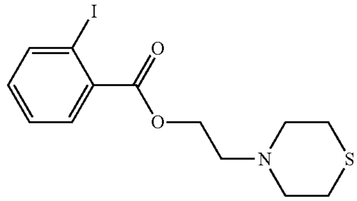
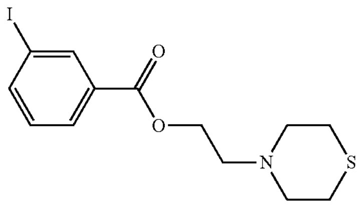
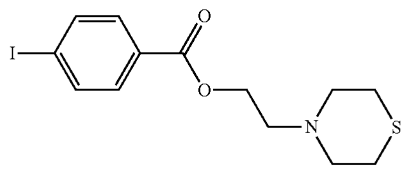
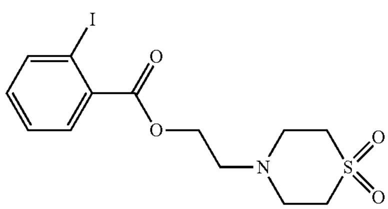
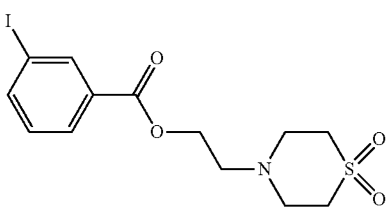
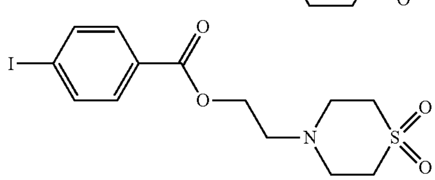
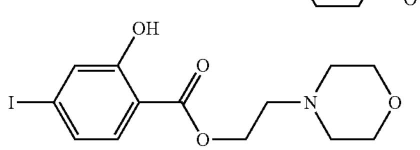
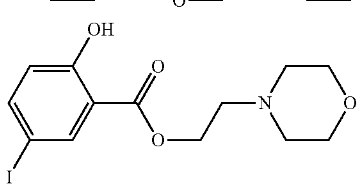
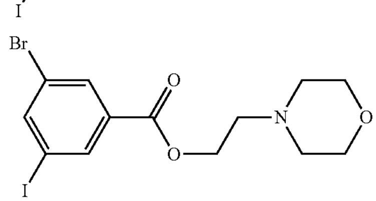
-continued
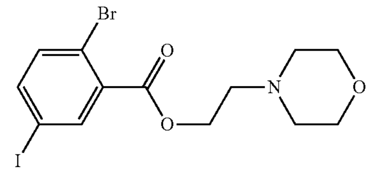
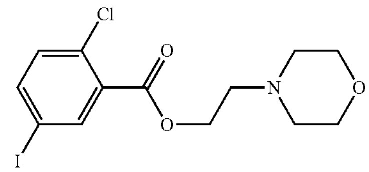
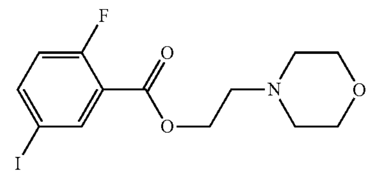
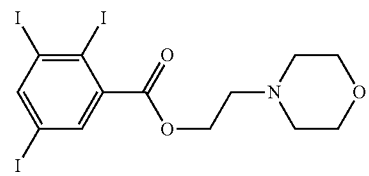
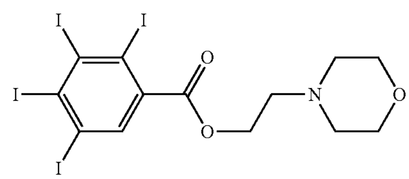
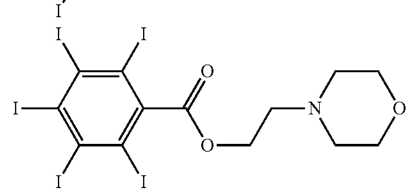
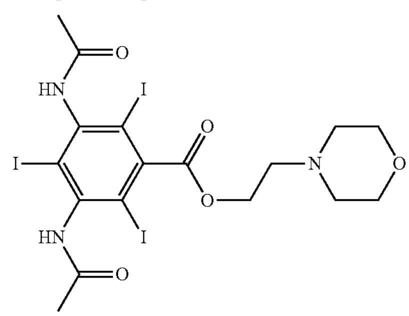
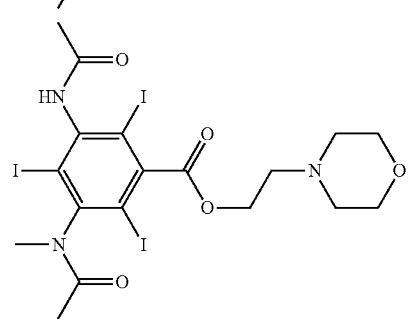

-continued
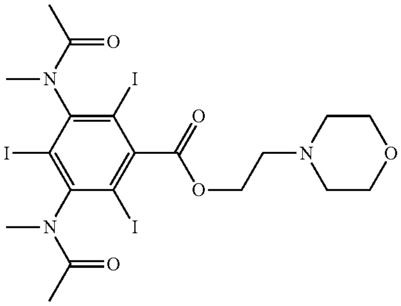
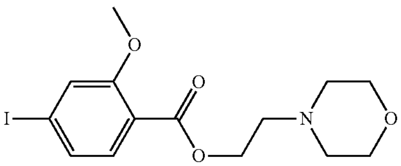
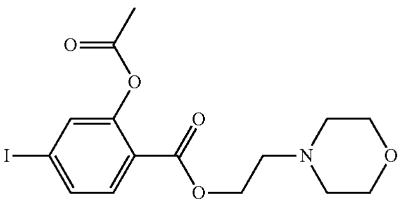
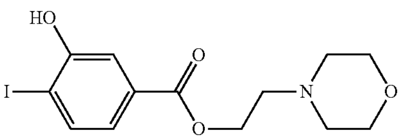
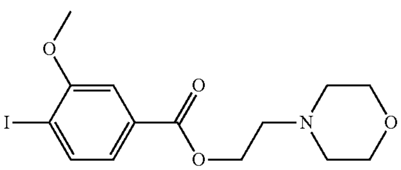
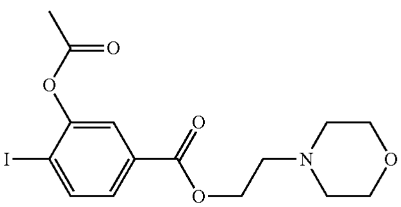
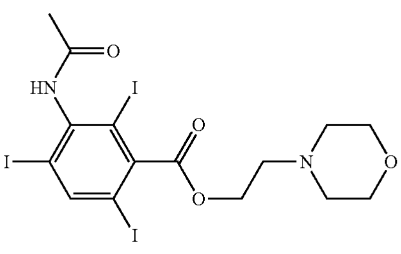
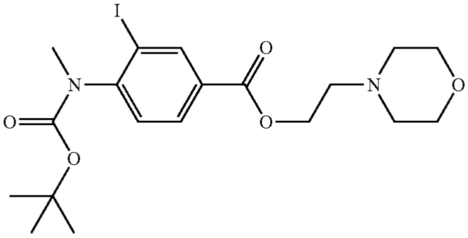
-continued
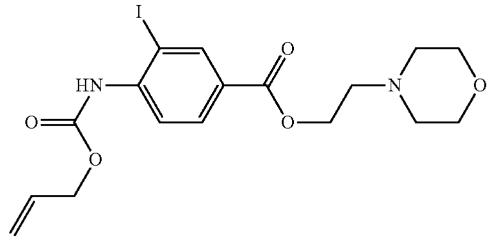
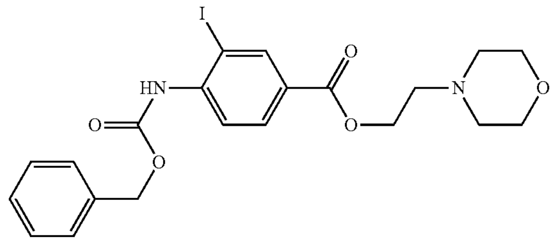
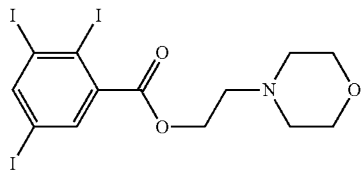
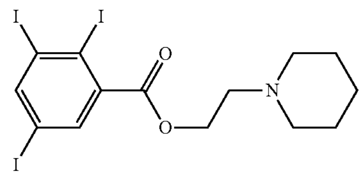
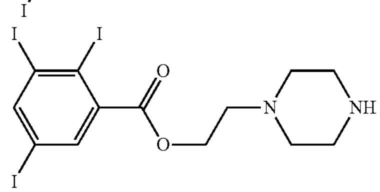
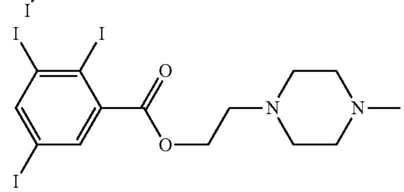
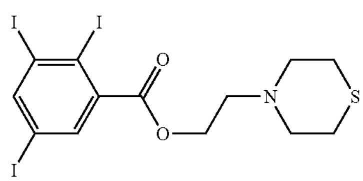
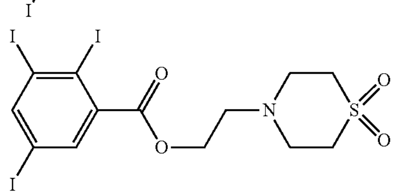
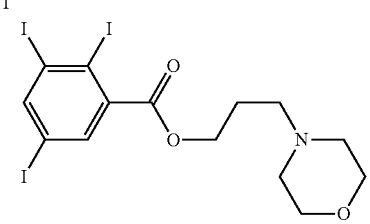

-continued
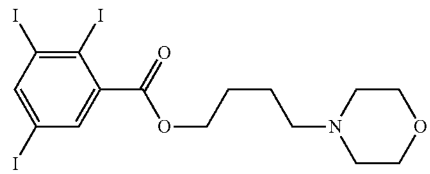
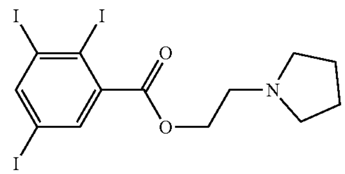
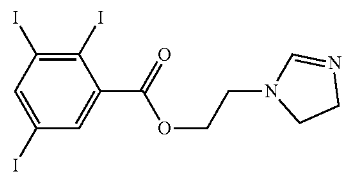
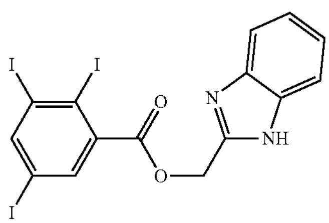
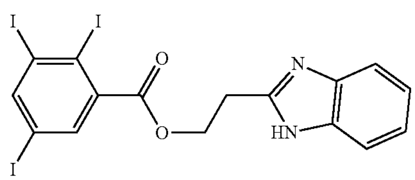
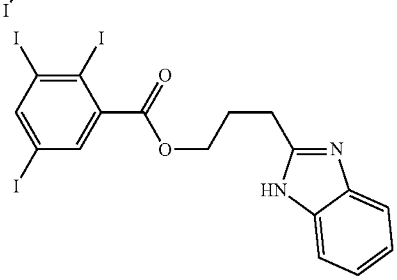
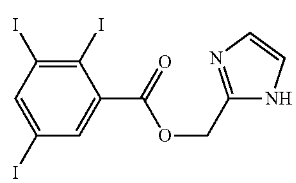
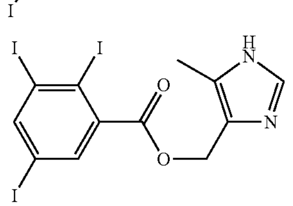
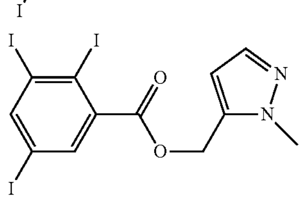
-continued
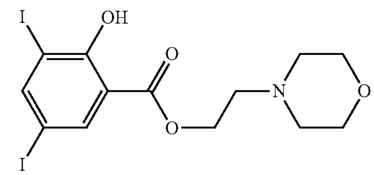
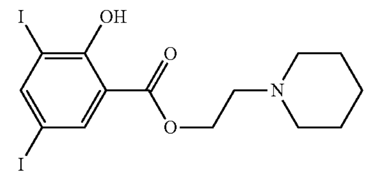
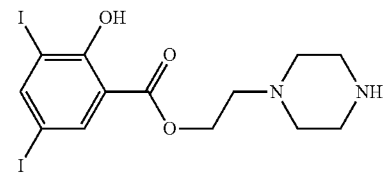
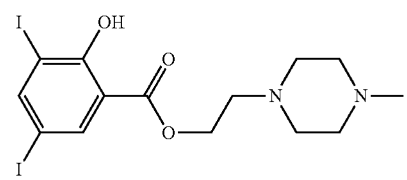
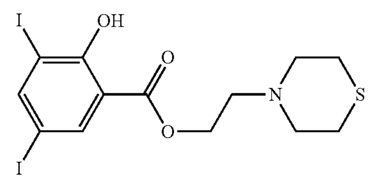
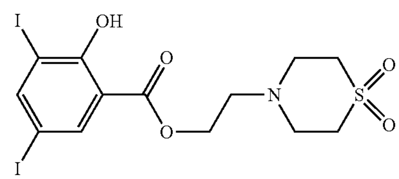
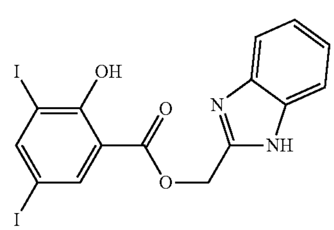
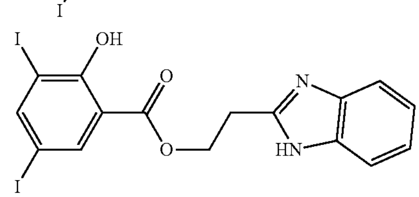
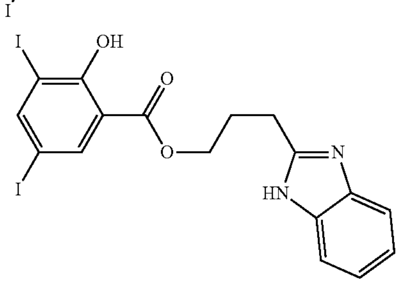

-continued
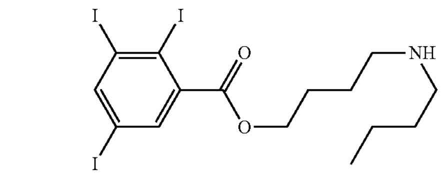
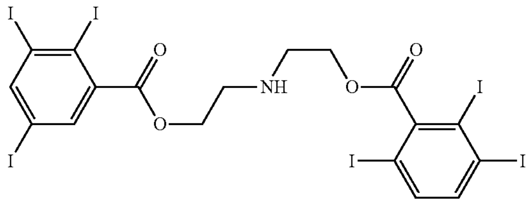
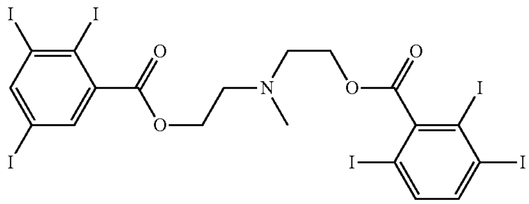
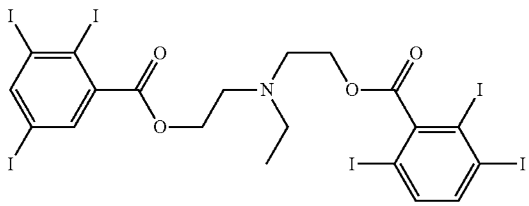
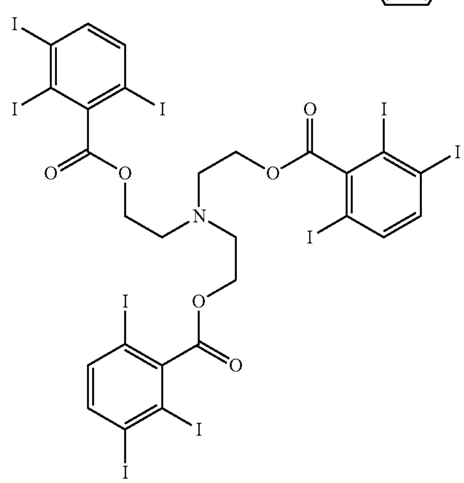
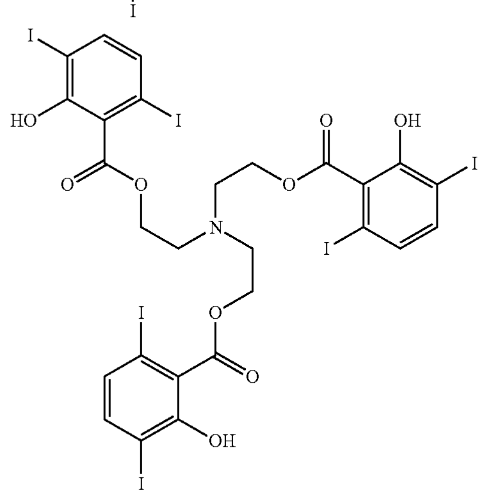
-continued
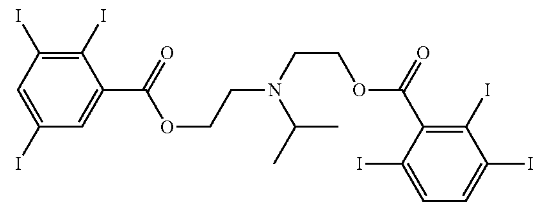
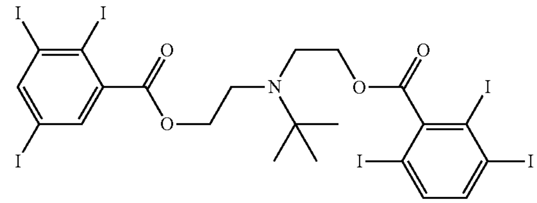
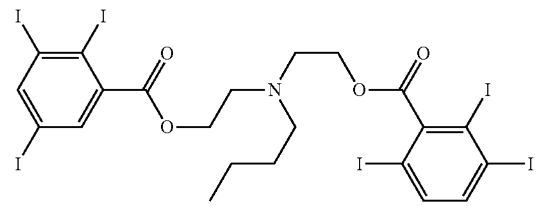
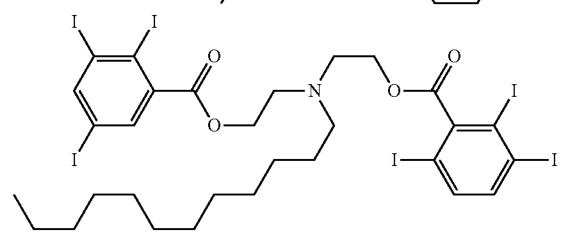
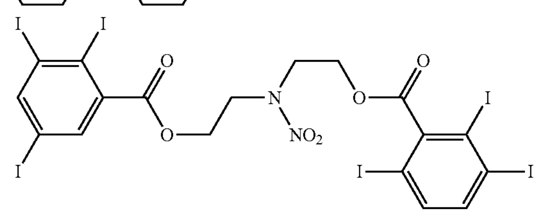
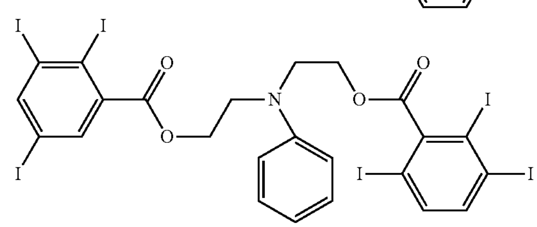
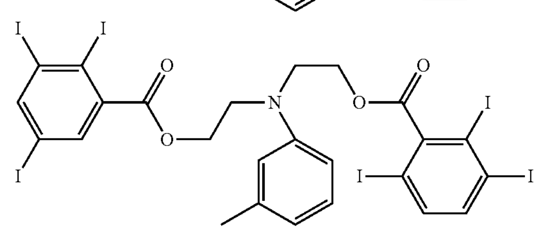
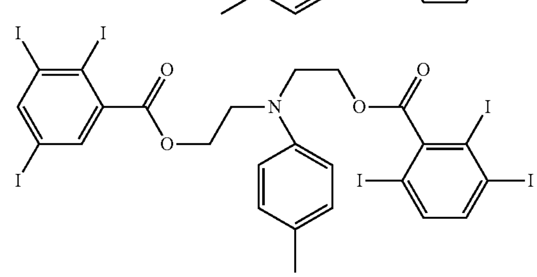

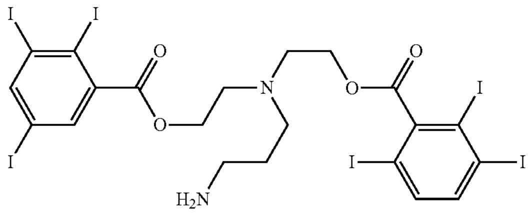
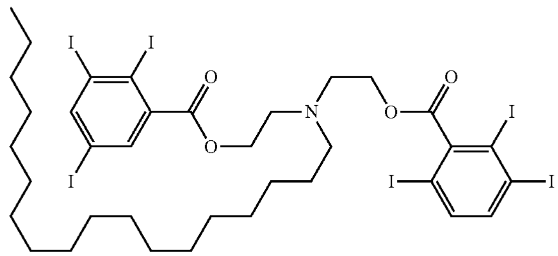
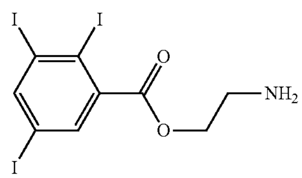
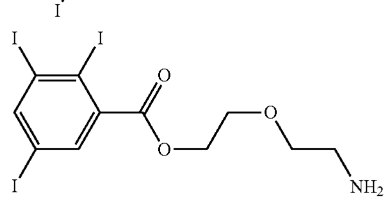
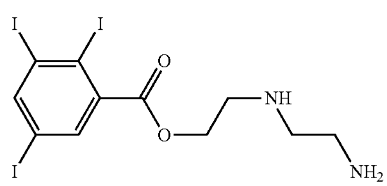
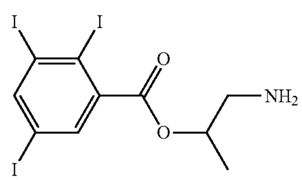
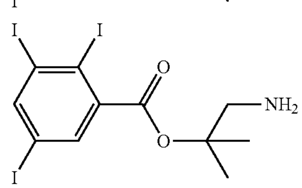
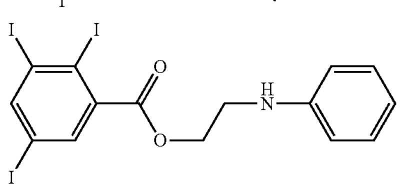
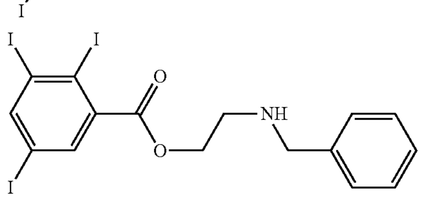
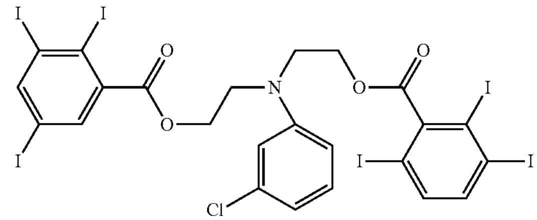
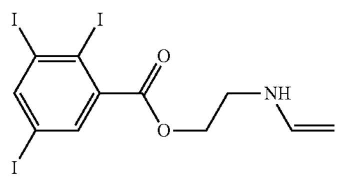
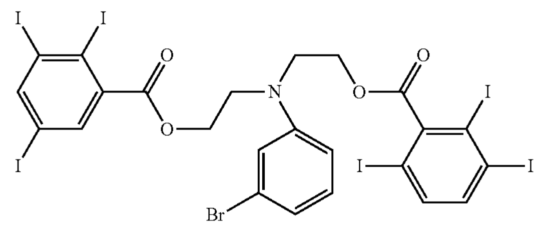
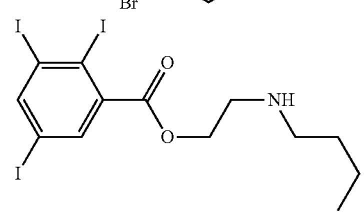
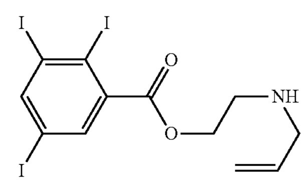
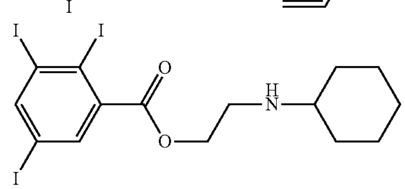
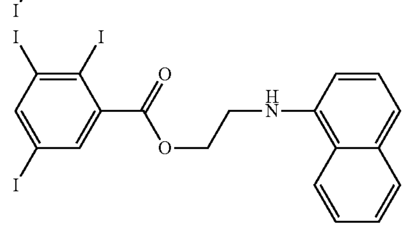
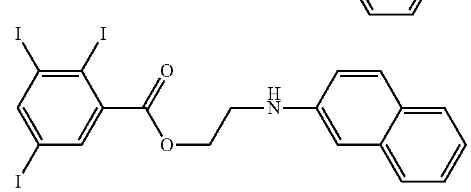

-continued
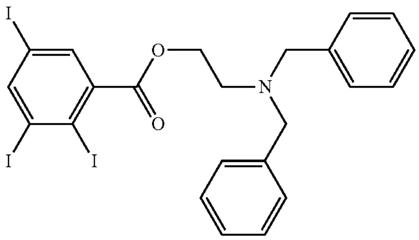
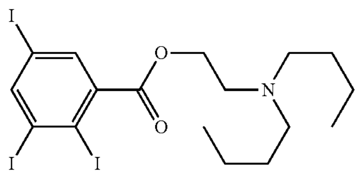
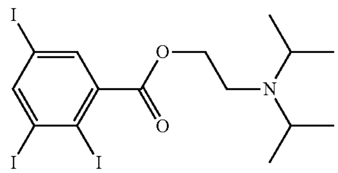
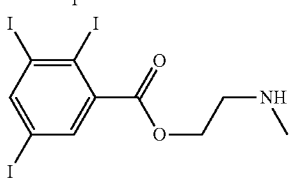
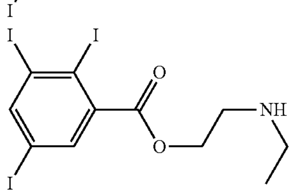
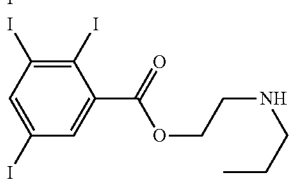
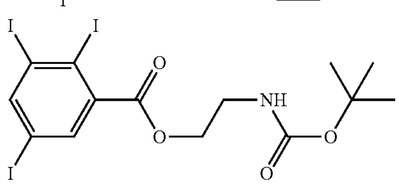
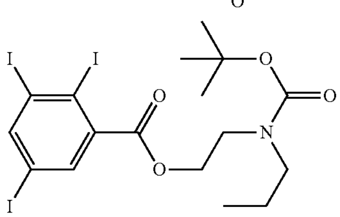
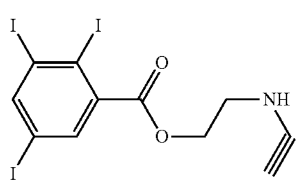
-continued
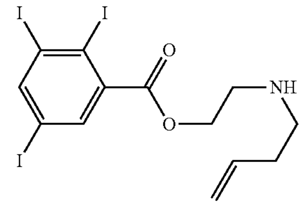
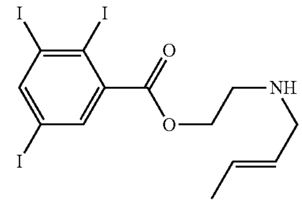
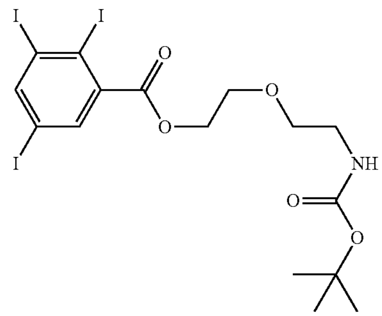
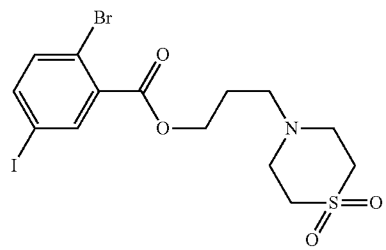
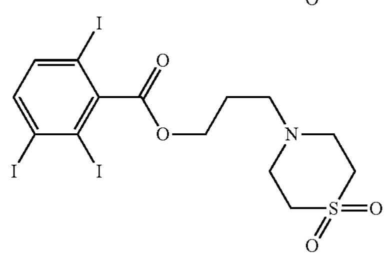
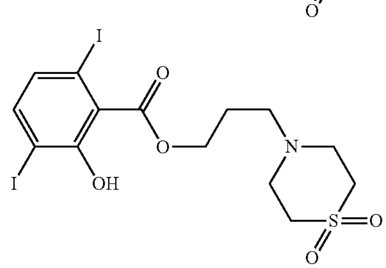
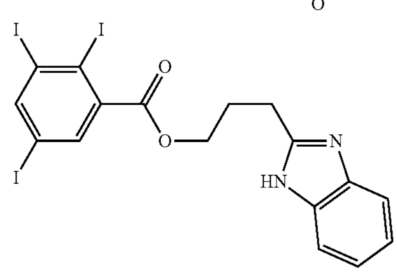

-continued
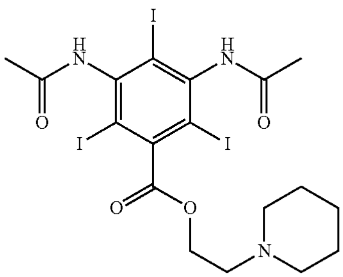
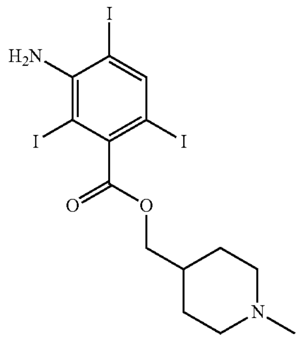
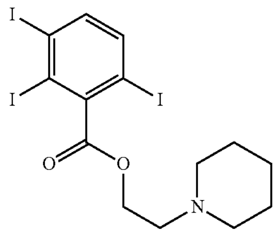
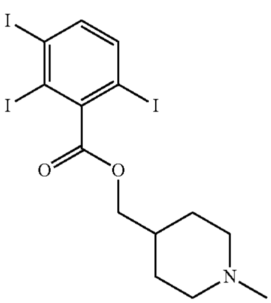
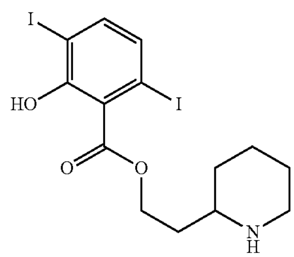
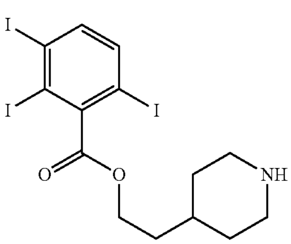
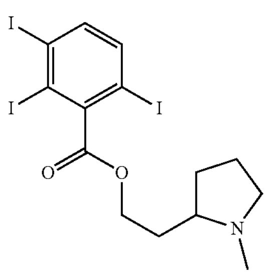
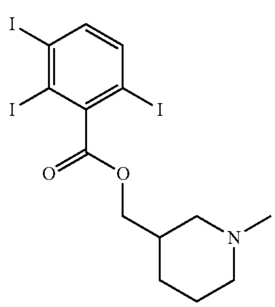
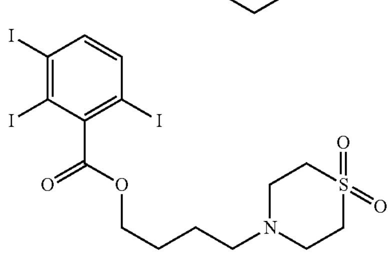
-continued
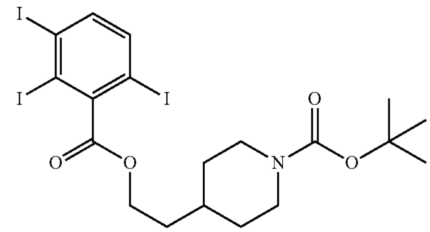
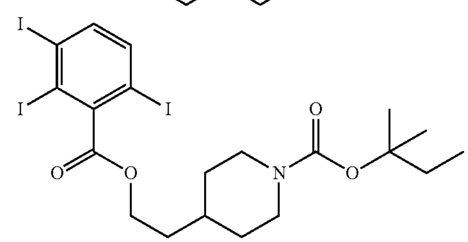
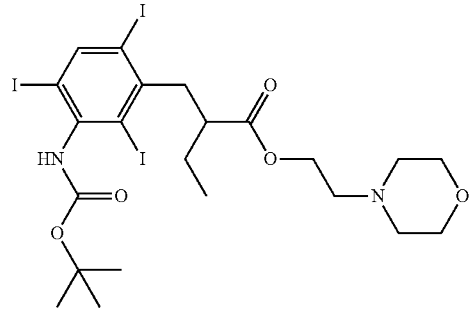
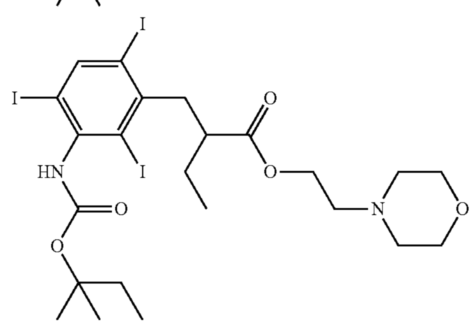
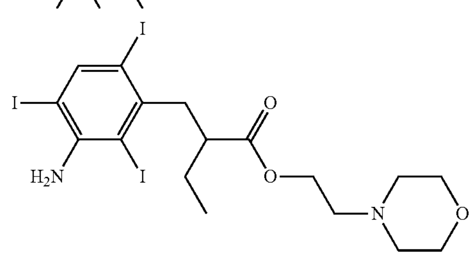
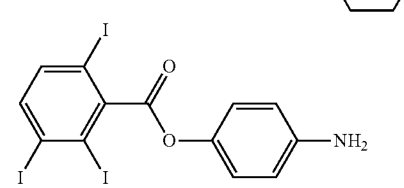
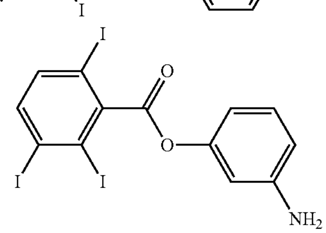

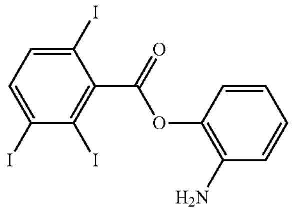
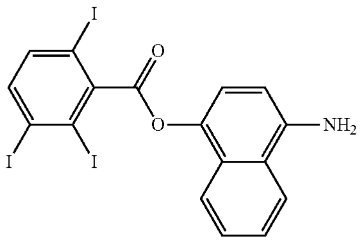
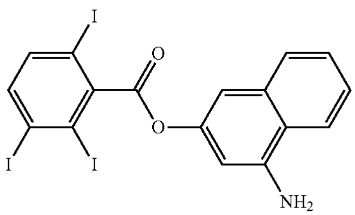
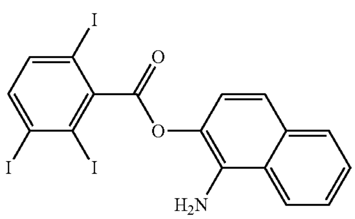
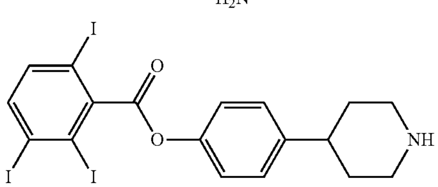
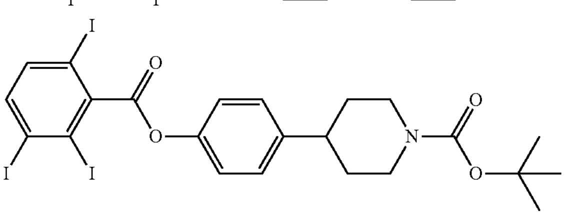
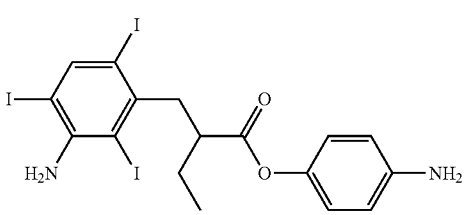
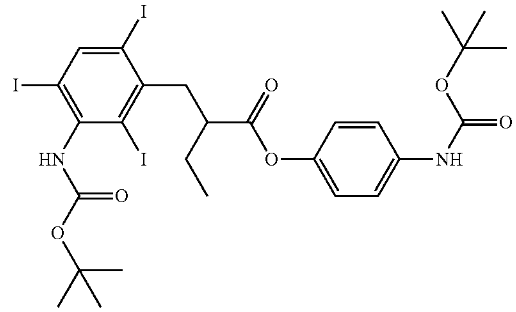
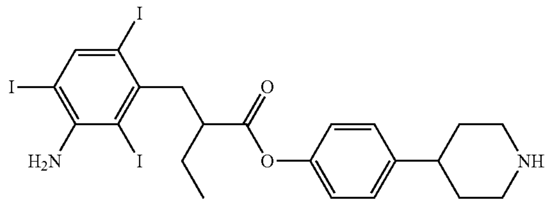
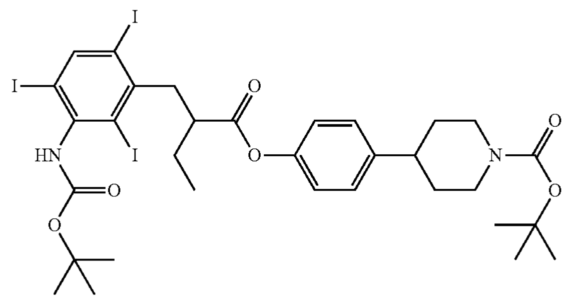
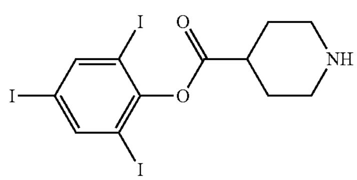
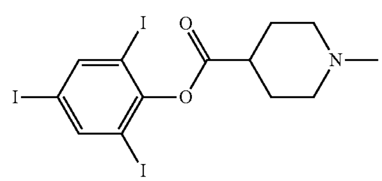
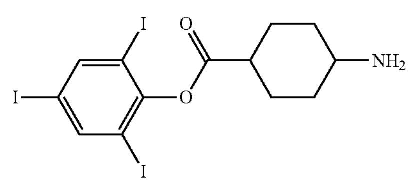
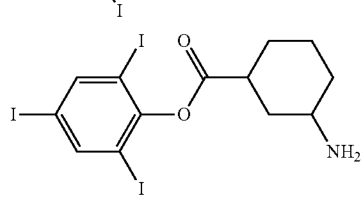
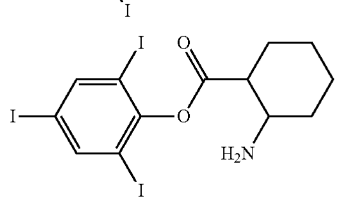

-continued
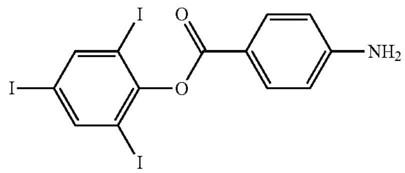
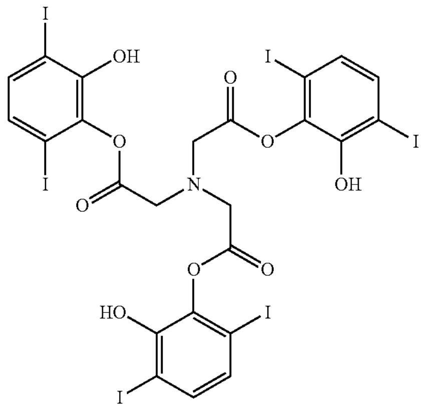
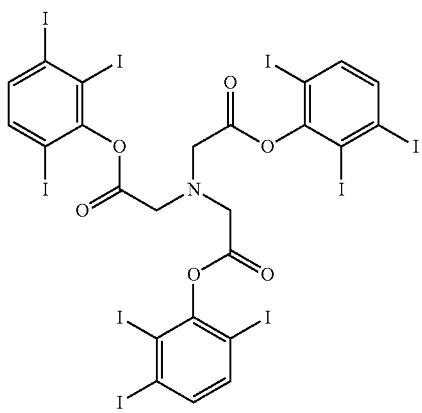
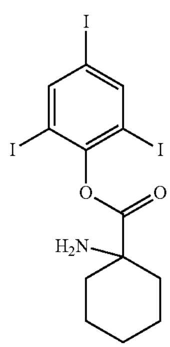
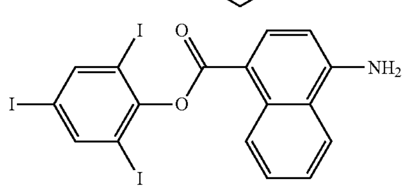
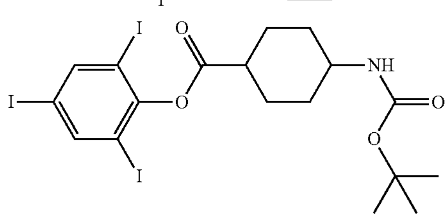
-continued
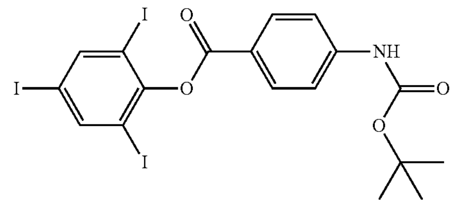
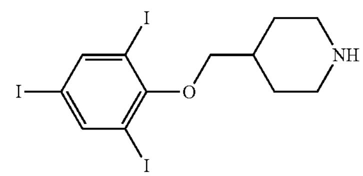
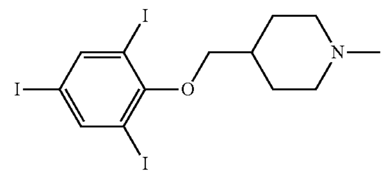
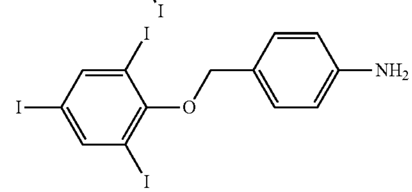
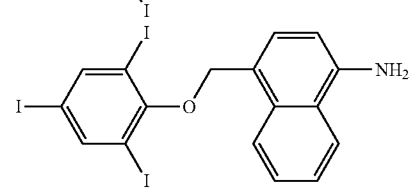
Examples of the cation of the ammonium salt having formula (A)-4 are shown below, but not limited thereto.
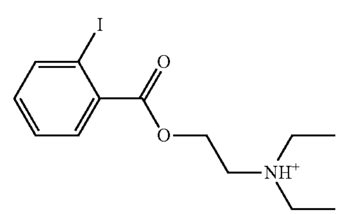
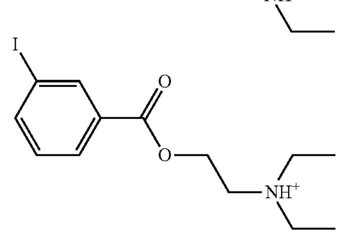
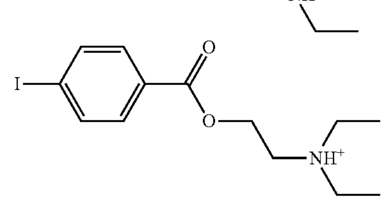

-continued
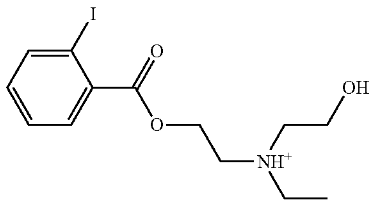
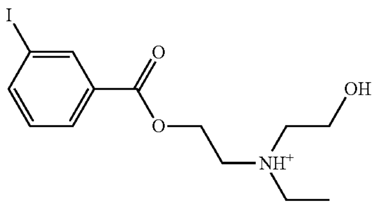
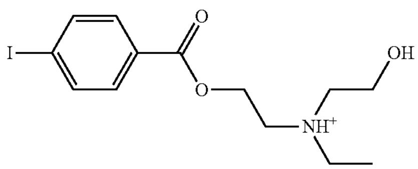
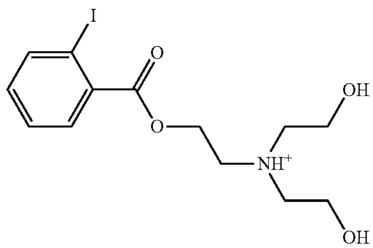
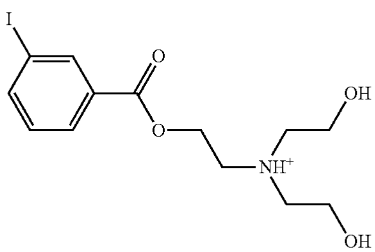
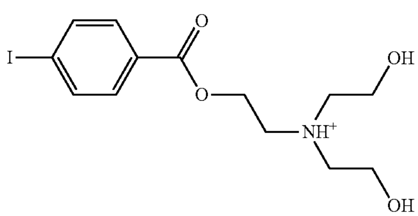
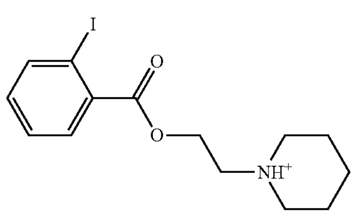
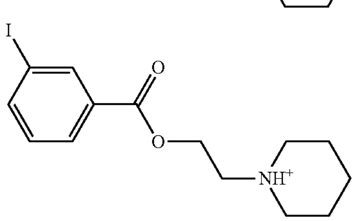
-continued
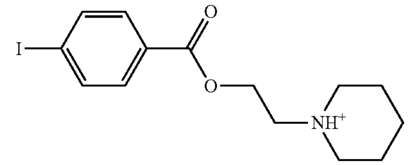
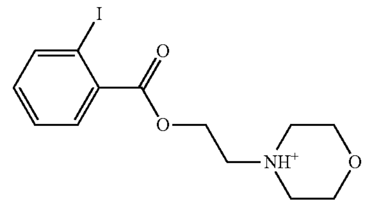
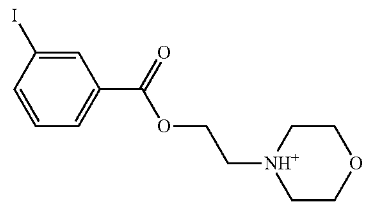
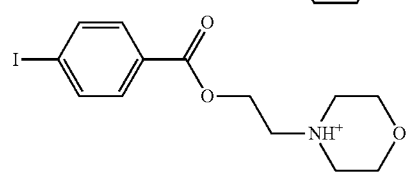
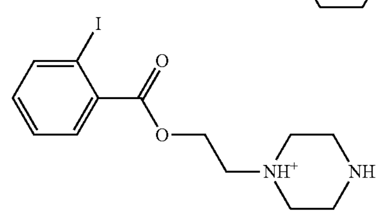
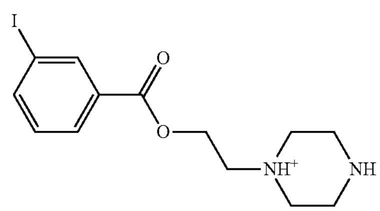
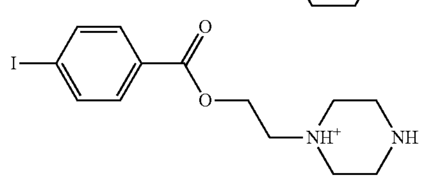
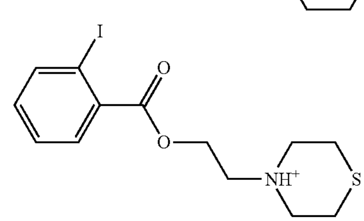
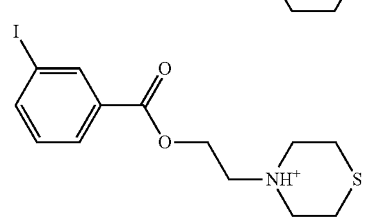

-continued
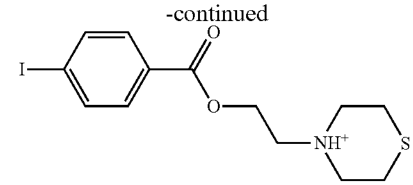
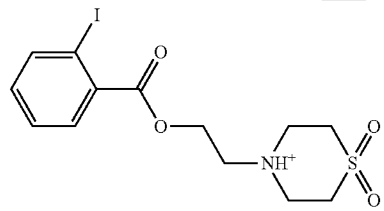
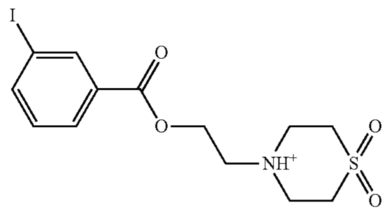
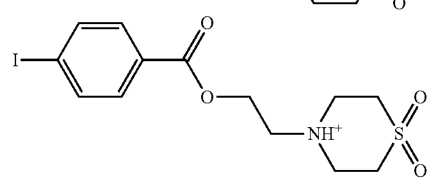
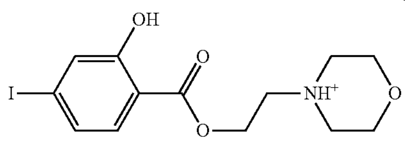
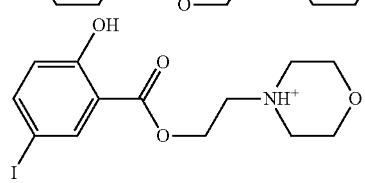
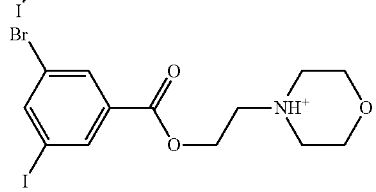
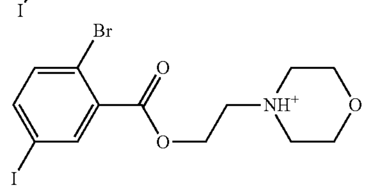
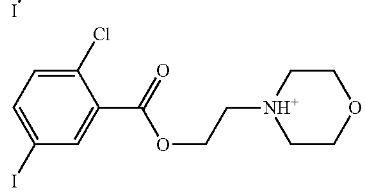
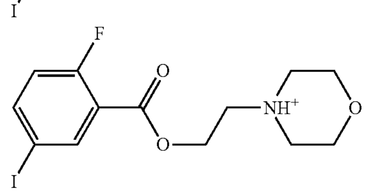
-continued
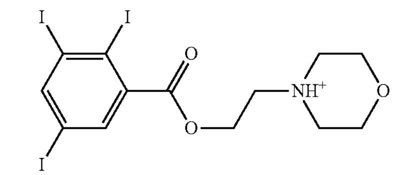
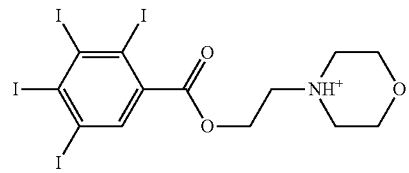
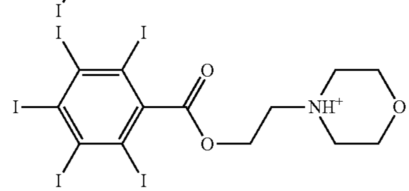
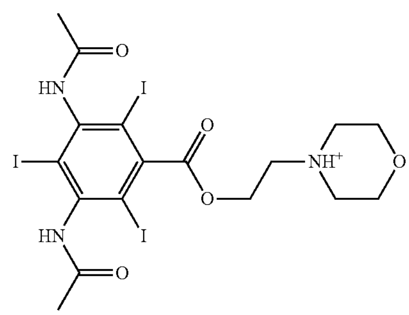
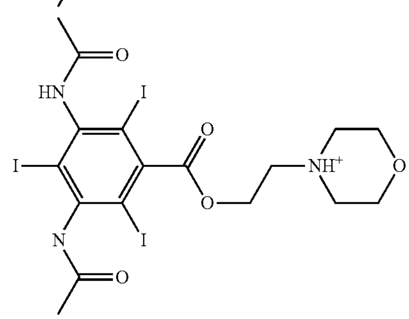
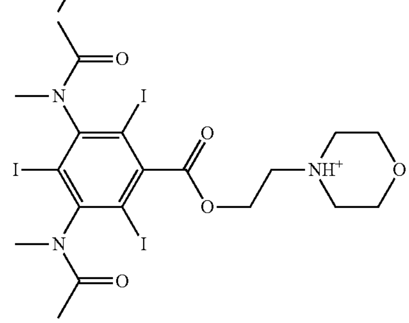
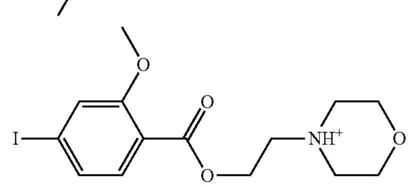

-continued
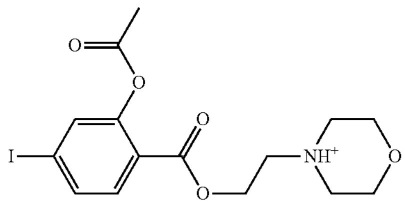
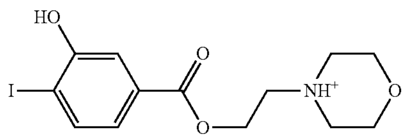
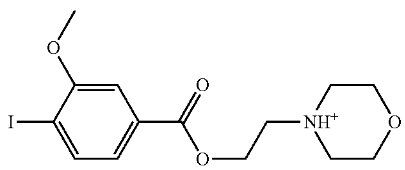
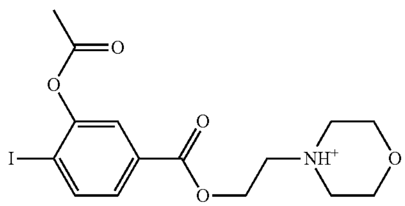
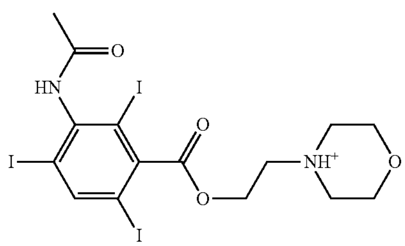
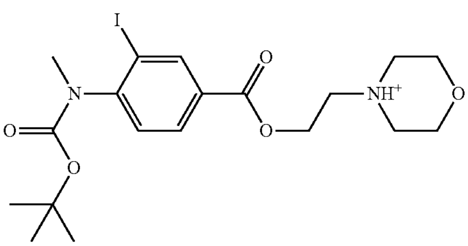
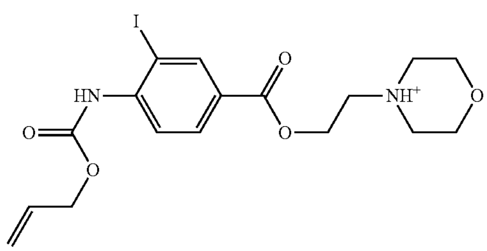
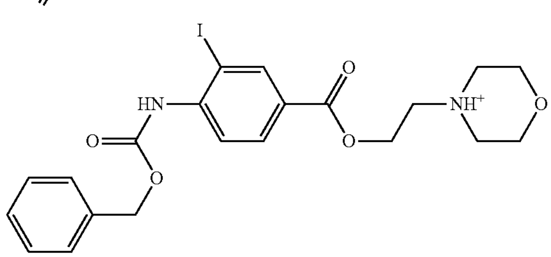
-continued
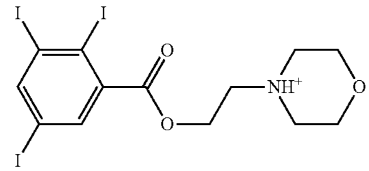
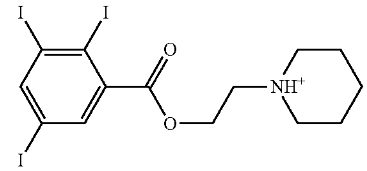
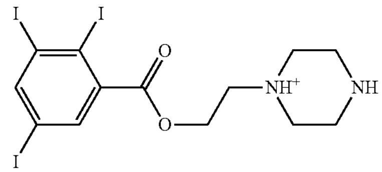
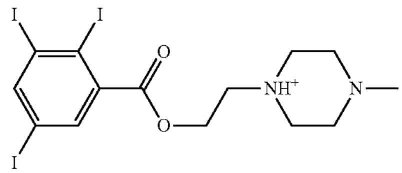
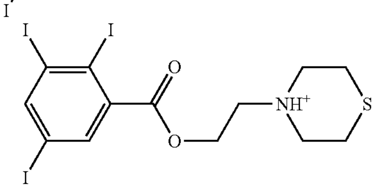
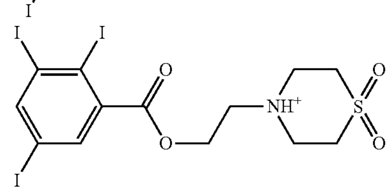
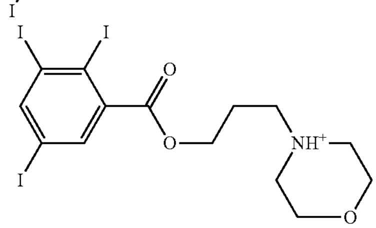
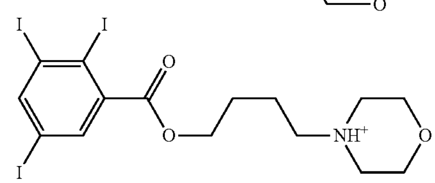
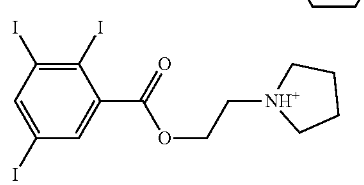
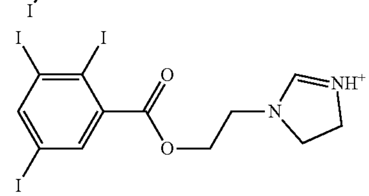

-continued
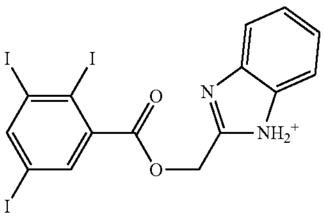
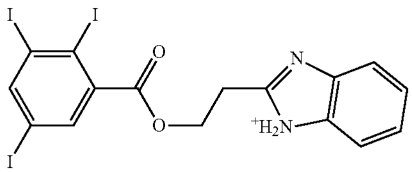
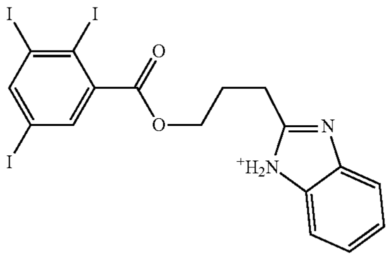
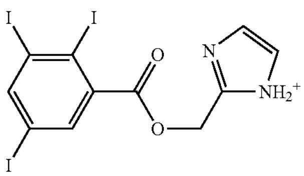
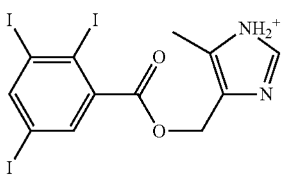
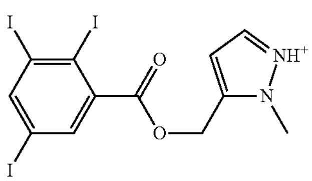
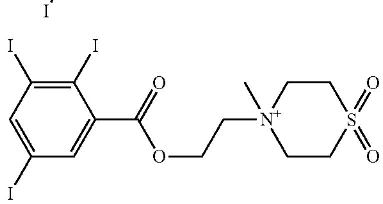
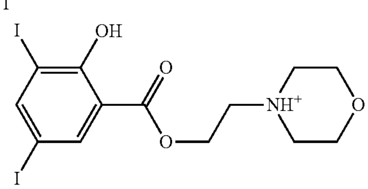
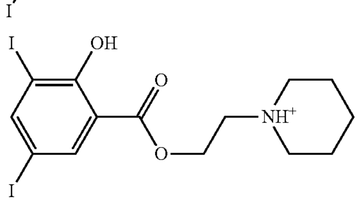
-continued
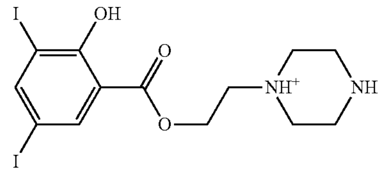
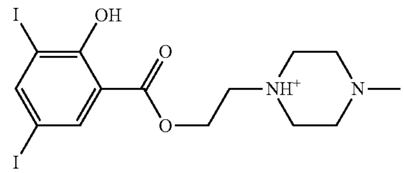
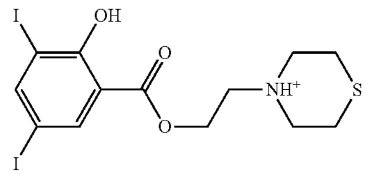
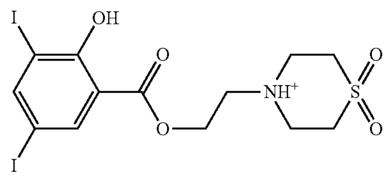
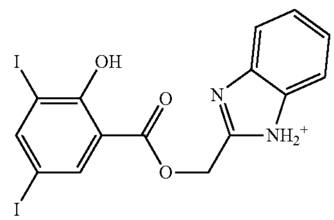
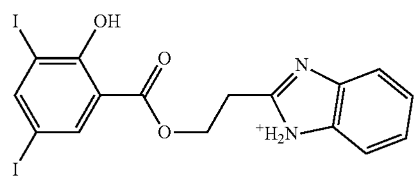
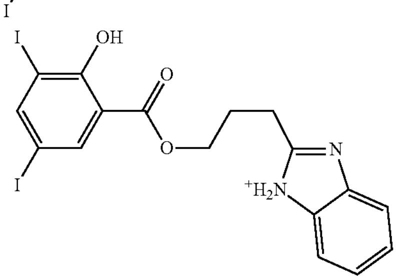
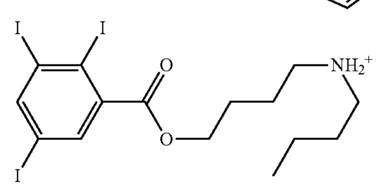
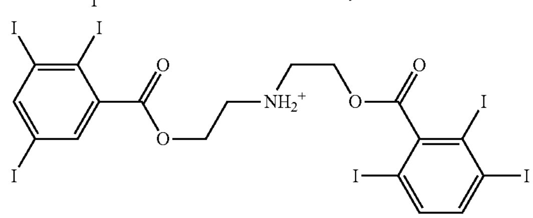

-continued
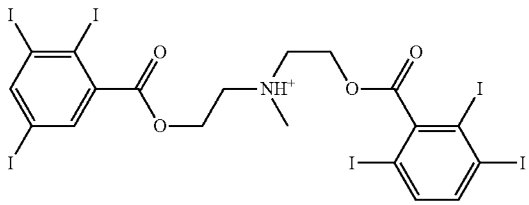
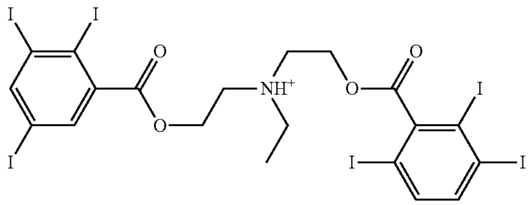
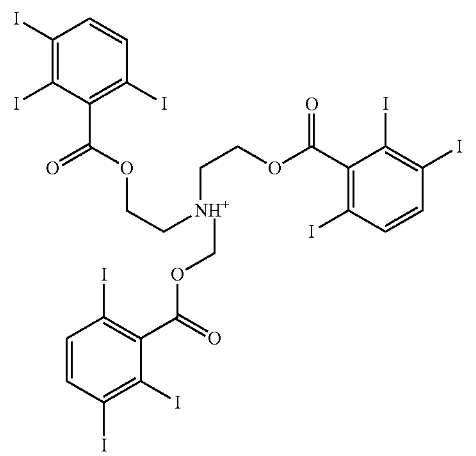
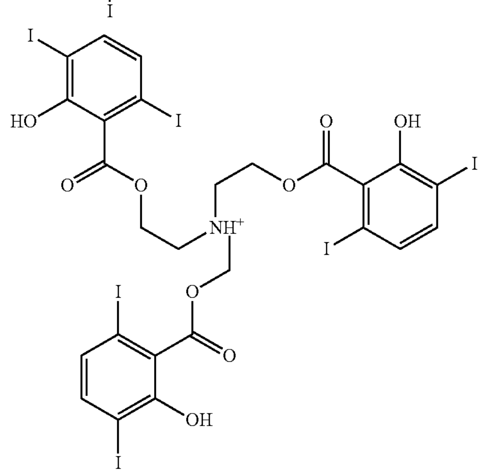
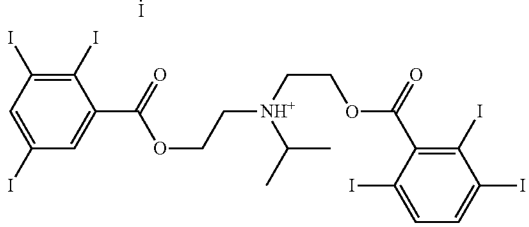
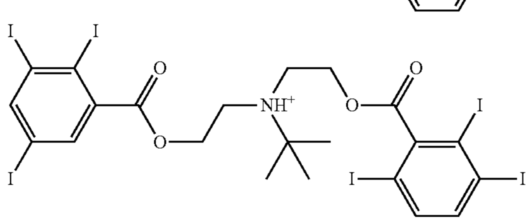
-continued
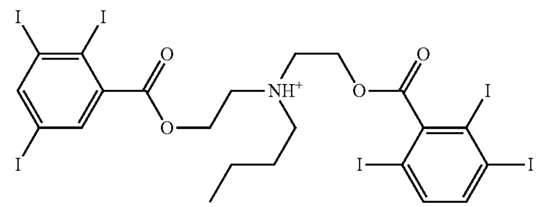
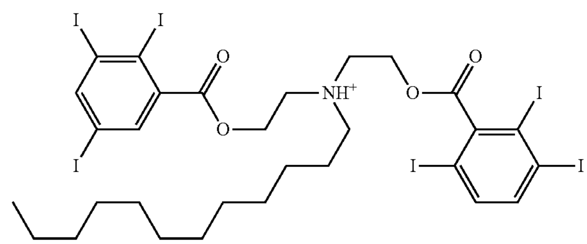
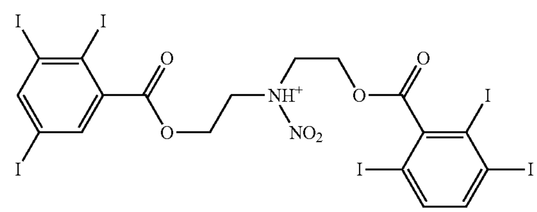
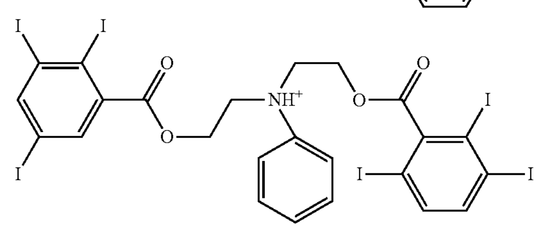
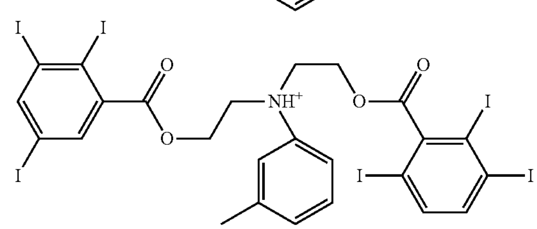
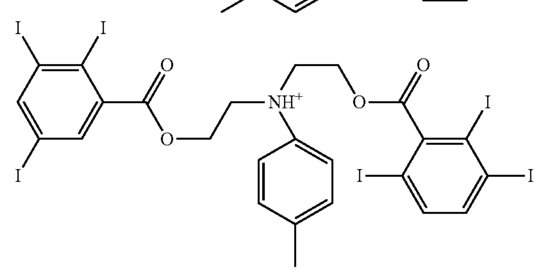
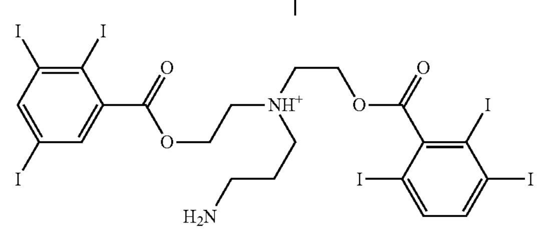

-continued
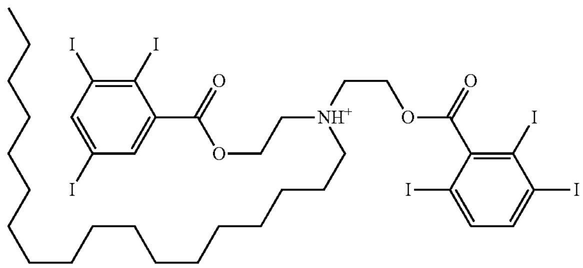
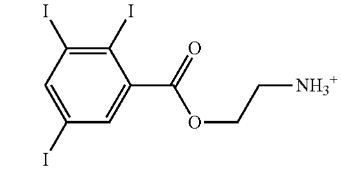
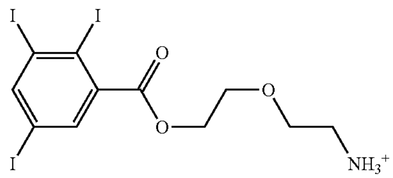
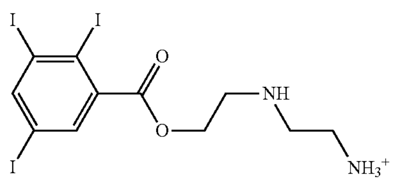
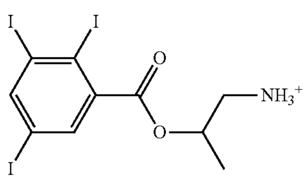
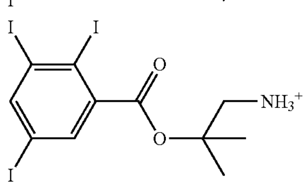
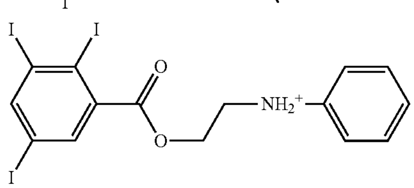
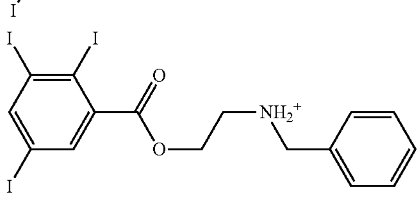
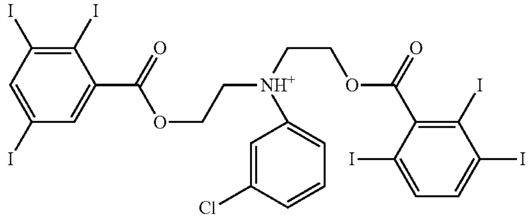
-continued
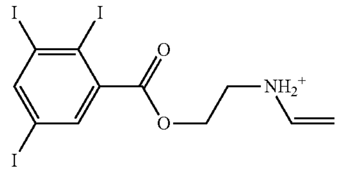
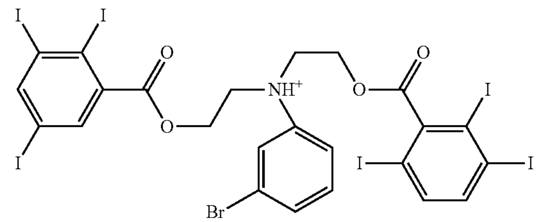
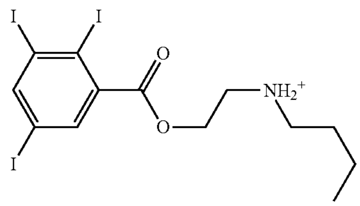
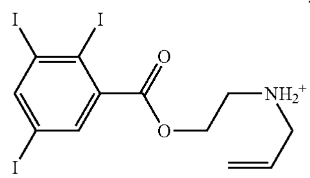
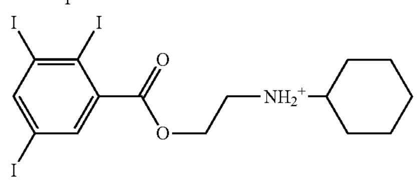
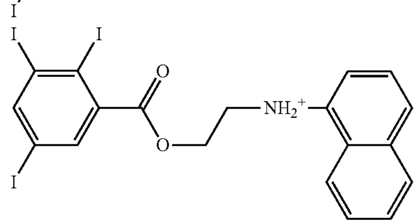
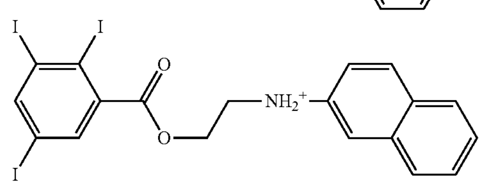
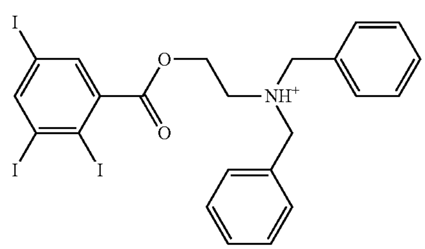
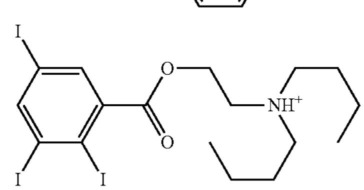

-continued
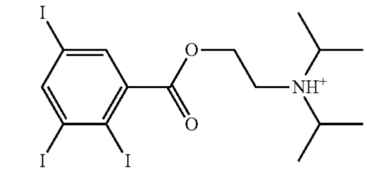
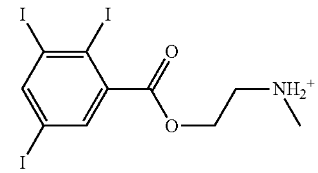
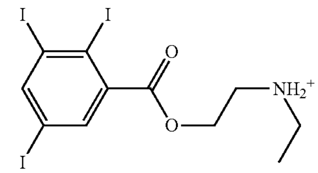
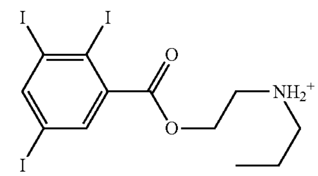
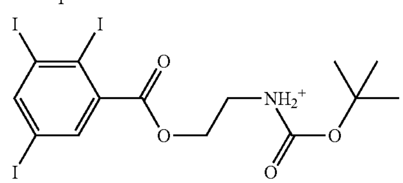
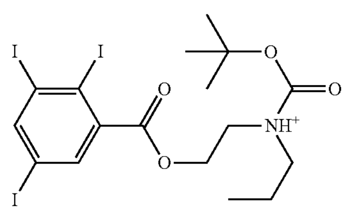
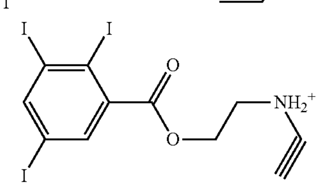
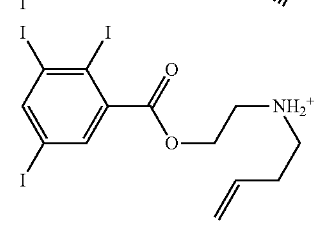
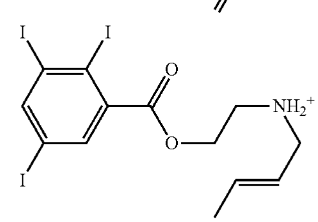
-continued
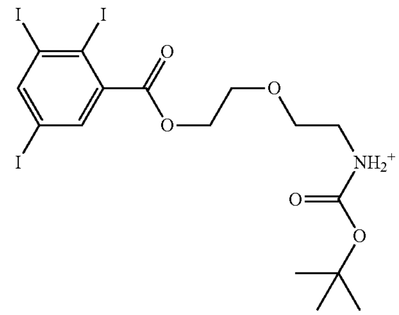
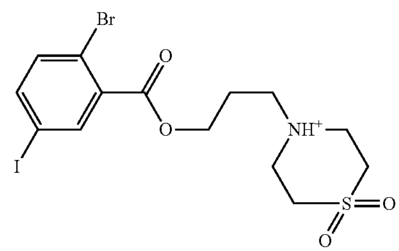
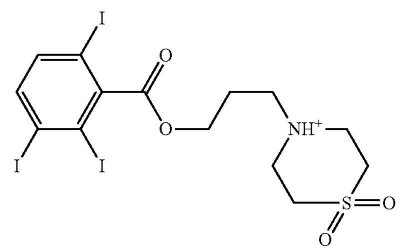
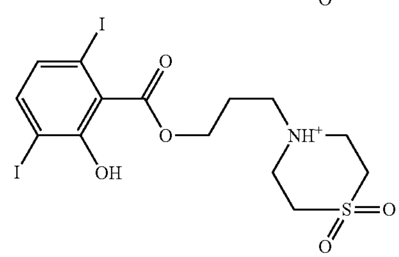
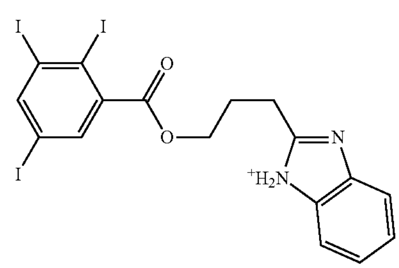
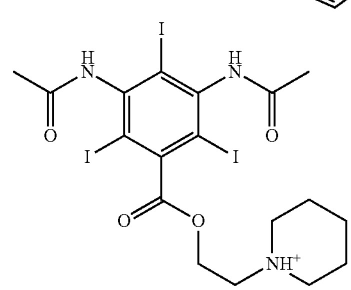

-continued
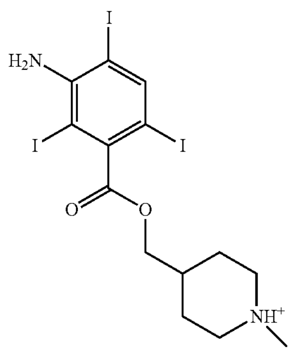
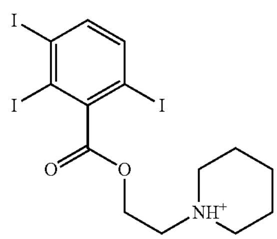
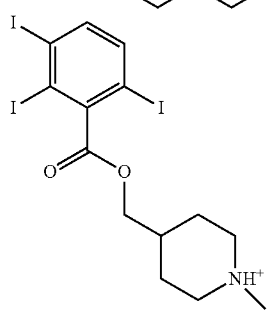
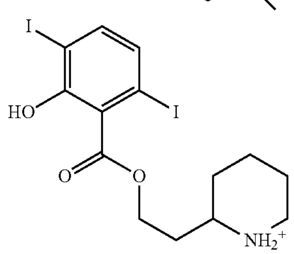
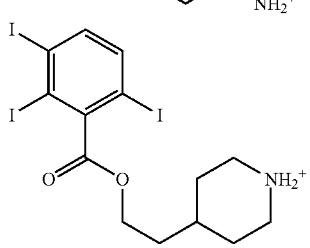
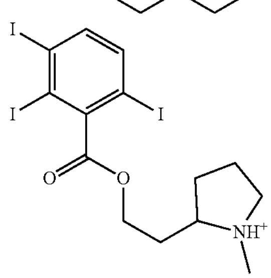
-continued
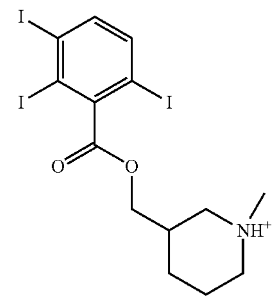
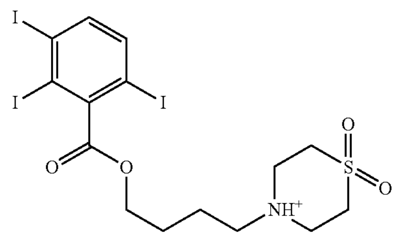
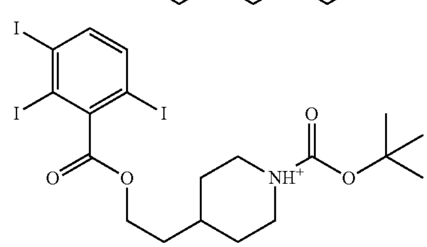
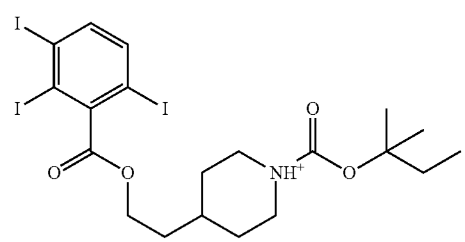
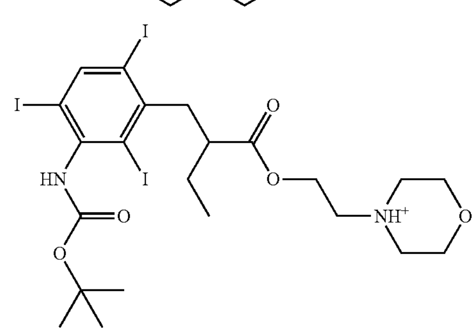
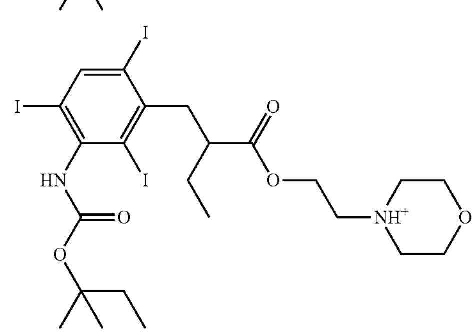

-continued
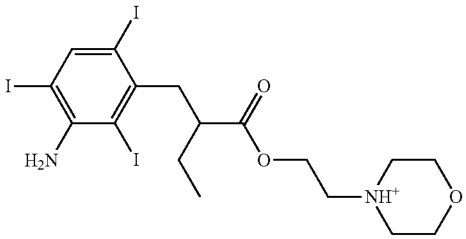
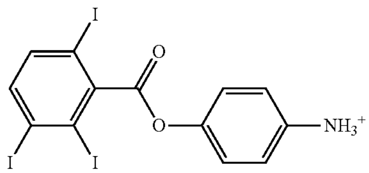
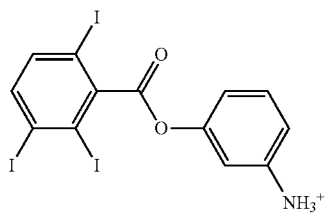
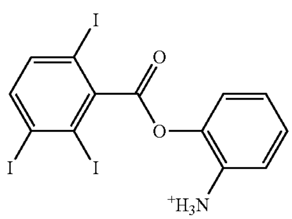
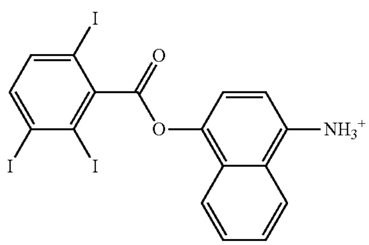
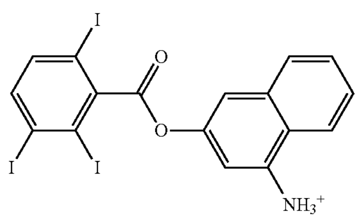
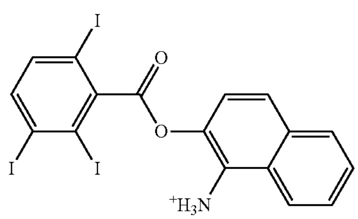
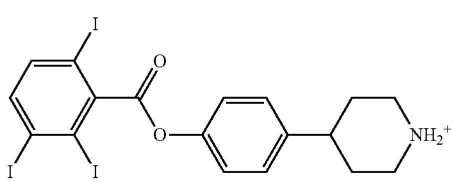
-continued
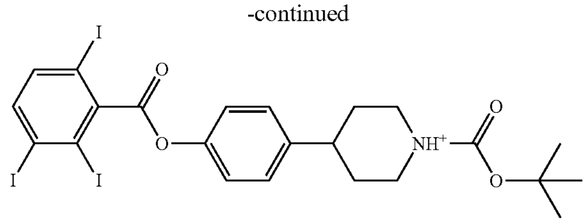
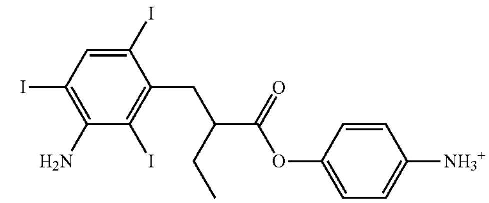
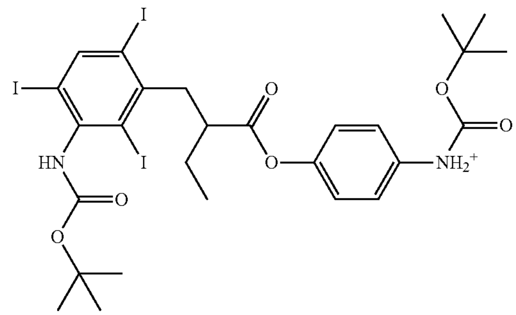
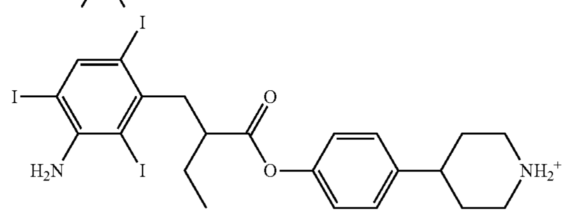
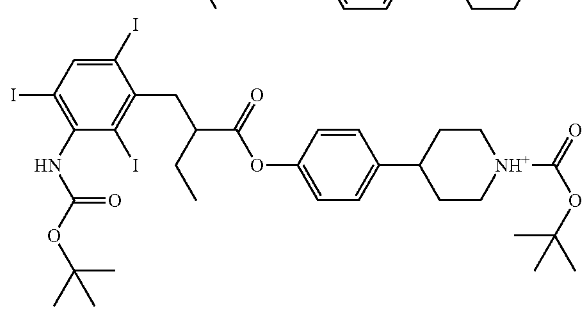
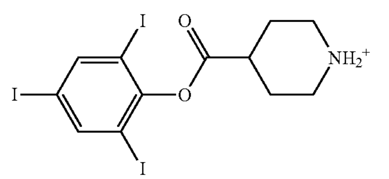
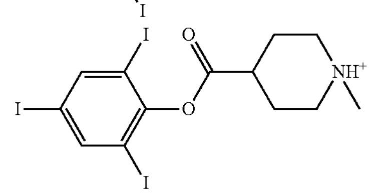
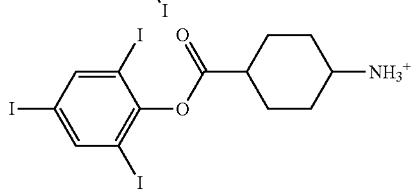

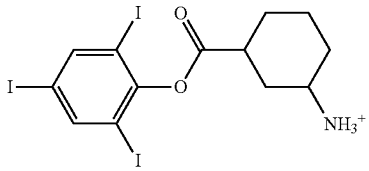
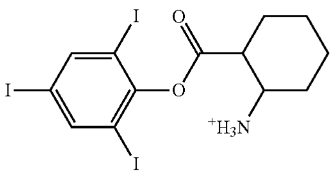
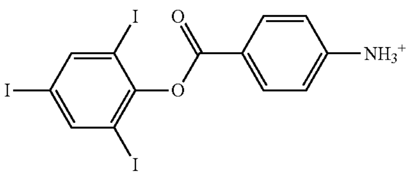
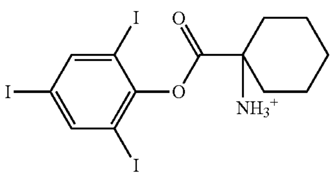
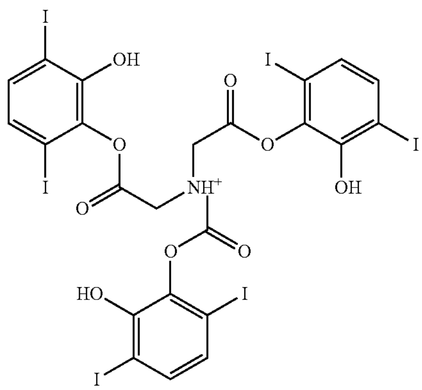
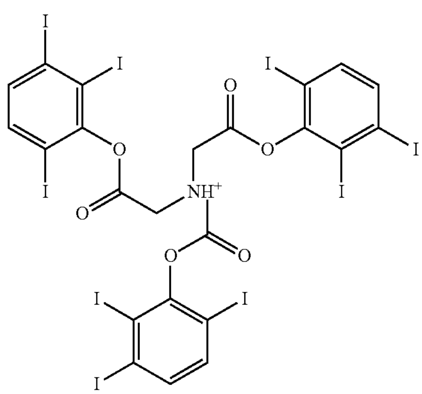
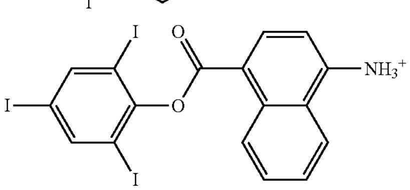
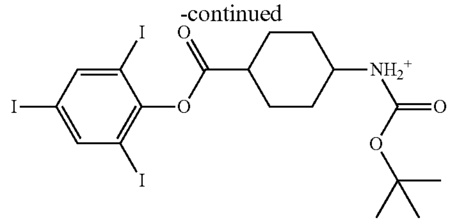
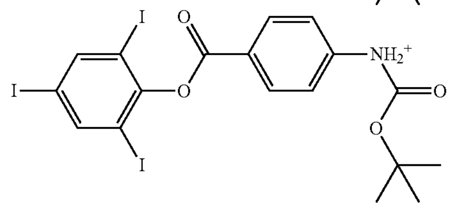
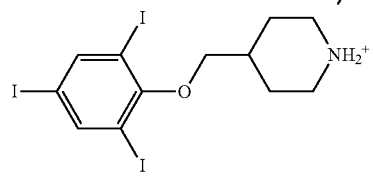
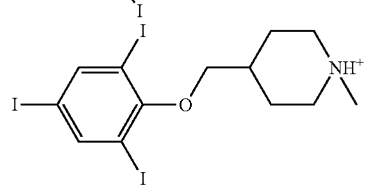
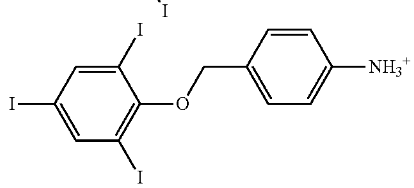
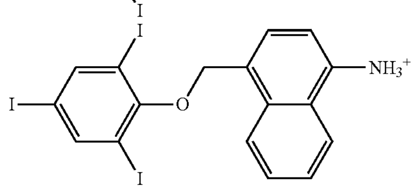
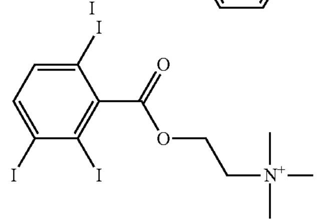
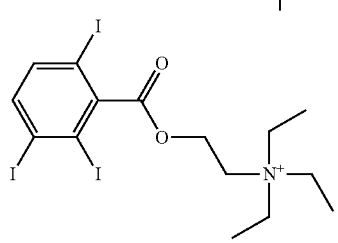
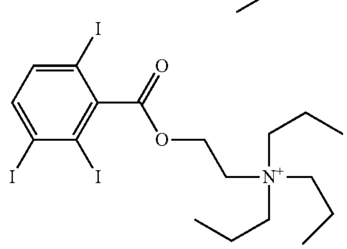

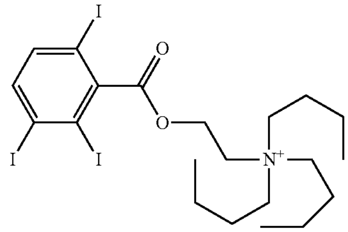
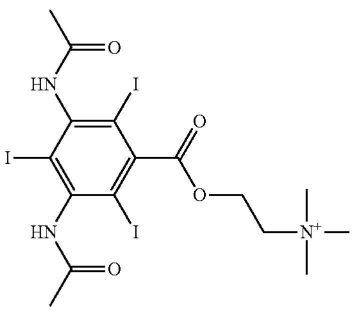
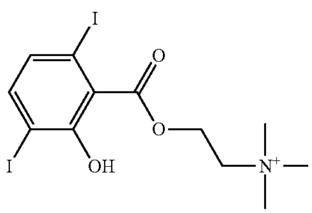
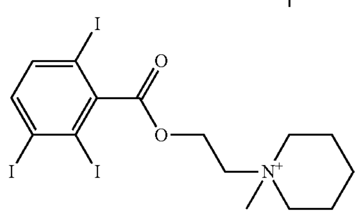
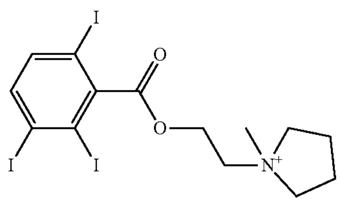
In formula (A)-4, $A^{q-}$ is a carboxylate anion, fluorine-free sulfonimide anion, sulfonamide anion, or halide ion.
Examples of the carboxylate anion are shown below, but not limited thereto.
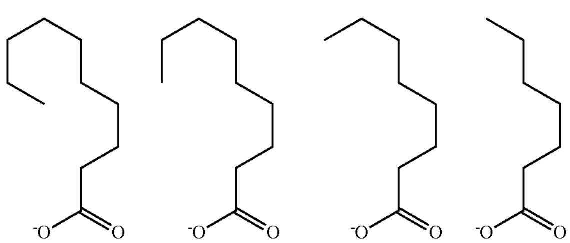
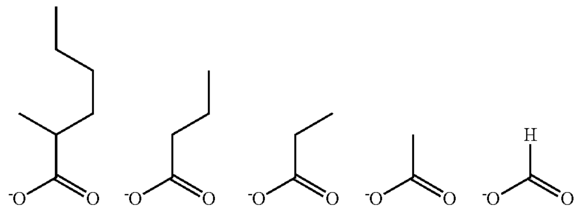
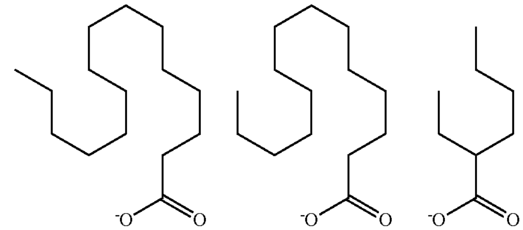
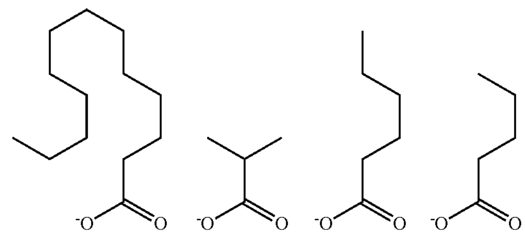
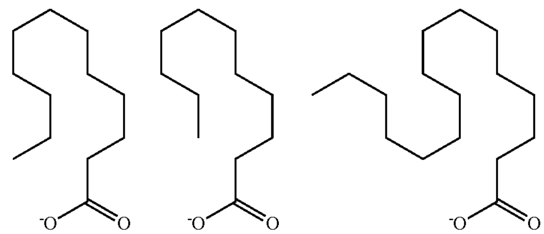
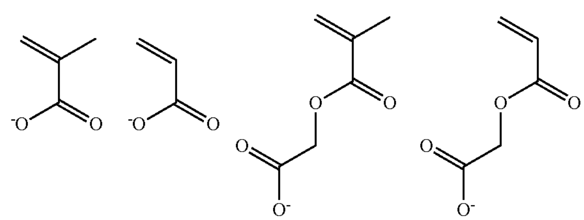
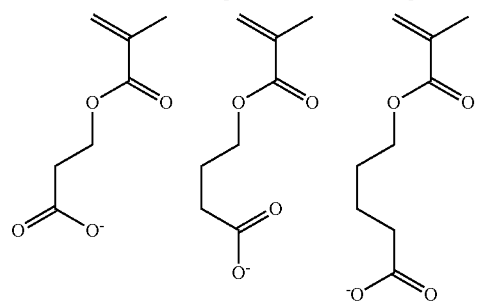
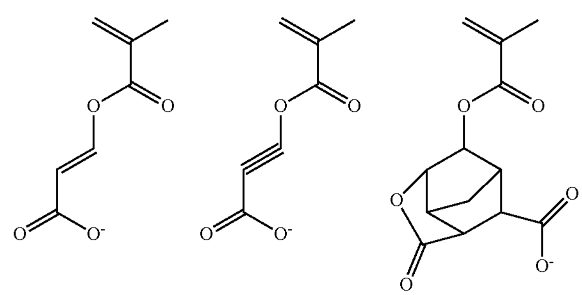

-continued
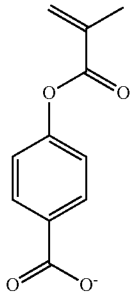
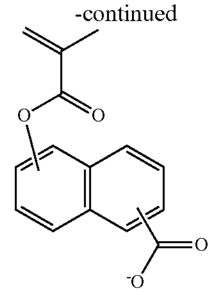
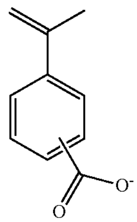
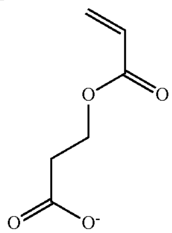
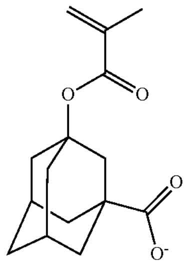
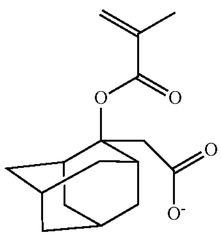
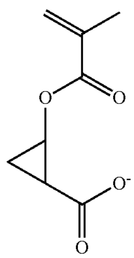
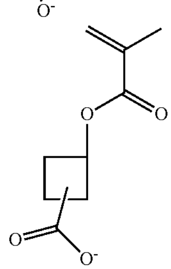
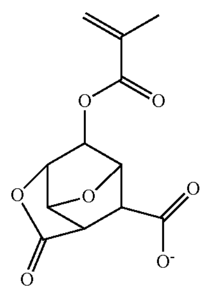
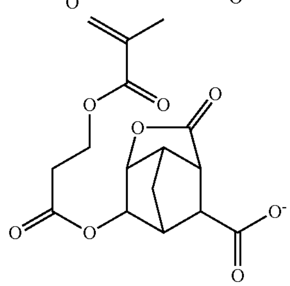
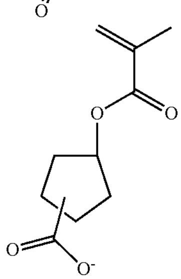
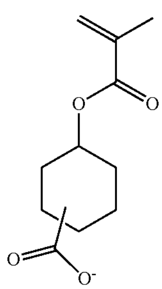
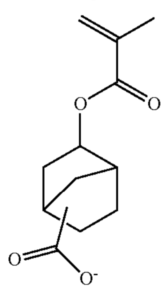
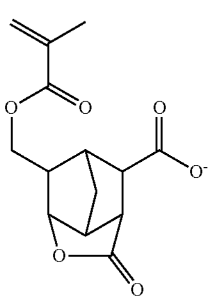
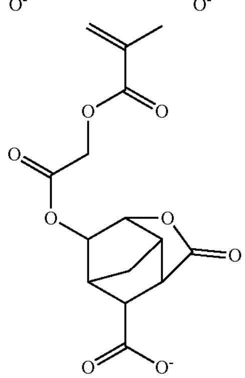
-continued
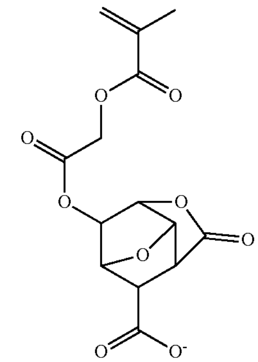
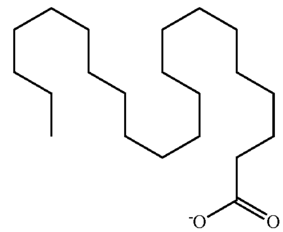
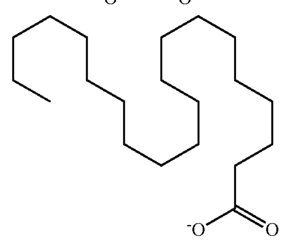
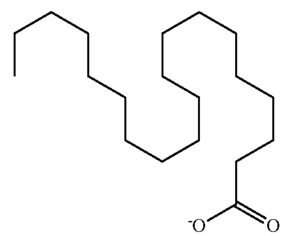
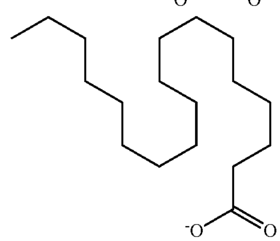
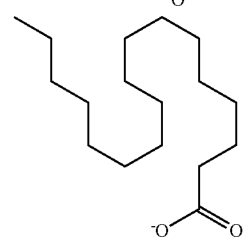
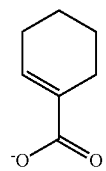
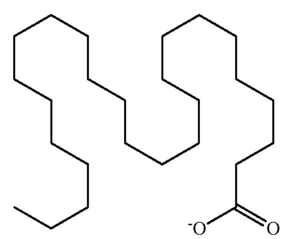
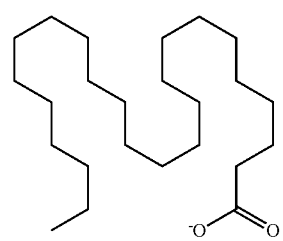
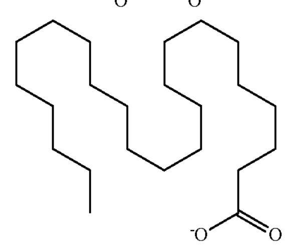
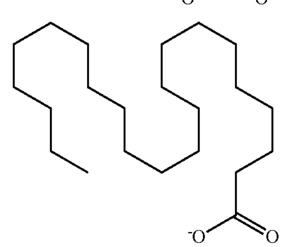
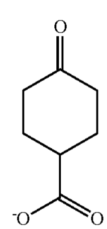
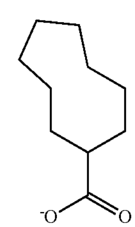
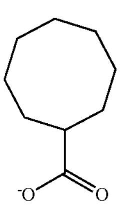
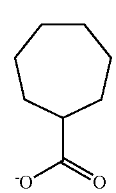
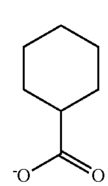
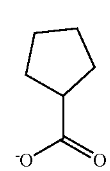

-continued
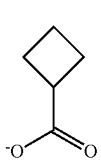
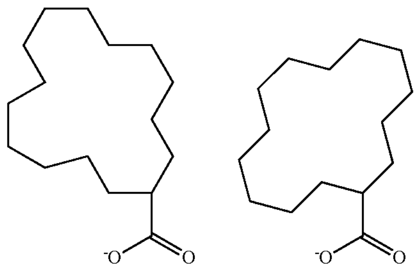
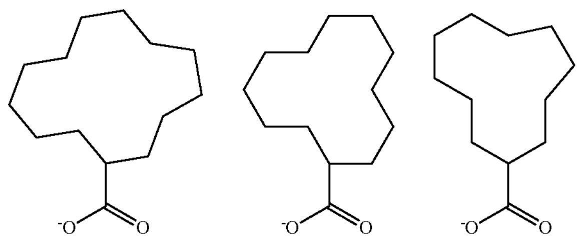
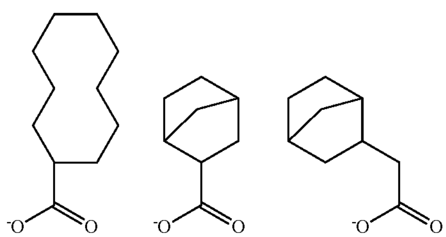
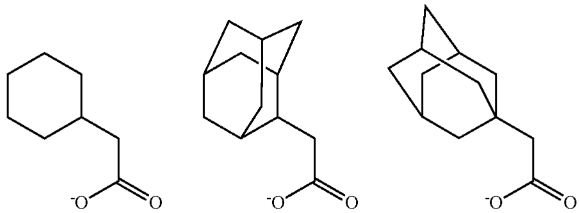
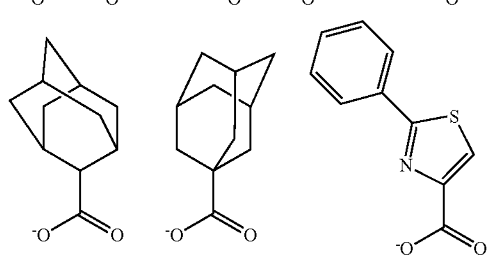
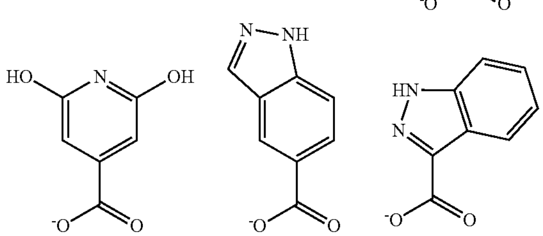
-continued
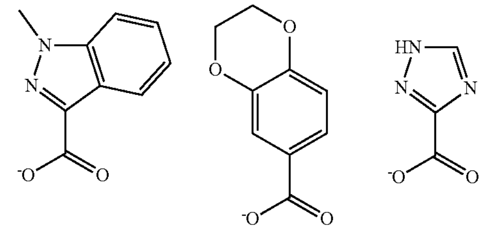
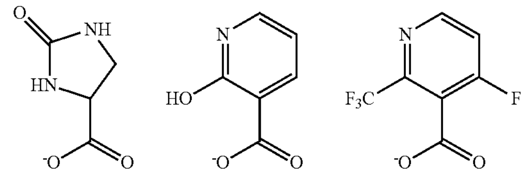
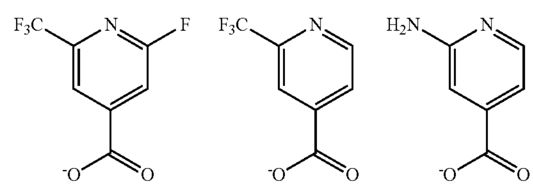
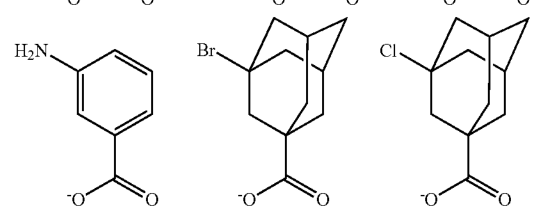
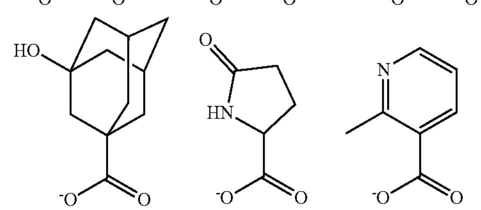
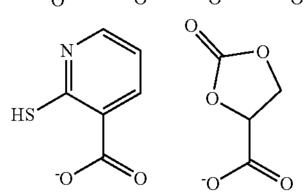
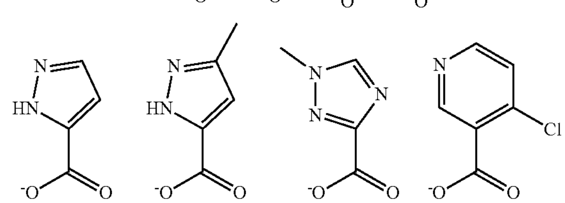
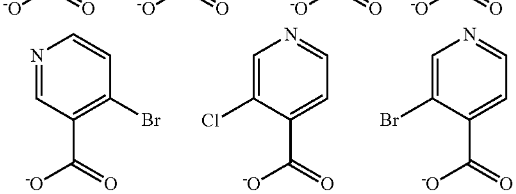

-continued
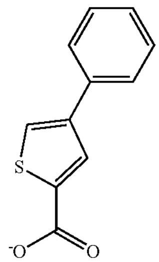
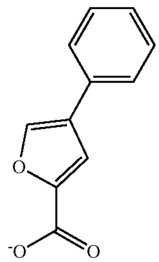
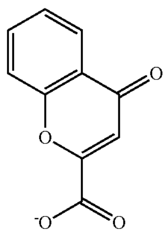
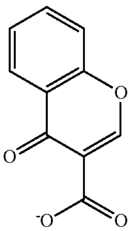
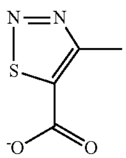
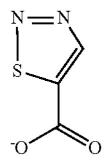
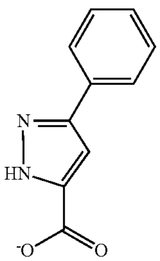
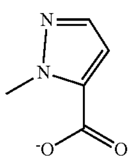
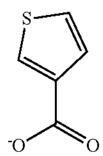
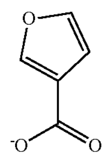
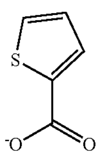
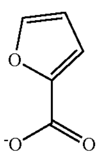
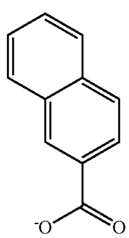
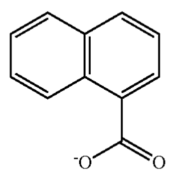
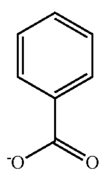
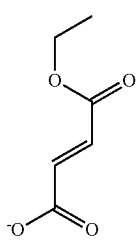
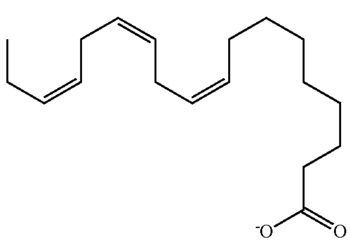
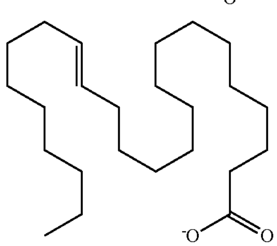
-continued
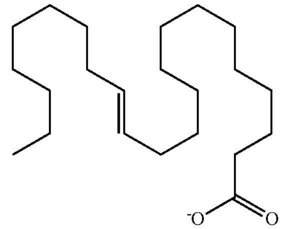
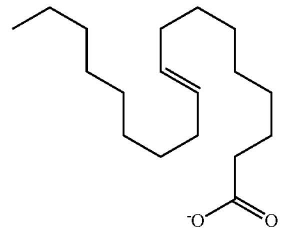
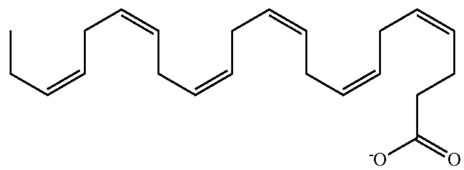
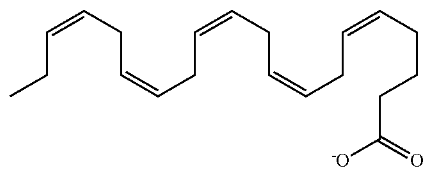
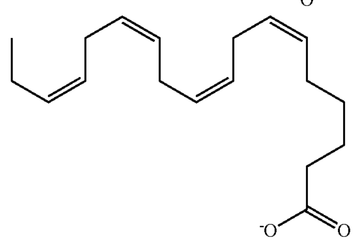
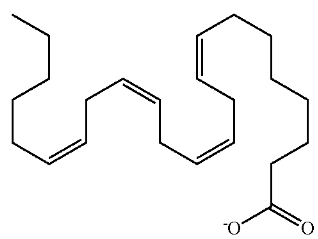
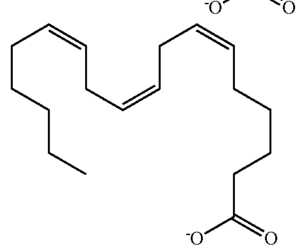
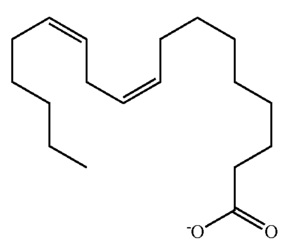
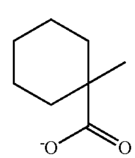
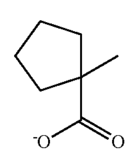

-continued
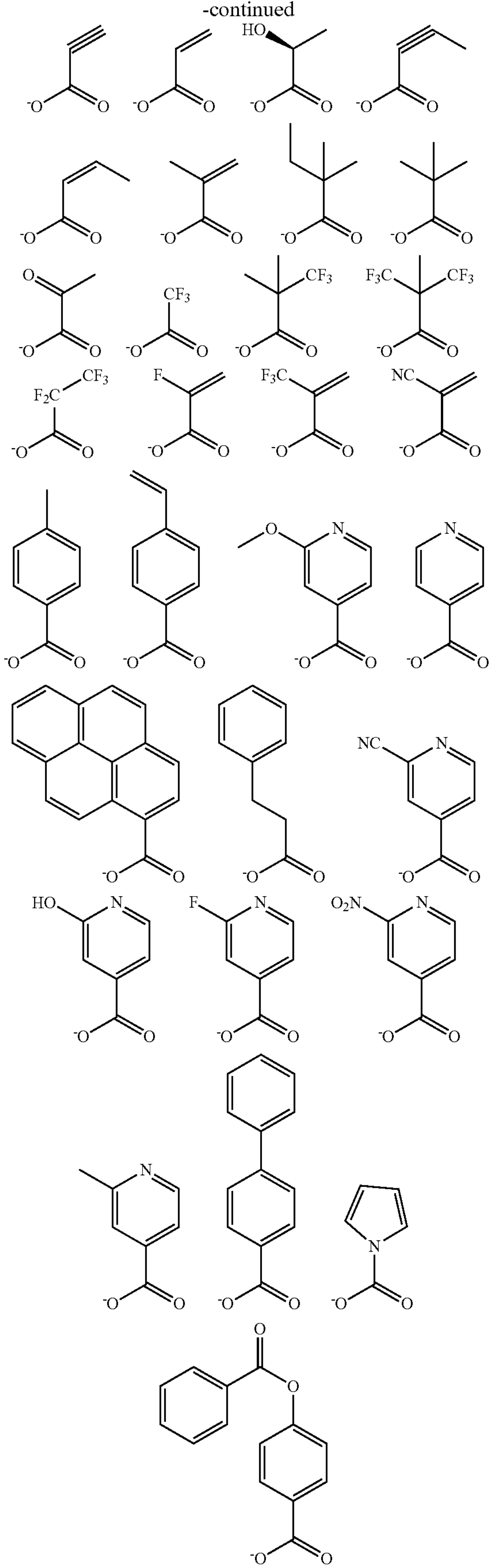
-continued
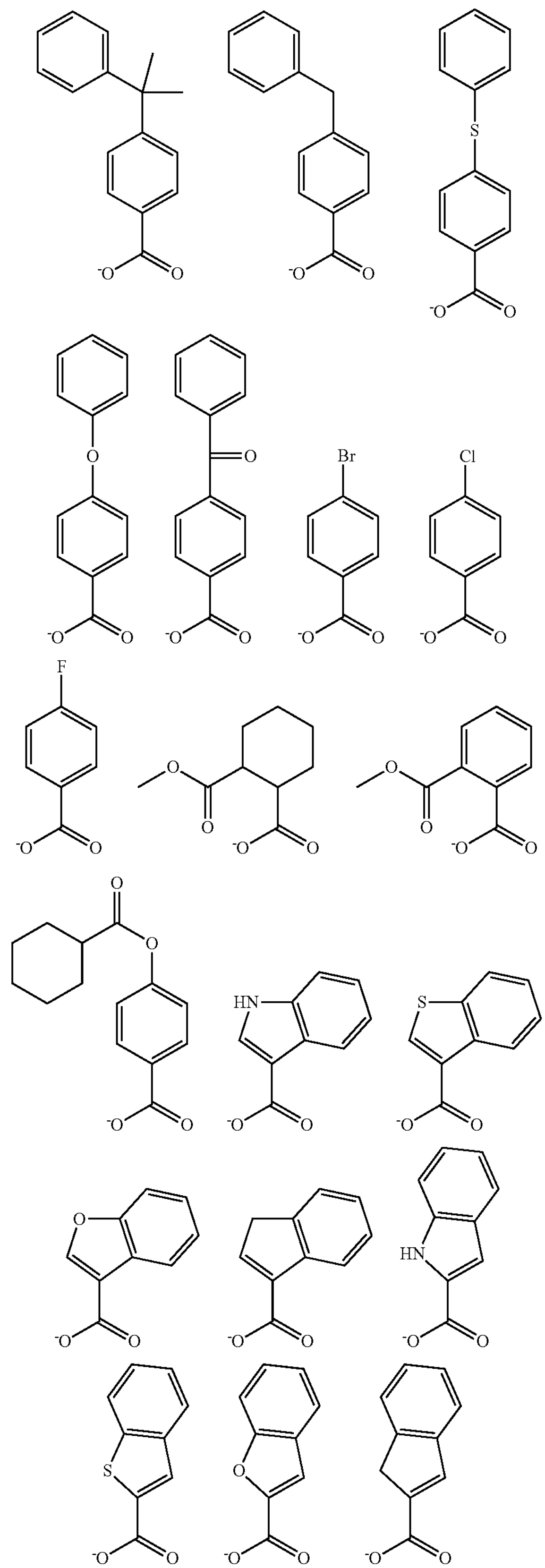

-continued
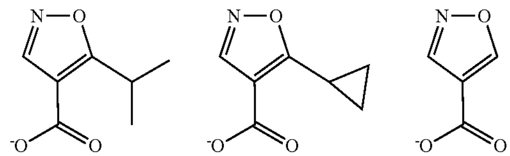
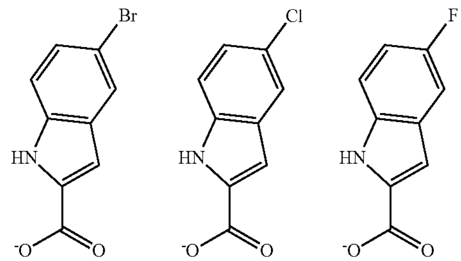
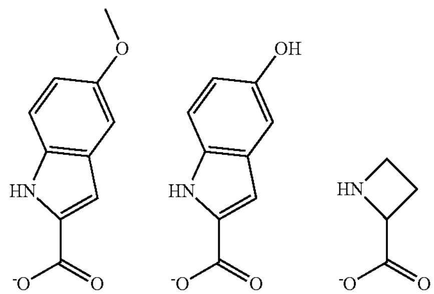
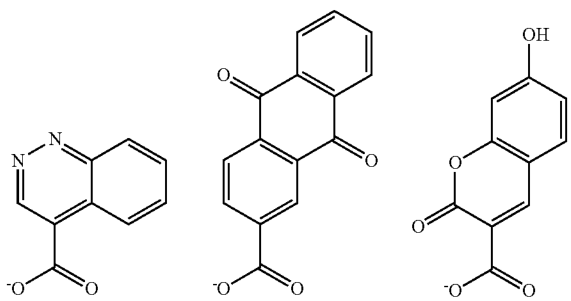
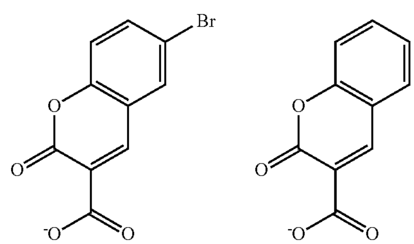
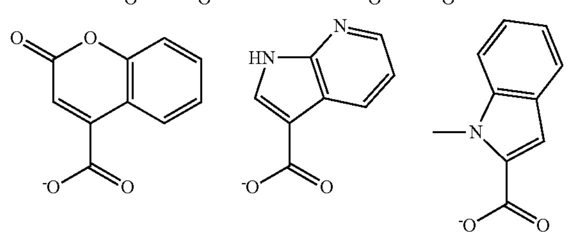
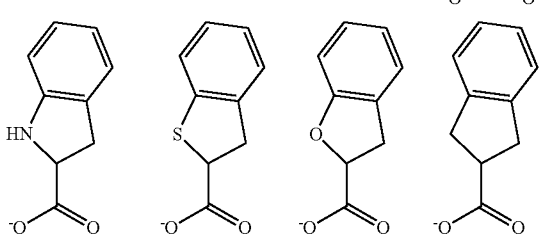
-continued
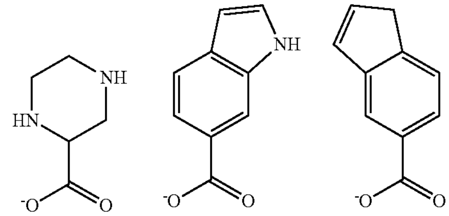
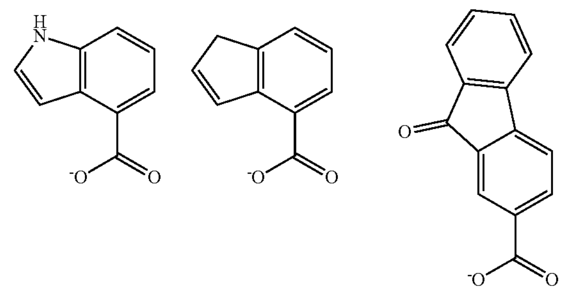
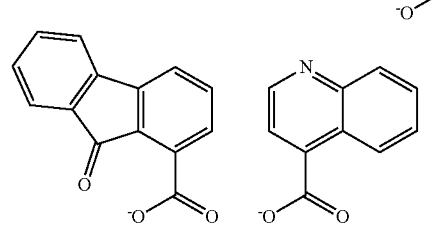
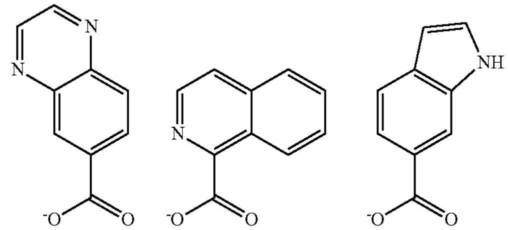
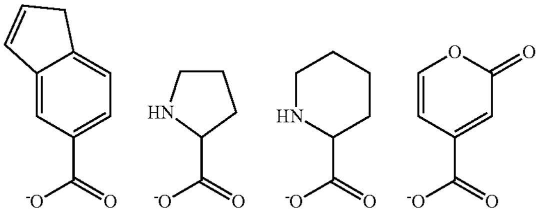
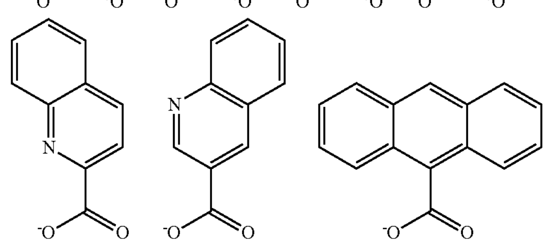
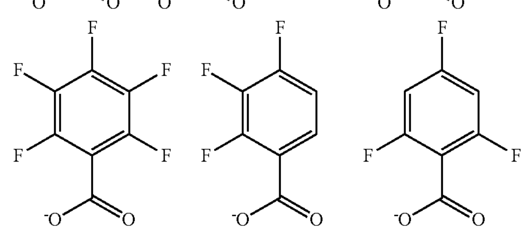

-continued
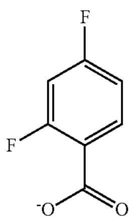
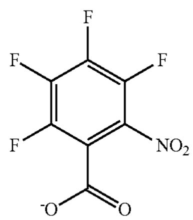
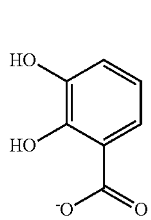
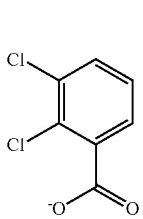
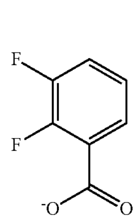
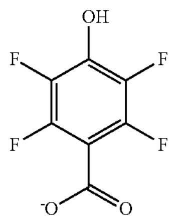
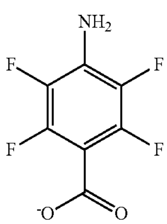
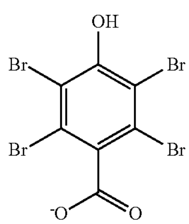
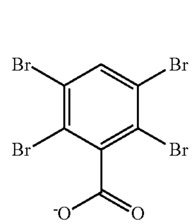
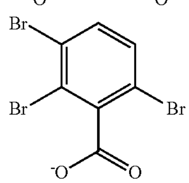
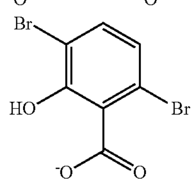
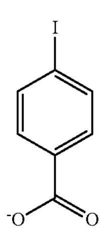
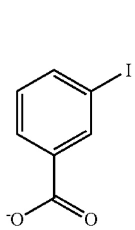
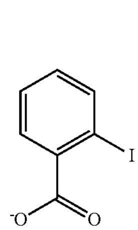
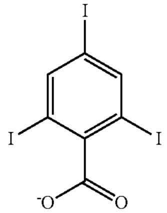
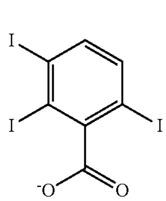
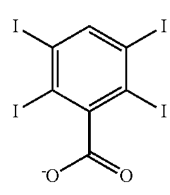
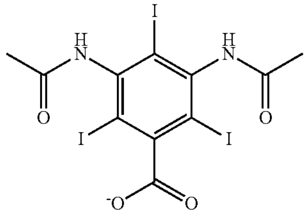
-continued
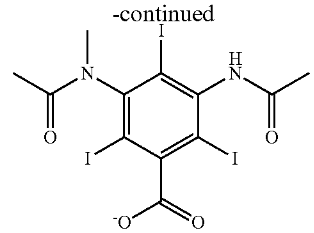
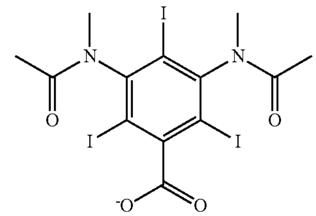
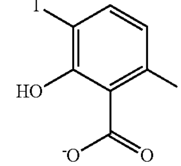
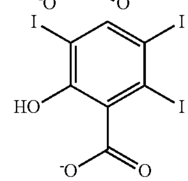
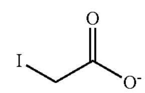
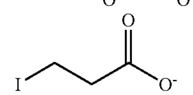
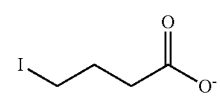
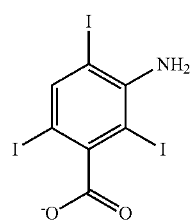
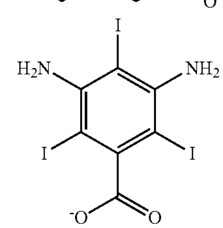
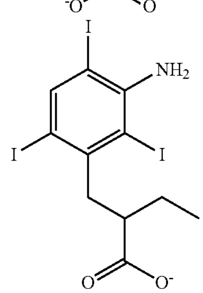
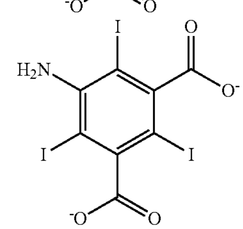
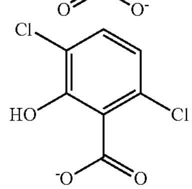
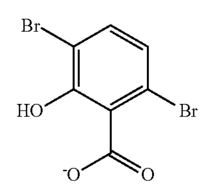
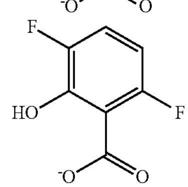
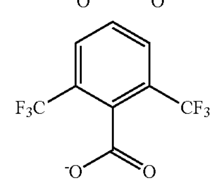
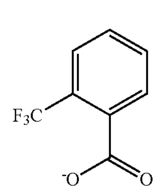
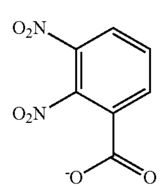
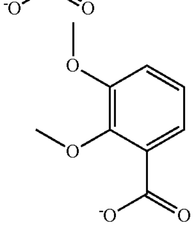

-continued
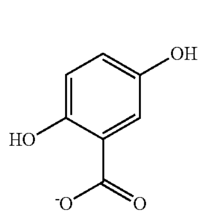
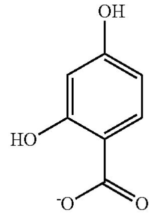
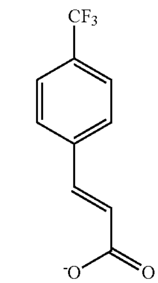
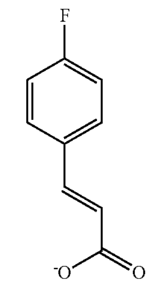
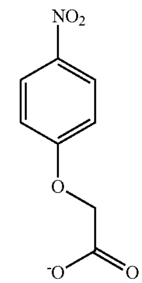
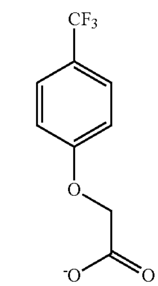
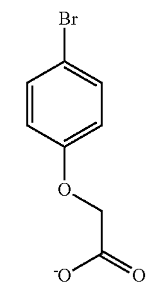
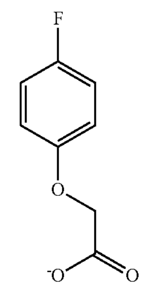
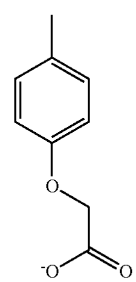
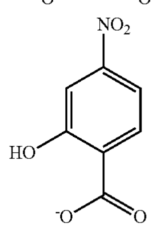
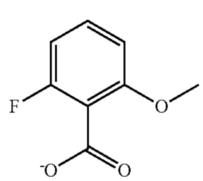
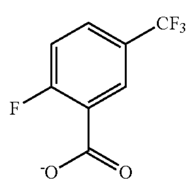
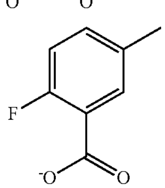
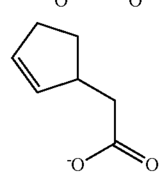
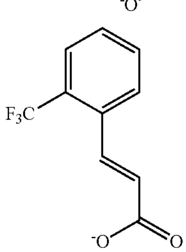
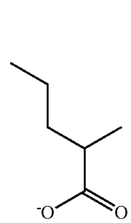
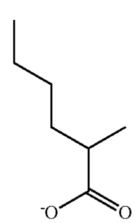
-continued
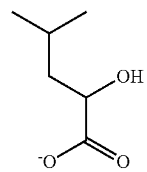
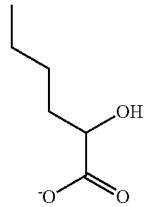
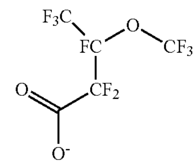
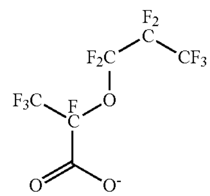
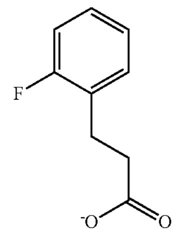
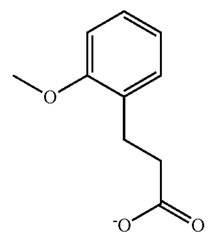
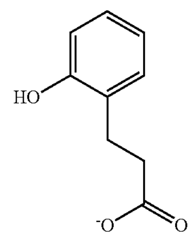
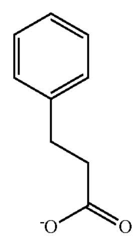
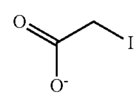
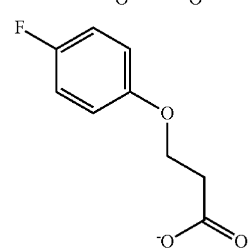
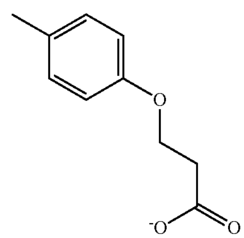
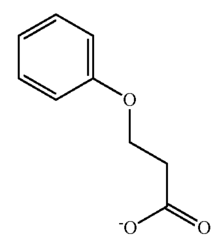
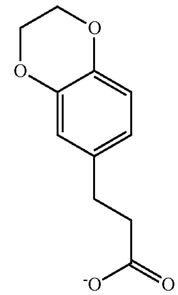
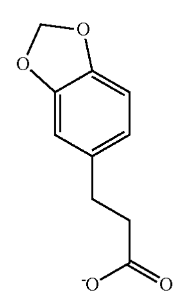
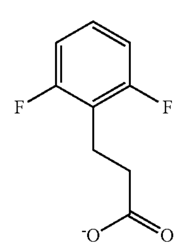
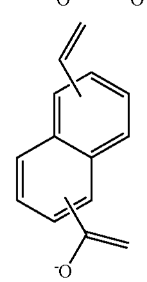

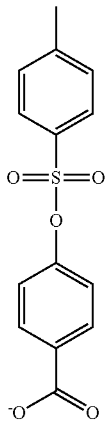
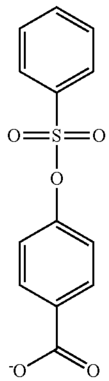
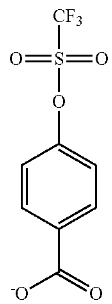
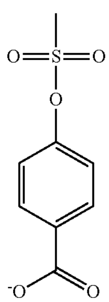
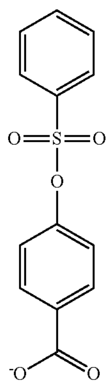
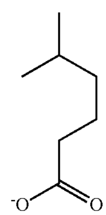
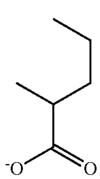
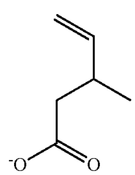
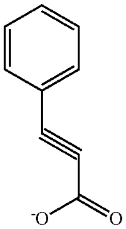
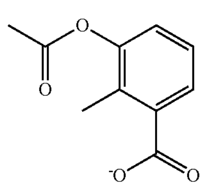
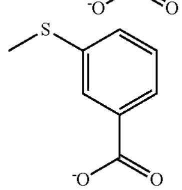
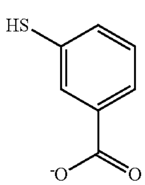
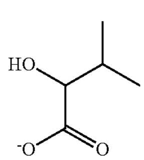
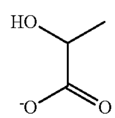
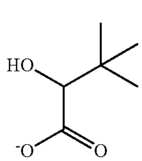
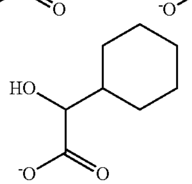
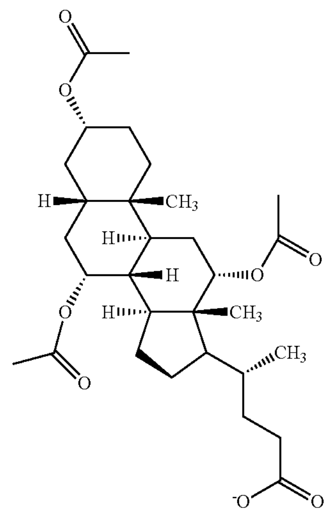
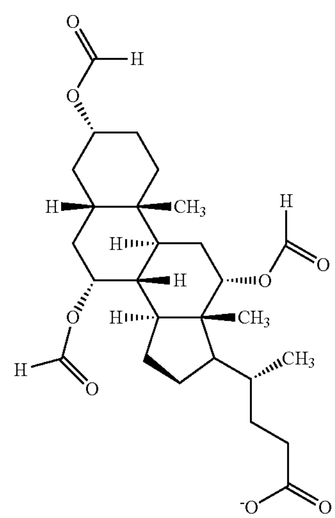
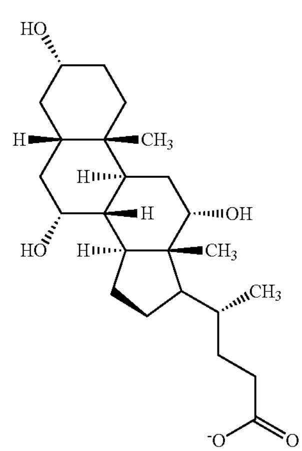
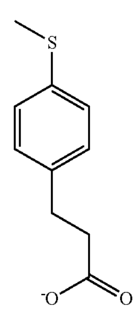

-continued
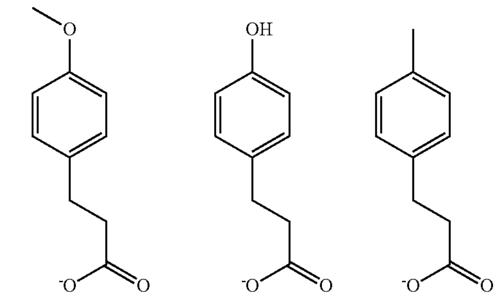
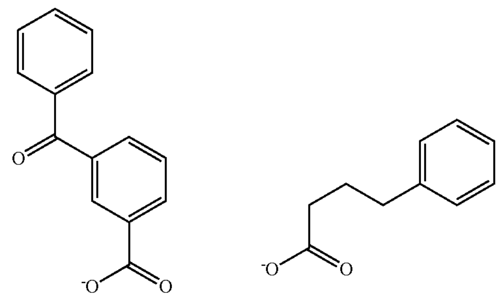
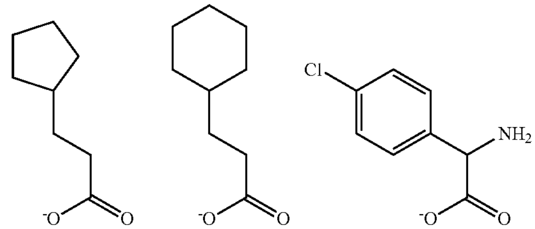
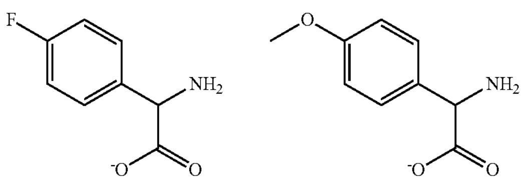
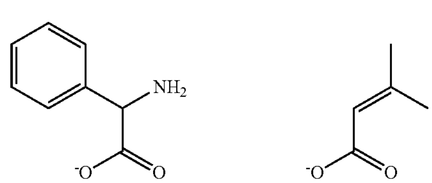
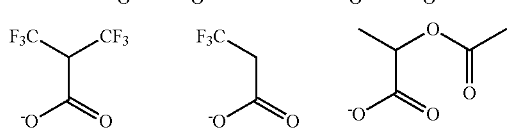
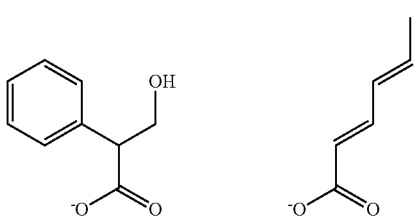
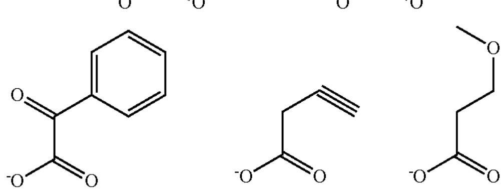
-continued
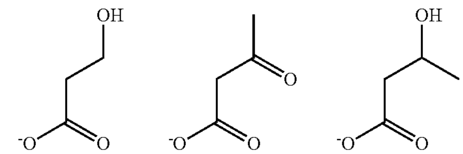
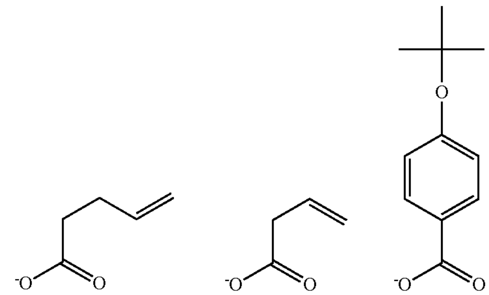
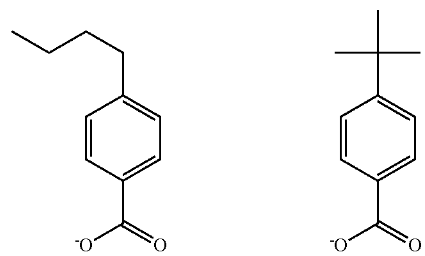
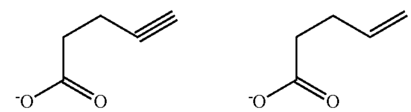
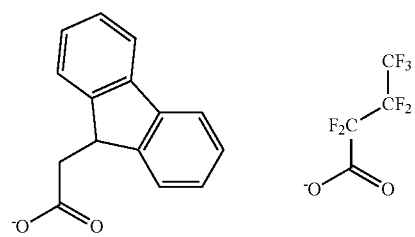
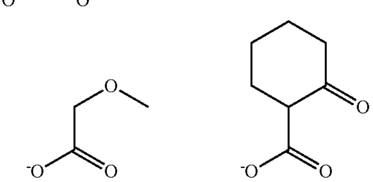
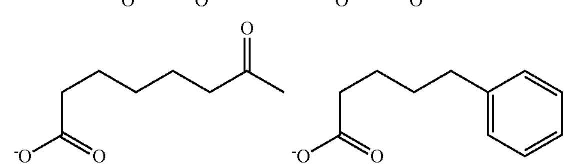
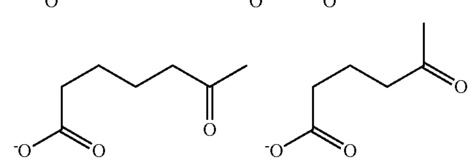
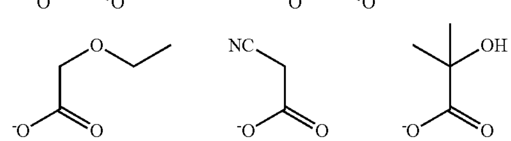

-continued
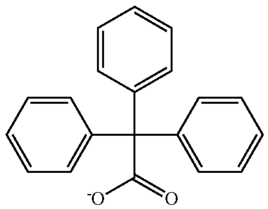
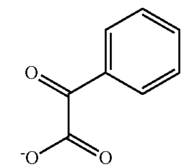
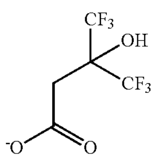
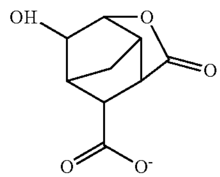
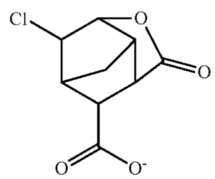
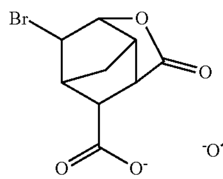
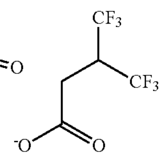
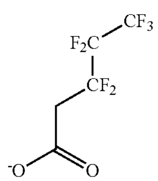
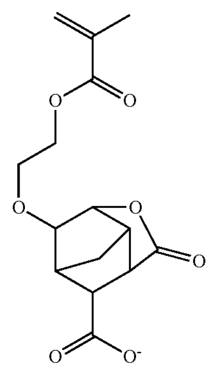
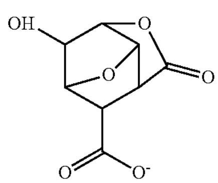
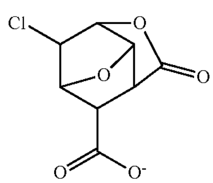
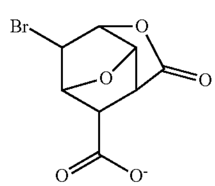
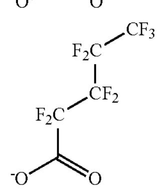
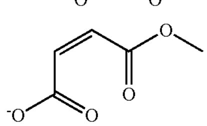
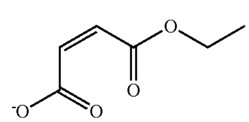
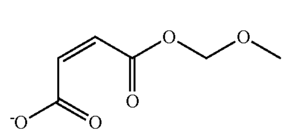
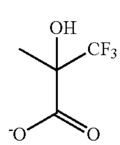
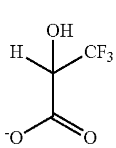
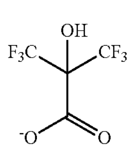
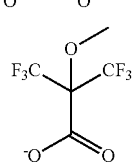
-continued
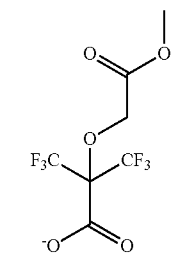
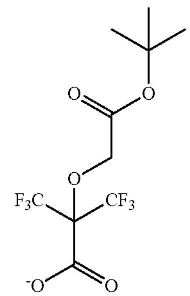
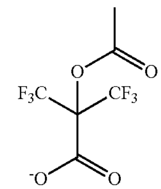
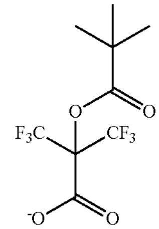
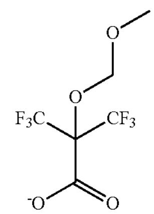
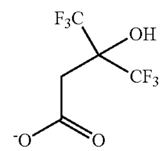
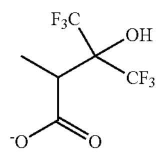
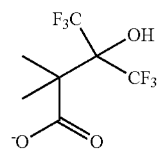
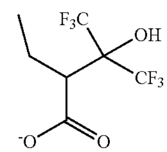
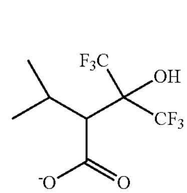
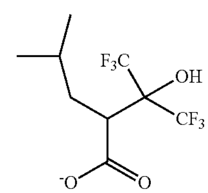
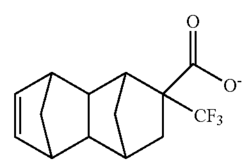
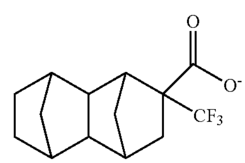
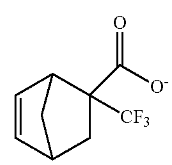
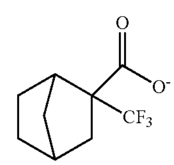
Examples of the fluorine-free sulfonimide anion are shown below, but not limited thereto.
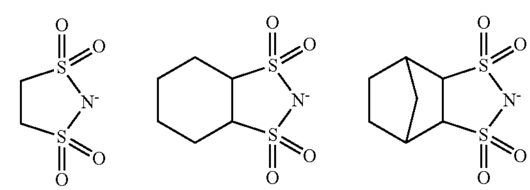
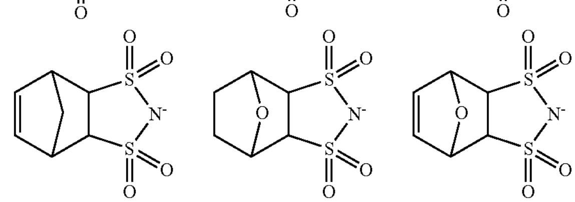

-continued
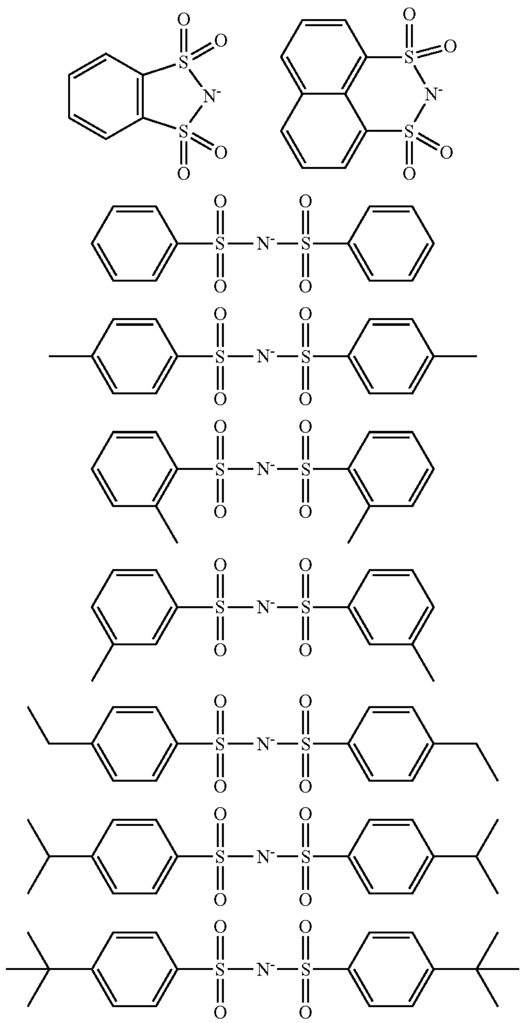
Examples of the sulfonamide anion are shown below, but not limited thereto.
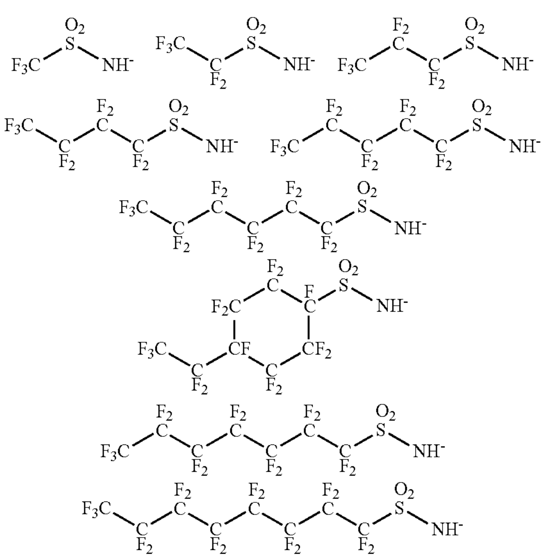
-continued
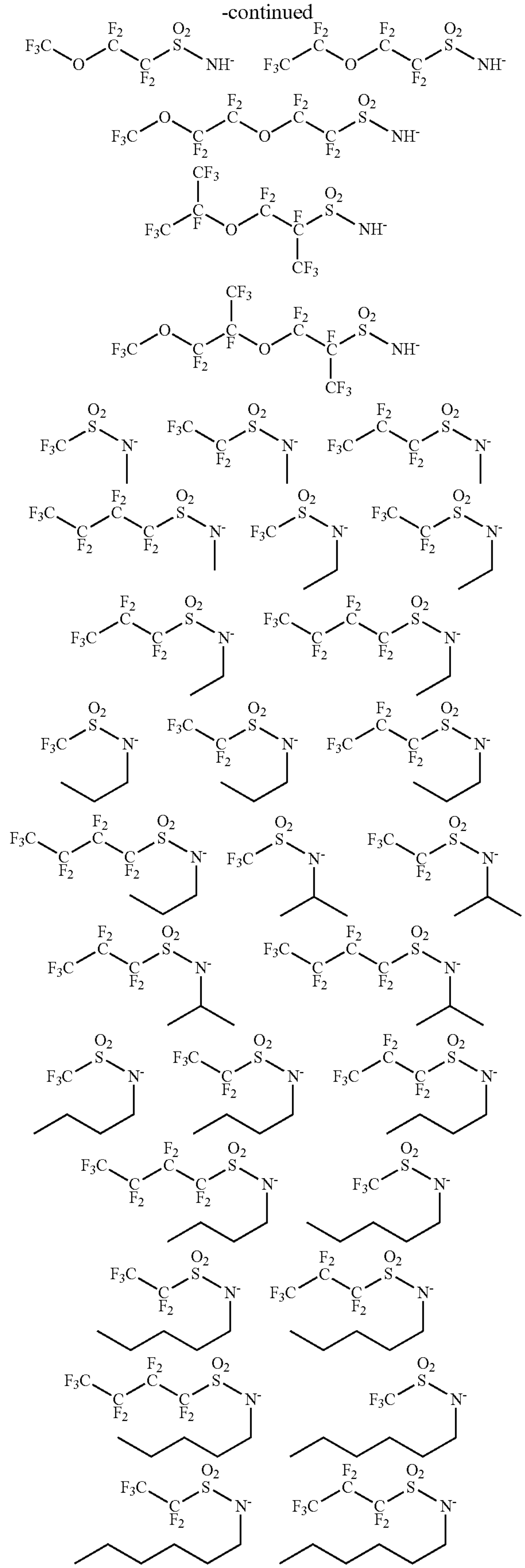

-continued
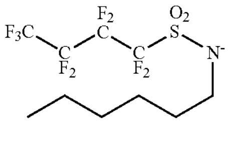
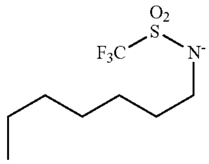
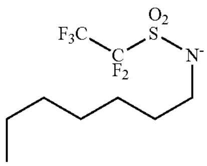
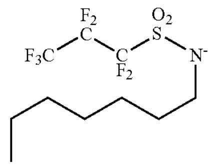
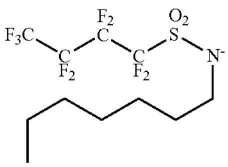
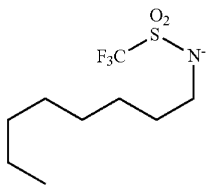
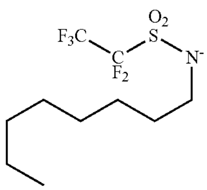
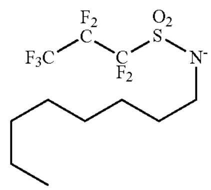
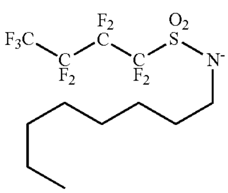
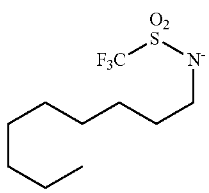
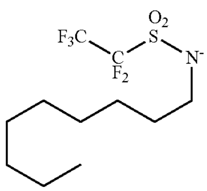
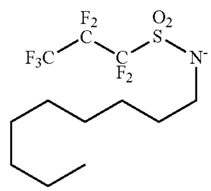
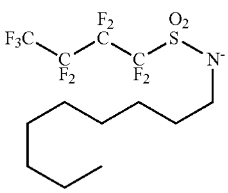
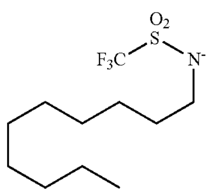
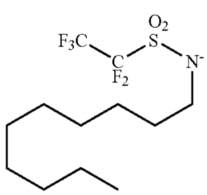
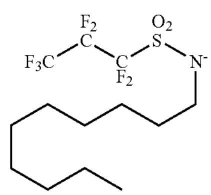
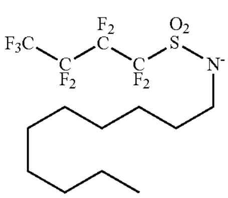
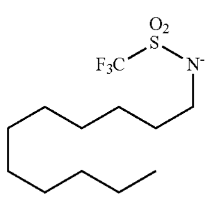
-continued
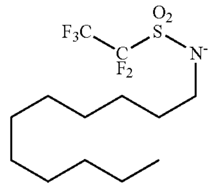
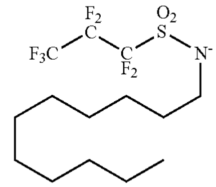
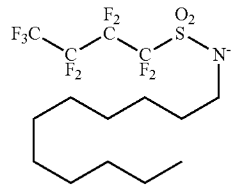
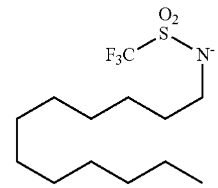
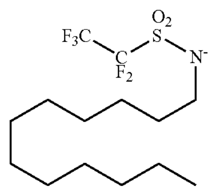
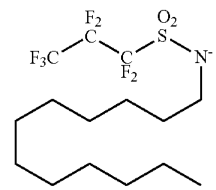
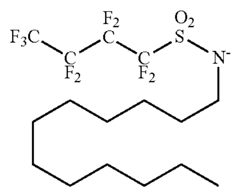
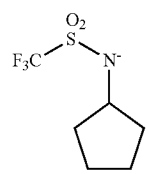
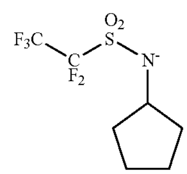
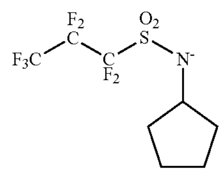
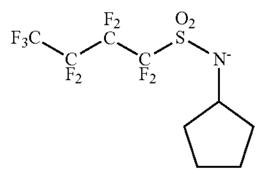
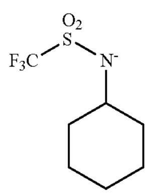
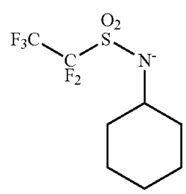
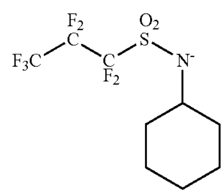
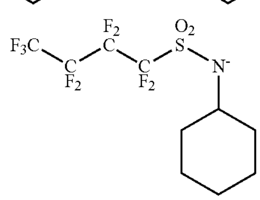
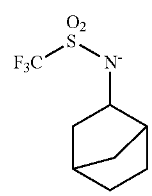
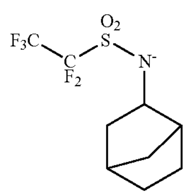
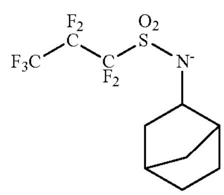
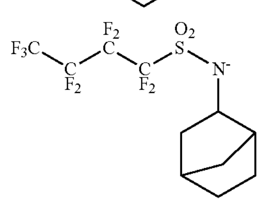
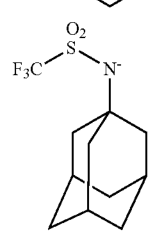

-continued
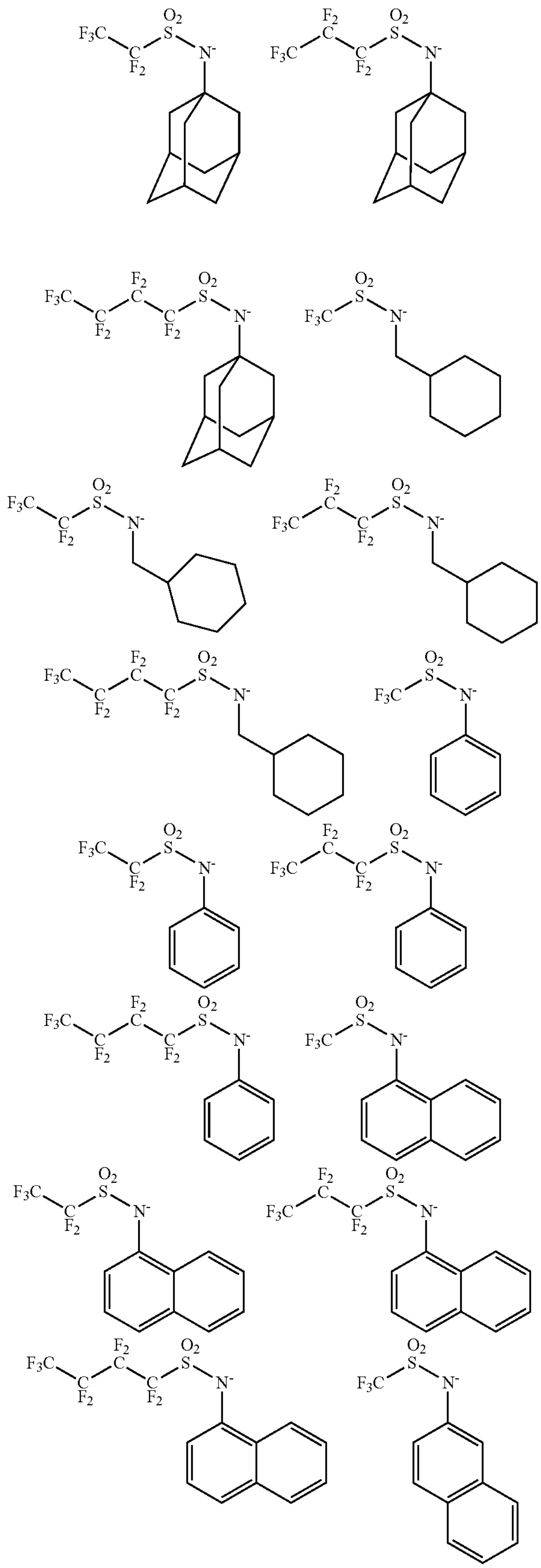
-continued
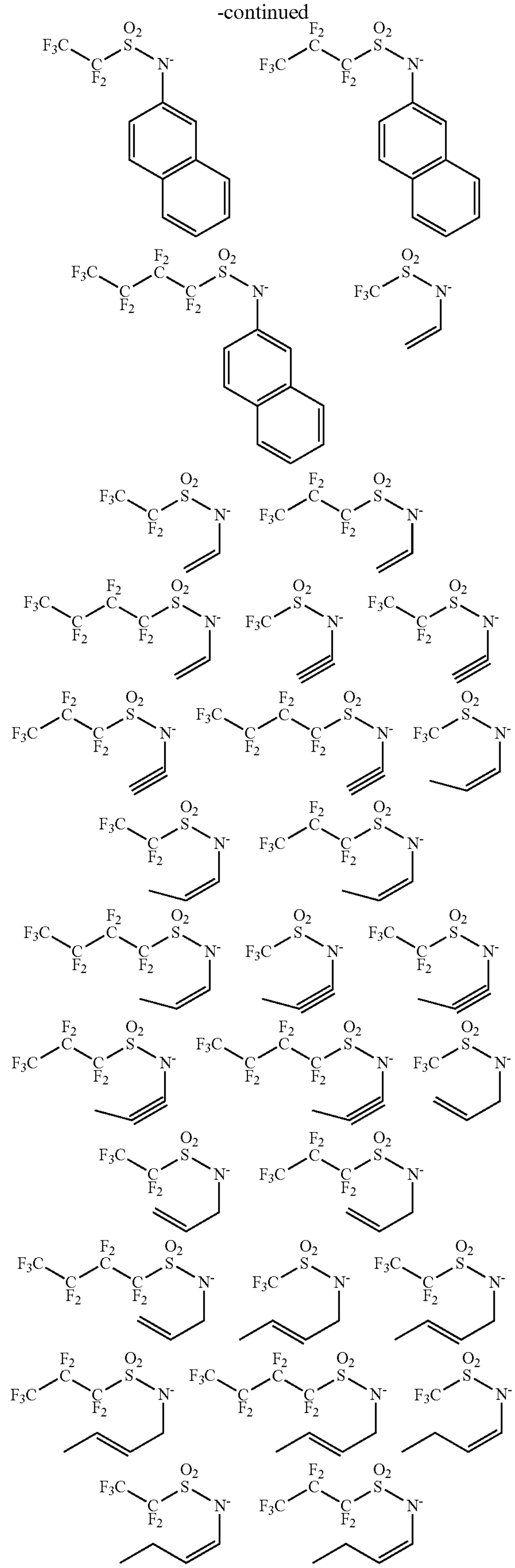

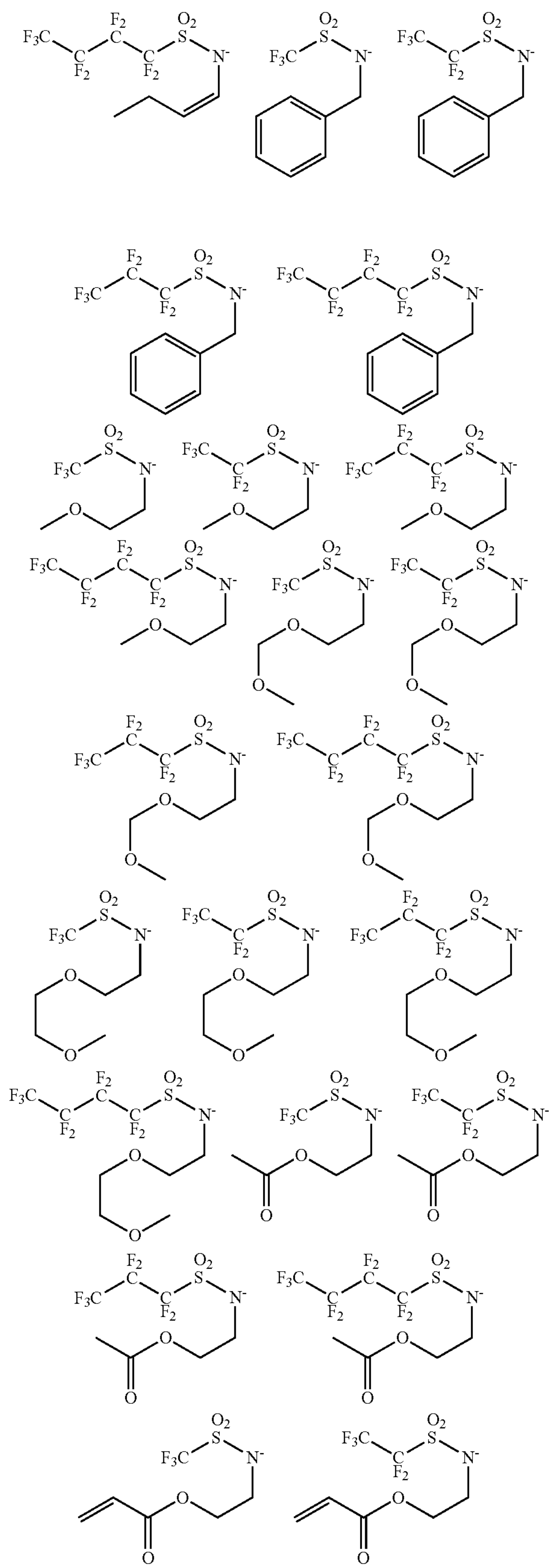
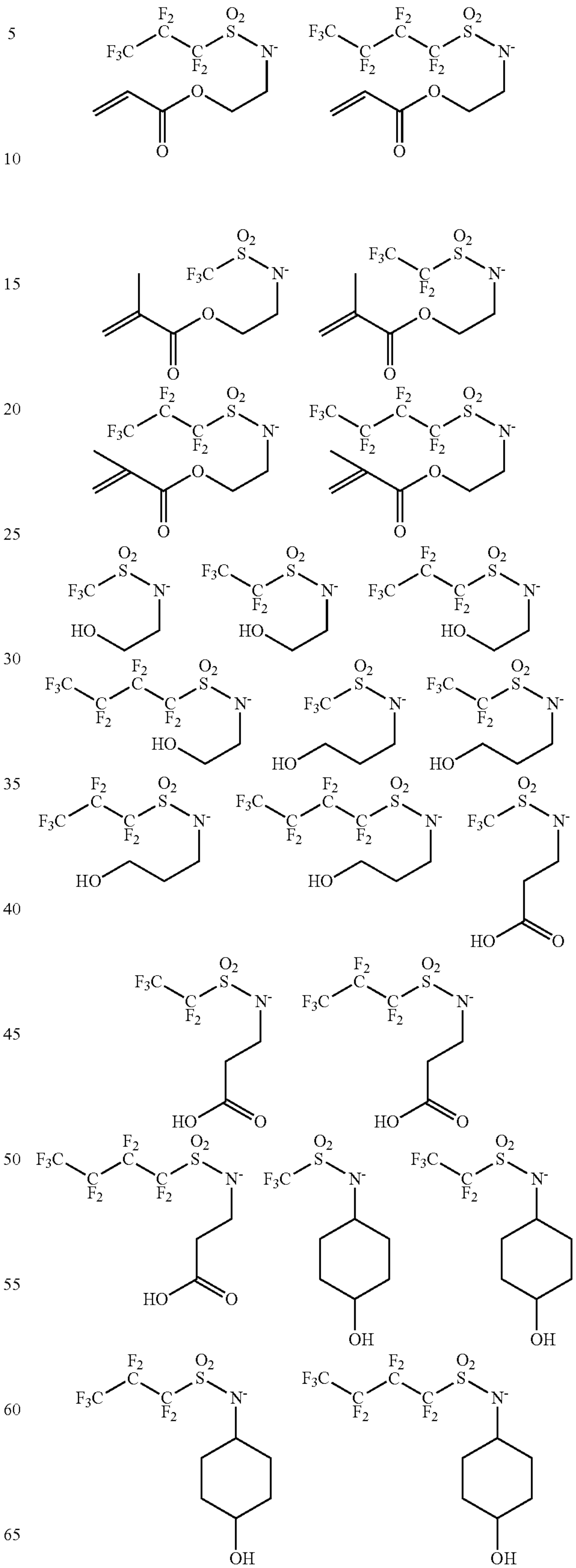

-continued
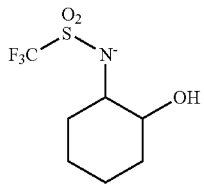
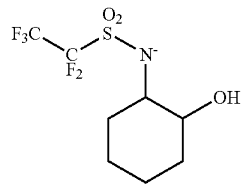
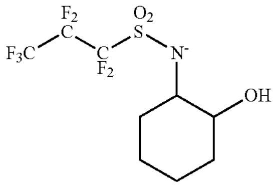
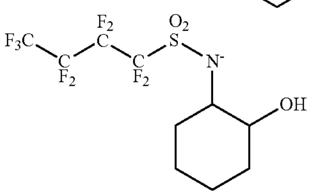
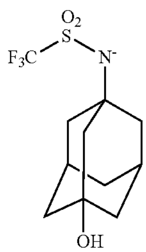
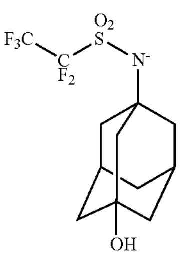
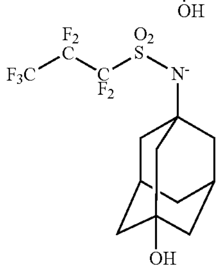
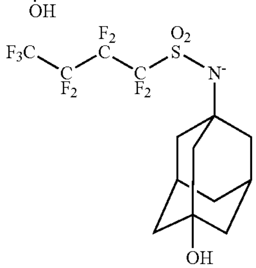
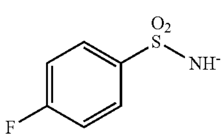
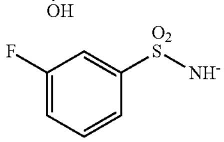
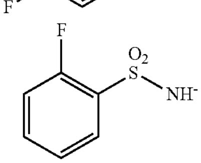
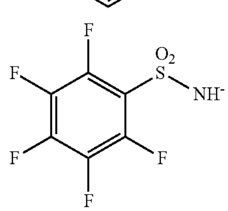
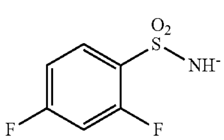
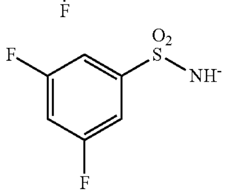
-continued
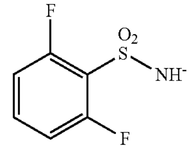
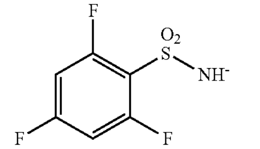
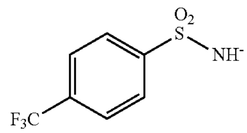
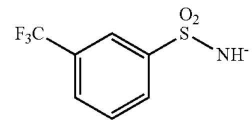
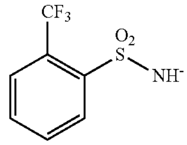
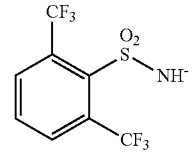
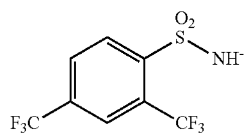
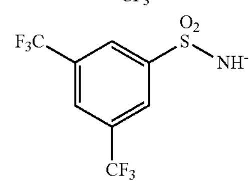
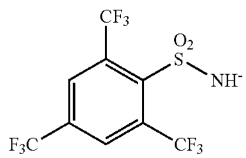
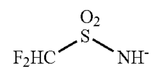
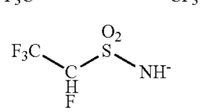
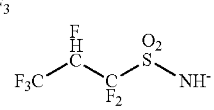
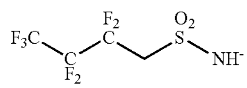
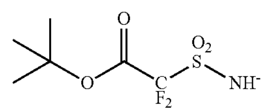
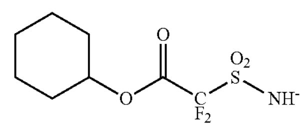
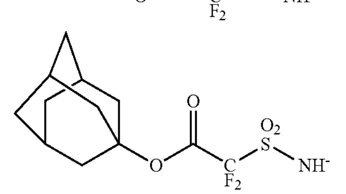
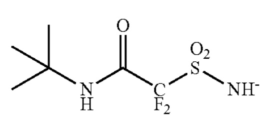
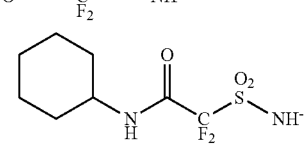
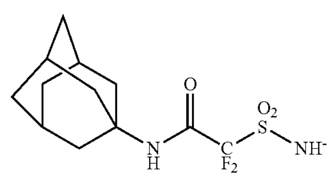
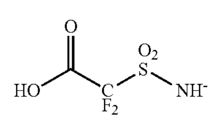
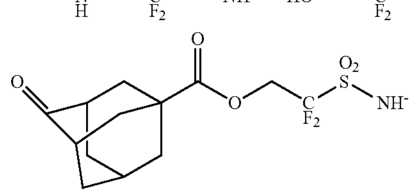

-continued
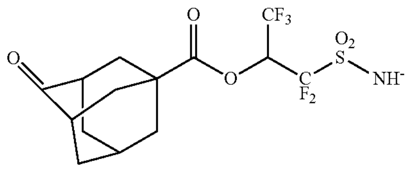
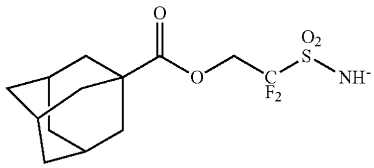
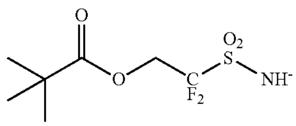
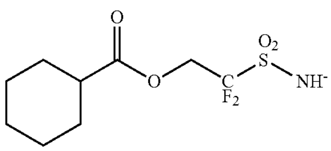
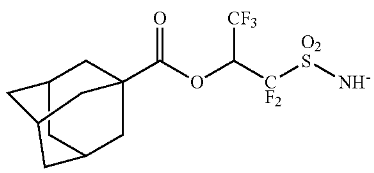
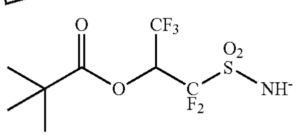
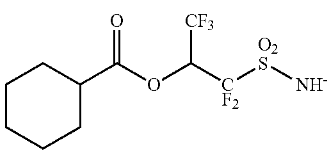
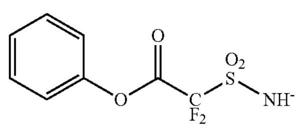
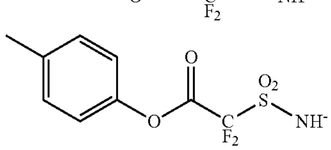
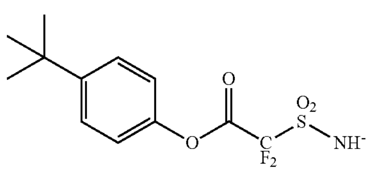
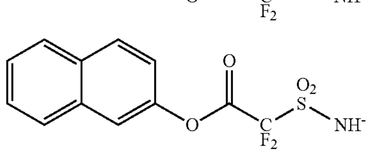
-continued
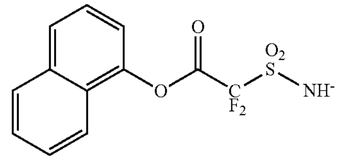
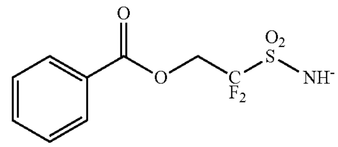
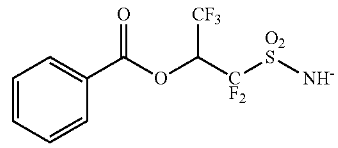
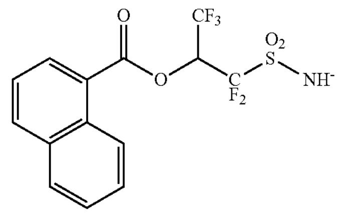
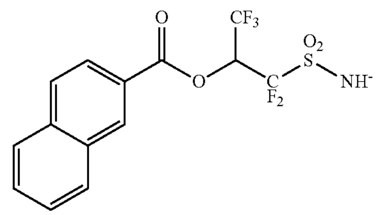
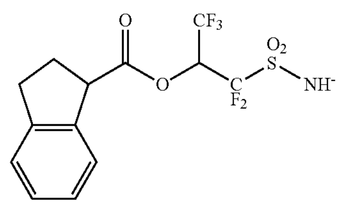
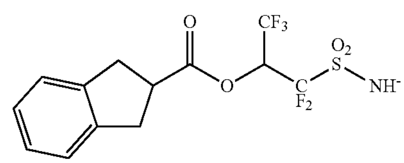
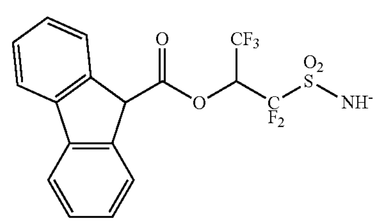
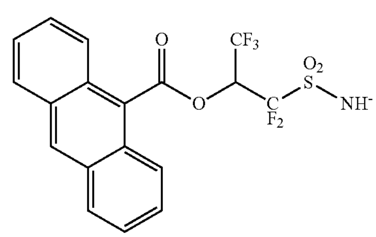

-continued
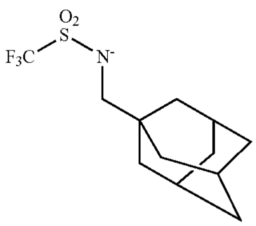
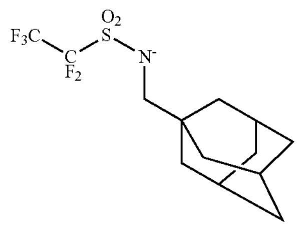
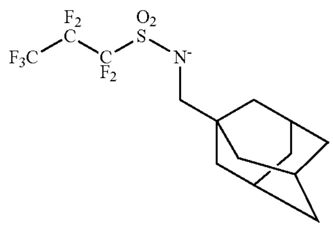
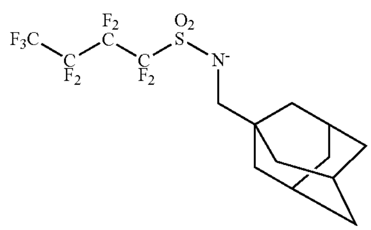
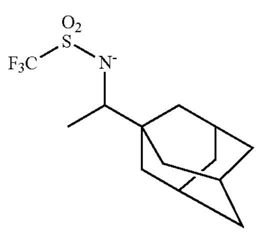
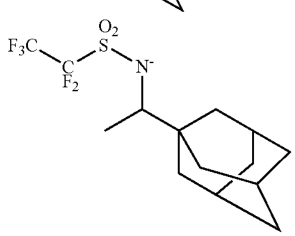
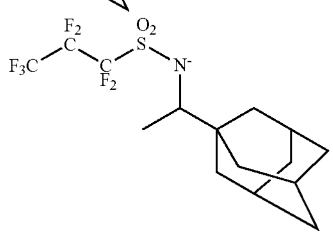
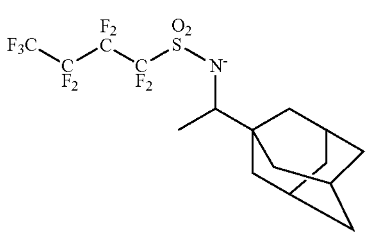
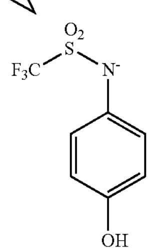
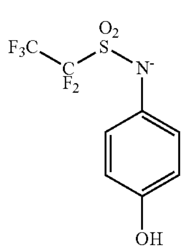
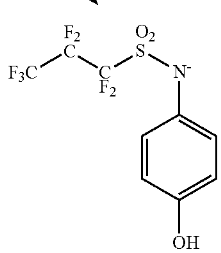
-continued
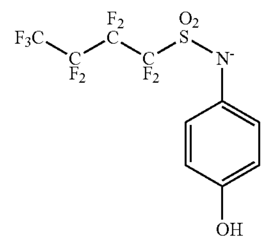
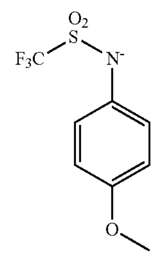
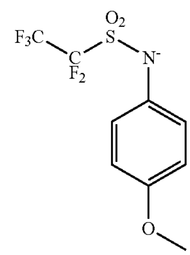
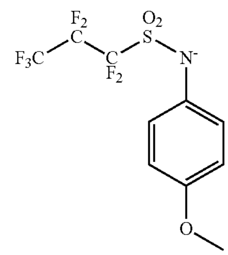
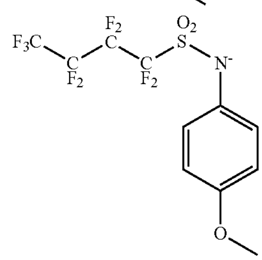
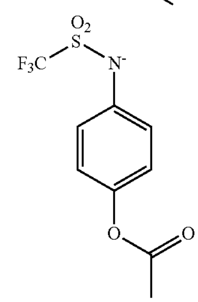
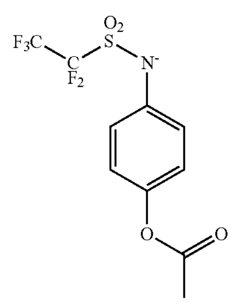
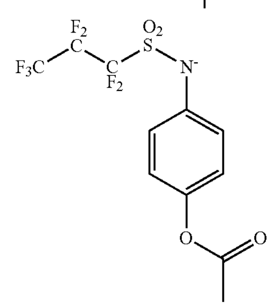
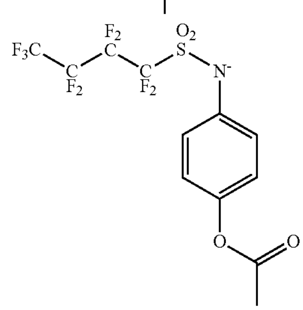
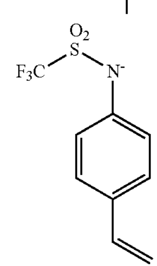
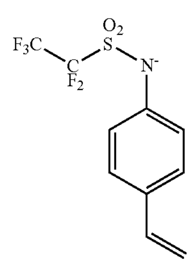
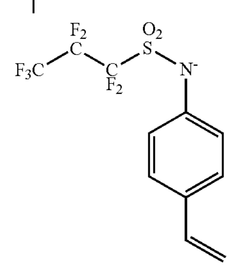

-continued

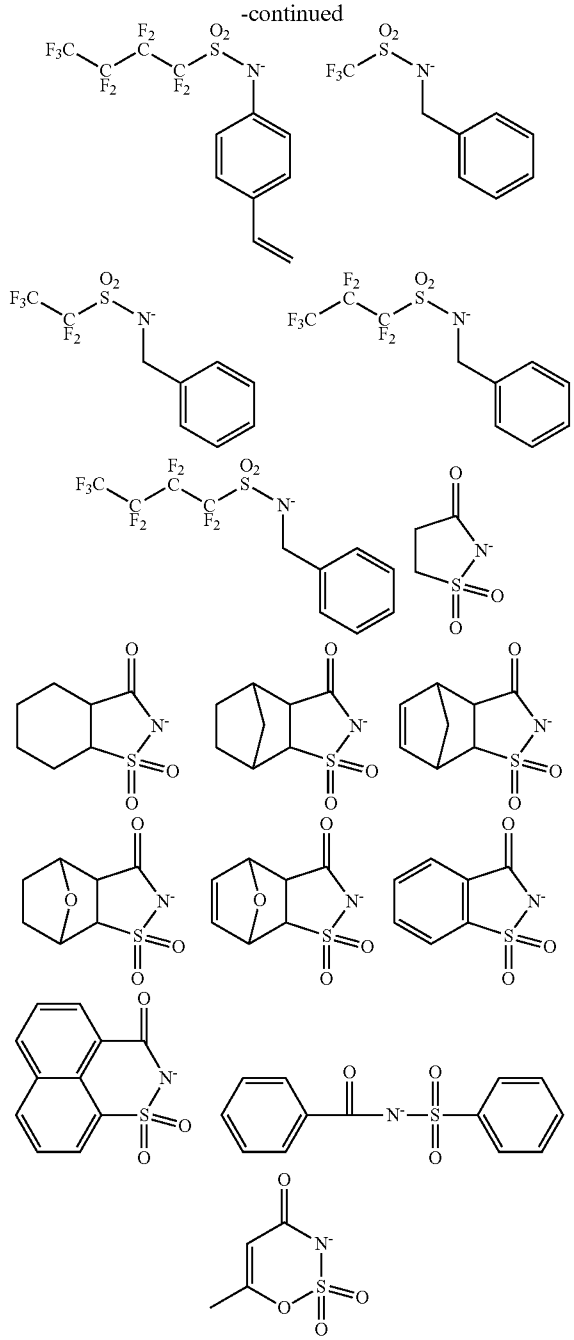

Exemplary of the halide ion are fluoride, chloride, bromide and iodide ions.

In the resist composition, it is preferred in view of sensitivity and acid diffusion suppressing effect to use the iodized benzene ring-containing quencher in an amount of 0.001 to 30 parts by weight, more preferably 0.005 to 20 parts by weight per 100 parts by weight of the base polymer. The iodized benzene ring-containing quencher may be used alone or in admixture.

Base Polymer

The base polymer in the resist composition is an iodized polymer, referred to as Polymer A, hereinafter. Polymer A preferably comprises recurring units having the formula (a1) or recurring units having the formula (a2). These units are simply referred to as recurring units (a1) and (a2).

(a1)

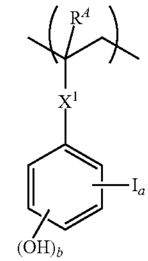

(a2)

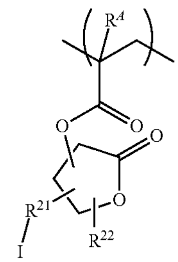

In formulae (a1) and (a2), $R^A$ is each independently hydrogen or methyl. $R^{21}$ is a single bond or methylene. $R^{22}$ is hydrogen or a $C_1$-$C_4$ alkyl group. The alkyl group may be straight, branched or cyclic and preferably straight or branched. $X^1$ is a single bond, ether bond, ester bond, amide bond, —C(═O)—O—$R^{23}$—, phenylene, -Ph-C(═O)—O—$R^{24}$—, or -Ph-$R^{25}$—O—C(═O)—$R^{26}$—, wherein Ph is phenylene, $R^{23}$ is a $C_1$-$C_{10}$ alkanediyl group which may be straight, branched or cyclic, and contain an ether bond or ester bond, $R^{24}$, $R^{25}$ and $R^{26}$ are each independently a single bond or a $C_1$-$C_6$ straight or branched alkanediyl group.

In formula (a1), "a" is an integer of 1 to 5, b is an integer of 0 to 4, and 1≤a+b≤5. It is preferred that b be an integer of 1 to 3 and "a" be an integer of 1 to 3 because the inclusion of hydroxyl group ensures more efficient generation of secondary electrons, leading to a higher sensitivity.

Examples of the monomer from which recurring units (a1) are derived are shown below, but not limited thereto. Herein $R^A$ is as defined above.

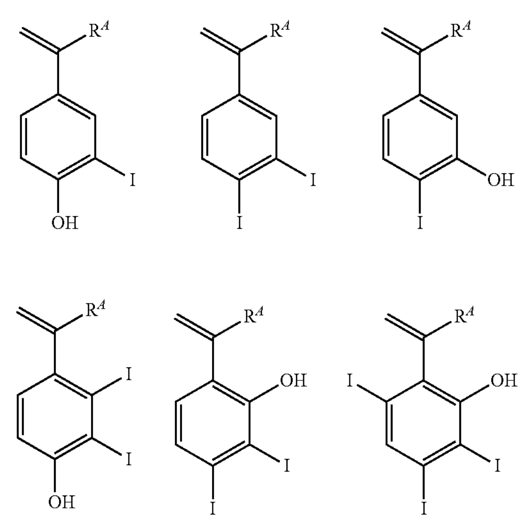

-continued
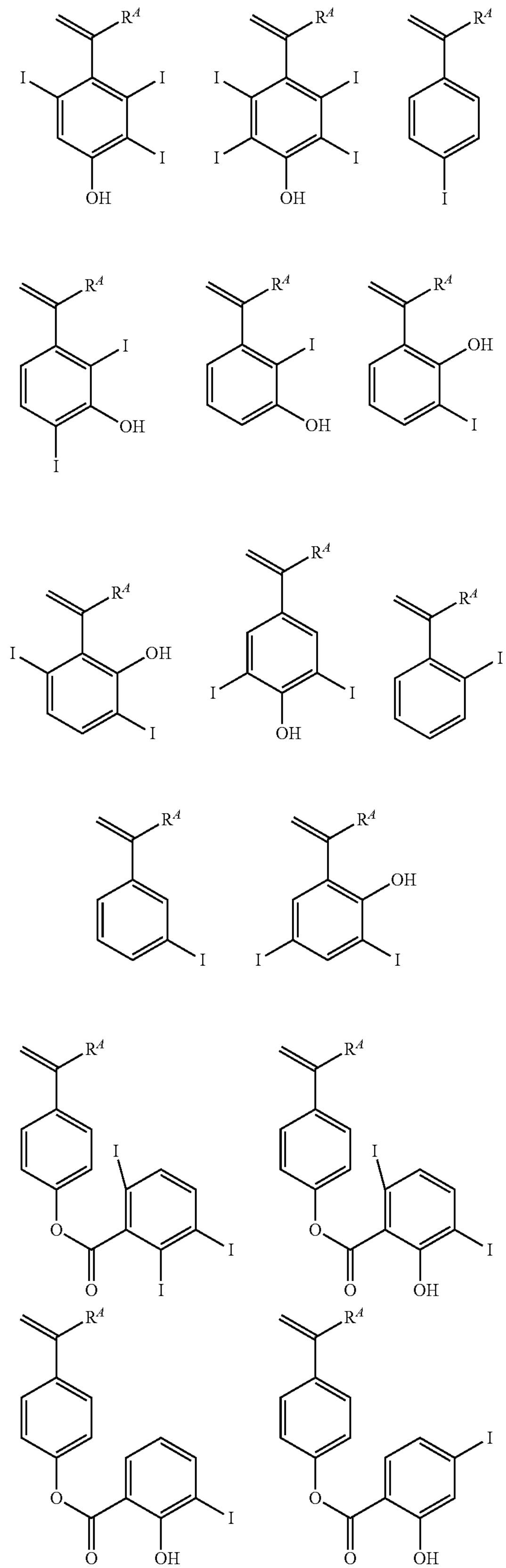
-continued
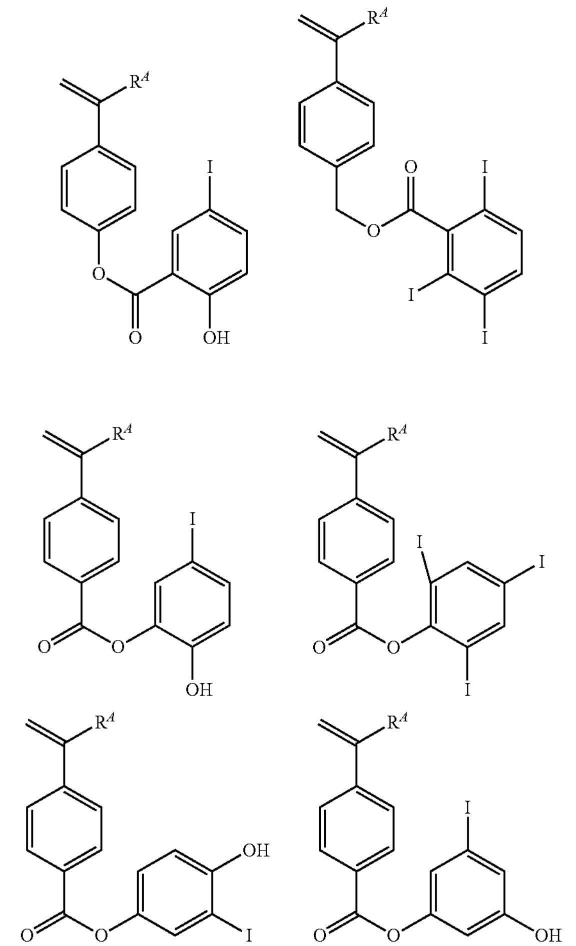
Examples of the monomer from which recurring units (a2) are derived are shown below, but not limited thereto. Herein $R^A$ is as defined above.
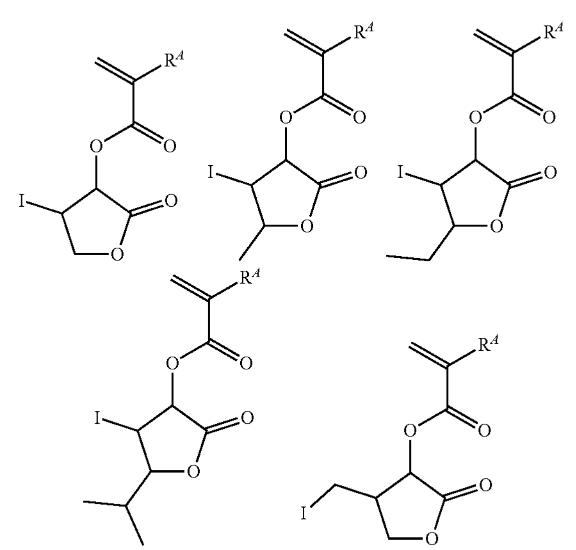

-continued

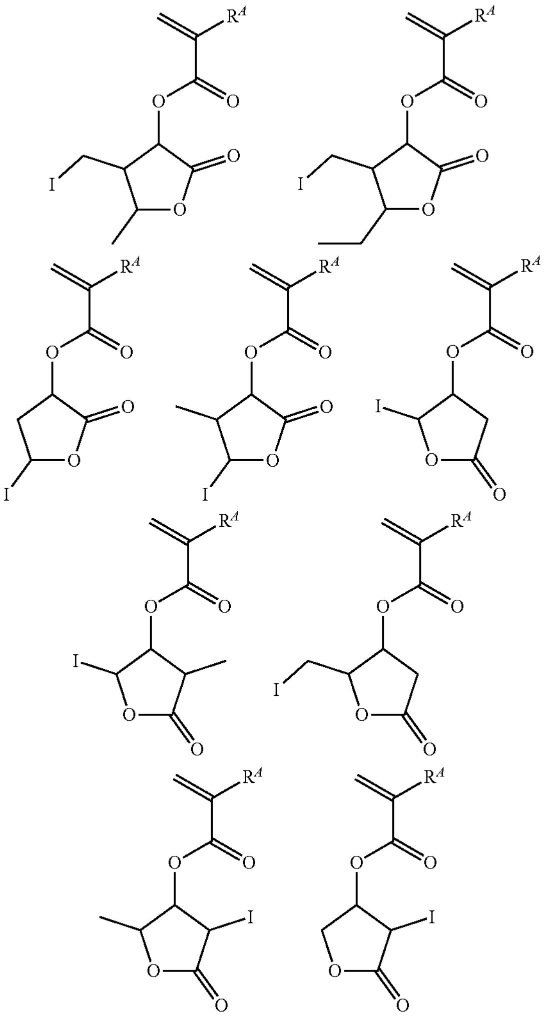

The recurring units (a1) or (a2) may be used alone or in admixture, and the recurring units (a1) and (a2) may be used in combination.

In one embodiment wherein the resist composition is of positive tone, preferably Polymer A further comprises recurring units having an acid labile group. The preferred recurring units having an acid labile group are recurring units having the formula (b1), which are referred to as recurring units (b1), or recurring units having the formula (b2), which are referred to as recurring units (b2), hereinafter. In another embodiment wherein the resist composition is of negative tone, preferably Polymer A is free of recurring units having an acid labile group.

(b1)

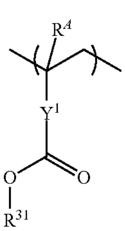

-continued (b2)

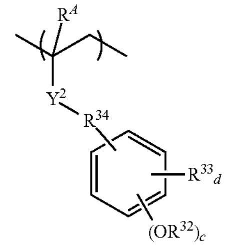

In formulae (b1) and (b2), $R^A$ is each independently hydrogen or methyl. $Y^1$ is a single bond, phenylene group, naphthylene group, or a $C_1$-$C_{12}$ linking group containing an ester bond or lactone ring. $Y^2$ is a single bond or ester bond. $R^{31}$ and $R^{32}$ are each independently an acid labile group. $R^{33}$ is fluorine, trifluoromethyl, cyano, $C_1$-$C_6$ alkyl, $C_1$-$C_6$ alkoxy, $C_2$-$C_7$ acyl, $C_2$-$C_7$ acyloxy, or $C_2$-$C_7$ alkoxycarbonyl group. $R^{34}$ is a single bond or a $C_1$-$C_6$ alkanediyl group in which some carbon may be replaced by an ether or ester bond, c is 1 or 2, d is an integer of 0 to 4, and $1 \le c+d \le 5$. The alkyl, alkoxy, acyl, acyloxy and alkoxycarbonyl groups may be straight, branched or cyclic. The $C_1$-$C_6$ alkanediyl groups are preferably straight or branched.

Examples of the monomer from which recurring units (b1) are derived are shown below, but not limited thereto. Herein $R^A$ and $R^{31}$ are as defined above.

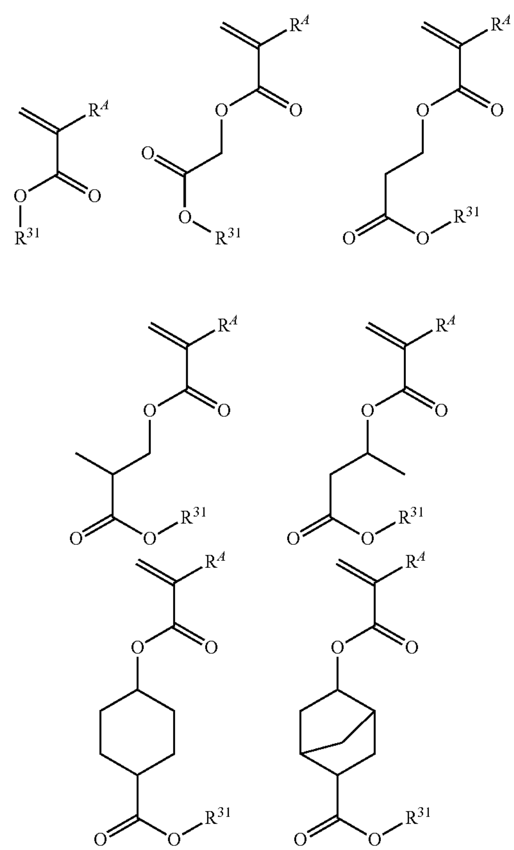

-continued

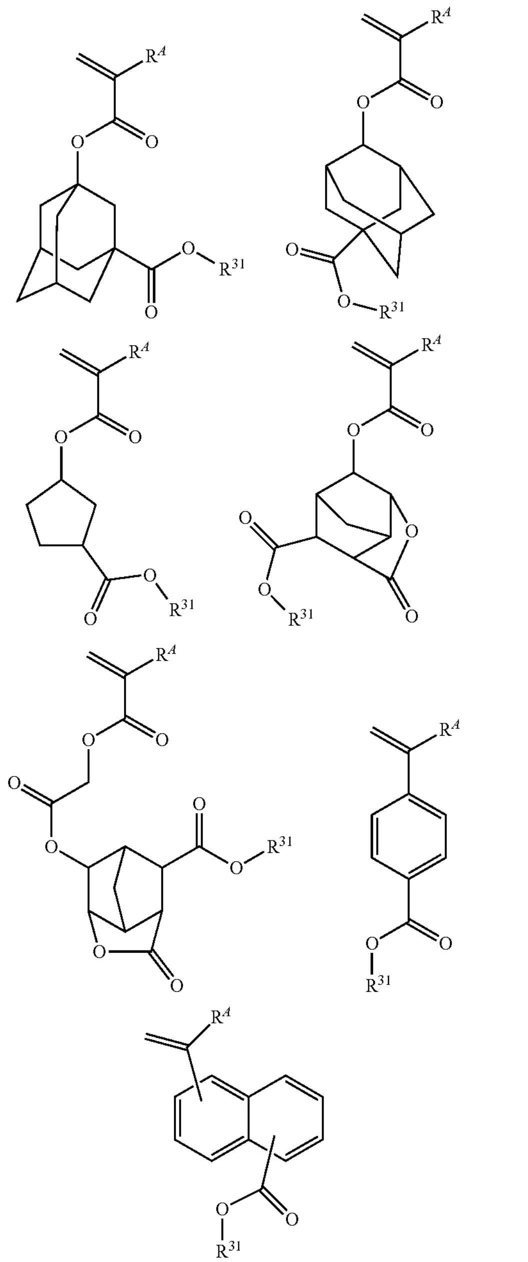

-continued

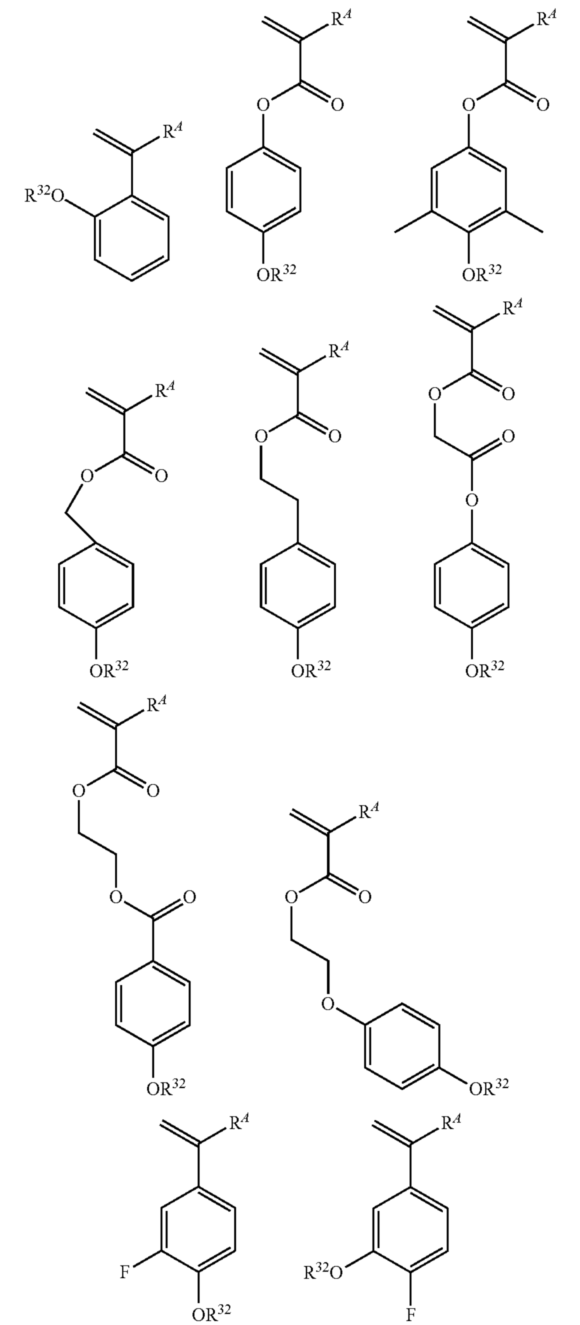

Examples of the monomer from which recurring units (b2) are derived are shown below, but not limited thereto. Herein $R^A$ and $R^{32}$ are as defined above.

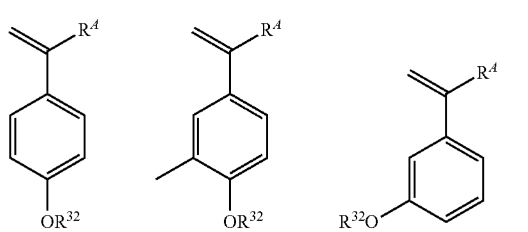

The acid labile groups represented by $R^{31}$ and $R^{32}$ in the recurring units (b1) and (b2) may be selected from a variety of such groups, for example, those groups described in JP-A 2013-080033 (U.S. Pat. No. 8,574,817) and JP-A 2013-083821 (U.S. Pat. No. 8,846,303).

Typical of the acid labile group are groups of the following formulae (AL-1) to (AL-3).

(AL-1)

$$(CH_2)_{x^1}-\overset{\displaystyle O}{\overset{\|}{C}}-O-R^{L1}$$

-continued (AL-2)

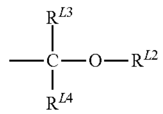

(AL-3)

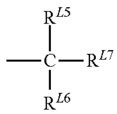

In formulae (AL-1) and (AL-2), $R^{L1}$ and $R^{L2}$ are each independently a monovalent hydrocarbon group which may contain a heteroatom such as oxygen, sulfur, nitrogen or fluorine. The monovalent hydrocarbon groups may be straight, branched or cyclic, with alkyl groups of 1 to 40 carbon atoms, especially 1 to 20 carbon atoms being preferred. In formula (AL-1), $x^1$ is an integer of 0 to 10, especially 1 to 5.

In formula (AL-2), $R^{L3}$ and $R^{L4}$ are each independently hydrogen or a monovalent hydrocarbon group which may contain a heteroatom such as oxygen, sulfur, nitrogen or fluorine. The monovalent hydrocarbon groups may be straight, branched or cyclic, with $C_1$-$C_{20}$ alkyl groups being preferred. Any two of $R^{L2}$, $R^{L3}$ and $R^{L4}$ may bond together to form a ring with the carbon atom or carbon and oxygen atoms to which they are attached. The ring contains 3 to 20 carbon atoms, preferably 4 to 16 carbon atoms, and is typically alicyclic.

In formula (AL-3), $R^{L5}$, $R^{L6}$ and $R^{L7}$ are each independently a monovalent hydrocarbon group which may contain a heteroatom such as oxygen, sulfur, nitrogen or fluorine. The monovalent hydrocarbon groups may be straight, branched or cyclic, with $C_1$-$C_{20}$ alkyl groups being preferred. Any two of $R^{L5}$, $R^{L6}$ and $R^{L7}$ may bond together to form a ring with the carbon atom to which they are attached. The ring contains 3 to 20 carbon atoms, preferably 4 to 16 carbon atoms and is typically alicyclic.

Polymer A may further comprise recurring units (c) having a phenolic hydroxyl group as an adhesive group. The recurring units (c) may be used alone or in admixture.

Examples of the monomers from which recurring units (c) are derived are given below, but not limited thereto. Herein $R^A$ is as defined above.

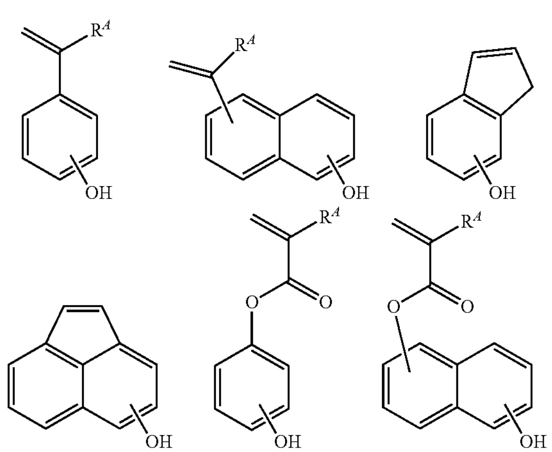

-continued

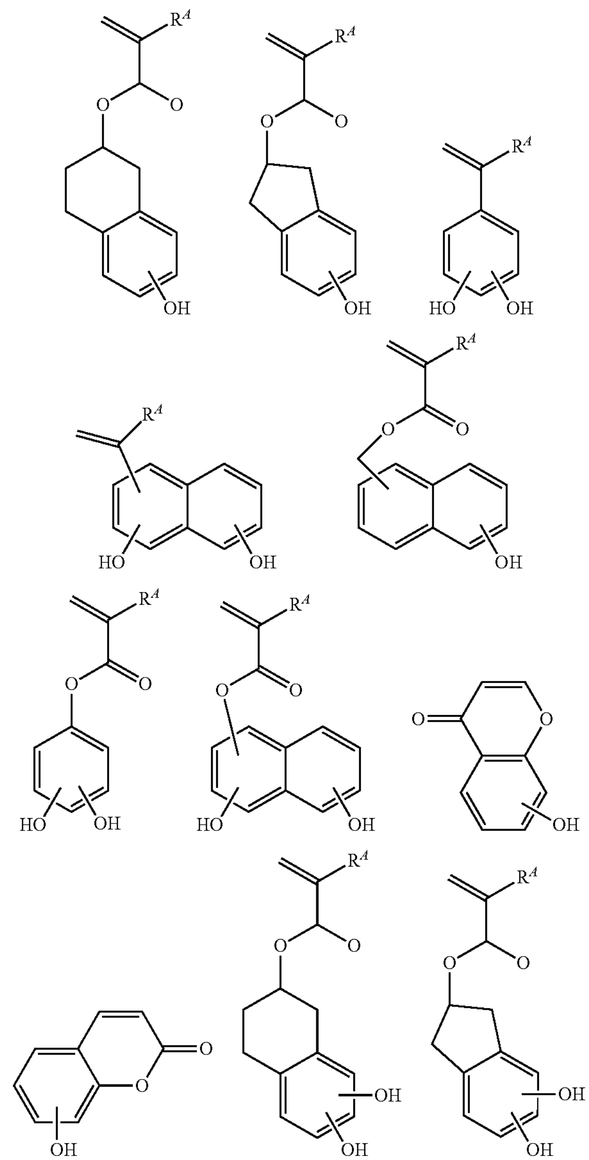

Polymer A may further comprise recurring units (d) having another adhesive group selected from hydroxyl (other than the phenolic hydroxyl), carboxyl, lactone ring, ether bond, ester bond, carbonyl and cyano groups. The recurring units (d) may be used alone or in admixture.

Examples of the monomer from which recurring units (d) are derived are given below, but not limited thereto. Herein $R^A$ is as defined above.

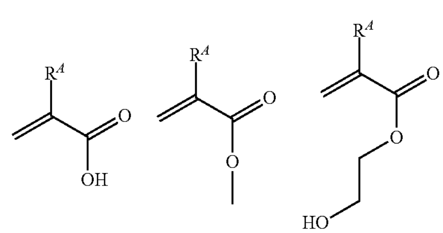

-continued
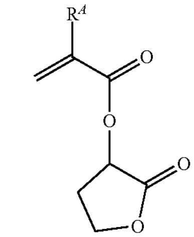
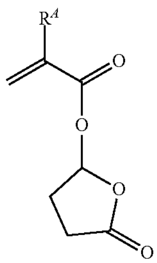
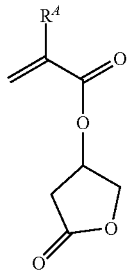
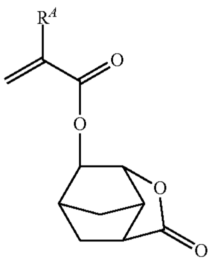
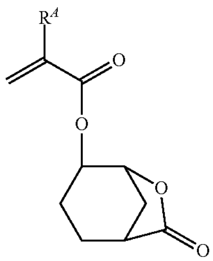
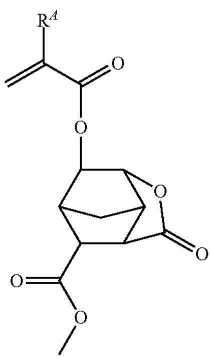
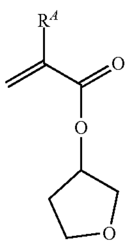
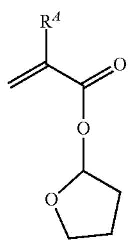
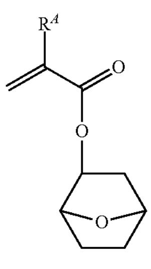
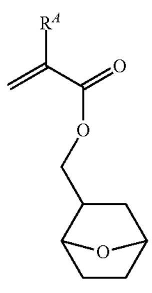
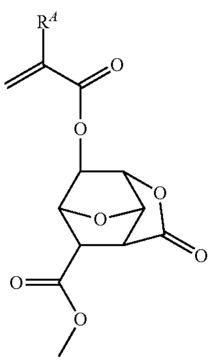
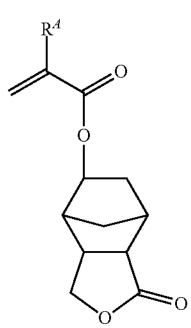
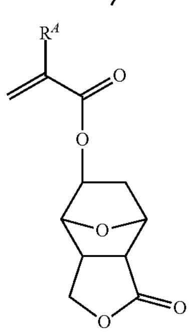
-continued
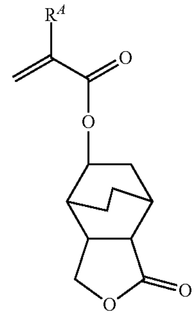
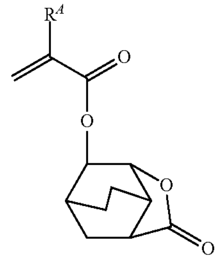
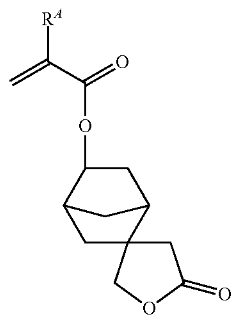
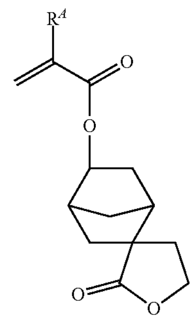
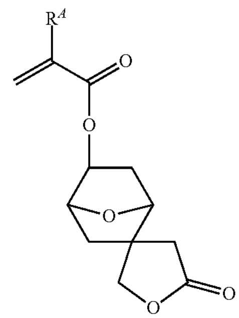
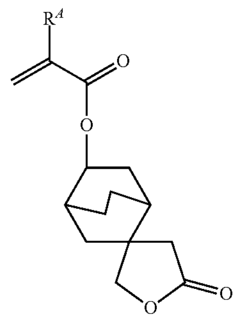
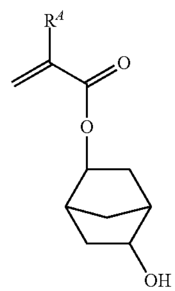
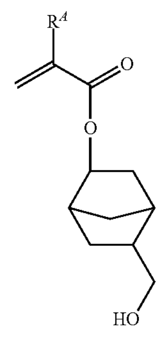
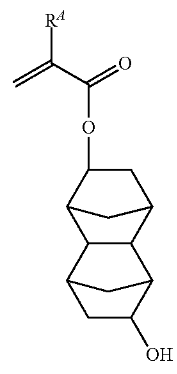
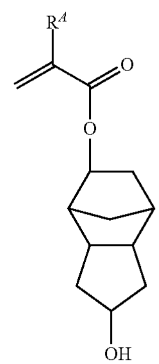
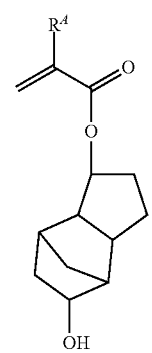
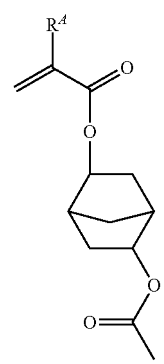

-continued
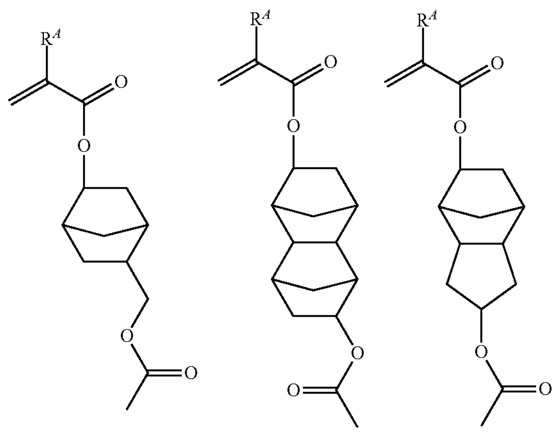
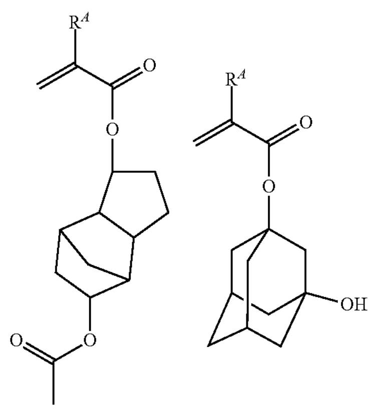
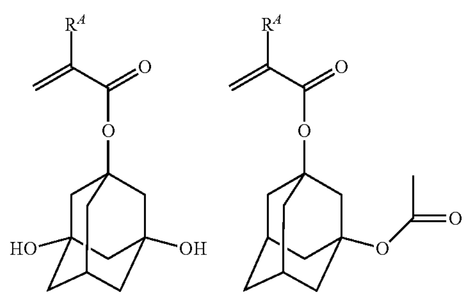
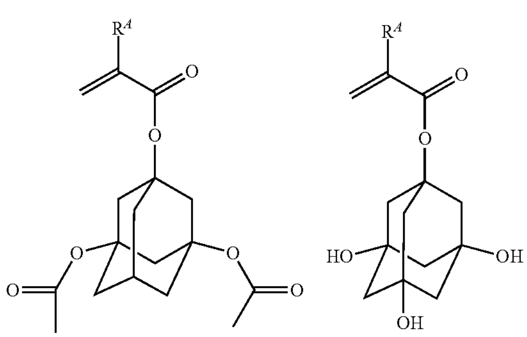
-continued
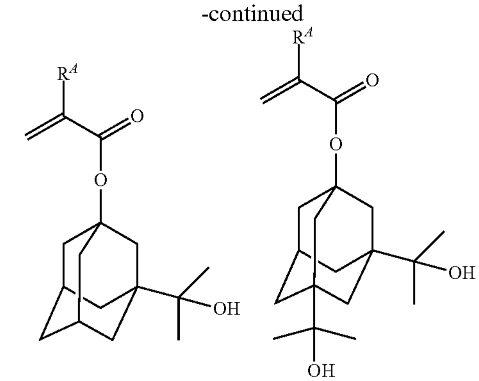
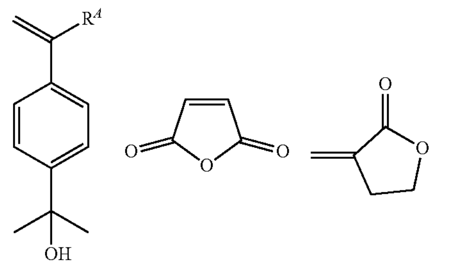
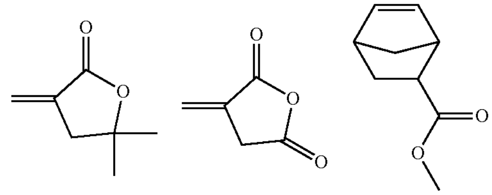
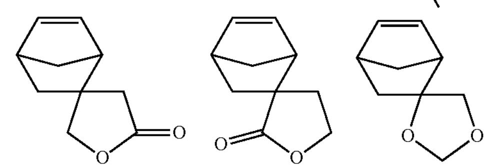
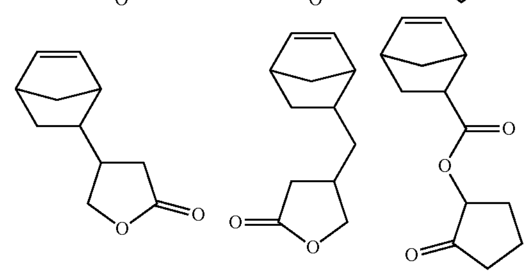
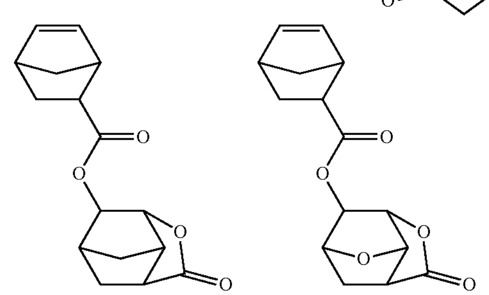
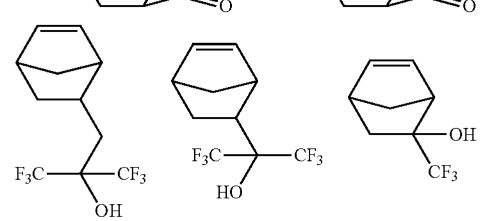

-continued
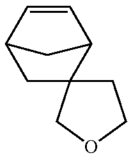
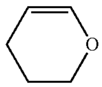
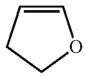
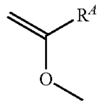
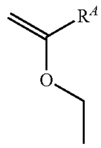
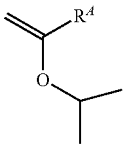
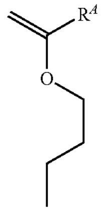
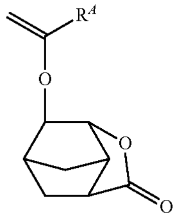
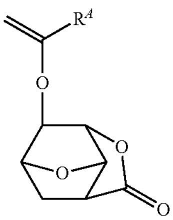
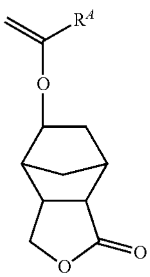
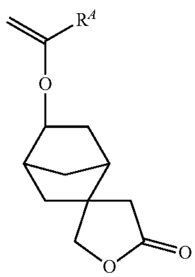
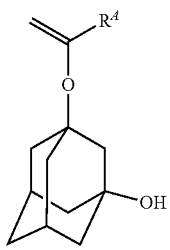
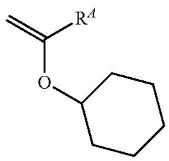
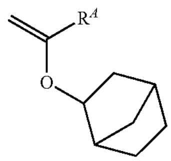
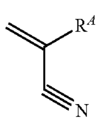
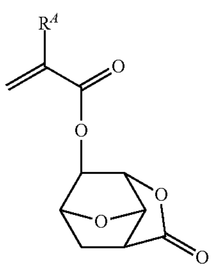
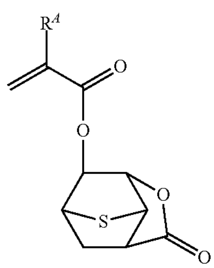
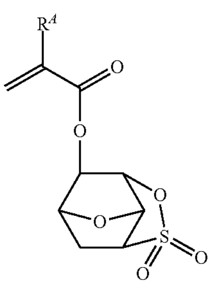
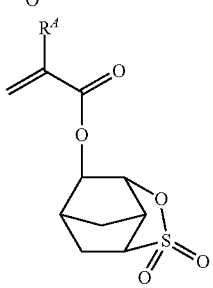
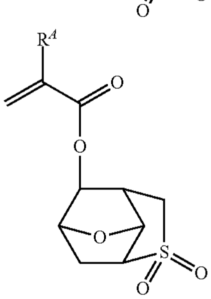
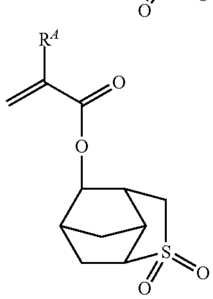
-continued
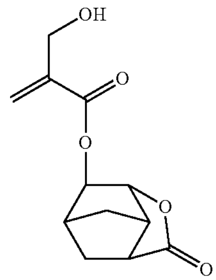
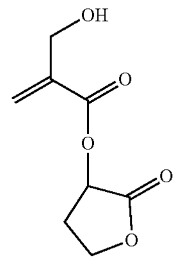
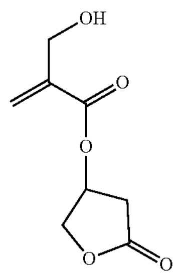
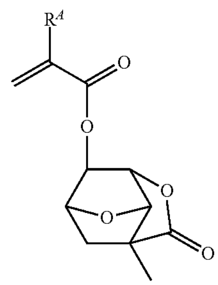
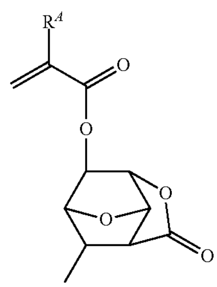
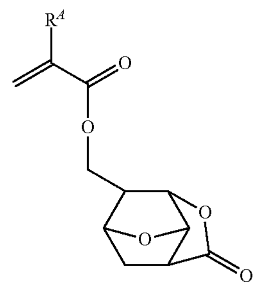
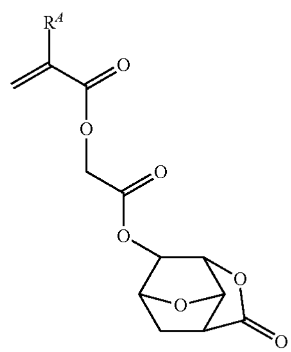
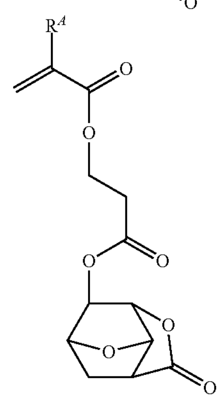
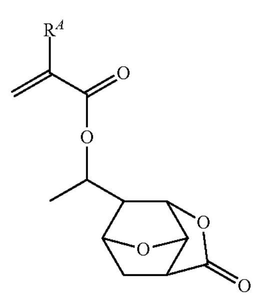
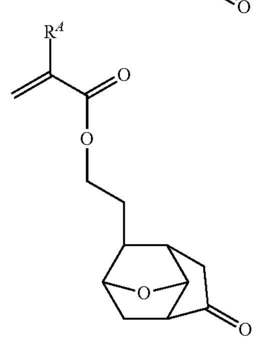

-continued
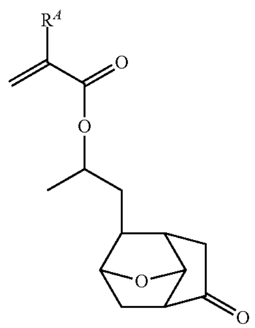
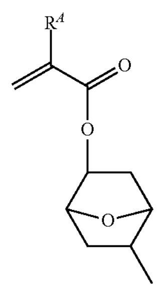
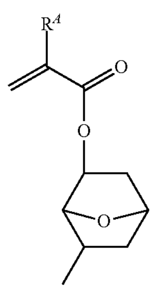
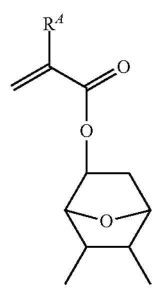
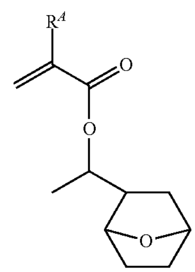
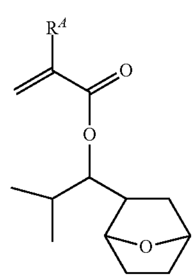
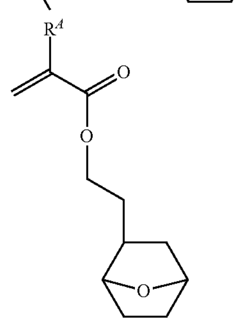
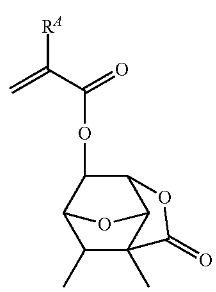
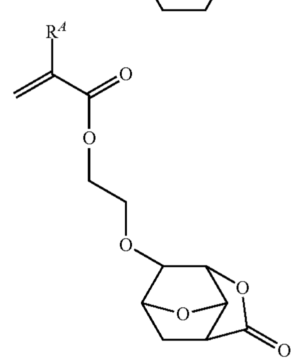
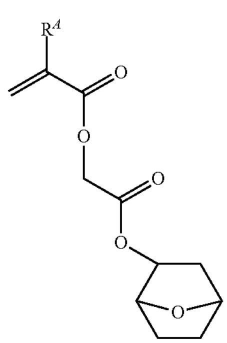
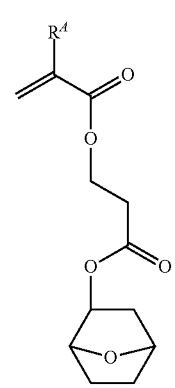
-continued
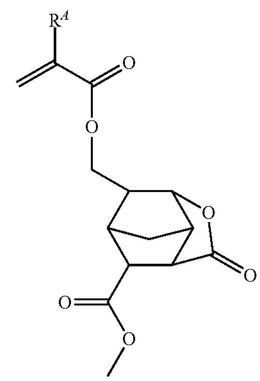
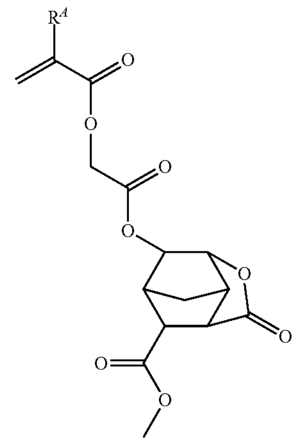
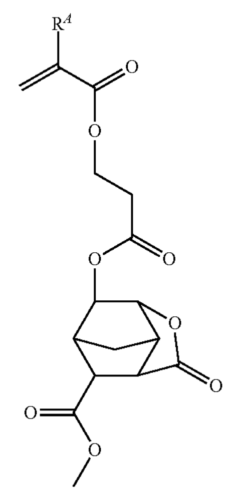
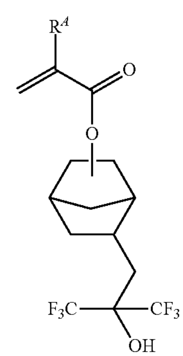
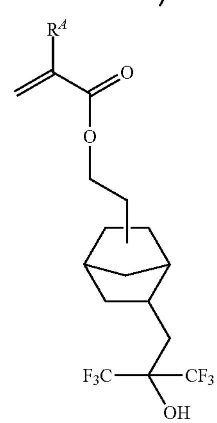
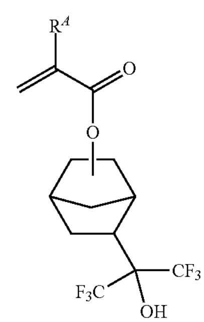
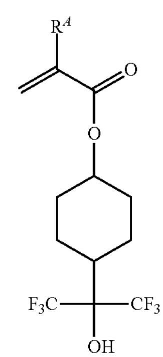
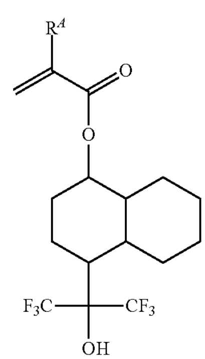
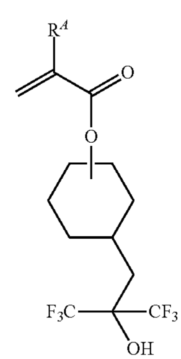
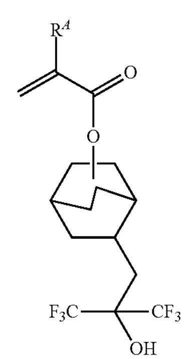

-continued
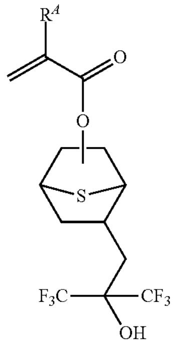
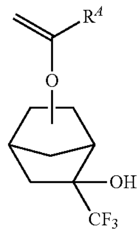
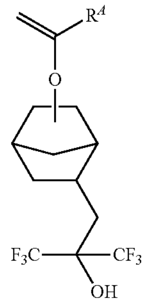
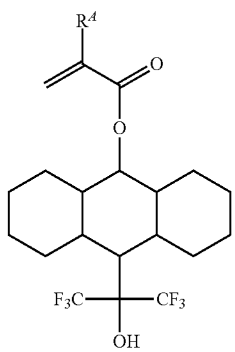
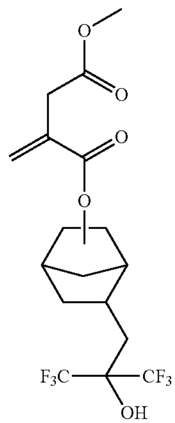
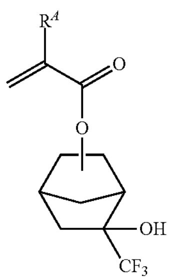
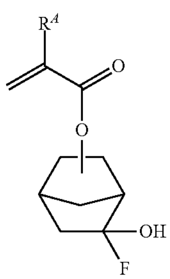
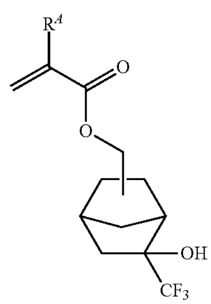
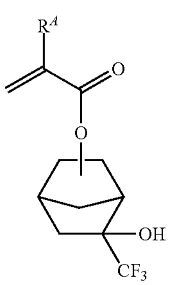
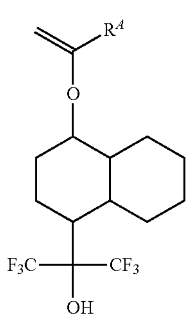
-continued
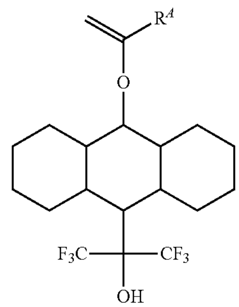
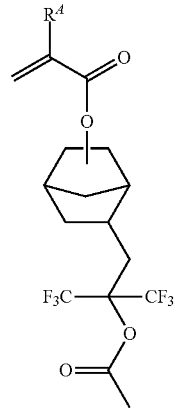
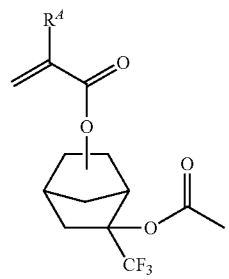
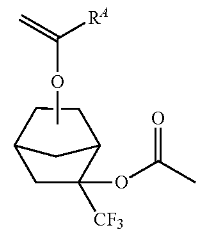
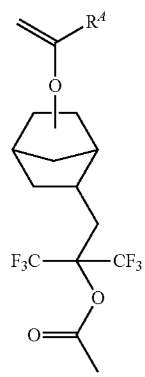
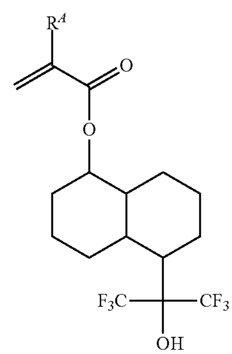
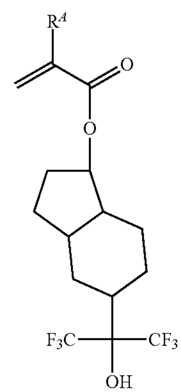
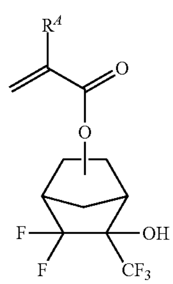
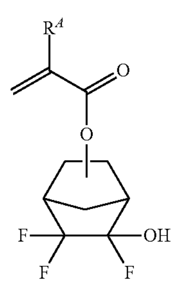
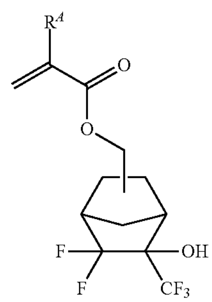
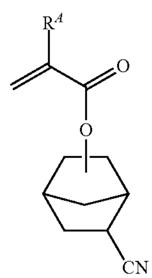
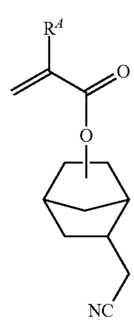
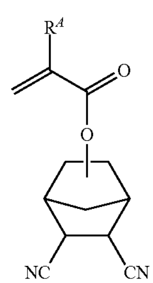

-continued
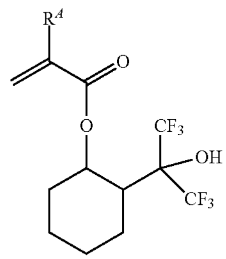
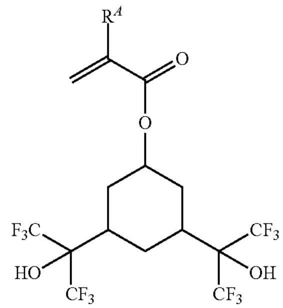
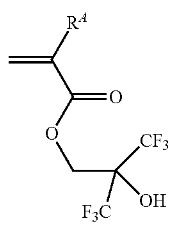
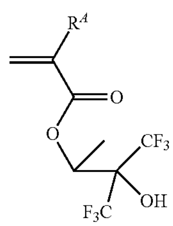
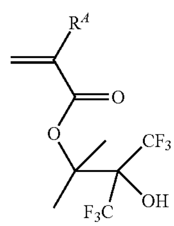
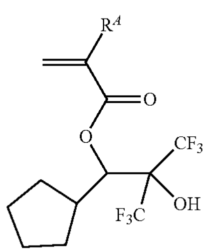
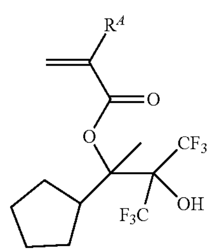
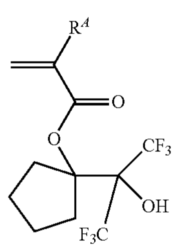
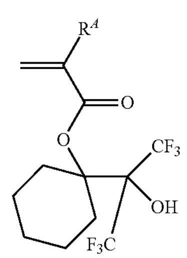
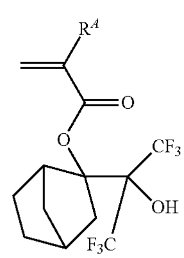
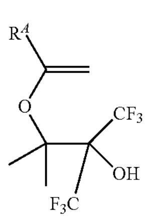
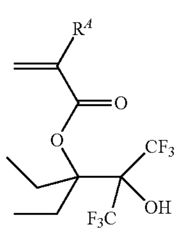
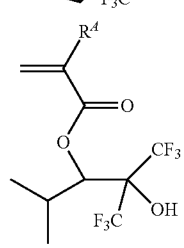
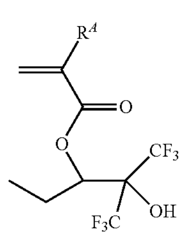
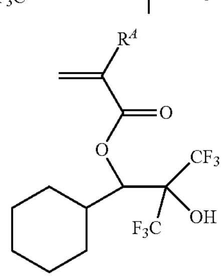
-continued
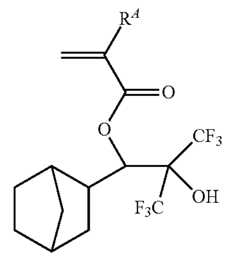
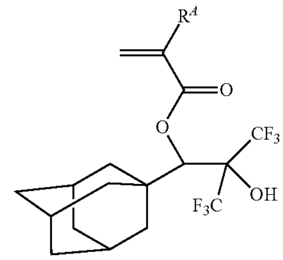
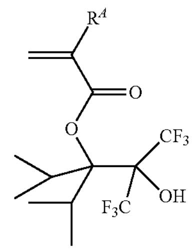
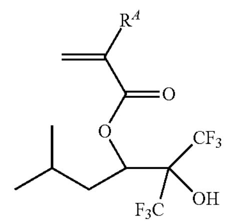
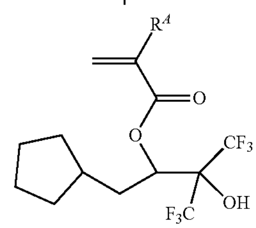
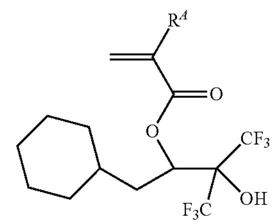
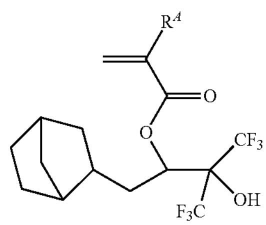
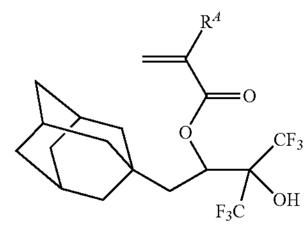
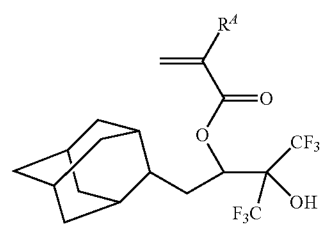
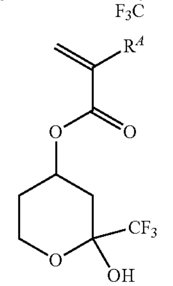
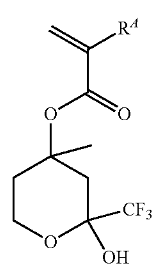
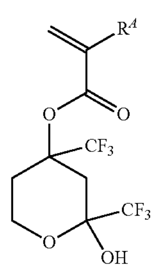
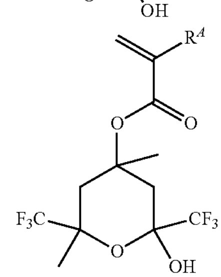
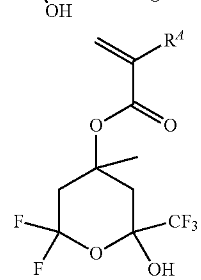
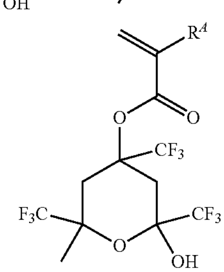

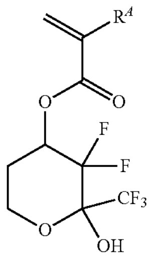
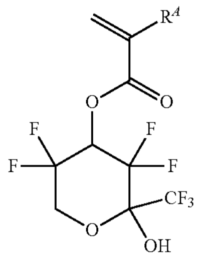
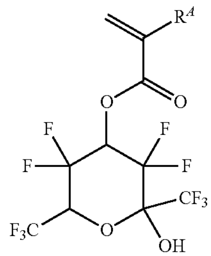
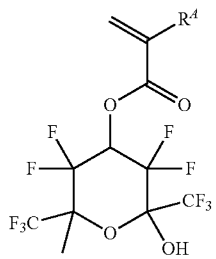
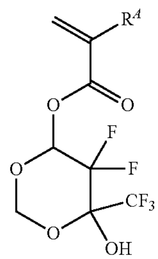
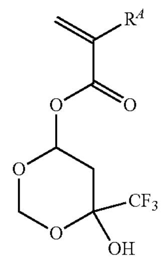
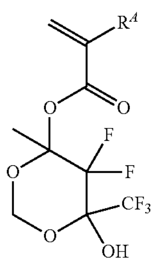
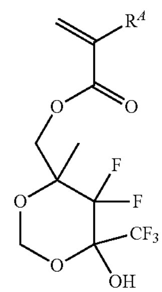
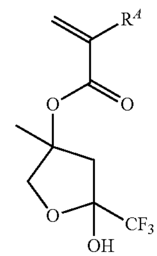
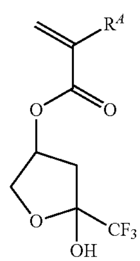
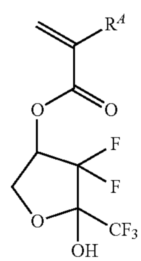
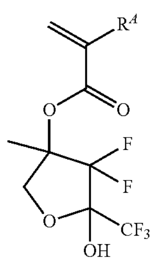
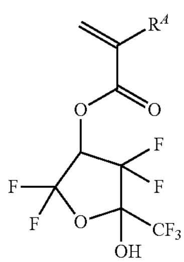
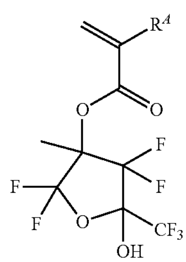
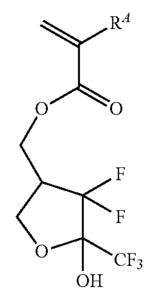
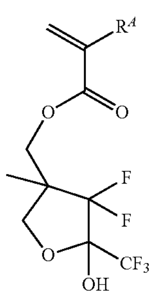
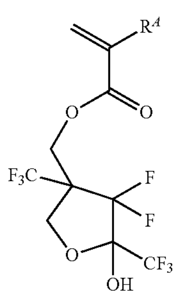
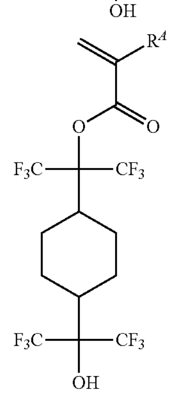
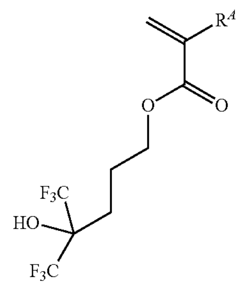
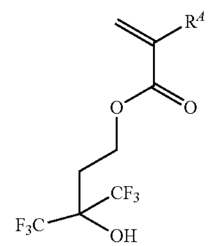
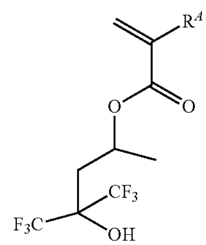
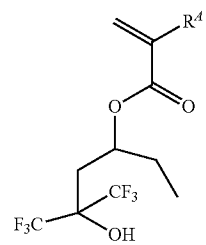
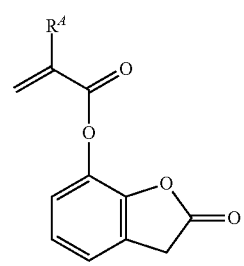
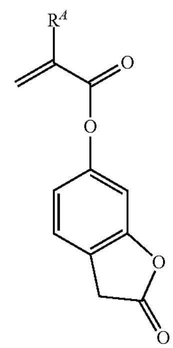
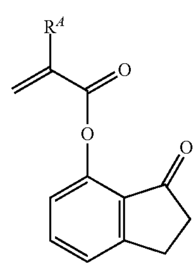
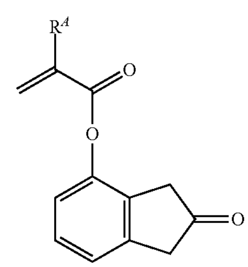
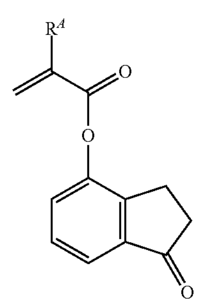
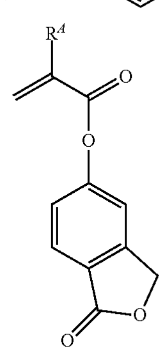
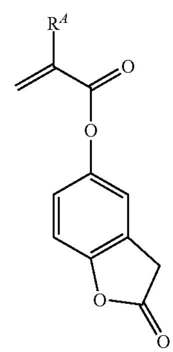

-continued
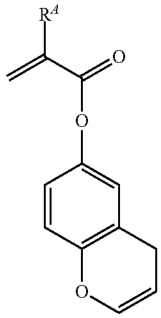
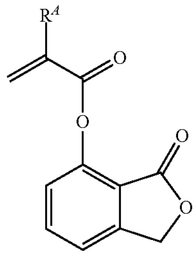
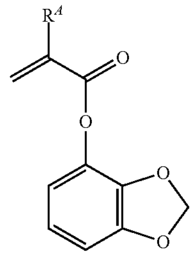
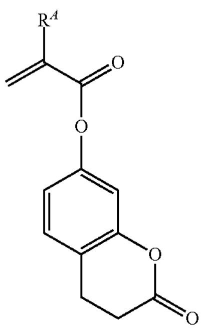
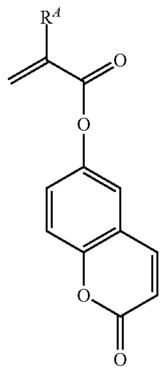
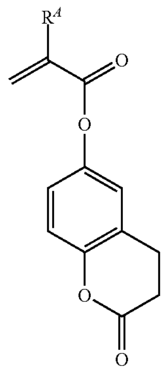
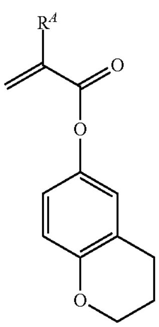
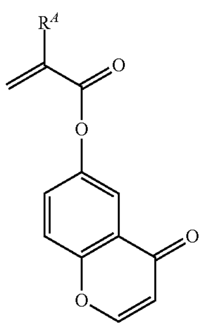
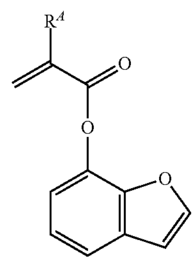
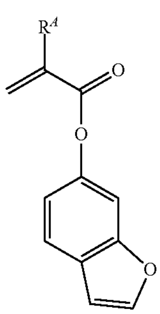
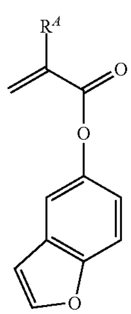
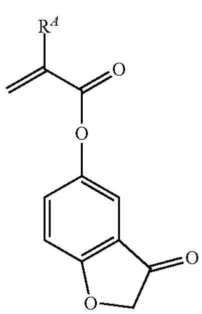
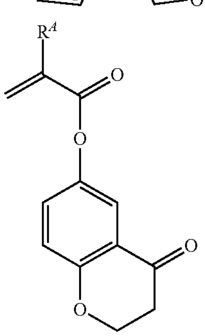
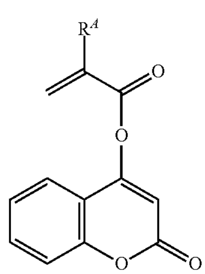
-continued
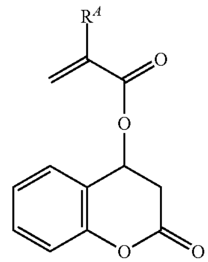
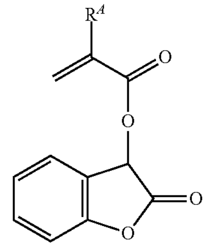
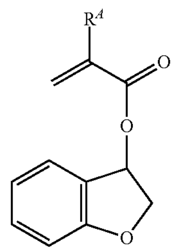
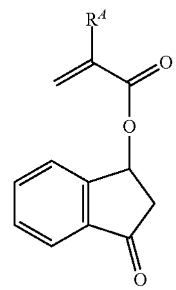
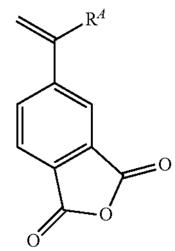
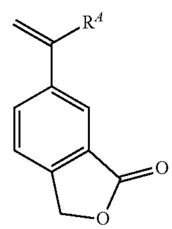
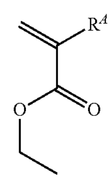
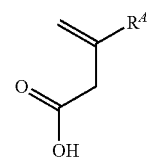
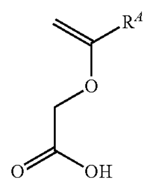
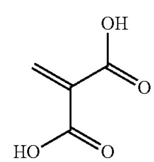
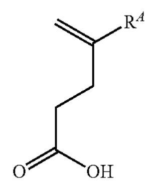
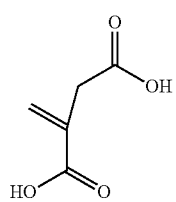
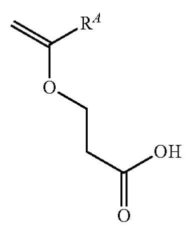
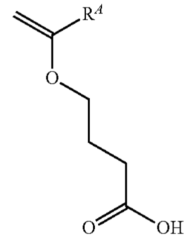
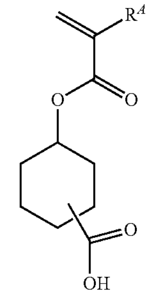
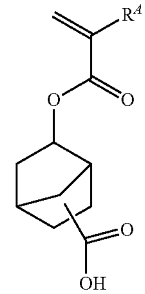
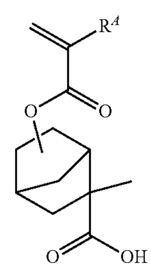

-continued

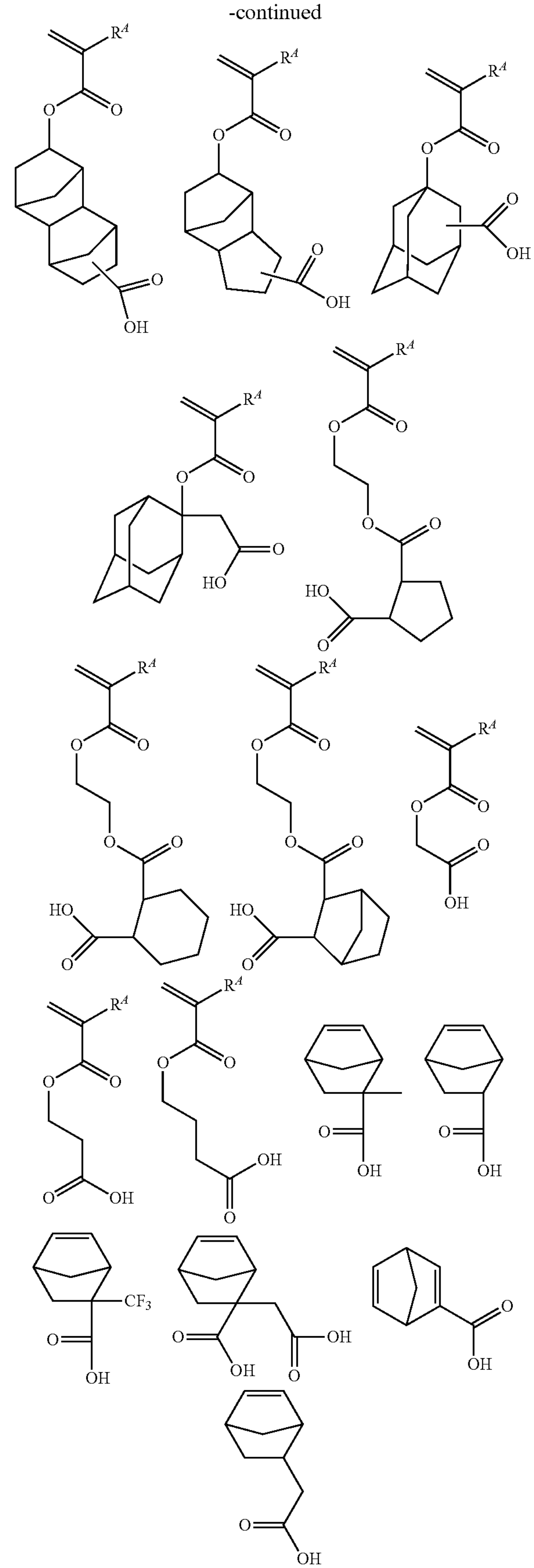

In another preferred embodiment, Polymer A may further comprise recurring units (e) selected from units of indene, benzofuran, benzothiophene, acenaphthylene, chromone, coumarin, and norbornadiene, or derivatives thereof. The recurring units (e) may be used alone or in admixture.

Suitable monomers from which recurring units (e) are derived are exemplified below, but not limited thereto.

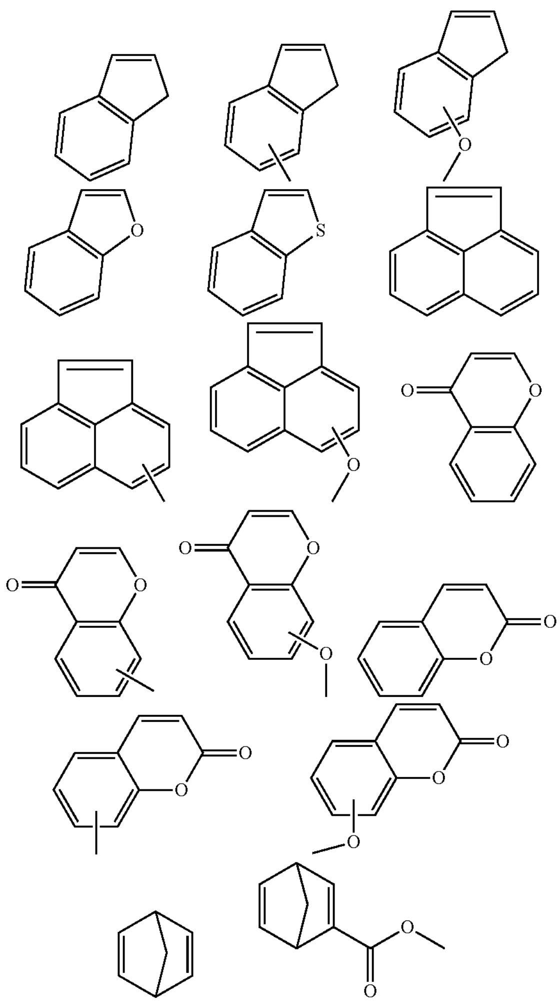

Polymer A may further comprise recurring units (f) which are derived from styrene, vinylnaphthalene, vinylanthracene, vinylpyrene, methyleneindene, vinylpyridine, and vinylcarbazole. The recurring units (f) may be used alone or in admixture.

In a further embodiment, Polymer A may further comprise recurring units (g) derived from a sulfonic acid onium salt having a polymerizable unsaturated bond. JP-A 2005-084365 discloses sulfonium and iodonium salts having a polymerizable unsaturated bond capable of generating a sulfonic acid. JP-A 2006-178317 discloses a sulfonium salt having sulfonic acid directly attached to the main chain.

The preferred recurring units (g) are recurring units having the following formulae (g1), (g2) and (g3). These units are simply referred to as recurring units (g1), (g2) and (g3), which may be used alone or in combination of two or more types.

(g1)

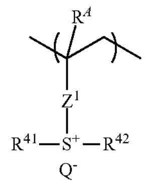

(g2)

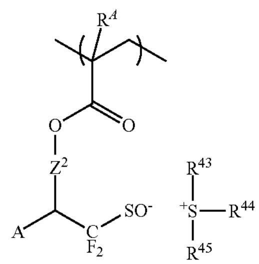

(g3)

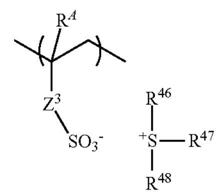

In formulae (g1) to (g3), $R^A$ is each independently hydrogen or methyl. $Z^1$ is a single bond, phenylene group, —O—$Z^{12}$—, or —C(═O)—$Z^{11}$—$Z^{12}$—, wherein $Z^{11}$ is —O— or —NH—, and $Z^{12}$ is a $C_1$-$C_6$ alkanediyl, $C_2$-$C_6$ alkenediyl or phenylene group, which may contain a carbonyl, ester bond, ether bond or hydroxyl moiety. $Z^2$ is a single bond, —$Z^{21}$—C(═O)—O—, —$Z^{21}$—O— or —$Z^{21}$—O—C(═O)—, wherein $Z^{21}$ is a $C_1$-$C_{12}$ alkanediyl group which may contain a carbonyl moiety, ester bond or ether bond. $Z^3$ is a single bond, methylene, ethylene, phenylene or fluorinated phenylene group, —O—$Z^{32}$—, or —C(═O)—$Z^{31}$—$Z^{32}$—, wherein $Z^{31}$ is —O— or —NH—, and $Z^{32}$ is a $C_1$-$C_6$ alkanediyl, phenylene, fluorinated phenylene, trifluoromethyl-substituted phenylene, or $C_2$-$C_6$ alkenediyl group, which may contain a carbonyl, ester bond, ether bond or hydroxyl moiety.

In formulae (g1) to (g3), $R^{41}$ to $R^{48}$ are each independently a $C_1$-$C_{20}$ monovalent hydrocarbon group which may contain a heteroatom. Any two of $R^{43}$, $R^{44}$ and $R^{45}$ or any two of $R^{46}$, $R^{47}$ and $R^{48}$ may bond together to form a ring with the sulfur atom to which they are attached. The sulfonium cation in formulae (g2) and (g3) is preferably selected from the cations having the foregoing formula (Aa), and examples thereof are as exemplified above for the sulfonium cation in formula (Aa).

In formula (g1), $Q^-$ is a non-nucleophilic counter ion. Examples of the non-nucleophilic counter ion include halide ions such as chloride and bromide ions; fluoroalkylsulfonate ions such as triflate, 1,1,1-trifluoroethanesulfonate, and nonafluorobutanesulfonate; arylsulfonate ions such as tosylate, benzenesulfonate, 4-fluorobenzenesulfonate, and 1,2,3,4,5-pentafluorobenzenesulfonate; alkylsulfonate ions such as mesylate and butanesulfonate; imide ions such as bis(trifluoromethylsulfonyl)imide, bis(perfluoroethylsulfonyl)imide and bis(perfluorobutylsulfonyl)imide; methide ions such as tris(trifluoromethylsulfonyl)methide and tris(perfluoroethylsulfonyl)methide.

Also included are sulfonate ions having fluorine substituted at α-position as represented by the formula (K-1) and sulfonate ions having fluorine substituted at α- and β-positions as represented by the formula (K-2).

(K-1)

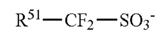

(K-2)

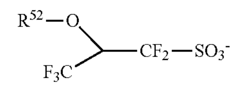

In formula (K-1), $R^{51}$ is hydrogen, or a $C_1$-$C_{20}$ alkyl group, $C_2$-$C_{20}$ alkenyl group, or $C_6$-$C_{20}$ aryl group, which may contain an ether bond, ester bond, carbonyl moiety, lactone ring, or fluorine atom. The alkyl and alkenyl groups may be straight, branched or cyclic.

In formula (K-2), $R^{52}$ is hydrogen, or a $C_1$-$C_{30}$ alkyl group, $C_2$-$C_{20}$ acyl group, $C_2$-$C_{20}$ alkenyl group, $C_6$-$C_{20}$ aryl group or $C_6$-$C_{20}$ aryloxy group, which may contain an ether bond, ester bond, carbonyl moiety or lactone ring. The alkyl, acyl and alkenyl groups may be straight, branched or cyclic.

Examples of the monomer from which recurring unit (g1) is derived are shown below, but not limited thereto. $R^A$ and $Q^-$ are as defined above.

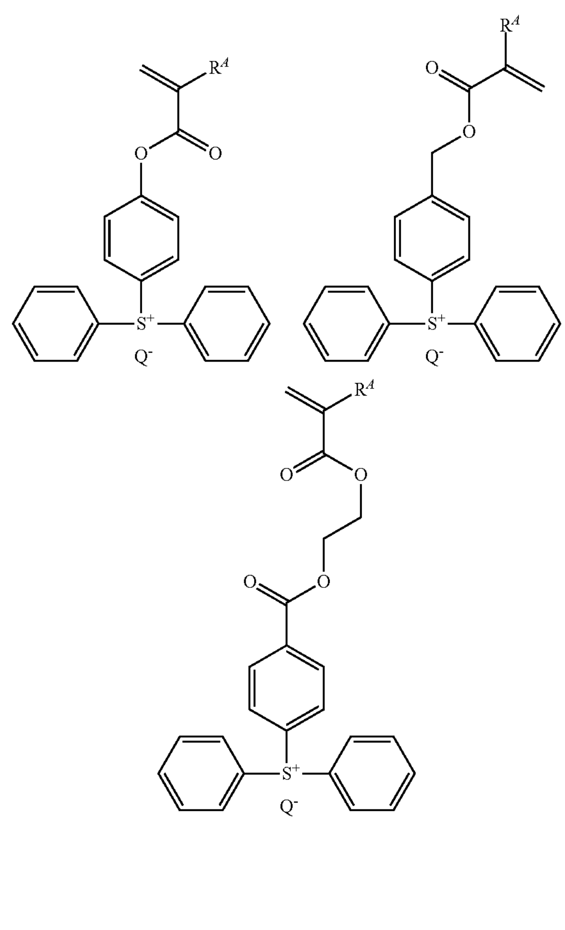

-continued
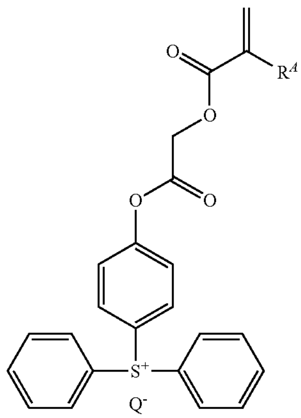
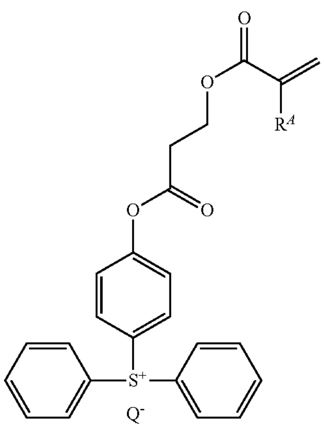
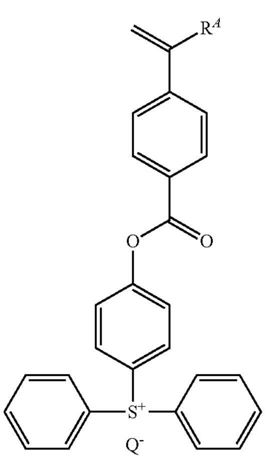
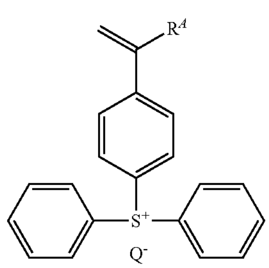
-continued
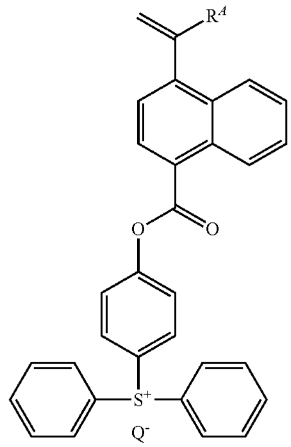
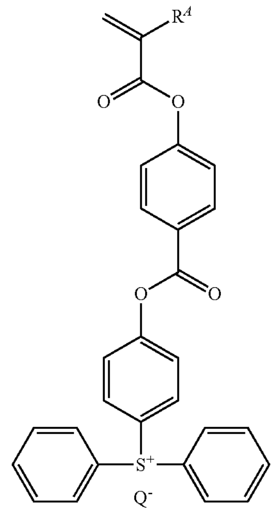
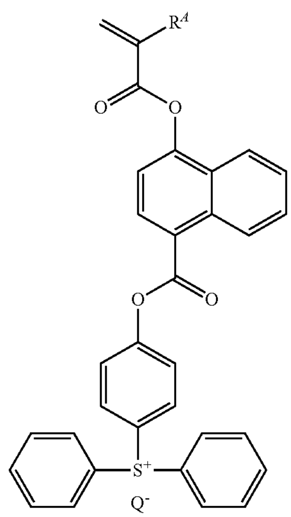
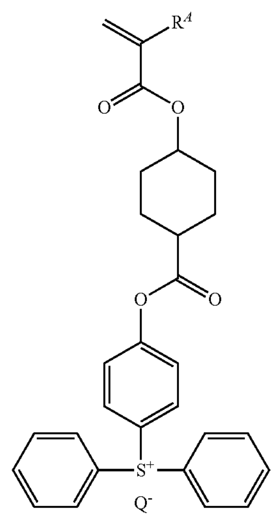
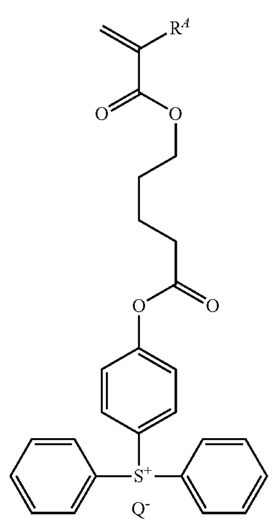
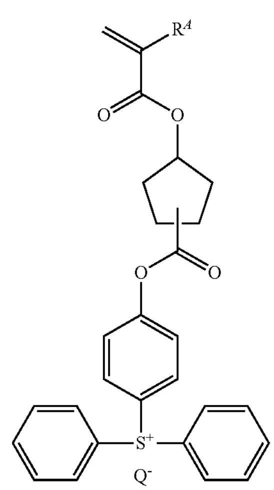

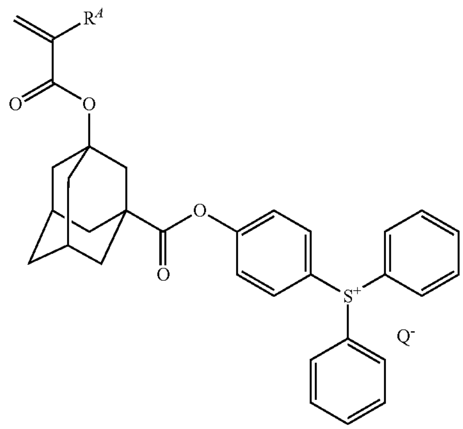
Examples of the monomer from which recurring unit (g2) is derived are shown below, but not limited thereto. $R^A$ is as defined above.
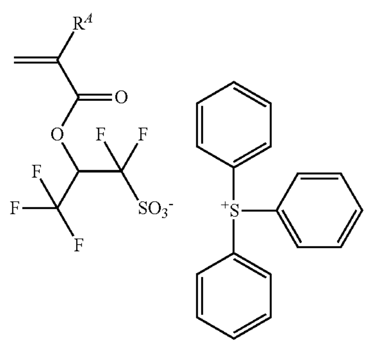
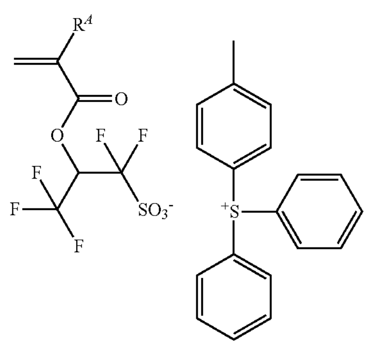
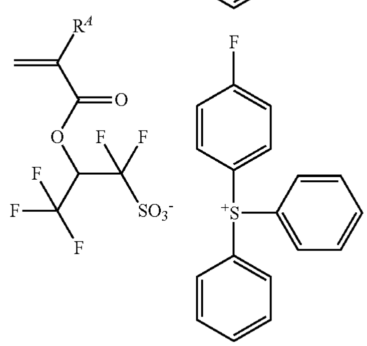
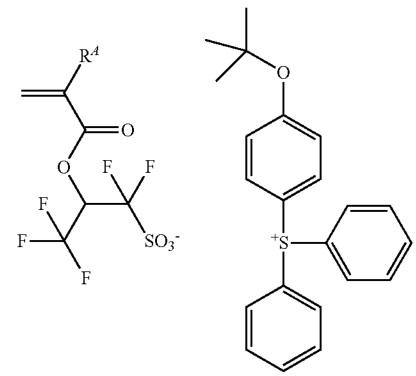
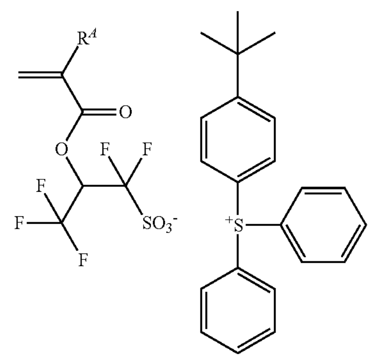
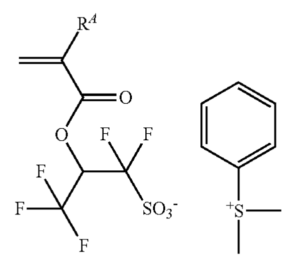
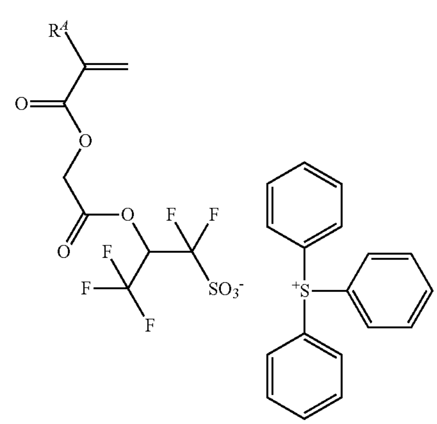

-continued
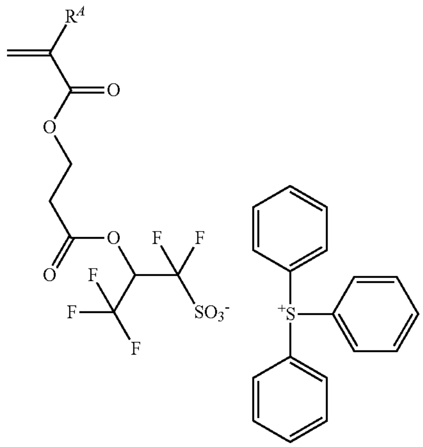
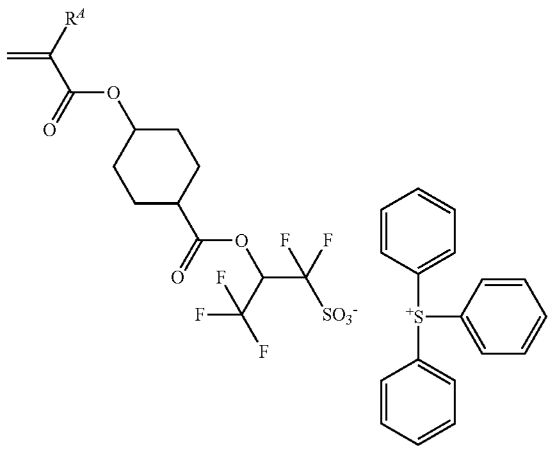
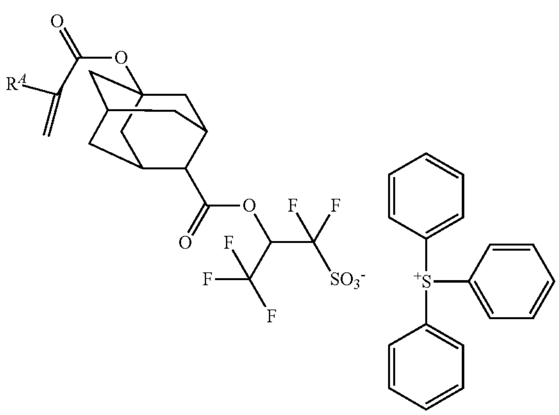
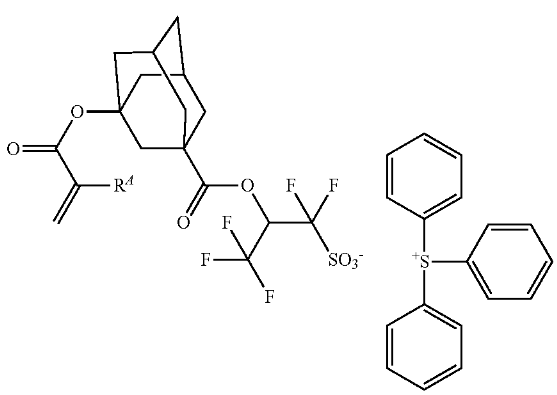
-continued
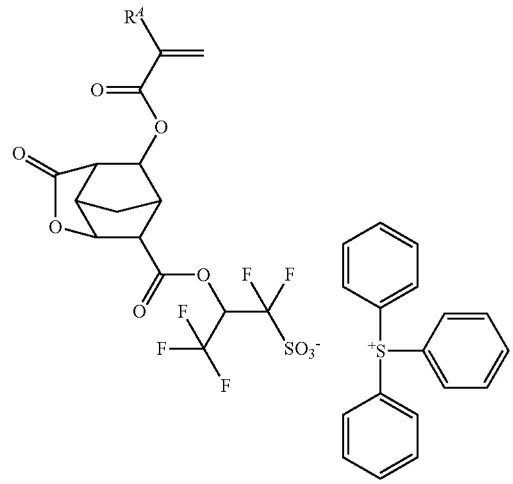
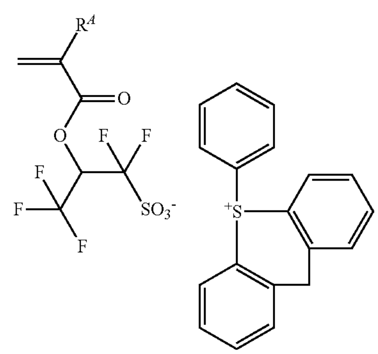
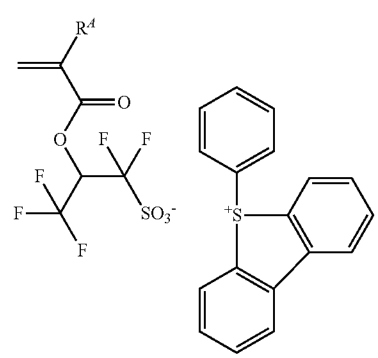
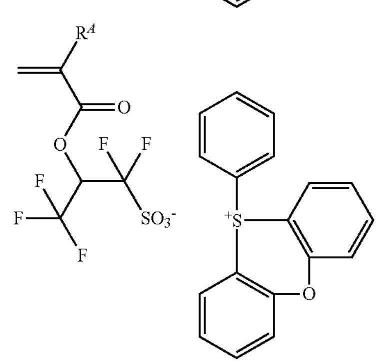

-continued
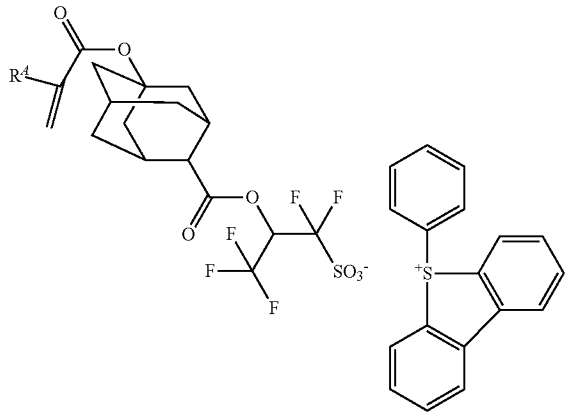
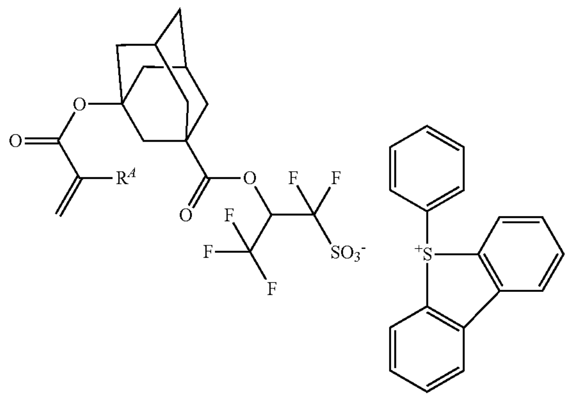
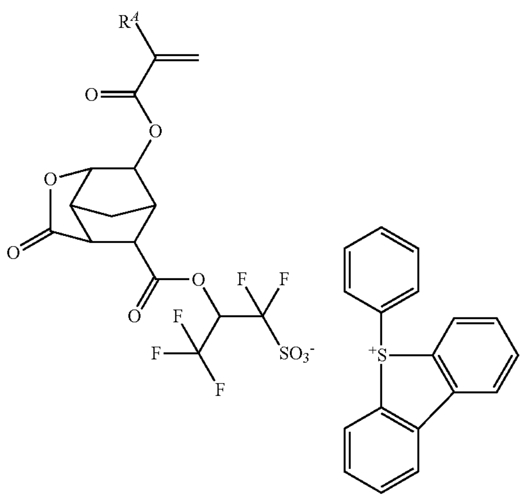
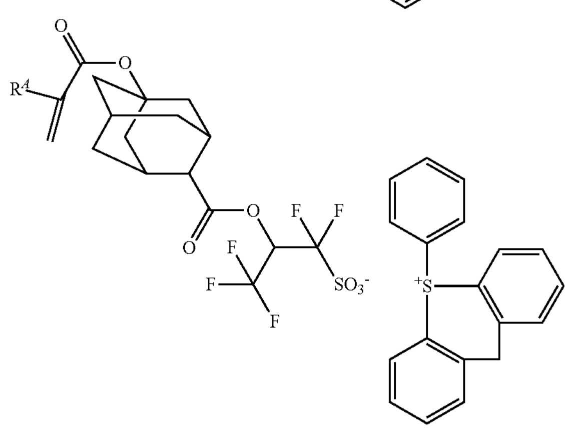
-continued
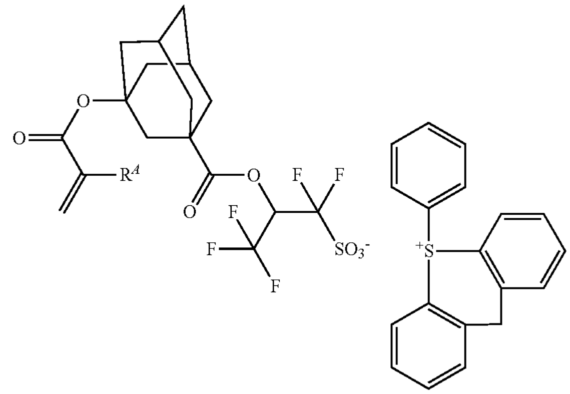
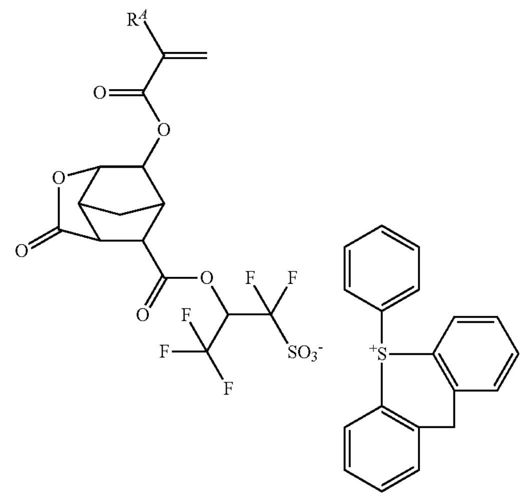
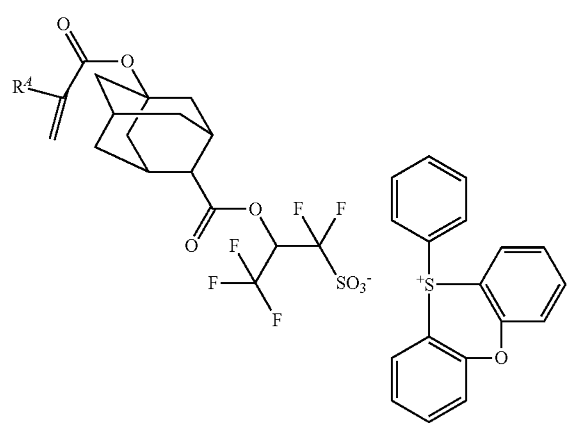
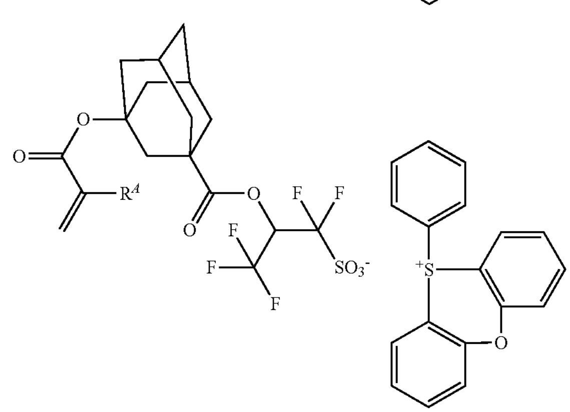

-continued
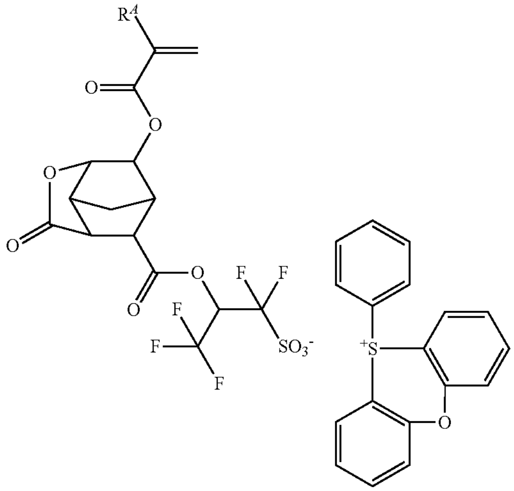
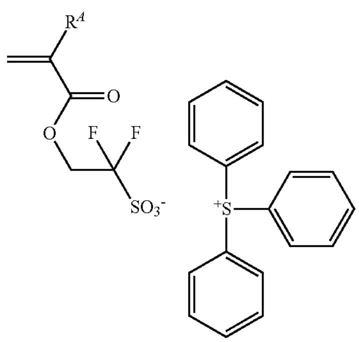
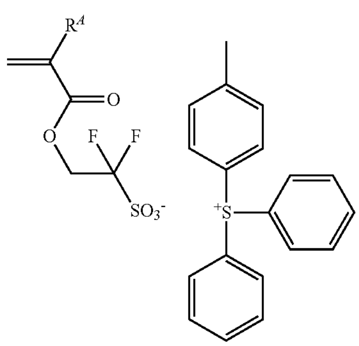
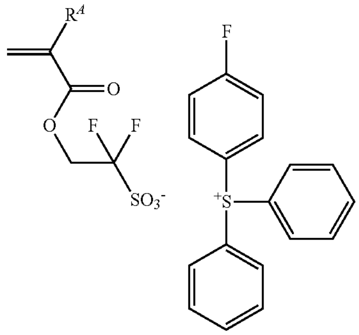
-continued
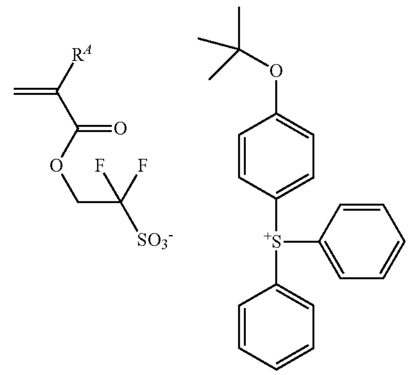
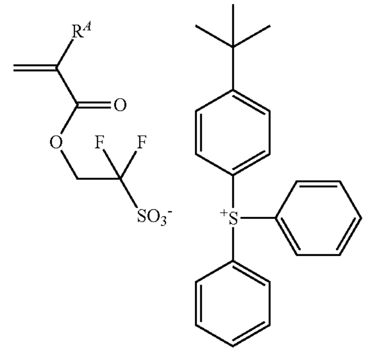
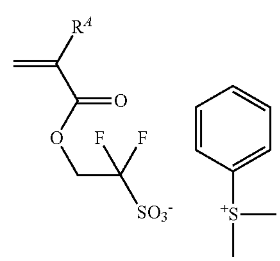
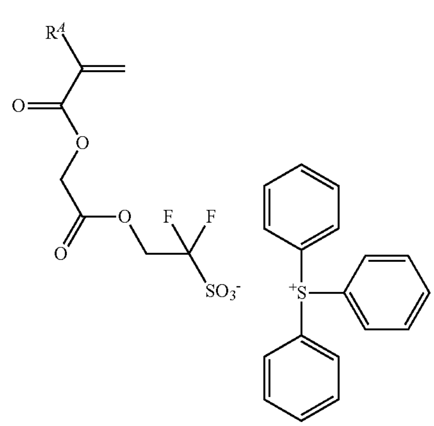

-continued
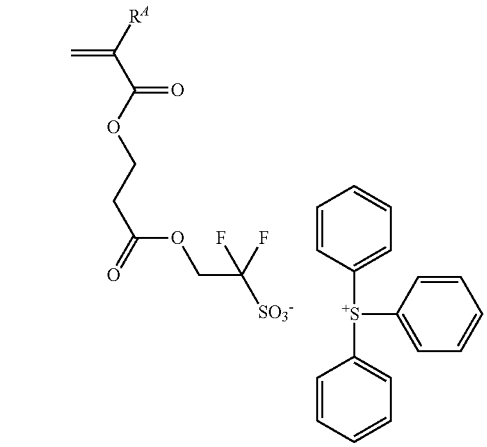
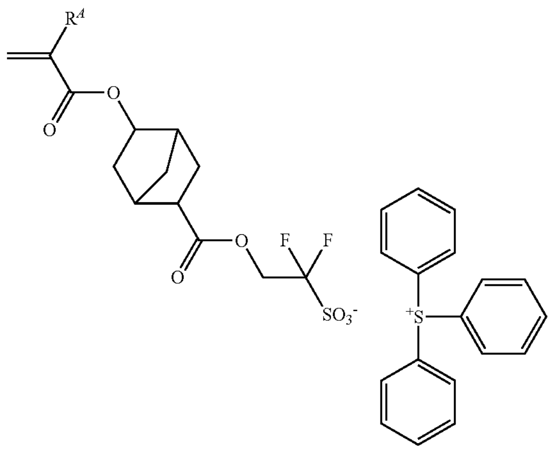
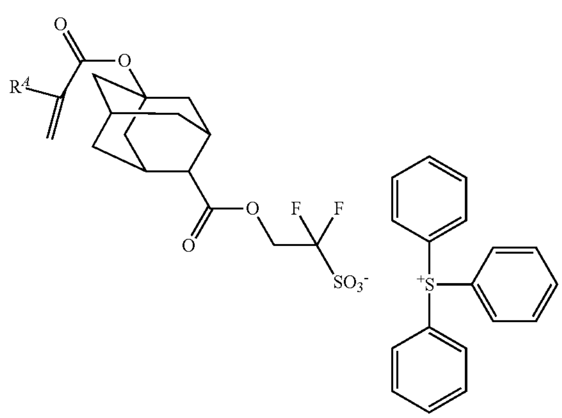
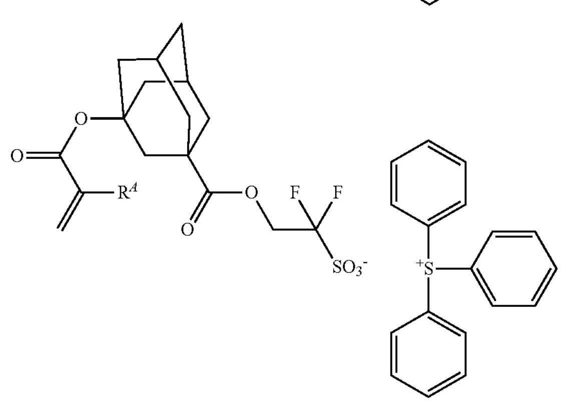
-continued
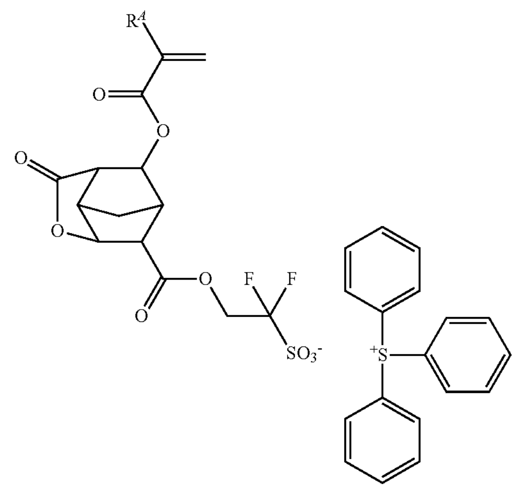
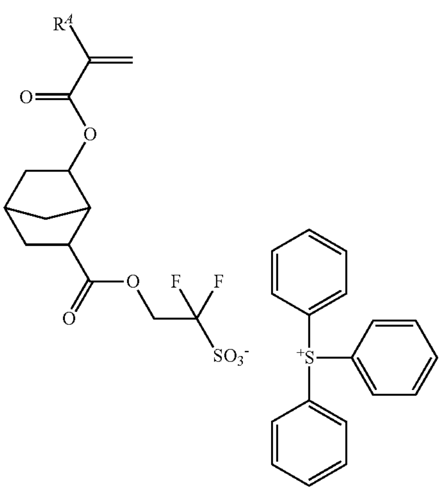
Examples of the monomer from which recurring unit (g3) is derived are shown below, but not limited thereto. $R^A$ is as defined above.
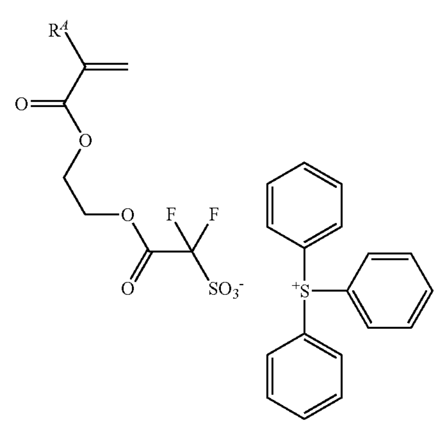

-continued
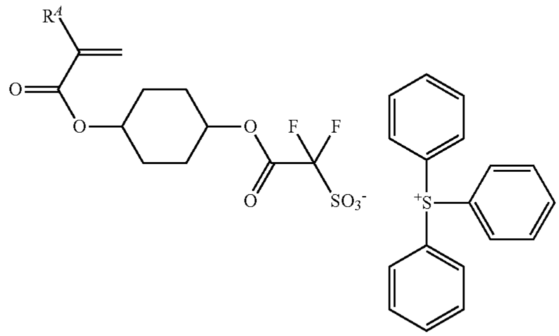
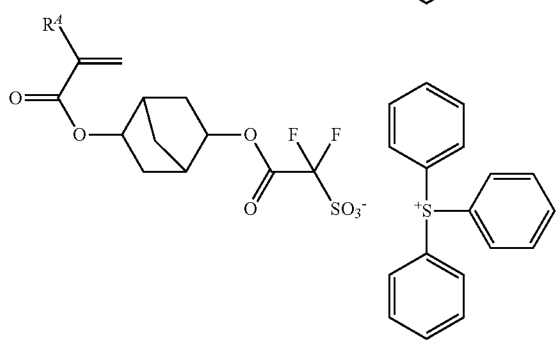
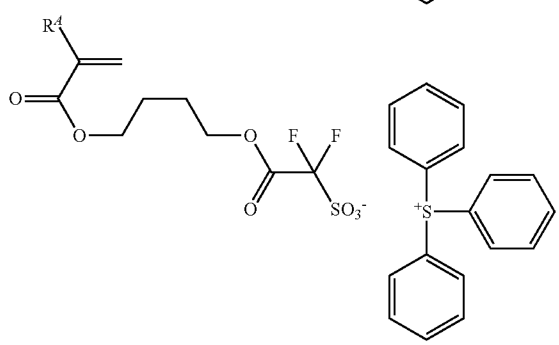
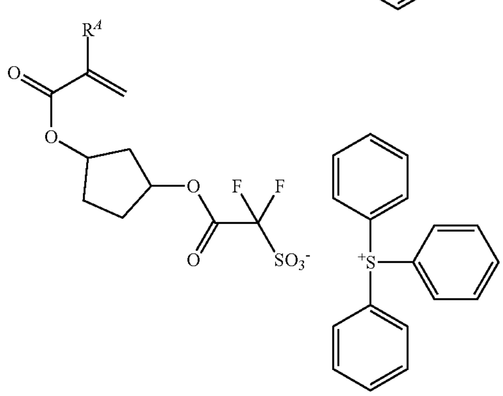
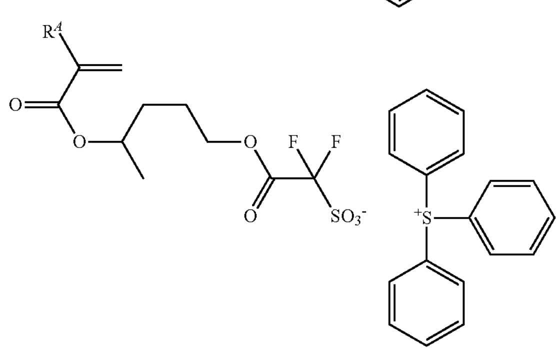
-continued
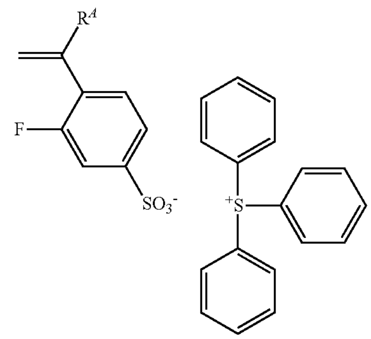
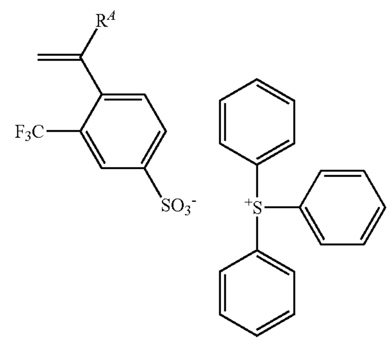
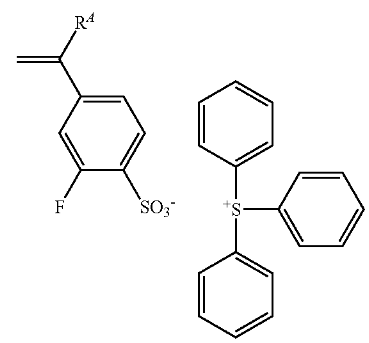
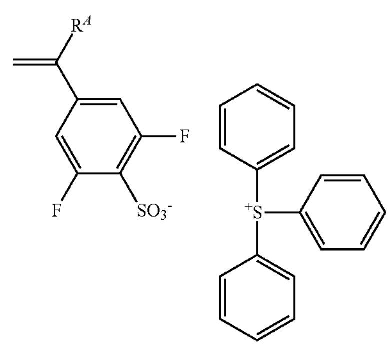
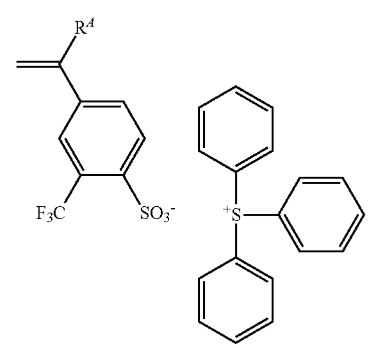

-continued
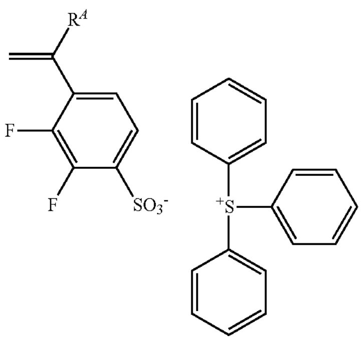
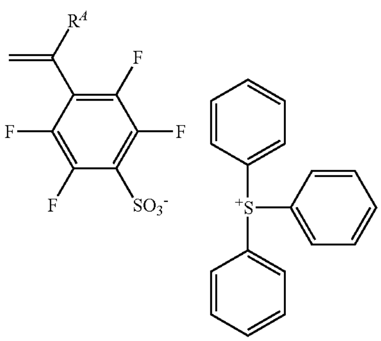
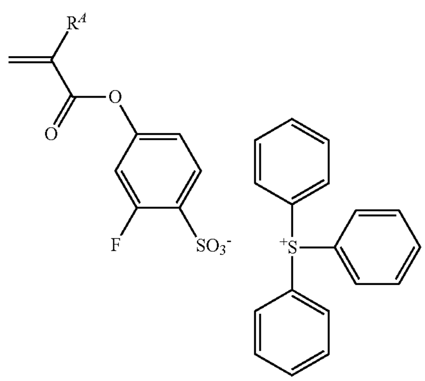
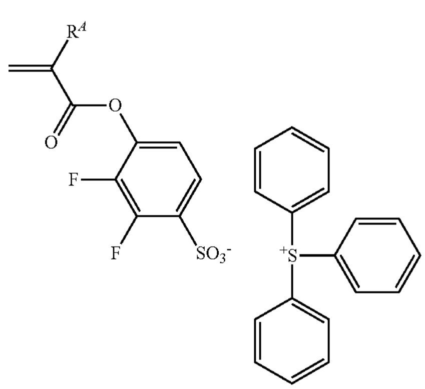
-continued
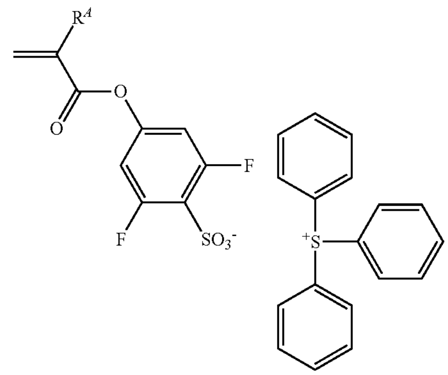
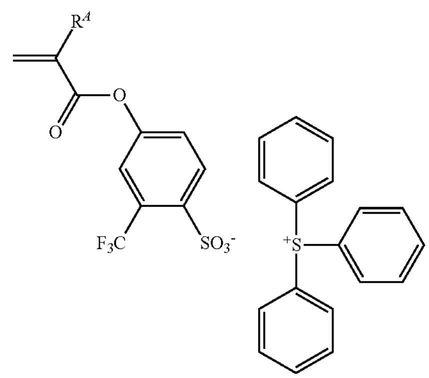
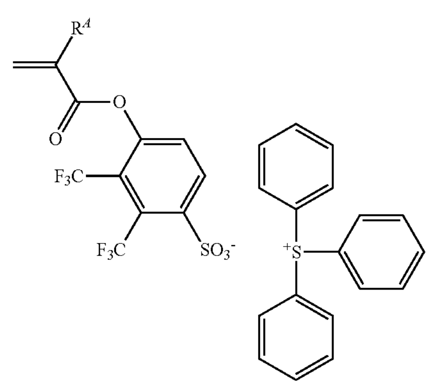
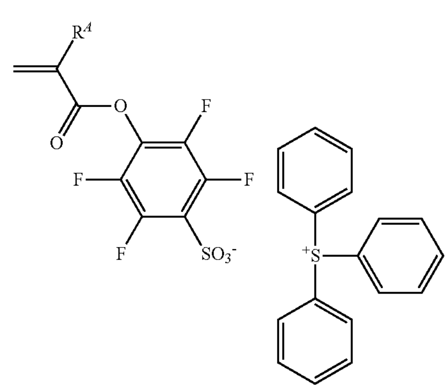

-continued

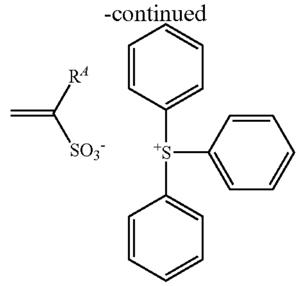

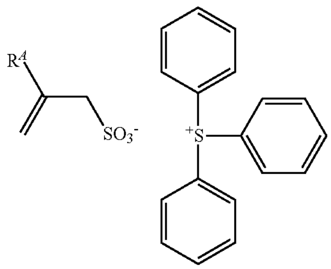

Recurring unit (g) functions as a polymer-bound acid generator. The attachment of an acid generator to the polymer main chain is effective in restraining acid diffusion, thereby preventing a reduction of resolution due to blur by acid diffusion. Also edge roughness is improved since the acid generator is uniformly distributed. Where a base polymer comprising recurring units (g) is used, an acid generator capable of generating a strong acid (or addition type, to be described later) may be omitted.

Polymer A for formulating the positive resist composition comprises recurring units (a1) or (a2) containing iodine and additionally recurring units (b1) or (b2) having an acid labile group, and optionally recurring units (c), (d), (e), (f), and (g). A fraction of units (a1), (a2), (b1), (b2), (c), (d), (e), (f) and (g) is: preferably $0\le a1<1.0$, $0<a2<1.0$, $0<a1+a2<1.0$, $0\le b1<1.0$, $0\le b2<1.0$, $0<b1+b2<1.0$, $0\le c\le 0.9$, $0\le d\le 0.9$, $0\le e\le 0.8$, $0\le f\le 0.8$, and $0\le g\le 0.5$; more preferably $0\le a1\le 0.9$, $0\le a2\le 0.9$, $0.1\le a1+a2\le 0.9$, $0\le b1\le 0.9$, $0\le b2\le 0.9$, $0.1\le b1+b2\le 0.9$, $0\le c\le 0.8$, $0\le d\le 0.8$, $0\le e\le 0.7$, $0\le f\le 0.7$, and $0\le g\le 0.4$; and even more preferably $0\le a1\le 0.8$, $0\le a2\le 0.8$, $0.1\le a1+a2\le 0.8$, $0\le b1\le 0.8$, $0\le b2\le 0.8$, $0.1\le b1+b2\le 0.8$, $0\le c\le 0.75$, $0\le d\le 0.75$, $0\le e\le 0.6$, $0\le f\le 0.6$, and $0\le g\le 0.3$. Notably, $g=g1+g2+g3$, meaning that unit (g) is at least one of units (g1) to (g3), and $a1+a2+b1+b2+c+d+e+f+g=1.0$.

For Polymer A for formulating the negative resist composition, an acid labile group is not necessarily essential. The polymer comprises iodized recurring units (a1) or (a2) and recurring units (c), and optionally recurring units (d), (e), (f), and/or (g). A fraction of these units is: preferably $0\le a1<1.0$, $0\le a2<1.0$, $0<a1+a2<1.0$, $0<c<1.0$, $0\le d\le 0.9$, $0\le e\le 0.8$, $0\le f\le 0.8$, and $0\le g\le 0.5$; more preferably $0\le a1\le 0.8$, $0\le a2\le 0.8$, $0.1\le a1+a2\le 0.8$, $0.2\le c\le 0.9$, $0\le d\le 0.8$, $0\le e\le 0.7$, $0\le f\le 0.7$, and $0\le g\le 0.4$; and even more preferably $0\le a1\le 0.7$, $0\le a2\le 0.7$, $0.2\le a1+a2\le 0.7$, $0.3\le c\le 0.8$, $0\le d\le 0.75$, $0\le e\le 0.6$, $0\le f\le 0.6$, and $0\le g\le 0.3$. Notably, $g=g1+g2+g3$, meaning that unit (g) is at least one of units (g1) to (g3), and $a1+a2+c+d+e+f+g=1.0$.

Polymer A may be synthesized by any desired methods, for example, by dissolving one or more monomers selected from the monomers corresponding to the foregoing recurring units in an organic solvent, adding a radical polymerization initiator thereto, and heating for polymerization. Examples of the organic solvent which can be used for polymerization include toluene, benzene, tetrahydrofuran, diethyl ether, and dioxane. Examples of the polymerization initiator used herein include 2,2'-azobisisobutyronitrile (AIBN), 2,2'-azobis(2,4-dimethylvaleronitrile), dimethyl 2,2-azobis(2-methylpropionate), benzoyl peroxide, and lauroyl peroxide. Preferably the reaction temperature is 50 to 80° C., and the reaction time is 2 to 100 hours, more preferably 5 to 20 hours.

In the case of a monomer having a hydroxyl group, the hydroxyl group may be replaced by an acetal group susceptible to deprotection with acid, typically ethoxyethoxy, prior to polymerization, and the polymerization be followed by deprotection with weak acid and water. Alternatively, the hydroxyl group may be replaced by an acetyl, formyl, pivaloyl or similar group prior to polymerization, and the polymerization be followed by alkaline hydrolysis.

When hydroxystyrene or hydroxyvinylnaphthalene is copolymerized, an alternative method is possible. Specifically, acetoxystyrene or acetoxyvinylnaphthalene is used instead of hydroxystyrene or hydroxyvinylnaphthalene, and after polymerization, the acetoxy group is deprotected by alkaline hydrolysis, for thereby converting the polymer product to hydroxystyrene or hydroxyvinylnaphthalene. For alkaline hydrolysis, a base such as aqueous ammonia or triethylamine may be used. Preferably the reaction temperature is −20° C. to 100° C., more preferably 0° C. to 60° C., and the reaction time is 0.2 to 100 hours, more preferably 0.5 to 20 hours.

Polymer A should preferably have a weight average molecular weight (Mw) in the range of 1,000 to 500,000, and more preferably 2,000 to 30,000, as measured by GPC versus polystyrene standards using tetrahydrofuran (THF) solvent. A polymer with a Mw in the range is heat resistant and alkaline soluble.

If a polymer has a wide molecular weight distribution or dispersity (Mw/Mn), which indicates the presence of lower and higher molecular weight polymer fractions, there is a possibility that foreign matter is left on the pattern or the pattern profile is degraded. The influences of Mw and Mw/Mn become stronger as the pattern rule becomes finer. Therefore, Polymer A should preferably have a narrow dispersity (Mw/Mn) of 1.0 to 2.0, especially 1.0 to 1.5, in order to provide a resist composition suitable for micropatterning to a small feature size.

The base polymer may be a blend of two or more Polymers A which differ in compositional ratio, Mw or Mw/Mn. Also the base polymer may or may not contain a polymer different from Polymer A, although it is preferred that the base polymer be free of a different polymer.

Acid Generator

The resist composition may further contain an acid generator, referred to as acid generator of addition type. With the acid generator added, the resist composition has a higher sensitivity and more improved properties. Where the base polymer contains recurring units (g), i.e., is a polymer-bound acid generator, the acid generator of addition type may be omitted.

The acid generator is typically a compound (PAG) capable of generating an acid upon exposure to actinic ray or radiation. Although the PAG used herein may be any compound capable of generating an acid upon exposure to high-energy radiation, those compounds capable of generating sulfonic acid, imide acid (imidic acid) or methide acid are preferred. Suitable PAGs include sulfonium salts, iodonium salts, sulfonyldiazomethane, N-sulfonyloxyimide, and oxime-O-sulfonate acid generators. Exemplary PAGs are described in U.S. Pat. No. 7,537,880 (JP-A 2008-111103, paragraphs [0122]-[0142]).

Also sulfonium salts having the formula (1-1) and iodonium salts having the formula (1-2) are useful PAGs.

(1-1)

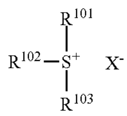

(1-2)

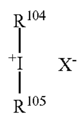

In formulae (1-1) and (1-2), $R^{101}$ to $R^{105}$ are each independently a $C_1$-$C_{20}$ monovalent hydrocarbon group which may contain a heteroatom. Any two of $R^{101}$, $R^{102}$ and $R^{103}$ may bond together to form a ring with the sulfur atom to which they are attached. The monovalent hydrocarbon group may be straight, branched or cyclic, and examples thereof are as exemplified above for $R^6$ to $R^8$ in formula (Aa).

Examples of the cation of the sulfonium salt having formula (1-1) are as exemplified above for the sulfonium cation having formula (Aa).

Examples of the cation of the iodonium salt having formula (1-2) are shown below, but not limited thereto.

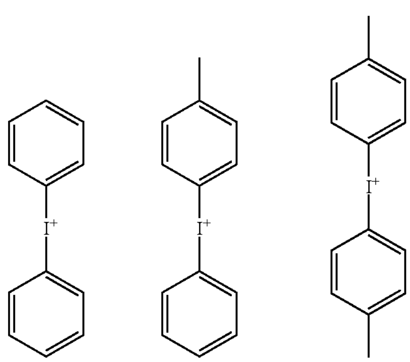

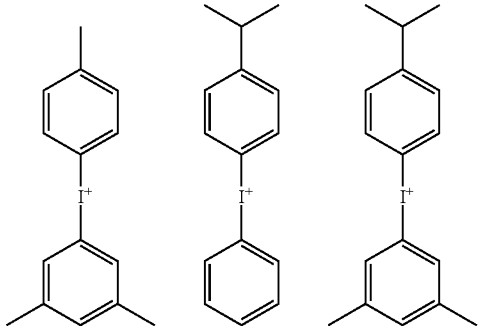

-continued

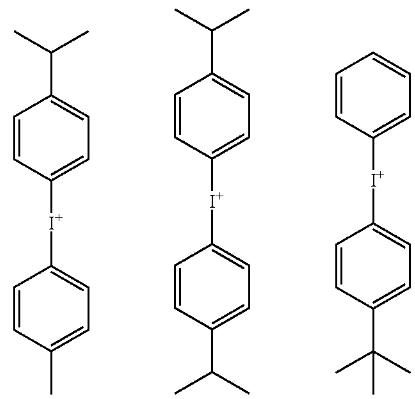

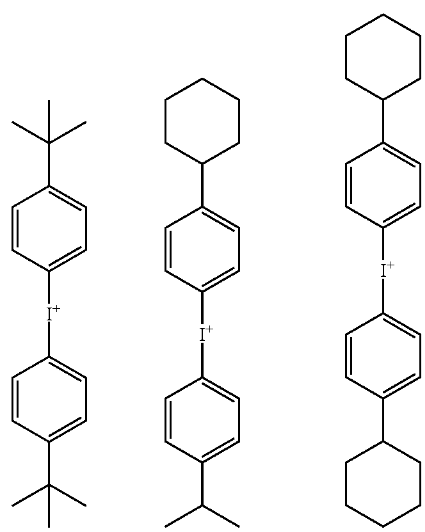

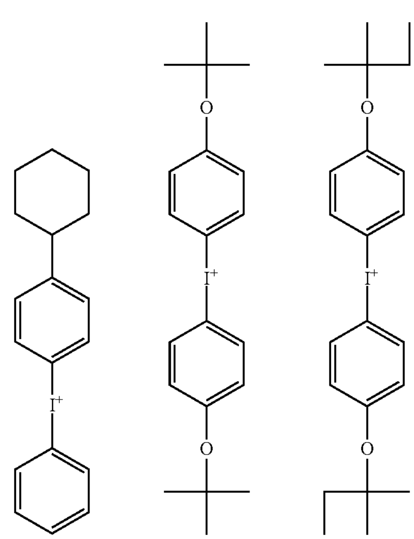

-continued
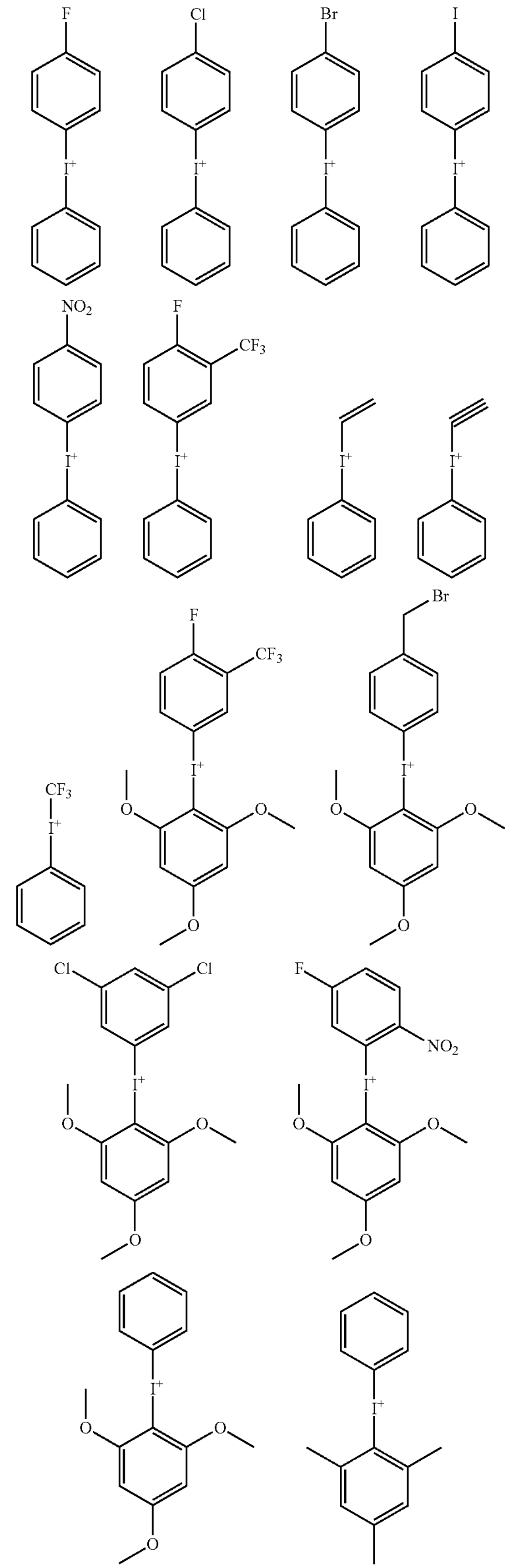
-continued
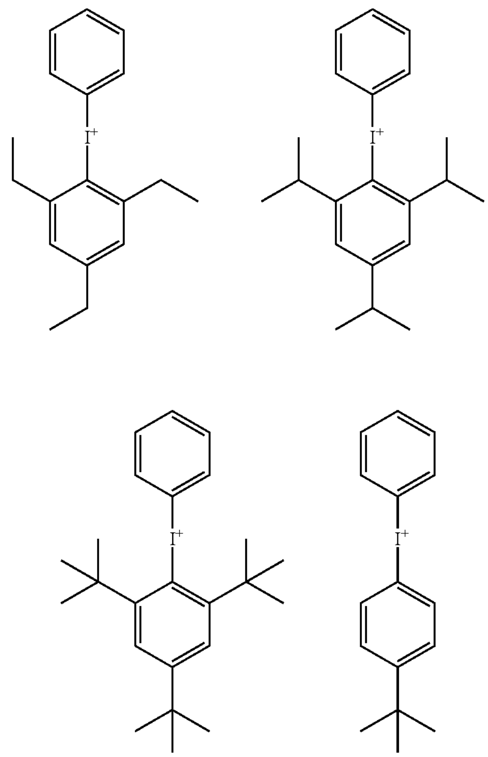
In formulae (1-1) and (1-2), $X^-$ is an anion selected from the formulae (1A) to (1D).
(1A)
$$R^{fa}-CF_2-SO_3^-$$
(1B)
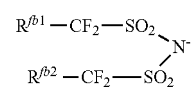
(1C)
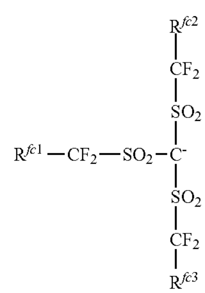
(1D)
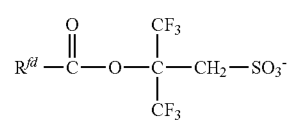
In formula (1A), $R^{fa}$ is fluorine or a $C_1$-$C_{40}$ monovalent hydrocarbon group which may contain a heteroatom. The monovalent hydrocarbon group may be straight, branched or cyclic and examples thereof are as will be exemplified below for $R^{17}$.

Of the anions of formula (1A), a structure having formula (1A') is preferred.

(1A')

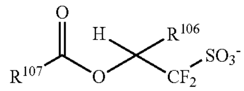

In formula (1A'), $R^{106}$ is hydrogen or trifluoromethyl, preferably trifluoromethyl. $R^{107}$ is a $C_1$-$C_{38}$ monovalent hydrocarbon group which may contain a heteroatom. Suitable heteroatoms include oxygen, nitrogen, sulfur and halogen, with oxygen being preferred. Of the monovalent hydrocarbon groups, those of 6 to 30 carbon atoms are preferred because a high resolution is available in fine pattern formation.

The monovalent hydrocarbon group may be straight, branched or cyclic.

Examples thereof include straight or branched alkyl groups such as methyl, ethyl, propyl, isopropyl, butyl, isobutyl, sec-butyl, tert-butyl, pentyl, neopentyl, cyclopentyl, hexyl, cyclohexyl, heptyl, 2-ethylhexyl, nonyl, undecyl, tridecyl, pentadecyl, heptadecyl, icosanyl; monovalent saturated alicyclic hydrocarbon groups such as 1-adamantyl, 2-adamantyl, 1-adamantylmethyl, norbornyl, norbornylmethyl, tricyclodecanyl, tetracyclododecanyl, tetracyclododecanylmethyl, dicyclohexylmethyl; monovalent unsaturated aliphatic hydrocarbon groups such as allyl and 3-cyclohexenyl; aryl groups such as phenyl, 1-naphthyl and 2-naphthyl; aralkyl groups such as benzyl and diphenylmethyl. Exemplary heteroatom-containing monovalent hydrocarbon groups are tetrahydrofuryl, methoxymethyl, ethoxymethyl, methylthiomethyl, acetamidomethyl, trifluoroethyl, (2-methoxyethoxy)methyl, acetoxymethyl, 2-carboxy-1-cyclohexyl, 2-oxopropyl, 4-oxo-1-adamantyl, and 3-oxocyclohexyl. Also included are the foregoing groups in which some hydrogen is substituted by a moiety containing a heteroatom such as oxygen, sulfur, nitrogen or halogen, or in which some carbon is replaced by a moiety containing a heteroatom such as oxygen, sulfur or nitrogen, so that the group may contain a hydroxyl, cyano, carbonyl, ether bond, ester bond, sulfonic acid ester bond, carbonate, lactone ring, sultone ring, carboxylic anhydride or haloalkyl moiety.

With respect to the synthesis of the sulfonium salt having an anion of formula (1A'), reference is made to JP-A 2007-145797, JP-A 2008-106045, JP-A 2009-007327, and JP-A 2009-258695. Also useful are the sulfonium salts described in JP-A 2010-215608, JP-A 2012-041320, JP-A 2012-106986, and JP-A 2012-153644.

Examples of the anion having formula (1A) are shown below, but not limited thereto.

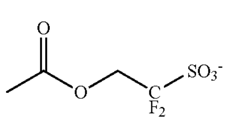

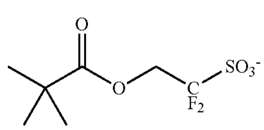

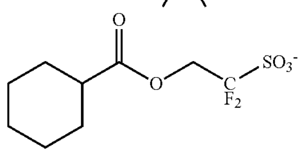

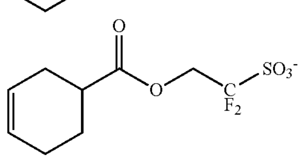

-continued

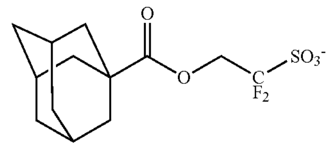

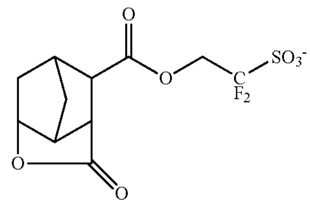

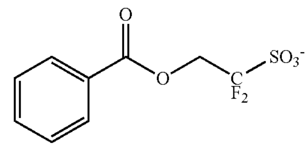

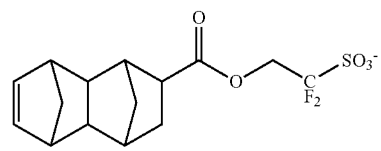

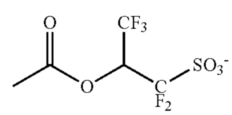

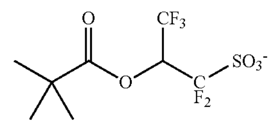

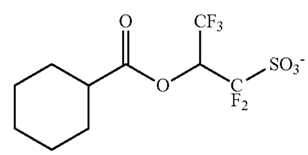

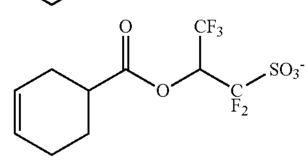

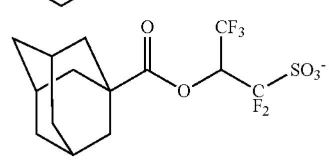

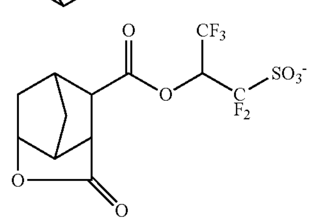

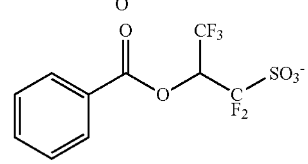

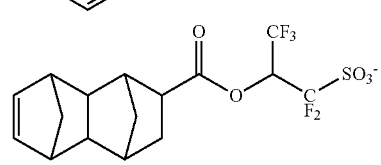

-continued
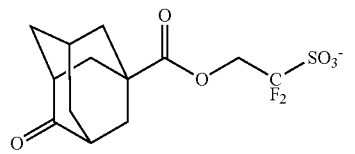
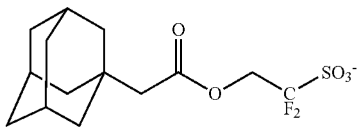
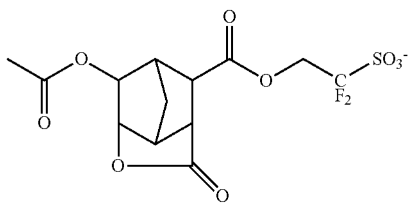
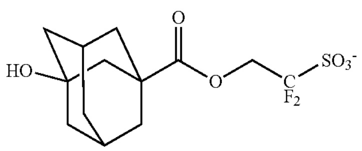
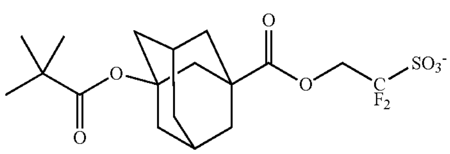
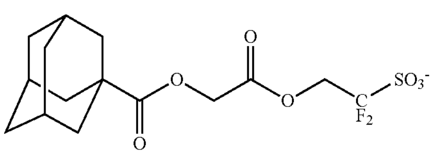
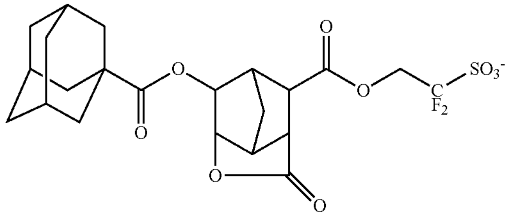
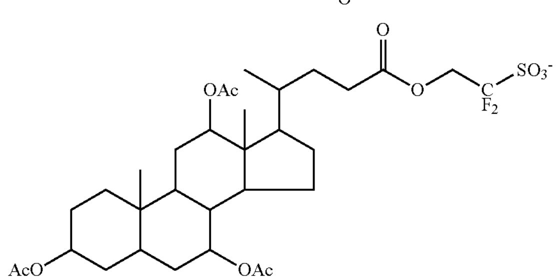
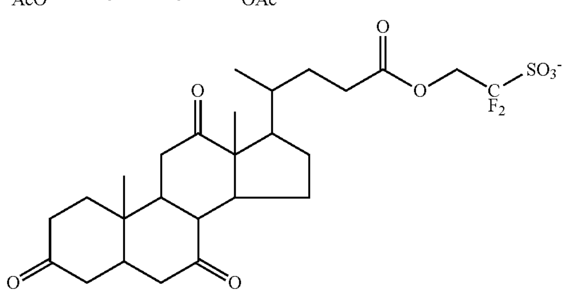
-continued
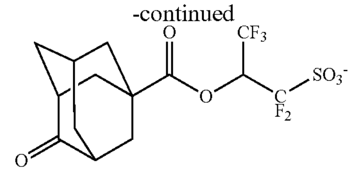
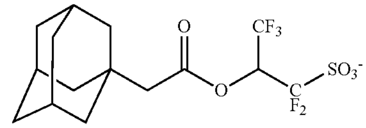
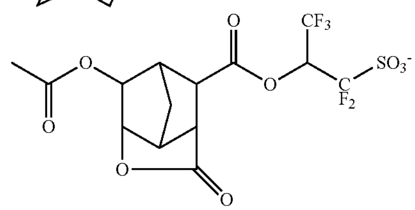
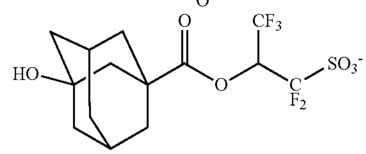
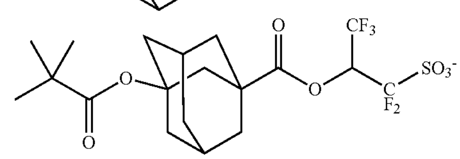
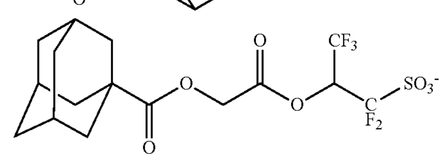
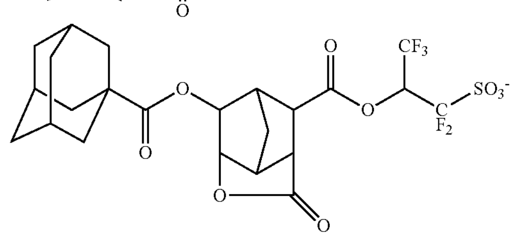
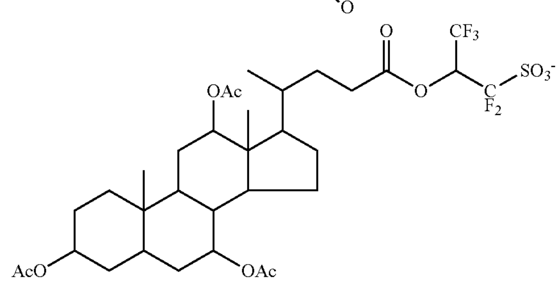
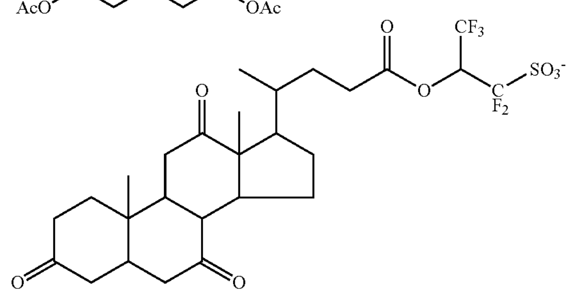
In formula (1B), $R^{fb1}$ and $R^{fb2}$ are each independently fluorine or a $C_1$-$C_{40}$ monovalent hydrocarbon group which may contain a heteroatom. The monovalent hydrocarbon group may be straight, branched or cyclic and examples thereof are as exemplified above for $R^{107}$. Preferably $R^{fb1}$ and $R^{fb2}$ each are fluorine or a straight $C_1$-$C_4$ fluorinated alkyl group. A pair of $R^{fb1}$ and $R^{fb2}$ may bond together to form a ring with the linkage (—$CF_2$—$SO_2$—$N^-$—$SO_2$—$CF_2$—) to which they are attached, and preferably the pair is a fluorinated ethylene or fluorinated propylene group.

In formula (1C), $R^{fc1}$, $R^{fc2}$ and $R^{fc3}$ are each independently fluorine or a $C_1$-$C_{40}$ monovalent hydrocarbon group which may contain a heteroatom. The monovalent hydrocarbon group may be straight, branched or cyclic and examples thereof are as exemplified above for $R^{107}$. Preferably $R^{fc1}$, $R^{fc2}$ and $R^{fc3}$ each are fluorine or a straight $C_1$-$C_4$ fluorinated alkyl group. A pair of $R^{fc1}$ and $R^{fc2}$ may bond together to form a ring with the linkage (—$CF_2$—$SO_2$—$C^-$—$SO_2$—$CF_2$—) to which they are attached, and preferably the pair is a fluorinated ethylene or fluorinated propylene group.

In formula (1D), $R^{fd}$ is a $C_1$-$C_{40}$ monovalent hydrocarbon group which may contain a heteroatom. The monovalent hydrocarbon group may be straight, branched or cyclic and examples thereof are as exemplified above for $R^{17}$.

With respect to the synthesis of the sulfonium salt having an anion of formula (1D), reference is made to JP-A 2010-215608 and JP-A 2014-133723.

Examples of the anion having formula (1D) are shown below, but not limited thereto.

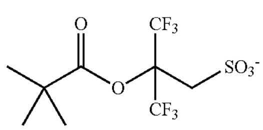

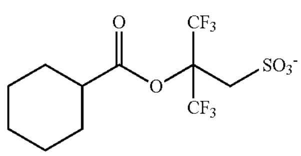

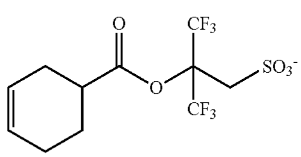

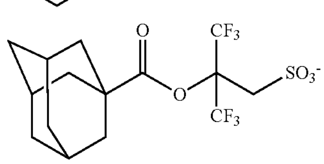

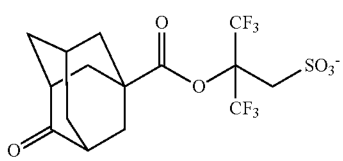

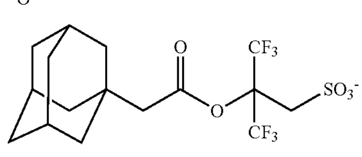

-continued

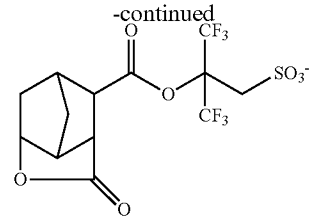

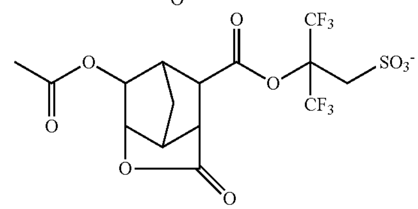

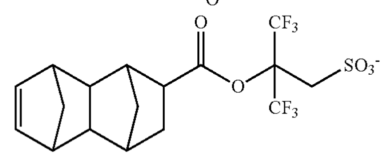

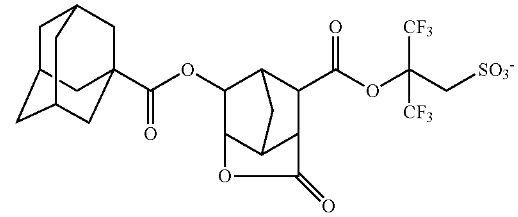

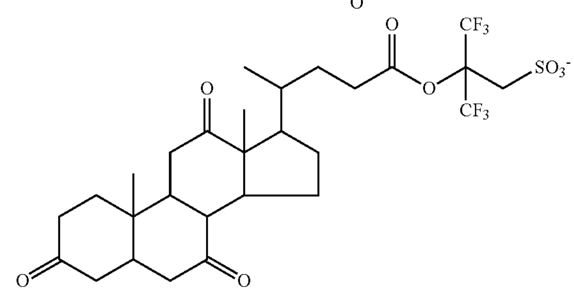

The compound having the anion of formula (1D) has a sufficient acid strength to cleave acid labile groups in the base polymer because it is free of fluorine at α-position of sulfo group, but has two trifluoromethyl groups at β-position. Thus the compound is a useful PAG.

A compound having the formula (2) is also a useful PAG.

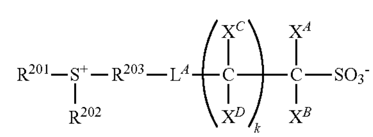

(2)

In formula (2), $R^{201}$ and $R^{202}$ are each independently a $C_1$-$C_{30}$ monovalent hydrocarbon group which may contain a heteroatom. $R^{203}$ is a $C_1$-$C_{30}$ divalent hydrocarbon group which may contain a heteroatom. Any two of $R^{201}$, $R^{202}$ and $R^{203}$ may bond together to form a ring with the sulfur atom to which they are attached. $L^A$ is a single bond, ether bond or a $C_1$-$C_{20}$ divalent hydrocarbon group which may contain a heteroatom. $X^A$, $X^B$, $X^C$ and $X^D$ are each independently hydrogen, fluorine or trifluoromethyl, with the proviso that at least one of $X^A$, $X^B$, $X^C$ and $X^D$ is fluorine or trifluoromethyl, and k is an integer of 0 to 3.

The monovalent hydrocarbon group may be straight, branched or cyclic. Examples thereof include straight or branched alkyl groups such as methyl, ethyl, propyl, isopropyl, n-butyl, sec-butyl, tert-butyl, n-pentyl, tert-pentyl, n-hexyl, n-octyl, n-nonyl, n-decyl, 2-ethylhexyl; monovalent saturated cyclic hydrocarbon groups such as cyclopentyl, cyclohexyl, cyclopentylmethyl, cyclopentylethyl, cyclopentylbutyl, cyclohexylmethyl, cyclohexylethyl, cyclohexylbutyl, norbornyl, oxanorbornyl, tricyclo[5.2.1.$0^{2,6}$]decanyl, adamantyl; aryl groups such as phenyl, naphthyl and anthracenyl. Also included are the foregoing groups in which some hydrogen is substituted by a moiety containing a heteroatom such as oxygen, sulfur, nitrogen or halogen, or in which some carbon is replaced by a moiety containing a heteroatom such as oxygen, sulfur or nitrogen, so that the group may contain a hydroxyl, cyano, carbonyl, ether bond, ester bond, sulfonic acid ester bond, carbonate bond, lactone ring, sultone ring, carboxylic anhydride or haloalkyl moiety.

The divalent hydrocarbon group may be straight, branched or cyclic. Examples thereof include straight or branched alkanediyl groups such as methylene, ethylene, propane-1,3-diyl, butane-1,4-diyl, pentane-1,5-diyl, hexane-1,6-diyl, heptane-1,7-diyl, octane-1,8-diyl, nonane-1,9-diyl, decane-1,10-diyl, undecane-1,11-diyl, dodecane-1,12-diyl, tridecane-1,13-diyl, tetradecane-1,14-diyl, pentadecane-1,15-diyl, hexadecane-1,16-diyl, heptadecane-1,17-diyl; divalent saturated cyclic hydrocarbon groups such as cyclopentanediyl, cyclohexanediyl, norbornanediyl, and adamantanediyl; and divalent unsaturated cyclic hydrocarbon groups such as phenylene and naphthylene. Also included are the foregoing groups in which some hydrogen is substituted by an alkyl group such as methyl, ethyl, propyl, n-butyl or tert-butyl, or in which some hydrogen is substituted by a moiety containing a heteroatom such as oxygen, sulfur, nitrogen or halogen, or in which some carbon is replaced by a moiety containing a heteroatom such as oxygen, sulfur or nitrogen, so that the group may contain a hydroxyl, cyano, carbonyl, ether bond, ester bond, sulfonic acid ester bond, carbonate, lactone ring, sultone ring, carboxylic anhydride or haloalkyl moiety. The preferred heteroatom is oxygen.

Of the PAGs having formula (2), those having formula (2') are preferred.

(2')

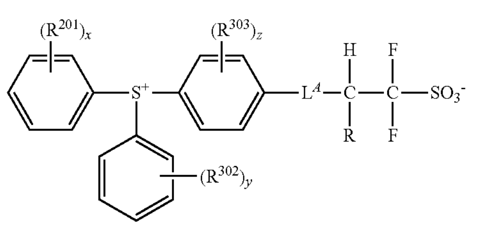

In formula (2'), $L^A$ is as defined above. R is hydrogen or trifluoromethyl, preferably trifluoromethyl. $R^{301}$, $R^{302}$ and $R^{303}$ are each independently hydrogen or a $C_1$-$C_{20}$ monovalent hydrocarbon group which may contain a heteroatom. The monovalent hydrocarbon group may be straight, branched or cyclic and examples thereof are as exemplified above for $R^{107}$. The subscripts x and y each are an integer of 0 to 5, and z is an integer of 0 to 4.

Of the foregoing PAGs, those compounds having an anion of formula (1A') or (1D) are especially preferred because of reduced acid diffusion and high solubility in resist solvent, and those compounds having an anion of formula (2') are especially preferred because of minimized acid diffusion.

Also sulfonium and iodonium salts having an anion containing an iodized or brominated aromatic ring are useful PAGs. These salts typically have the formulae (3-1) and (3-2).

(3-1)

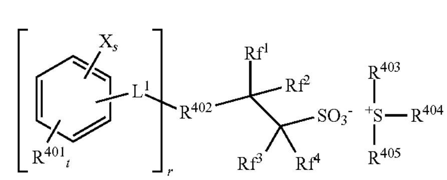

(3-2)

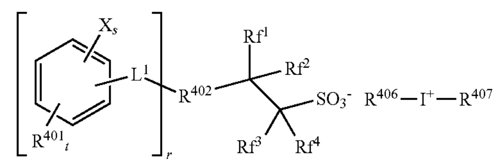

In formulae (3-1) and (3-2), X is iodine or bromine. When s is at least 2, groups X may be identical or different.

$L^1$ is a single bond, ether bond, ester bond, or a $C_1$-$C_6$ alkanediyl group which may contain an ether bond or ester bond. The alkanediyl group may be straight, branched or cyclic.

$R^{401}$ is hydroxyl, carboxyl, fluorine, chlorine, bromine, amino or a $C_1$-$C_{20}$ alkyl group, $C_1$-$C_{20}$ alkoxy group, $C_2$-$C_{10}$ alkoxycarbonyl, $C_2$-$C_{20}$ acyloxy group, or $C_1$-$C_{20}$ alkylsulfonyloxy group, which may contain fluorine, chlorine, bromine, hydroxyl, amino or $C_1$-$C_{10}$ alkoxy moiety, or —$NR^{401A}$—C(═O)—$R^{401B}$ or —$NR^{401A}$—C(═O)—O—$R^{401B}$. $R^{401A}$ is hydrogen or a $C_1$-$C_6$ alkyl group which may contain halogen, hydroxyl, $C_1$-$C_6$ alkoxy, $C_2$-$C_6$ acyl or $C_2$-$C_6$ acyloxy moiety; $R^{401B}$ is a $C_1$-$C_6$ alkyl group, $C_2$-$C_{16}$ alkenyl group or $C_6$-$C_{12}$ aryl group, which may contain halogen, hydroxyl, a $C_1$-$C_6$ alkoxy, $C_2$-$C_6$ acyl or $C_2$-$C_6$ acyloxy moiety. The alkyl, alkoxy, alkoxycarbonyl, acyloxy, acyl and alkenyl groups may be straight, branched or cyclic. When t is at least 2, groups $R^{401}$ may be identical or different.

Inter alia, $R^{401}$ is preferably selected from hydroxyl, —$NR^{401A}$—C(═O)—$R^{401B}$, —$NR^{401A}$—C(═O)—O—$R^{401B}$, fluorine, chlorine, bromine, methyl, and methoxy.

$R^{402}$ is a single bond or a $C_1$-$C_{20}$ divalent linking group in case of r=1, and a $C_1$-$C_{20}$ tri- or tetravalent linking group in case of r=2 or 3. The linking group may contain oxygen, sulfur or nitrogen.

$Rf^1$ to $Rf^4$ are each independently hydrogen, fluorine or trifluoromethyl, at least one thereof being fluorine or trifluoromethyl. Also $Rf^1$ and $Rf^2$, taken together, may form a carbonyl group. Most preferably both $Rf^3$ and $Rf^4$ are fluorine.

$R^{403}$, $R^{404}$, $R^{405}$, $R^{406}$ and $R^{407}$ are each independently a $C_1$-$C_{20}$ monovalent hydrocarbon group which may contain a heteroatom. Any two of $R^{403}$, $R^{404}$ and $R^{405}$ may bond together to form a ring with the sulfur atom to which they are attached. The monovalent hydrocarbon group may be straight, branched or cyclic and examples thereof include $C_1$-$C_{12}$ alkyl groups, $C_2$-$C_{12}$ alkenyl groups, $C_2$-$C_{12}$ alkynyl groups, $C_6$-$C_{20}$ aryl groups, and $C_7$-$C_{12}$ aralkyl groups. In these groups, some or all hydrogen may be substituted by hydroxyl, carboxyl, halogen, cyano, nitro, mercapto, sultone, sulfone, or sulfonium salt-containing moiety; or some carbon may be replaced by an ether bond, ester bond, carbonyl, amide bond, carbonate or sulfonic acid ester bond.

The subscript r is an integer of 1 to 3. The subscript s is an integer of 1 to 5, and t is an integer of 0 to 3, meeting $1 \le s+t \le 5$. Preferably, s is an integer of 1 to 3, more preferably 2 or 3, and t is an integer of 0 to 2.

The cation moiety in the sulfonium salt having formula (3-1) is as exemplified above for the cation moiety in the sulfonium salt having formula (Aa). The cation moiety in the iodonium salt having formula (3-2) is as exemplified above for the cation moiety in the iodonium salt having formula (1-2).

The acid generator of addition type may be used alone or in admixture. When used, the acid generator is preferably added in an amount of 0.1 to 200 parts, more preferably 1 to 100 parts by weight per 100 parts by weight of the base polymer.

Other Components

With the foregoing components, other components such as an organic solvent, surfactant, dissolution inhibitor, and crosslinker may be blended in any desired combination to formulate a positive or negative resist composition. This positive or negative resist composition has a very high sensitivity in that the dissolution rate in developer of the base polymer in exposed areas is accelerated by catalytic reaction. In addition, the resist film has a high dissolution contrast, resolution, exposure latitude, and process adaptability, and provides a good pattern profile after exposure, and minimal proximity bias because of restrained acid diffusion. By virtue of these advantages, the composition is fully useful in commercial application and suited as a pattern-forming material for the fabrication of VLSIs. Particularly when an acid generator is incorporated to formulate a chemically amplified positive resist composition capable of utilizing acid catalyzed reaction, the composition has a higher sensitivity and is further improved in the properties described above.

Examples of the organic solvent used herein are described in JP-A 2008-111103, paragraphs [0144]-[0145] (U.S. Pat. No. 7,537,880). Exemplary solvents include ketones such as cyclohexanone, cyclopentanone and methyl-2-n-pentyl ketone; alcohols such as 3-methoxybutanol, 3-methyl-3-methoxybutanol, 1-methoxy-2-propanol, 1-ethoxy-2-propanol, and diacetone alcohol (DAA); ethers such as propylene glycol monomethyl ether, ethylene glycol monomethyl ether, propylene glycol monoethyl ether, ethylene glycol monoethyl ether, propylene glycol dimethyl ether, and diethylene glycol dimethyl ether; esters such as propylene glycol monomethyl ether acetate (PGMEA), propylene glycol monoethyl ether acetate, ethyl lactate, ethyl pyruvate, butyl acetate, methyl 3-methoxypropionate, ethyl 3-ethoxypropionate, t-butyl acetate, t-butyl propionate, and propylene glycol mono-t-butyl ether acetate; and lactones such as γ-butyrolactone, which may be used alone or in admixture.

The organic solvent is preferably added in an amount of 100 to 10,000 parts, and more preferably 200 to 8,000 parts by weight per 100 parts by weight of the base polymer.

Exemplary surfactants are described in JP-A 2008-111103, paragraphs [0165]-[0166].

Inclusion of a surfactant may improve or control the coating characteristics of the resist composition. The surfactant may be used alone or in admixture. The surfactant is preferably added in an amount of 0.0001 to 10 parts by weight per 100 parts by weight of the base polymer.

In the case of a positive resist composition, inclusion of a dissolution inhibitor may lead to an increased difference in dissolution rate between exposed and unexposed areas and a further improvement in resolution. The dissolution inhibitor which can be used herein is a compound having at least two phenolic hydroxyl groups on the molecule, in which an average of from 0 to 100 mol % of all the hydrogen atoms on the phenolic hydroxyl groups are replaced by acid labile groups or a compound having at least one carboxyl group on the molecule, in which an average of 50 to 100 mol % of all the hydrogen atoms on the carboxyl groups are replaced by acid labile groups, both the compounds having a molecular weight of 100 to 1,000, and preferably 150 to 800. Typical are bisphenol A, trisphenol, phenolphthalein, cresol novolac, naphthalenecarboxylic acid, adamantanecarboxylic acid, and cholic acid derivatives in which the hydrogen atom on the hydroxyl or carboxyl group is replaced by an acid labile group, as described in U.S. Pat. No. 7,771,914 (JP-A 2008-122932, paragraphs [0155]-[0178]).

In the resist composition which is positive, the dissolution inhibitor is preferably added in an amount of 0 to 50 parts, more preferably 5 to 40 parts by weight per 100 parts by weight of the base polymer. The dissolution inhibitor may be used alone or in admixture.

In the case of a negative resist composition, a crosslinker is added thereto to reduce the dissolution rate in the exposed region of a resist film, yielding a negative pattern. Suitable crosslinkers which can be used herein include epoxy compounds, melamine compounds, guanamine compounds, glycoluril compounds and urea compounds having substituted thereon at least one group selected from among methylol, alkoxymethyl and acyloxymethyl groups, isocyanate compounds, azide compounds, and compounds having a double bond such as an alkenyl ether group. These compounds may be used as an additive or introduced into a polymer side chain as a pendant. Hydroxy-containing compounds may also be used as the crosslinker. The crosslinker may be used alone or in admixture.

Of the foregoing crosslinkers, suitable epoxy compounds include tris(2,3-epoxypropyl) isocyanurate, trimethylolmethane triglycidyl ether, trimethylolpropane triglycidyl ether, and triethylolethane triglycidyl ether. Examples of the melamine compound include hexamethylol melamine, hexamethoxymethyl melamine, hexamethylol melamine compounds having 1 to 6 methylol groups methoxymethylated and mixtures thereof, hexamethoxyethyl melamine, hexaacyloxymethyl melamine, hexamethylol melamine compounds having 1 to 6 methylol groups acyloxymethylated and mixtures thereof. Examples of the guanamine compound include tetramethylol guanamine, tetramethoxymethyl guanamine, tetramethylol guanamine compounds having 1 to 4 methylol groups methoxymethylated and mixtures thereof, tetramethoxyethyl guanamine, tetraacyloxyguanamine, tetramethylol guanamine compounds having 1 to 4 methylol groups acyloxymethylated and mixtures thereof. Examples of the glycoluril compound include tetramethylol glycoluril, tetramethoxyglycoluril, tetramethoxymethyl glycoluril, tetramethylol glycoluril compounds having 1 to 4 methylol groups methoxymethylated and mixtures thereof, tetramethylol glycoluril compounds having 1 to 4 methylol groups acyloxymethylated and mixtures thereof. Examples of the urea compound include tetramethylol urea, tetramethoxymethyl urea, tetramethylol urea compounds having 1 to 4 methylol groups methoxymethylated and mixtures thereof, and tetramethoxyethyl urea.

Suitable isocyanate compounds include tolylene diisocyanate, diphenylmethane diisocyanate, hexamethylene diisocyanate and cyclohexane diisocyanate. Suitable azide compounds include 1,1'-biphenyl-4,4'-bisazide, 4,4'-methylidenebisazide, and 4,4'-oxybisazide. Examples of the alkenyl ether group-containing compound include ethylene glycol divinyl ether, triethylene glycol divinyl ether, 1,2-propanediol divinyl ether, 1,4-butanediol divinyl ether, tetramethylene glycol divinyl ether, neopentyl glycol divinyl ether, trimethylol propane trivinyl ether, hexanediol divinyl ether, 1,4-cyclohexanediol divinyl ether, pentaerythritol trivinyl ether, pentaerythritol tetravinyl ether, sorbitol tetravinyl ether, sorbitol pentavinyl ether, and trimethylol propane trivinyl ether.

In the negative resist composition, the crosslinker is preferably added in an amount of 0.1 to 50 parts, more preferably 1 to 40 parts by weight per 100 parts by weight of the base polymer.

In the resist composition of the invention, a quencher of the structure not containing an iodized benzene ring (referred to as another quencher) may be blended. The other quencher is typically selected from conventional basic compounds. Conventional basic compounds include primary, secondary, and tertiary aliphatic amines, mixed amines, aromatic amines, heterocyclic amines, nitrogen-containing compounds with carboxyl group, nitrogen-containing compounds with sulfonyl group, nitrogen-containing compounds with hydroxyl group, nitrogen-containing compounds with hydroxyphenyl group, alcoholic nitrogen-containing compounds, amide derivatives, imide derivatives, and carbamate derivatives. Also included are primary, secondary, and tertiary amine compounds, specifically amine compounds having a hydroxyl, ether, ester, lactone ring, cyano, or sulfonic acid ester group as described in JP-A 2008-111103, paragraphs [0146]-[0164], and compounds having a carbamate group as described in JP 3790649. Addition of a basic compound may be effective for further suppressing the diffusion rate of acid in the resist film or correcting the pattern profile.

Onium salts such as sulfonium salts, iodonium salts and ammonium salts of sulfonic acids which are not fluorinated at α-position as described in U.S. Pat. No. 8,795,942 (JP-A 2008-158339) and similar onium salts of carboxylic acid may also be used as the other quencher. While an α-fluorinated sulfonic acid, imide acid, and methide acid are necessary to deprotect the acid labile group of carboxylic acid ester, an α-non-fluorinated sulfonic acid or carboxylic acid is released by salt exchange with an α-non-fluorinated onium salt. An α-non-fluorinated sulfonic acid and a carboxylic acid function as a quencher because they do not induce deprotection reaction.

To the resist composition, a water repellency improver may also be added for improving the water repellency on surface of a resist film as spin coated. The water repellency improver may be used in the topcoatless immersion lithography. Suitable water repellency improvers include polymers having a fluoroalkyl group and polymers having a specific structure with a 1,1,1,3,3,3-hexafluoro-2-propanol residue and are described in JP-A 2007-297590 and JP-A 2008-111103, for example. The water repellency improver to be added to the resist composition should be soluble in the organic solvent as the developer. The water repellency improver of specific structure with a 1,1,1,3,3,3-hexafluoro-2-propanol residue is well soluble in the developer. A polymer having an amino group or amine salt copolymerized as recurring units may serve as the water repellent additive and is effective for preventing evaporation of acid during PEB, thus preventing any hole pattern opening failure after development. The water repellency improver may be used alone or in admixture. An appropriate amount of the water repellency improver is 0 to 20 parts, preferably 0.5 to 10 parts by weight per 100 parts by weight of the base polymer.

Also, an acetylene alcohol may be blended in the resist composition. Suitable acetylene alcohols are described in JP-A 2008-122932, paragraphs [0179]-[0182]. An appropriate amount of the acetylene alcohol blended is 0 to 5 parts by weight per 100 parts by weight of the base polymer.

Pattern Forming Process

The resist composition is used in the fabrication of various integrated circuits. Pattern formation using the resist composition may be performed by well-known lithography processes. The process generally involves coating, exposure, and development. If necessary, any additional steps may be added.

For example, the positive resist composition is first applied onto a substrate on which an integrated circuit is to be formed (e.g., Si, $SiO_2$, SiN, SiON, TiN, WSi, BPSG, SOG, or organic antireflective coating) or a substrate on which a mask circuit is to be formed (e.g., Cr, CrO, CrON, $MoSi_2$, or $SiO_2$) by a suitable coating technique such as spin coating, roll coating, flow coating, dipping, spraying or doctor coating. The coating is prebaked on a hotplate at a temperature of 60 to 150° C. for 10 seconds to 30 minutes, preferably at 80 to 120° C. for 30 seconds to 20 minutes. The resulting resist film is generally 0.01 to 2.0 μm thick.

The resist film is then exposed to a desired pattern of high-energy radiation such as UV, deep-UV, EB, EUV of wavelength 3 to 15 nm, x-ray, soft x-ray, excimer laser light, γ-ray or synchrotron radiation. When UV, deep-UV, EUV, x-ray, soft x-ray, excimer laser, γ-ray or synchrotron radiation is used as the high-energy radiation, the resist film is exposed thereto through a mask having a desired pattern in a dose of preferably about 1 to 200 mJ/cm$^2$, more preferably about 10 to 100 mJ/cm$^2$. When EB is used as the high-energy radiation, the resist film is exposed thereto through a mask having a desired pattern or directly in a dose of preferably about 0.1 to 100 μC/cm$^2$, more preferably about 0.5 to 50 μC/cm$^2$. It is appreciated that the inventive resist composition is suited in micropatterning using KrF excimer laser, ArF excimer laser, EB, EUV, x-ray, soft x-ray, γ-ray or synchrotron radiation, especially in micropatterning using EB or EUV.

After the exposure, the resist film may be baked (PEB) on a hot plate at 60 to 150° C. for 10 seconds to 30 minutes, preferably at 80 to 120° C. for 30 seconds to 20 minutes.

After the exposure or PEB, the resist film is developed in a developer in the form of an aqueous base solution for 3 seconds to 3 minutes, preferably 5 seconds to 2 minutes by conventional techniques such as dip, puddle and spray techniques. A typical developer is a 0.1 to 10 wt %, preferably 2 to 5 wt % aqueous solution of tetramethylammonium hydroxide (TMAH), tetraethylammonium hydroxide (TEAH), tetrapropylammonium hydroxide (TPAH), or tetrabutylammonium hydroxide (TBAH). The resist film in the exposed area is dissolved in the developer whereas the resist film in the unexposed area is not dissolved. In this way, the desired positive pattern is formed on the substrate. Inversely in the case of negative resist, the exposed area of resist film is insolubilized and the unexposed area is dissolved in the developer.

In an alternative embodiment, a negative pattern may be formed via organic solvent development using a positive resist composition comprising a base polymer having an acid labile group. The developer used herein is preferably selected from among 2-octanone, 2-nonanone, 2-heptanone, 3-heptanone, 4-heptanone, 2-hexanone, 3-hexanone, diisobutyl ketone, methylcyclohexanone, acetophenone, methylacetophenone, propyl acetate, butyl acetate, isobutyl acetate, pentyl acetate, butenyl acetate, isopentyl acetate, propyl formate, butyl formate, isobutyl formate, pentyl formate, isopentyl formate, methyl valerate, methyl pentenoate, methyl crotonate, ethyl crotonate, methyl propionate, ethyl propionate, ethyl 3-ethoxypropionate, methyl lactate, ethyl lactate, propyl lactate, butyl lactate, isobutyl lactate, pentyl lactate, isopentyl lactate, methyl 2-hydroxyisobutyrate, ethyl 2-hydroxyisobutyrate, methyl benzoate, ethyl benzoate, phenyl acetate, benzyl acetate, methyl phenylacetate, benzyl formate, phenylethyl formate, methyl 3-phenylpropionate, benzyl propionate, ethyl phenylacetate, and 2-phenylethyl acetate, and mixtures thereof.

At the end of development, the resist film is rinsed. As the rinsing liquid, a solvent which is miscible with the developer and does not dissolve the resist film is preferred. Suitable solvents include alcohols of 3 to 10 carbon atoms, ether compounds of 8 to 12 carbon atoms, alkanes, alkenes, and alkynes of 6 to 12 carbon atoms, and aromatic solvents. Specifically, suitable alcohols of 3 to 10 carbon atoms include n-propyl alcohol, isopropyl alcohol, 1-butyl alcohol, 2-butyl alcohol, isobutyl alcohol, t-butyl alcohol, 1-pentanol, 2-pentanol, 3-pentanol, t-pentyl alcohol, neopentyl alcohol, 2-methyl-1-butanol, 3-methyl-1-butanol, 3-methyl-3-pentanol, cyclopentanol, 1-hexanol, 2-hexanol, 3-hexanol, 2,3-dimethyl-2-butanol, 3,3-dimethyl-1-butanol, 3,3-dimethyl-2-butanol, 2-ethyl-1-butanol, 2-methyl-1-pentanol, 2-methyl-2-pentanol, 2-methyl-3-pentanol, 3-methyl-1-pentanol, 3-methyl-2-pentanol, 3-methyl-3-pentanol, 4-methyl-1-pentanol, 4-methyl-2-pentanol, 4-methyl-3-pentanol, cyclohexanol, and 1-octanol. Suitable ether compounds of 8 to 12 carbon atoms include di-n-butyl ether, diisobutyl ether, di-s-butyl ether, di-n-pentyl ether, diisopentyl ether, di-s-pentyl ether, di-t-pentyl ether, and di-n-hexyl ether. Suitable alkanes of 6 to 12 carbon atoms include hexane, heptane, octane, nonane, decane, undecane, dodecane, methylcyclopentane, dimethylcyclopentane, cyclohexane, methylcyclohexane, dimethylcyclohexane, cycloheptane, cyclooctane, and cyclononane. Suitable alkenes of 6 to 12 carbon atoms include hexene, heptene, octene, cyclohexene, methylcyclohexene, dimethylcyclohexene, cycloheptene, and cyclooctene. Suitable alkynes of 6 to 12 carbon atoms include hexyne, heptyne, and octyne. Suitable aromatic solvents include toluene, xylene, ethylbenzene, isopropylbenzene, t-butylbenzene and mesitylene.

Rinsing is effective for minimizing the risks of resist pattern collapse and defect formation. However, rinsing is not essential. If rinsing is omitted, the amount of solvent used may be reduced.

A hole or trench pattern after development may be shrunk by the thermal flow, RELACS® or DSA process. A hole pattern is shrunk by coating a shrink agent thereto, and baking such that the shrink agent may undergo crosslinking at the resist surface as a result of the acid catalyst diffusing from the resist layer during bake, and the shrink agent may attach to the sidewall of the hole pattern. The bake is preferably at a temperature of 70 to 180° C., more preferably 80 to 170° C., for a time of 10 to 300 seconds. The extra shrink agent is stripped and the hole pattern is shrunk.

EXAMPLES

Examples of the invention are given below by way of illustration and not by way of limitation. All parts are by weight (pbw).

Quenchers 1 to 14 used in resist compositions have the structure shown below. A sulfonium salt was synthesized by ion exchange with a sulfonium chloride providing the cation shown below. A quaternary ammonium salt was synthesized by ion exchange with a quaternary ammonium chloride. A tertiary ammonium compound was synthesized by mixing a tertiary amine compound with a carboxyl-containing compound.

Quencher 1

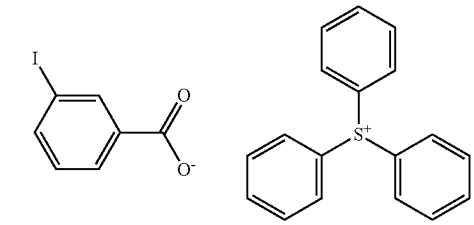

Quencher 2

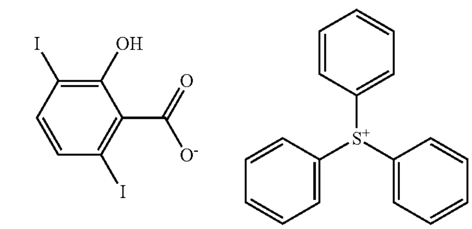

Quencher 3

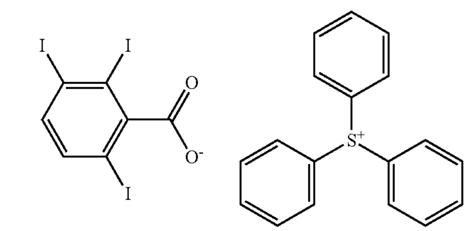

Quencher 4

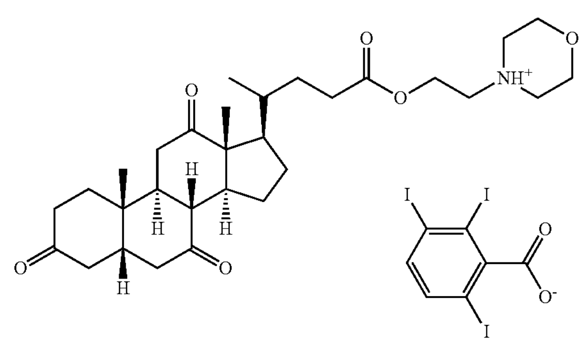

Quencher 5

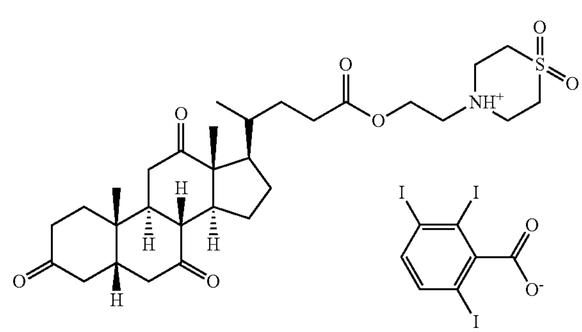

-continued

Quencher 6

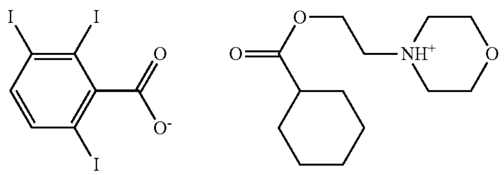

Quencher 7

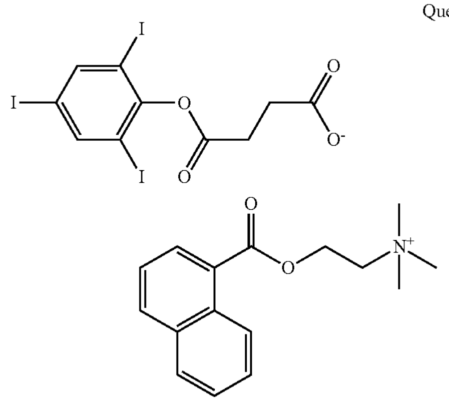

Quencher 8

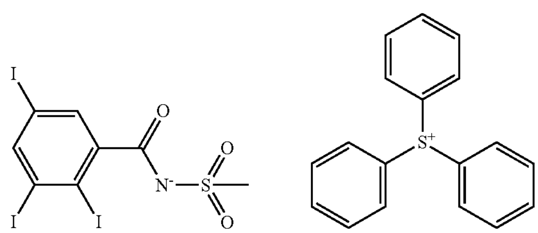

Quencher 9

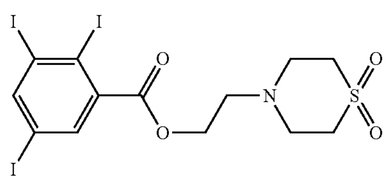

Quencher 10

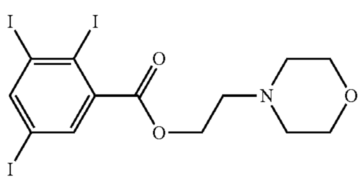

Quencher 11

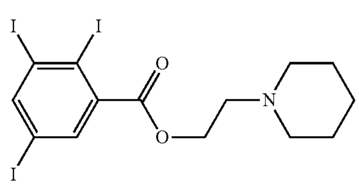

Quencher 12

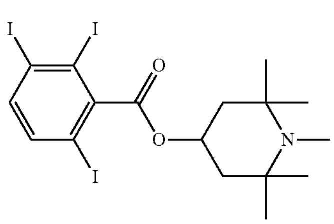

-continued

Quencher 13

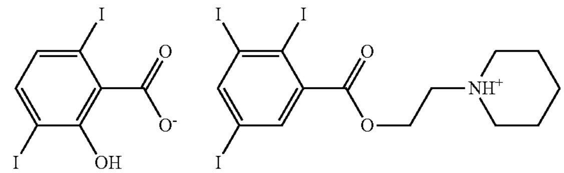

Quencher 14

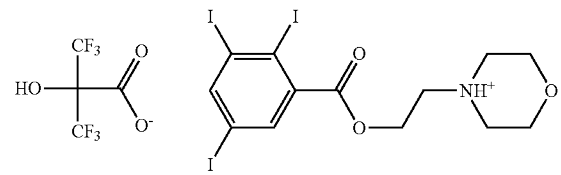

Synthesis Example

Synthesis of base polymers (Polymers 1 to 12, Comparative Polymers 1, 2)

Base polymers were prepared by combining suitable monomers, effecting copolymerization reaction thereof in tetrahydrofuran (THF) solvent, pouring the reaction solution into methanol for crystallization, repeatedly washing with hexane, isolation, and drying. The resulting polymers, designated Polymers 1 to 12 and Comparative Polymers 1 and 2, were analyzed for composition by $^{1}$H-NMR spectroscopy, and for Mw and Mw/Mn by GPC versus polystyrene standards using THF solvent.

Polymer 1

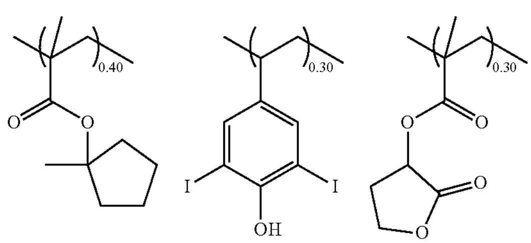

Mw = 7,700
Mw/Mn = 1.73

Polymer 2

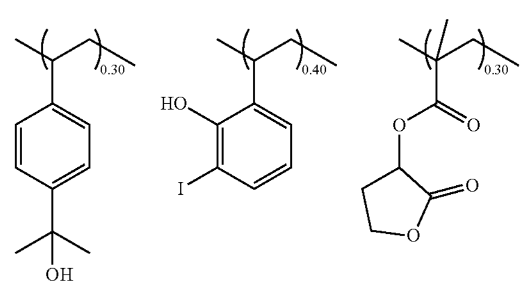

Mw = 8,100
Mw/Mn = 1.65

-continued
Polymer 3
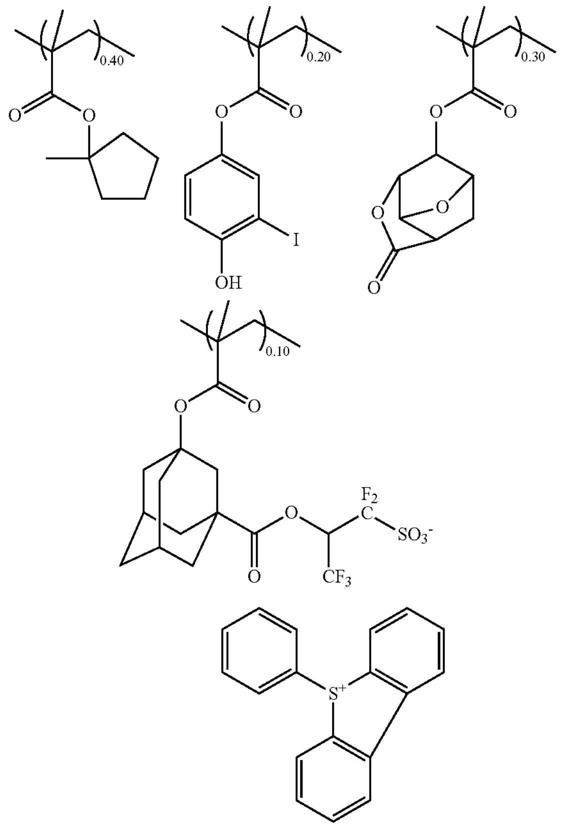
Mw = 7,600
Mw/Mn = 1.73
Polymer4
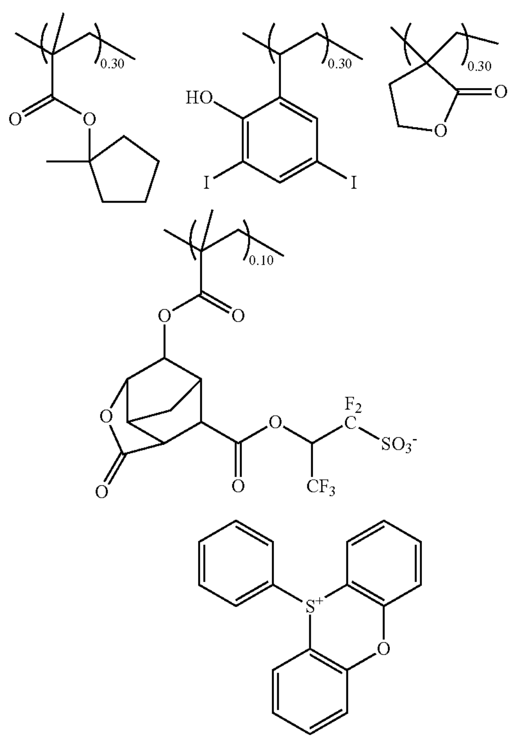
Mw = 7,600
Mw/Mn = 1.73
-continued
Polymer 5
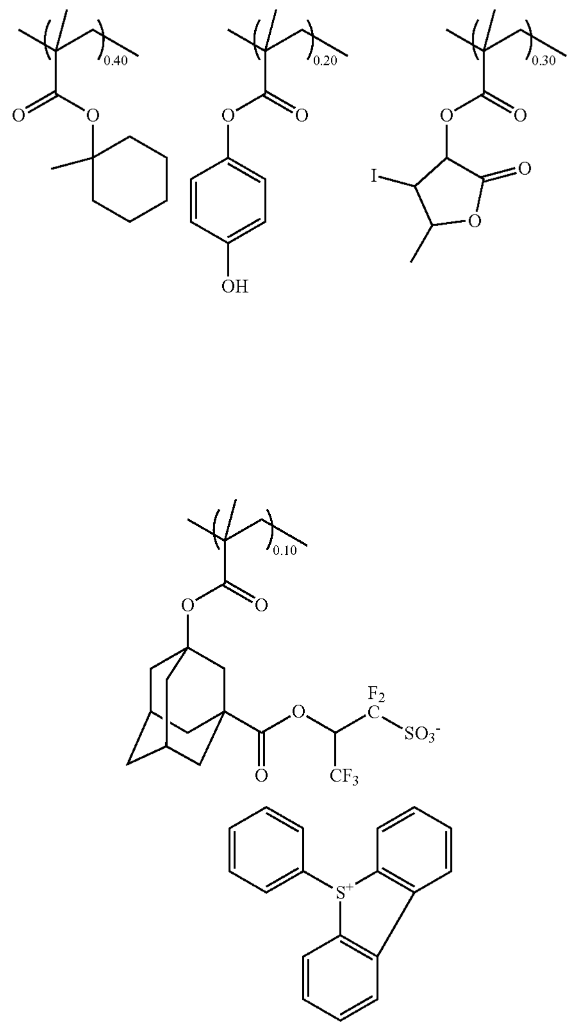
Mw = 8,900
Mw/Mn = 1.88
Polymer 6
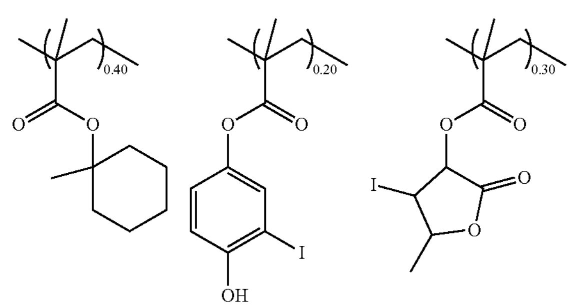

-continued
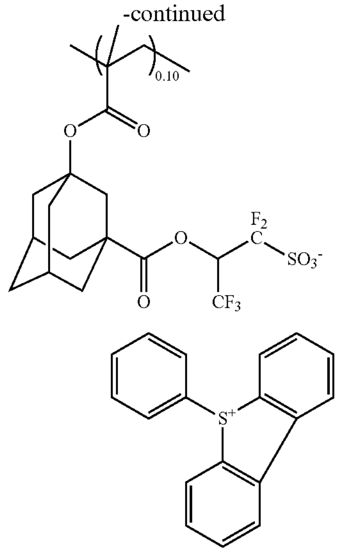
Mw = 9,200
Mw/Mn = 1.92
Polymer 7
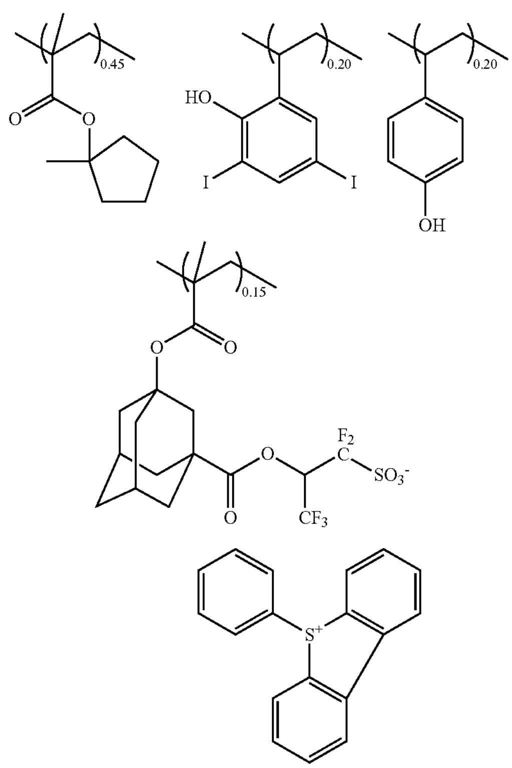
Mw = 9,600
Mw/Mn = 1.93
Polymer 8
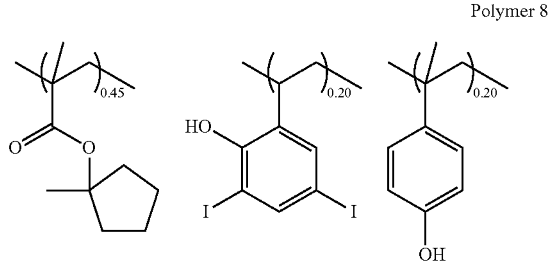
-continued
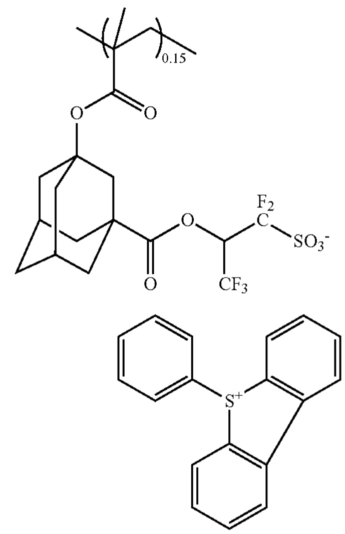
Mw = 9,900
Mw/Mn = 1.97
Polymer 9
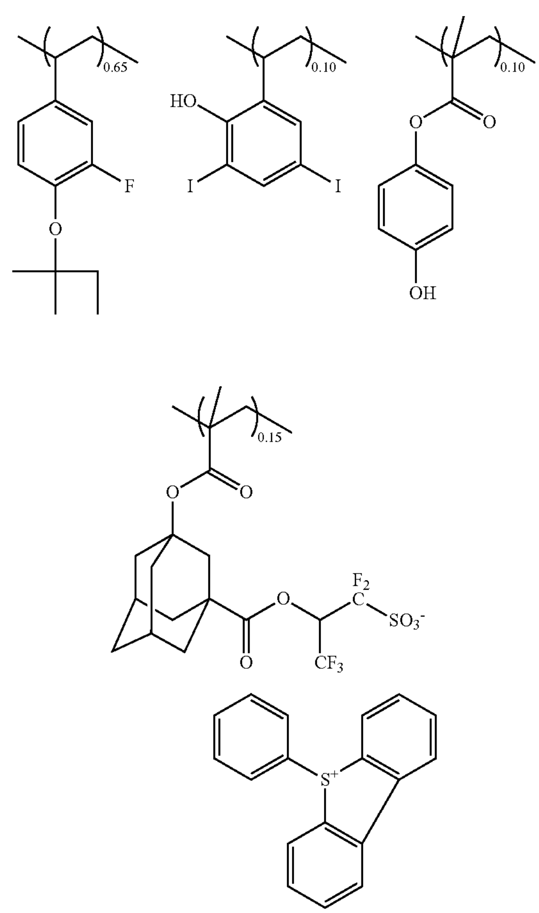
Mw = 10,100
Mw/Mn = 1.69

-continued
Polymer 10
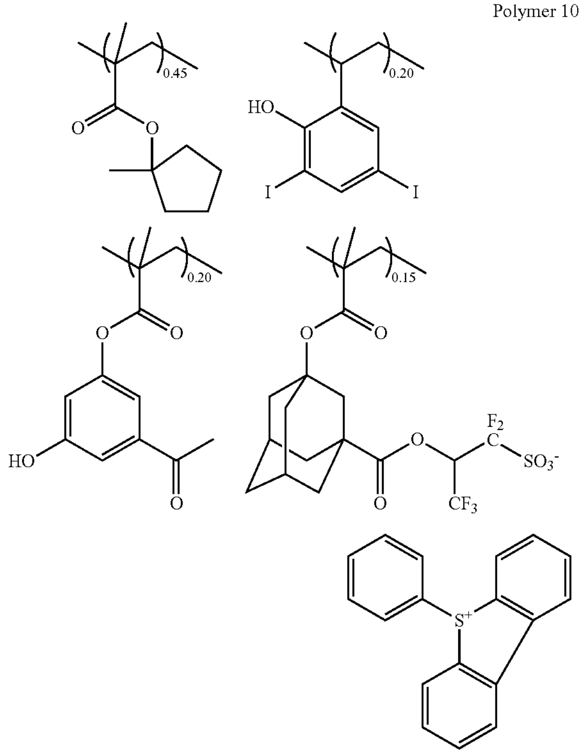
Mw = 9,800
Mw/Mn = 1.91
Polymer 11
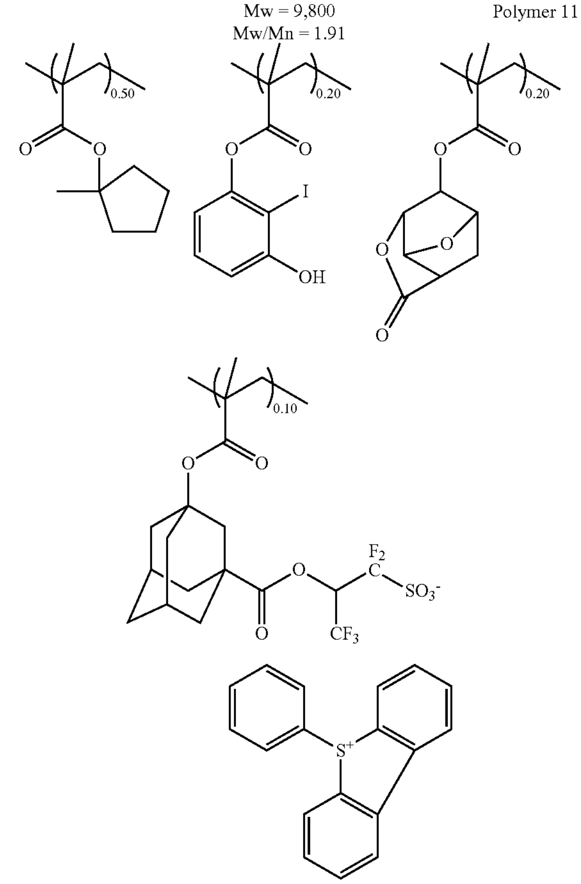
Mw = 9,100
Mw/Mn = 1.79
-continued
Polymer 12
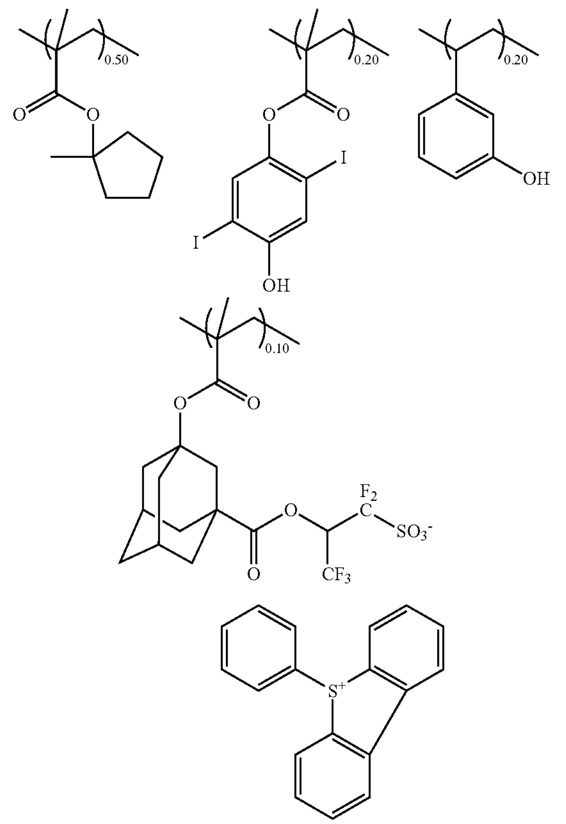
Mw = 9,600
Mw/Mn = 1.78
Comparative Polymer 1
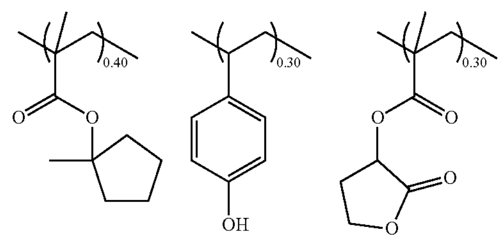
Mw = 7,200
Mw/Mn = 1.71
Comparative Polymer 2
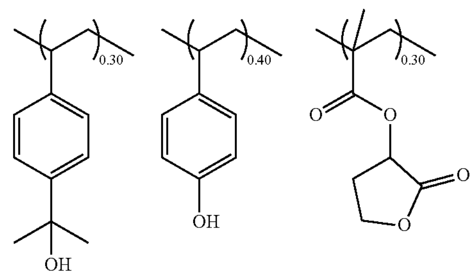
Mw = 8,600
Mw/Mn = 1.79

Examples 1 to 25 and Comparative Examples 1 to 10

[1] Preparation of Resist Composition

Resist compositions were prepared by dissolving the selected components in a solvent in accordance with the recipe shown in Tables 1 and 2, and filtering through a filter having a pore size of 0.2 μm. The solvent contained 100 ppm of surfactant FC-4430 (3M). The components in Tables 1 and 2 are as identified below.

Organic Solvents:

PGMEA (propylene glycol monomethyl ether acetate)

DAA (diacetone alcohol)

Acid generator: PAG 1 to PAG 6 of the following structural formulae

PAG 1

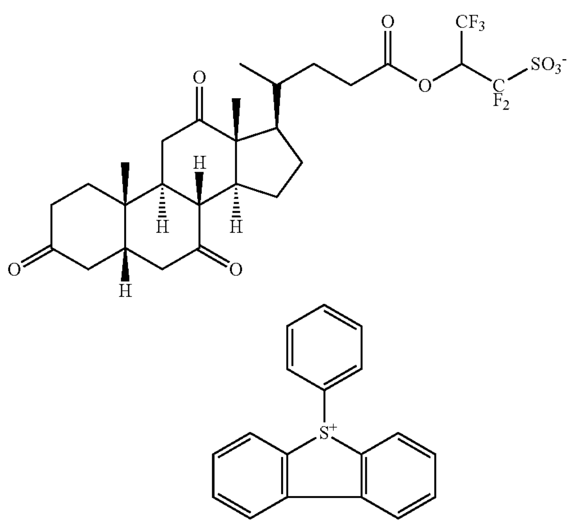

PAG 2

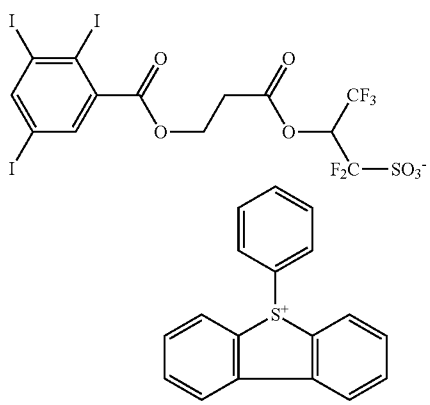

PAG 3

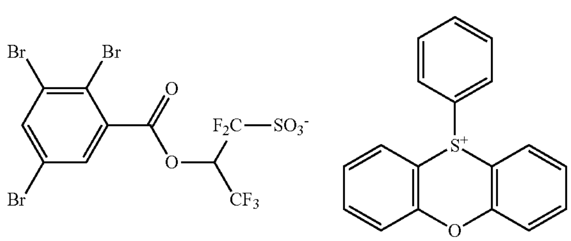

-continued

PAG 4

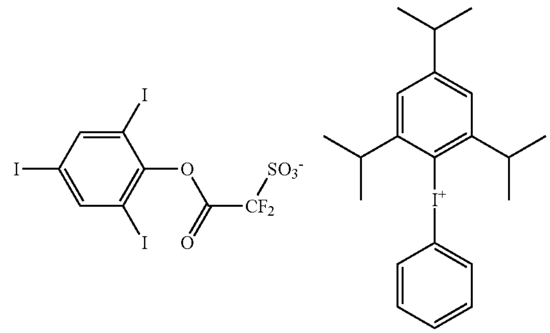

PAG 5

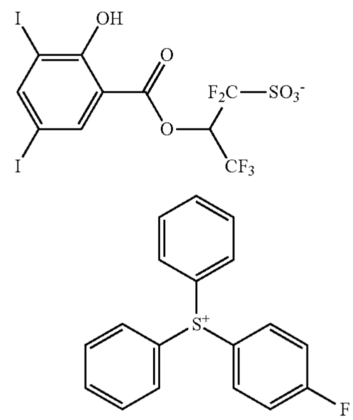

PAG 6

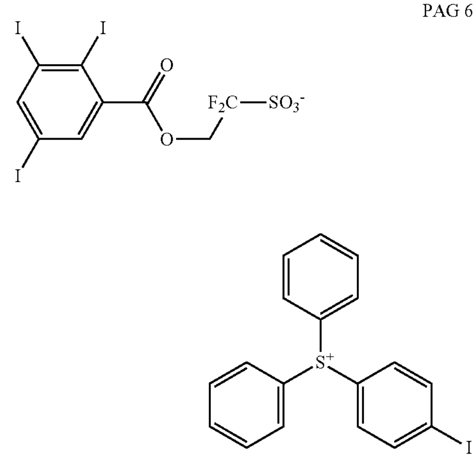

Comparative quenchers 1 to 7 of the following structural formulae

Comparative quencher 1

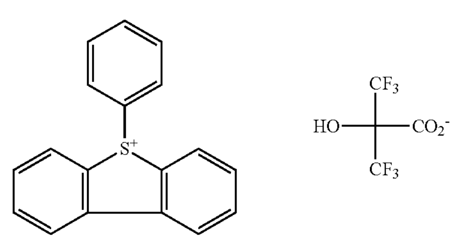

-continued

Comparative quencher 2

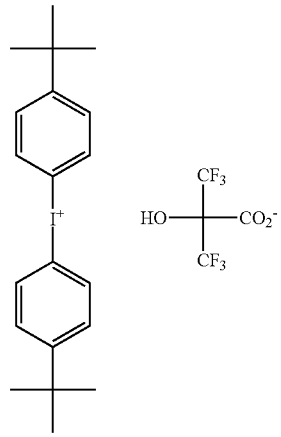

Comparative quencher 3

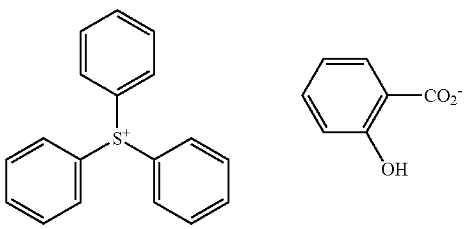

Comparative quencher 4

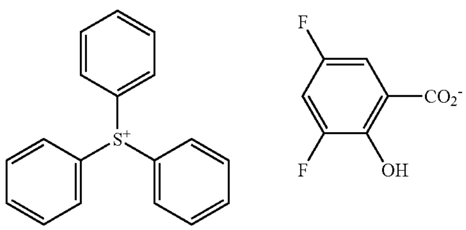

Comparative quencher 5

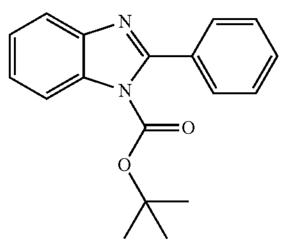

-continued

Comparative quencher 6

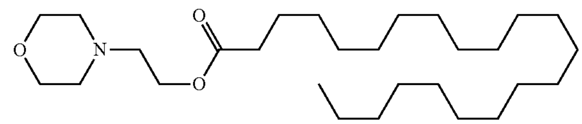

Comparative quencher 7

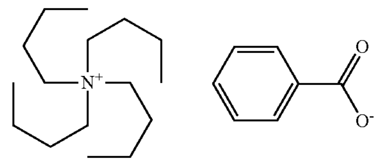

[2] EUV Lithography Test

Each of the resist compositions in Tables 1 and 2 was spin coated on a silicon substrate having a 20-nm coating of silicon-containing spin-on hard mask SHB-A940 (Shin-Etsu Chemical Co., Ltd., Si content 43 wt %) and prebaked on a hotplate at 105° C. for 60 seconds to form a resist film of 50 nm thick. Using an EUV scanner NXE3300 (ASML, NA 0.33, σ 0.9/0.6, quadrupole illumination), the resist film was exposed to EUV through a mask bearing a hole pattern at a pitch 46 nm (on-wafer size) and +20% bias. The resist film was baked (PEB) on a hotplate at the temperature shown in Tables 1 and 2 for 60 seconds and developed in a 2.38 wt % TMAH aqueous solution for 30 seconds to form a pattern. In Examples 1 to 20 and Comparative Examples 1 to 9, a positive resist pattern, i.e., hole pattern having a size of 23 nm was formed. In Example 21 and Comparative Example 10, a negative resist pattern, i.e., dot pattern having a size of 23 nm was formed.

The resist pattern was observed under CD-SEM (CG-5000, Hitachi High-Technologies Corp.). The exposure dose that provides a hole or dot pattern having a size of 23 nm is reported as sensitivity. The size of 50 holes or dots was measured, from which a size variation (3a) was computed and reported as CDU.

The resist composition is shown in Tables 1 and 2 together with the sensitivity and CDU of EUV lithography.

TABLE 1

| | | Polymer (pbw) | Acid generator (pbw) | Quencher (pbw) | Organic solvent (pbw) | PEB temp. (° C.) | Sensitivity (mJ/cm²) | CDU (nm) |
|---|---|---|---|---|---|---|---|---|
| Example | 1 | Polymer 1 (100) | PAG 1 (20.0) | Quencher 1 (5.10) | PGMEA (2,000) DAA (500) | 95 | 27 | 3.6 |
| | 2 | Polymer 1 (100) | PAG 1 (20.0) | Quencher 2 (6.51) | PGMEA (2,000) DAA (500) | 95 | 25 | 3.0 |
| | 3 | Polymer 1 (100) | PAG 1 (20.0) | Quencher 3 (7.61) | PGMEA (2,000) DAA (500) | 95 | 24 | 3.3 |
| | 4 | Polymer 1 (100) | PAG 1 (20.0) | Quencher 4 (3.00) | PGMEA (2,000) DAA (500) | 95 | 26 | 3.2 |
| | 5 | Polymer 1 (100) | PAG 1 (20.0) | Quencher 5 (10.63) | PGMEA (2,000) DAA (500) | 95 | 25 | 3.3 |
| | 6 | Polymer 1 (100) | PAG 1 (20.0) | Quencher 6 (7.41) | PGMEA (2,000) DAA (500) | 95 | 26 | 3.1 |
| | 7 | Polymer 1 (100) | PAG 2 (22.0) | Quencher 7 (8.28) | PGMEA (2,000) DAA (500) | 95 | 26 | 3.0 |

TABLE 1-continued

| | Polymer (pbw) | Acid generator (pbw) | Quencher (pbw) | Organic solvent (pbw) | PEB temp. (° C.) | Sensitivity (mJ/cm$^2$) | CDU (nm) |
|---|---|---|---|---|---|---|---|
| 8 | Polymer 1 (100) | PAG 3 (20.0) | Quencher 8 (8.38) | PGMEA (2,000) DAA (500) | 95 | 24 | 3.0 |
| 9 | Polymer 1 (100) | PAG 4 (26.0) | Quencher 9 (6.61) | PGMEA (2,000) DAA (500) | 95 | 26 | 3.0 |
| 10 | Polymer 1 (100) | PAG 5 (24.0) | Quencher 10 (6.12) | PGMEA (2,000) DAA (500) | 95 | 26 | 3.1 |
| 11 | Polymer 1 (100) | PAG 6 (24.0) | Quencher 11 (6.10) | PGMEA (2,000) DAA (500) | 95 | 27 | 3.2 |
| 12 | Polymer 1 (100) | PAG 1 (20.0) | Quencher 12 (6.52) | PGMEA (2,000) DAA (500) | 95 | 28 | 3.0 |
| 13 | Polymer 1 (100) | PAG 1 (20.0) | Quencher 13 (10.00) | PGMEA (2,000) DAA (500) | 95 | 24 | 2.8 |
| 14 | Polymer 1 (100) | PAG 1 (20.0) | Quencher 14 (8.24) | PGMEA (2,000) DAA (500) | 95 | 25 | 2.9 |
| 15 | Polymer 3 (100) | — | Quencher 2 (6.51) | PGMEA (2,000) DAA (500) | 95 | 24 | 2.7 |
| 16 | Polymer 4 (100) | — | Quencher 2 (6.51) | PGMEA (2,000) DAA (500) | 95 | 24 | 2.6 |
| 17 | Polymer 5 (100) | — | Quencher 2 (6.51) | PGMEA (2,000) DAA (500) | 95 | 24 | 2.7 |
| 18 | Polymer 6 (100) | — | Quencher 2 (6.51) | PGMEA (2,000) DAA (500) | 95 | 26 | 2.7 |
| 19 | Polymer 7 (100) | — | Quencher 2 (6.51) | PGMEA (2,000) DAA (500) | 95 | 25 | 2.6 |
| 20 | Polymer 8 (100) | — | Quencher 2 (6.51) | PGMEA (2,000) DAA (500) | 95 | 26 | 2.8 |
| 21 | Polymer 2 (100) | PAG 1 (15.0) | Quencher 2 (3.00) | PGMEA (2,000) DAA (500) | 95 | 35 | 3.7 |
| 22 | Polymer 9 (100) | — | Quencher 2 (6.51) | PGMEA (2,000) DAA (500) | 95 | 28 | 2.6 |
| 23 | Polymer 10 (100) | — | Quencher 2 (6.51) | PGMEA (2,000) DAA (500) | 95 | 27 | 2.7 |
| 24 | Polymer 11 (100) | — | Quencher 2 (6.51) | PGMEA (2,000) DAA (500) | 95 | 26 | 2.6 |
| 25 | Polymer 12 (100) | — | Quencher 2 (6.51) | PGMEA (2,000) DAA (500) | 95 | 24 | 2.6 |

| | | Polymer (pbw) | Acid generator (pbw) | Quencher (pbw) | Organic solvent (pbw) | PEB temp. (° C.) | Sensitivity (mJ/cm$^2$) | CDU (nm) |
|---|---|---|---|---|---|---|---|---|
| Comparative Example | 1 | Polymer 1 (100) | PAG 1 (20.0) | Comparative quencher 1 (4.72) | PGMEA (2,000) DAA (500) | 95 | 29 | 3.8 |
| | 2 | Polymer 1 (100) | PAG 1 (20.0) | Comparative quencher 2 (6.04) | PGMEA (2,000) DAA (500) | 95 | 30 | 3.9 |
| | 3 | Polymer 1 (100) | PAG 1 (20.0) | Comparative quencher 3 (4.00) | PGMEA (2,000) DAA (500) | 95 | 32 | 3.8 |
| | 4 | Polymer 1 (100) | PAG 1 (20.0) | Comparative quencher 4 (4.36) | PGMEA (2,000) DAA (500) | 95 | 31 | 3.7 |
| | 5 | Polymer 1 (100) | PAG 1 (20.0) | Comparative quencher 5 (2.94) | PGMEA (2,000) DAA (500) | 95 | 36 | 4.1 |
| | 6 | Polymer 1 (100) | PAG 1 (20.0) | Comparative quencher 6 (4.53) | PGMEA (2,000) DAA (500) | 95 | 38 | 4.0 |
| | 7 | Polymer 1 (100) | PAG 1 (20.0) | Comparative quencher 7 (3.63) | PGMEA (2,000) DAA (500) | 95 | 37 | 3.9 |
| | 8 | Comparative Polymer 1 (100) | PAG 1 (20.0) | Quencher 1 (5.10) | PGMEA (2,000) DAA (500) | 95 | 35 | 3.9 |
| | 9 | Comparative Polymer 1 (100) | PAG 1 (20.0) | Comparative quencher 1 (4.72) | PGMEA (2,000) DAA (500) | 95 | 39 | 4.1 |
| | 10 | Comparative Polymer 2 (100) | PAG 1 (15.0) | Quencher 1 (5.10) | PGMEA (2,000) DAA (500) | 95 | 45 | 4.5 |

It is demonstrated in Tables 1 and 2 that resist compositions comprising an iodized polymer and an iodized benzene ring-containing quencher within the scope of the invention offer a high sensitivity and improved CDU.

Japanese Patent Application No. 2018-236571 is incorporated herein by reference.

Although some preferred embodiments have been described, many modifications and variations may be made thereto in light of the above teachings. It is therefore to be understood that the invention may be practiced otherwise than as specifically described without departing from the scope of the appended claims.

The invention claimed is:

1. A resist composition comprising an iodized base polymer, and at least one quencher selected from the group consisting of a sulfonium or ammonium salt of iodized benzene ring-containing carboxylic acid, a sulfonium or ammonium salt of iodized benzene ring-containing N-carbonylsulfonamide, and an iodized benzene ring-containing ammonium salt, wherein the sulfonium or ammonium salt of iodized benzene ring-containing carboxylic acid, the sulfonium or ammonium salt of iodized benzene ring-containing N-carbonylsulfonamide, and the iodized benzene ring-containing ammonium salt have the following formulae (A)-1, (A)-2 and (A)-4, respectively, (A)-1

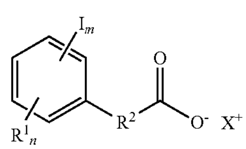

(A)-2

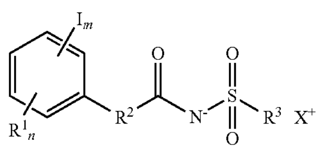

(A)-4

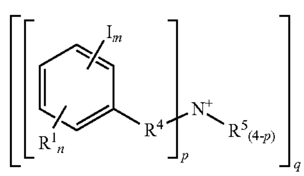

wherein $R^1$ is hydroxyl, fluorine, chlorine, bromine, amino, nitro, cyano, or a $C_1$-$C_6$ alkyl group, $C_1$-$C_6$ alkoxy group, $C_2$-$C_6$ acyloxy group or $C_1$-$C_4$ alkylsulfonyloxy group, which may be substituted with halogen, or —$NR^{1A}$—C(═O)—$R^{1B}$ or —$NR^{1A}$—C(═O)—O—$R^{1B}$, $R^{1A}$ is hydrogen or a $C_1$-$C_6$ alkyl group, $R^{1B}$ is a $C_1$-$C_6$ alkyl group or $C_2$-$C_8$ alkenyl group, $R^2$ is a single bond or a $C_1$-$C_{20}$ divalent linking group which may contain ether bond, carbonyl moiety, ester bond, amide bond, sultone moiety, lactam moiety, carbonate moiety, halogen, hydroxyl moiety or carboxyl moiety, $R^3$ is a $C_1$-$C_{10}$ alkyl group or $C_6$-$C_{10}$ aryl group, which may be substituted with amino, nitro, cyano, $C_1$-$C_{12}$ alkyl, $C_1$-$C_{12}$ alkoxy, $C_2$-$C_{12}$ alkoxycarbonyl, $C_2$-$C_{12}$ acyl, $C_2$-$C_{12}$ acyloxy, hydroxyl or halogen, $R^4$ is a $C_1$-$C_{20}$ divalent hydrocarbon group which may contain an ester bond or ether bond, $R^5$ is hydrogen, nitro, or a $C_1$-$C_{20}$ monovalent hydrocarbon group which may contain hydroxyl, carboxyl, ether bond, ester bond, thiol, nitro, cyano or amino, with the proviso that in case of p=1, groups $R^5$ may bond together to form a ring with the nitrogen atom to which they are attached, the ring optionally containing a double bond, oxygen, sulfur or nitrogen, m is an integer of 1 to 5, n is an integer of 0 to 4, meeting $1 \le m+n \le 5$, p is 1, 2 or 3, q is 1 or 2, $A^{q-}$ is a carboxylate anion, fluorine-free sulfonimide anion, sulfonamide anion, or halide ion, $X^+$ is a sulfonium cation having the formula (Aa) or ammonium cation having the formula (Ab):

(Aa)

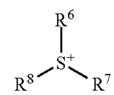

(Ab)

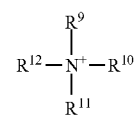

wherein $R^6$, $R^7$ and $R^8$ are each independently fluorine, chlorine, bromine, iodine, or a $C_1$-$C_{20}$ monovalent hydrocarbon group which may contain a heteroatom, $R^6$ and $R^7$ may bond together to form a ring with the sulfur atom to which they are attached, $R^9$ to $R^{12}$ are each independently hydrogen or a $C_1$-$C_{24}$ monovalent hydrocarbon group which may contain halogen, hydroxyl, carboxyl, thiol, ether bond, ester bond, thioester bond, thionoester bond, dithioester bond, amino, nitro, sulfone or ferrocenyl, $R^9$ and $R^{10}$ may bond together to form a ring, $R^9$ and $R^{10}$ taken together may form ═C($R^{9A}$)($R^{10A}$), $R^{9A}$ and $R^{10A}$ are each independently hydrogen or a $C_1$-$C_{16}$ monovalent hydrocarbon group, $R^{9A}$ and $R^{10A}$ may bond together to form a ring with the carbon and nitrogen atoms to which they are attached, the ring optionally containing a double bond, oxygen, sulfur or nitrogen, wherein the iodized base polymer comprises recurring units having the formula (a1) or recurring units having the formula (a2):

(a1)

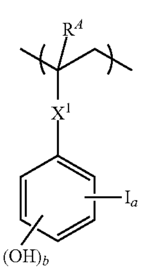

-continued (a2)

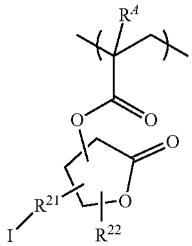

wherein $R^A$ is each independently hydrogen or methyl, $R^{21}$ is a single bond or methylene, $R^{22}$ is hydrogen or a $C_1$-$C_4$ alkyl group, $X^1$ is a single bond, ether bond, ester bond, amide bond, —C(═O)—O—$R^{23}$—, phenylene, -Ph-C(═O)—O—$R^{24}$—, or -Ph-$R^{25}$—O—C(═O)—$R^{26}$—, wherein Ph stands for phenyl, $R^{23}$ is a $C_1$-$C_{10}$ alkanediyl group which may contain an ether bond or ester bond, $R^{24}$, $R^{25}$ and $R^{26}$ are each independently a single bond or a $C_1$-$C_6$ straight or branched alkanediyl group, a is an integer of 1 to 5, b is an integer of 1 to 4, meeting $1 \le a+b \le 5$.

2. The resist composition of claim 1, further comprising an acid generator capable of generating sulfonic acid, imidic acid or methide acid.

3. The resist composition of claim 1 wherein a is an integer of 1 to 3.

4. The resist composition of claim 1, further comprising an organic solvent.

5. The resist composition of claim 1 wherein the iodized base polymer further comprises recurring units having the formula (b1) or recurring units having the formula (b2):

(b1)

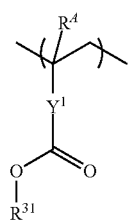

(b2)

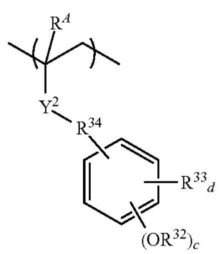

wherein $R^A$ is each independently hydrogen or methyl, $Y^1$ is a single bond, phenylene, naphthylene, or a $C_1$-$C_{12}$ linking group containing an ester bond or lactone ring, $Y^2$ is a single bond or ester bond, $R^{31}$ and $R^{32}$ are each independently an acid labile group, $R^{33}$ is fluorine, trifluoromethyl, cyano, a $C_1$-$C_6$ alkyl, $C_1$-$C_6$ alkoxy, $C_2$-$C_7$ acyl, $C_2$-$C_7$ acyloxy, or $C_2$-$C_7$ alkoxycarbonyl group, $R^{34}$ is a single bond or $C_1$-$C_6$ alkanediyl group in which some carbon may be replaced by an ether or ester bond, c is 1 or 2, d is an integer of 0 to 4, meeting $1 \le c+d \le 5$.

6. The resist composition of claim 5, further comprising a dissolution inhibitor.

7. The resist composition of claim 5 which is a chemically amplified positive resist composition.

8. The resist composition of claim 1 wherein the iodized base polymer is free of an acid labile group.

9. The resist composition of claim 8, further comprising a crosslinker.

10. The resist composition of claim 8 which is a chemically amplified negative resist composition.

11. The resist composition of claim 1, further comprising an iodine-free quencher.

12. The resist composition of claim 1, further comprising a surfactant.

13. The resist composition of claim 1 wherein the iodized base polymer further comprises recurring units of at least one type selected from recurring units having the formulae (g1) to (g3):

(g1)

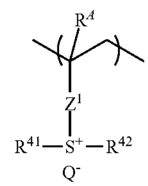

(g2)

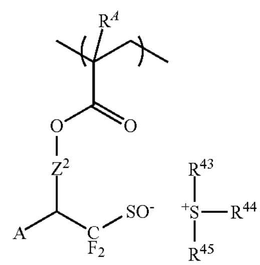

(g3)

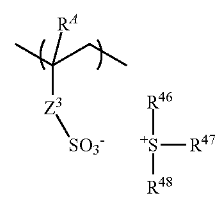

wherein $R^A$ is each independently hydrogen or methyl, $Z^1$ is a single bond, phenylene, —O—$Z^{12}$—, —C(═O)—$Z^{11}$—$Z^{12}$—, $Z^{11}$ is —O— or —NH—, $Z^{12}$ is a $C_1$-$C_6$ alkanediyl group, $C_2$-$C_6$ alkenediyl group or phenylene group, which may contain a carbonyl moiety, ester bond, ether bond or hydroxyl moiety, $Z^2$ is a single bond, —$Z^{21}$—C(═O)—O—, —$Z^{21}$—O—, or —$Z^{21}$—O—C(═O)—, $Z^{21}$ is a $C_1$-$C_{12}$ alkanediyl group which may contain a carbonyl moiety, ester bond or ether bond, $Z^3$ is a single bond, methylene, ethylene, phenylene, fluorinated phenylene, —O—$Z^{32}$—, or —C(═O)—$Z^{31}$—$Z^{32}$—, $Z^{31}$ is —O— or —NH—, $Z^{32}$ is a $C_1$-$C_6$ alkanediyl group, phenylene, fluorinated phenylene, trifluoromethyl-substituted phenylene group, or $C_2$-$C_6$ alkenediyl group, which may contain a carbonyl moiety, ester bond, ether bond or hydroxyl moiety, $R^{41}$ to $R^{48}$ are each independently a $C_1$-$C_{20}$ monovalent hydrocarbon group which may contain a heteroatom, any two of $R^{43}$, $R^{44}$ and $R^{45}$ or any two of $R^{46}$, $R^{47}$ and $R^{48}$ may bond together to form a ring with the sulfur atom to which they are attached, A is hydrogen or trifluoromethyl, and $Q^-$ is a non-nucleophilic counter ion.

14. A pattern forming process comprising the steps of applying the resist composition of claim 1 to form a resist film on a substrate, exposing the resist film to high-energy radiation, and developing the exposed resist film in a developer.

15. The process of claim 14 wherein the high-energy radiation is ArF excimer laser of wavelength 193 nm or KrF excimer laser of wavelength 248 nm.

16. The process of claim 14 wherein the high-energy radiation is EB or EUV of wavelength 3 to 15 nm.

17. The resist composition of claim 1 wherein the quencher is selected from the group consisting of a sulfonium or ammonium salt of iodized benzene ring-containing N-carbonylsulfonamide having the formula (A)-2, and an iodized benzene ring-containing ammonium salt having the formula (A)-4.

* * * * *